US012331064B2

(12) United States Patent
Li et al.

(10) Patent No.: US 12,331,064 B2
(45) Date of Patent: Jun. 17, 2025

(54) TANDEM CARBENE PHOSPHORS

(71) Applicant: University of Southern California, Los Angeles, CA (US)

(72) Inventors: Tian-Yi Li, Los Angeles, CA (US); Peter I. Djurovich, Long Beach, CA (US); Mark E. Thompson, Anaheim, CA (US)

(73) Assignee: University of Southern California, Los Angeles, CA (US)

( * ) Notice: Subject to any disclaimer, the term of this patent is extended or adjusted under 35 U.S.C. 154(b) by 834 days.

(21) Appl. No.: 17/528,258

(22) Filed: Nov. 17, 2021

(65) Prior Publication Data

US 2022/0185826 A1 Jun. 16, 2022

Related U.S. Application Data

(60) Provisional application No. 63/122,963, filed on Dec. 9, 2020.

(51) Int. Cl.
*H01L 51/50* (2006.01)
*C07F 1/00* (2006.01)
(Continued)

(52) U.S. Cl.
CPC ............ *C07F 1/00* (2013.01); *H10K 85/371* (2023.02); *H10K 50/11* (2023.02); *H10K 2101/30* (2023.02)

(58) Field of Classification Search
None
See application file for complete search history.

(56) References Cited

U.S. PATENT DOCUMENTS 4,769,292 A 9/1988 Tang
5,061,569 A 10/1991 Vanslyke
(Continued)

FOREIGN PATENT DOCUMENTS

EP 0650955 5/1995
EP 1238981 9/2002
(Continued)

OTHER PUBLICATIONS

Huynh et al., Donor Strength Determination of Benzoxazolin-2-ylidene, Benzobisoxazolin-2-ylidene, and Their Isocyanide precursors by 13C NMR Spectroscopy of Their PdII and AuI Complexes; Organometallics 2017, 36, 275-284 (Year: 2017).*
(Continued)

*Primary Examiner* — Gregory D Clark
(74) *Attorney, Agent, or Firm* — Riverside Law LLP

(57) ABSTRACT

Tandem carbene phosphors such as those of Formula I can act as electron acceptors in tandem to increase the energy separation between the ground and excited state, which is
(Continued)

higher than those found in analogous monometallic complexes. These compounds should find application as luminescent materials in organic light emitting diodes (OLEDs).

Formula I

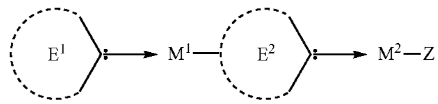

19 Claims, 41 Drawing Sheets

(51) Int. Cl.

| | |
|---|---|
| ***H10K 85/30*** | (2023.01) |
| *H10K 50/11* | (2023.01) |
| *H10K 101/30* | (2023.01) |

(56) References Cited

U.S. PATENT DOCUMENTS

| | | | |
|---|---|---|---|
| 5,247,190 | A | 9/1993 | Friend |
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 6,528,187 | B1 | 3/2003 | Okada |
| 6,687,266 | B1 | 2/2004 | Ma |
| 6,835,469 | B2 | 12/2004 | Kwong |
| 6,921,915 | B2 | 7/2005 | Takiguchi |
| 7,087,321 | B2 | 8/2006 | Kwong |
| 7,090,928 | B2 | 8/2006 | Thompson |
| 7,154,114 | B2 | 12/2006 | Brooks |
| 7,250,226 | B2 | 7/2007 | Tokito |
| 7,279,704 | B2 | 10/2007 | Walters |
| 7,332,232 | B2 | 2/2008 | Ma |
| 7,338,722 | B2 | 3/2008 | Thompson |
| 7,393,599 | B2 | 7/2008 | Thompson |
| 7,396,598 | B2 | 7/2008 | Takeuchi |
| 7,431,968 | B1 | 10/2008 | Shtein |
| 7,445,855 | B2 | 11/2008 | Mackenzie |
| 7,534,505 | B2 | 5/2009 | Lin |
| 7,968,146 | B2 | 6/2011 | Wagner |
| 8,409,729 | B2 | 4/2013 | Zeng |
| 2002/0034656 | A1 | 3/2002 | Thompson |
| 2002/0134984 | A1 | 9/2002 | Igarashi |
| 2002/0158242 | A1 | 10/2002 | Son |
| 2003/0138657 | A1 | 7/2003 | Li |
| 2003/0152802 | A1 | 8/2003 | Tsuboyama |
| 2003/0162053 | A1 | 8/2003 | Marks |
| 2003/0175553 | A1 | 9/2003 | Thompson |
| 2003/0230980 | A1 | 12/2003 | Forrest |
| 2004/0036077 | A1 | 2/2004 | Ise |
| 2004/0137267 | A1 | 7/2004 | Igarashi |
| 2004/0137268 | A1 | 7/2004 | Igarashi |
| 2004/0174116 | A1 | 9/2004 | Lu |
| 2005/0025993 | A1 | 2/2005 | Thompson |
| 2005/0112407 | A1 | 5/2005 | Ogasawara |
| 2005/0238919 | A1 | 10/2005 | Ogasawara |
| 2005/0244673 | A1 | 11/2005 | Satoh |
| 2005/0260441 | A1 | 11/2005 | Thompson |
| 2005/0260449 | A1 | 11/2005 | Walters |
| 2006/0008670 | A1 | 1/2006 | Lin |
| 2006/0202194 | A1 | 9/2006 | Jeong |
| 2006/0240279 | A1 | 10/2006 | Adamovich |
| 2006/0251923 | A1 | 11/2006 | Lin |
| 2006/0263635 | A1 | 11/2006 | Ise |
| 2006/0280965 | A1 | 12/2006 | Kwong |
| 2007/0190359 | A1 | 8/2007 | Knowles |
| 2007/0278938 | A1 | 12/2007 | Yabunouchi |
| 2008/0015355 | A1 | 1/2008 | Schafer |
| 2008/0018221 | A1 | 1/2008 | Egen |
| 2008/0106190 | A1 | 5/2008 | Yabunouchi |
| 2008/0124572 | A1 | 5/2008 | Mizuki |
| 2008/0220265 | A1 | 9/2008 | Xia |
| 2008/0297033 | A1 | 12/2008 | Knowles |
| 2009/0008605 | A1 | 1/2009 | Kawamura |
| 2009/0009065 | A1 | 1/2009 | Nishimura |
| 2009/0017330 | A1 | 1/2009 | Iwakuma |
| 2009/0030202 | A1 | 1/2009 | Iwakuma |
| 2009/0039776 | A1 | 2/2009 | Yamada |
| 2009/0045730 | A1 | 2/2009 | Nishimura |
| 2009/0045731 | A1 | 2/2009 | Nishimura |
| 2009/0101870 | A1 | 4/2009 | Prakash |
| 2009/0108737 | A1 | 4/2009 | Kwong |
| 2009/0115316 | A1 | 5/2009 | Zheng |
| 2009/0165846 | A1 | 7/2009 | Johannes |
| 2009/0167162 | A1 | 7/2009 | Lin |
| 2009/0179554 | A1 | 7/2009 | Kuma |
| 2013/0026452 | A1 | 1/2013 | Kottas |
| 2013/0119354 | A1 | 5/2013 | Ma |
| 2014/0054564 | A1 | 2/2014 | Kim |
| 2015/0318487 | A1 | 11/2015 | Ito |

FOREIGN PATENT DOCUMENTS

| | | |
|---|---|---|
| EP | 1725079 | 11/2006 |
| EP | 2034538 | 3/2009 |
| EP | 2551932 | 1/2013 |
| EP | 2977378 | 1/2016 |
| JP | 200511610 | 1/2005 |
| JP | 2007123392 | 5/2007 |
| JP | 2007254297 | 10/2007 |
| JP | 2008074939 | 4/2008 |
| JP | 2010135467 | 6/2010 |
| WO | 0139234 | 5/2001 |
| WO | 0202714 | 1/2002 |
| WO | 0215645 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2004111066 A1 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008044723 | 4/2008 |
| WO | 2008056746 | 5/2008 |
| WO | 2008057394 A1 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |

(56) References Cited

FOREIGN PATENT DOCUMENTS

| | | | |
|---|---|---|---|
| WO | 2009062578 | | 5/2009 |
| WO | 2009063833 | | 5/2009 |
| WO | 2009066778 | | 5/2009 |
| WO | 2009066779 | | 5/2009 |
| WO | 2009086028 | | 7/2009 |
| WO | 2009100991 | | 8/2009 |
| WO | 2010011390 | A2 | 1/2010 |
| WO | 2010111175 | | 9/2010 |
| WO | 2010126234 | | 11/2010 |

OTHER PUBLICATIONS

Huynh et. et. at., Gold and Palladium Hetero-Bis-NHC Complexes: Characterizations, Correlations, and Ligand Redistributions; Organometallics 2013, 32, 3685-3696 (Year: 2013).*

Hamze et. Al., "Quick-Silver" from a Systematic Study of Highly Luminescent, Two-Coordinate, d10 Coinage Metal Complexes; J. Am. Chem. Soc. 2019, 141, 8616-8626 (Year: 2019).*

Adachi et al., "Nearly 100% Internal Phosphorescent Efficiency in an Organic Light Emitting Device," J. Appl. Phys., vol. 90, No. 10, pp. 5048-5051 (2001).

Adachi, Chihaya et al., "High-Efficiency Red Electrophosphorescence Devices," Appl. Phys. Lett., 78(11):1622-1624 (2001).

Adachi, Chihaya et al., "Organic Electroluminescent Device Having a Hole Conductor as an Emitting Layer," Appl. Phys. Lett., 55(15): 1489-1491 (1989).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., "Highly Efficient Phosphorescent Emission from Organic Electroluminescent Devices," Nature, vol. 395, pp. 151-154 (1998).

Baldo et al., "Very high-efficiency green organic light-emitting devices based on electrophosphorescence," Appl. Phys. Lett., vol. 75, No. 3, 4-6 (1999).

Carden, et al., Chem. Eur. J. 2017, 23, 17992-18001.

Chotard, et al., Chem. Mater. 2020, 32, 6114-6122.

Gao, Zhiqiang et al., "Bright-Blue Electroluminescence From a Silyl-Substituted ter-(phenylenevinylene) derivative," Appl. Phys. Lett., 74(6):865-867 (1999).

Gernert, et al., J. Am. Chem. Soc. 2020, 142, 8897-8909.

Guo, Tzung-Fang et al., "Highly Efficient Electrophosphorescent Polymer Light-Emitting Devices," Organic Electronics, 1:15-20 (2000).

Hamada, Yuji et al., "High Luminance in Organic Electroluminescent Devices with Bis(10-hydroxybenzo[h]quinolinato)beryllium as an Emitter," Chem. Lett., 905-906 (1993).

Hamze, et al., Frontiers in Chemistry 2020, 8, 401.

Hamze, et al., J. Am. Chem. Soc. 2019, 141, 8616-8626.

Hamze, et al., Science 2019, 363, 601-606.

Holmes, R.J. et al., "Blue Organic Electrophosphorescence Using Exothermic Host-Guest Energy Transfer," Appl. Phys. Lett., 82(15):2422-2424 (2003).

Hu, et al., Angew. Chem. Int. Ed. 2019, 58, 8405-8409.

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3,"Appl. Phys. Lett., 78(5):673-675 (2001).

Ikai, Masamichi and Tokito, Shizuo, "Highly Efficient Phosphorescence From Organic Light-Emitting Devices with an Exciton-Block Layer," Appl. Phys. Lett., 79(2):156-158 (2001).

Ikeda, Hisao et al., "P-185: Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Izumi, et al., J. Am. Chem. Soc. 2020, 142, 1482-1491.

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al.," 1,2,4-Triazole Derivative as an Electron Transport Layer in Organic Electroluminescent Devices," Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).

Kwong et al., "High Operational Stability of Electrophosphorescent Devices," Appl. Phys. Lett., vol. 81, No. 1, pp. 162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Li, et al., J. Am. Chem. Soc. 2020, 142, 6158-6172.

Li, et al., A Luminescent Two-Coordinate AuI Bimetallic Complex with a Tandem-Carbene Structure: A Molecular Design for the Enhancement of TADF Radiative Decay Rate, 2021.

Li, et al., Angew. Chem. Int. Ed. 2019, 58, 11301-11305.

Li, et al., Angew. Chem. Int. Ed. 2019, 58, 9088-9094.

Li, et al., J. Am. Chem. Soc. 2019, 141, 18204-18210.

Lo, Shih-Chun et al., "Blue Phosphorescence from Iridium(III) Complexes at Room Temperature," Chem. Mater., 18(21):5119-5129 (2006).

Luo, et al., Adv. Mater. 2020, 32, 2001248.

M. J. Blitzer, et al.; Ru—Ag and Ru—Au dicarbene complexes from an abnormal carbene ruthenium system, Dalton Trans., 2015, 44, 11686.

M. Poyatos, et al, Insights into the past and future of Janus-di-N-heterocyclic carbenes, Dalton Trans., 2021,50, 12748-12763.

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode: an Isoindole Derivative," Chem. Mater., 15(16):3148-3151 (2003).

Nishida, Jun-ichi et al., "Preparation, Characterization, and Electroluminescence Characteristics of a-Diimine-type Platinum(II) Complexes with Perfluorinated Phenyl Groups as Ligands," Chem. Lett., 34(4):592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and shirota, Yasuhiko, "5,6-Bis(dinnesitylboryl)-2,2'-bithiophene and 5,5"-Bis(dimesitylbory1)-2,2':5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

Palilis, Leonidas C., "High Efficiency Molecular Organic Light-Emitting Diodes Based On Silole Derivatives And Their Exciplexes," Organic Electronics, 4:113-121 (2003).

Paulose, Betty Marie Jennifer S, et al., "First Examples of Alkenyl Pyridines as Organic Ligands for Phosphorescent Iridium Complexes," Adv. Mater., 16(22):2003-2007 (2004).

(56) References Cited

OTHER PUBLICATIONS

Qu, et al., J. Mater. Chem. C 2020, 8, 3846-3854.
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Ravinson and Thompson, Materials Horizons 2020, 7, 1210-1217.
Romanov, et al., Chem. Sci. 2020, 11, 435-446.
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91:209-215 (1997).
Shi, et al., Chem. Mater. 2018, 30, 7988-8001.
Shi, et al., J. Am. Chem. Soc. 2019, 141, 3576-3588.
Shirota, Yasuhiko et al., "Starburst Molecules Based on p-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Ostergard et al., "Langmuir-Blodgett Light-Emitting Diodes Of Poly(3-Hexylthiophene): Electro-Optical Characteristics Related to Structure," Synthetic Metals, 87:171-177 (1997).
Takizawa, Shin-ya et al., "Phosphorescent Iridium Complexes Based on 2-Phenylimidazo[1,2-a]pyridine Ligands: Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8):1059-1064 (2005).
U. J. Scheele, et al., Non-Innocence of N-Heterocyclic Carbene Ligands: Intermolecular C—H Activation in Allyl Palladium NHC Complexes, Chem. Eur. J. 2008, 14, 5112-5115.
Van Slyke, S. A. et al., "Organic Electroluminescent Devices with Improved Stability," Appl. Phys. Lett, 69(15 ):2160-2162 (1996).
Wang, et al., Chem. Asian J. 2020, 15, 2520-2531.
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., "A Novel Class of Phosphorescent Gold(III) Alkynyl-Based Organic Light-Emitting Devices with Tunable Colour," Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Yang, et al., Chem. Soc. Rev. 2017, 46, 915-1016.
Yersin, et al., ChemPhysChem 2017, 18, 3508-3535.
Z. Hu, et al., Six-Membered Janus-type Ditopic N□ Heterocyclicarbene Coinage Metal Complexes, Organometallics 2019, 38, 9, 2132-2137.

* cited by examiner $Au^{C}$

3-OTf $Au^C$ $Au^{CC}$

| State | $Au^C$ | $Au_2^{CC}$ |
|---|---|---|
| $S_1$ |  ICT: 3.11eV (98.7%) |  ICT: 3.34eV (99.1%) |
| $S_2$ |  ICT/MLCT: 3.78eV (99.7%) |  ICT: 3.79eV (99.3%) |
| $S_3$ |  ICT/LMCT: 3.96eV (99.6%) |  MLCT: 4.12eV (98.8%) |
| $T_1$ |  ICT: 2.83eV (94.8%) |  LE(AAC): 3.03eV (98.2%) |
| $T_2$ |  LE(Cz): 3.06eV (99.3%) |  LE(Cz): 3.08eV (99.4%) |
| $T_3$ |  LE(AAC): 3.31eV (98.4%) |  ICT: 3.16eV (96.3%) |
| $T_4$ |  LE(Cz): 3.35eV (96.4%) |  LE(Cz): 3.33eV (94.9%) |

AuPhCl

AuPhCz

TANDEM CARBENE PHOSPHORS

CROSS-REFERENCE TO RELATED APPLICATIONS

This application claims priority under 35 U.S.C. § 119(e) to U.S. Provisional Application No. 63/122,963, filed Dec. 9, 2020, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

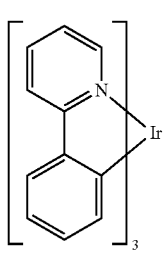

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

In one aspect, the present disclosure relates to a compound represented by the following Formula I:

Formula I

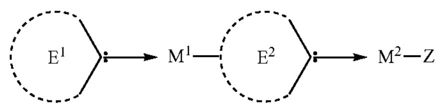

wherein $M^1$ and $M^2$ are independently selected from the group consisting of Au(I), Ag(I), and Cu(I);

$E^1$ is a carbene coordinated to the metal $M^1$;

$E^2$ is an anionic carbene coordinated to the metal $M^1$ and the metal $M^2$;

Z is a monoanionic ligand.

$E^1$, $E^2$, and Z may each be substituted with one or more substituents independently selected from the group consisting of hydrogen, deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ether, ester, vinyl, ketone, sulfinyl, sulfonyl, cyano, phosphino, and combinations thereof; wherein any two adjacent substituents may together join to form a ring.

An OLED comprising the compound of the present disclosure in an organic layer therein is also disclosed.

A consumer product comprising the OLED is also disclosed.

DETAILED DESCRIPTION

Generally, an OLED comprises at least one organic layer disposed between and electrically connected to an anode and a cathode. When a current is applied, the anode injects holes and the cathode injects electrons into the organic layer(s).

The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
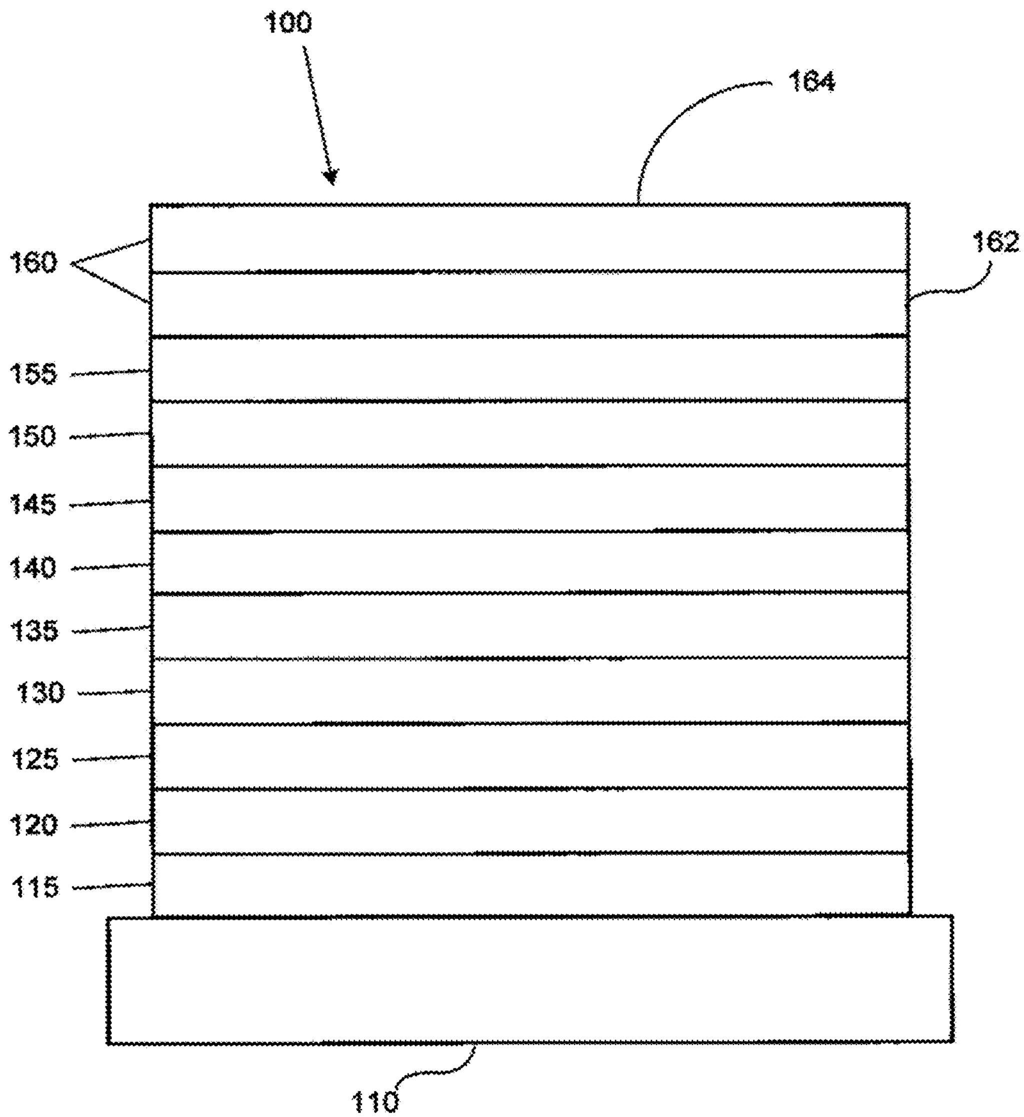
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
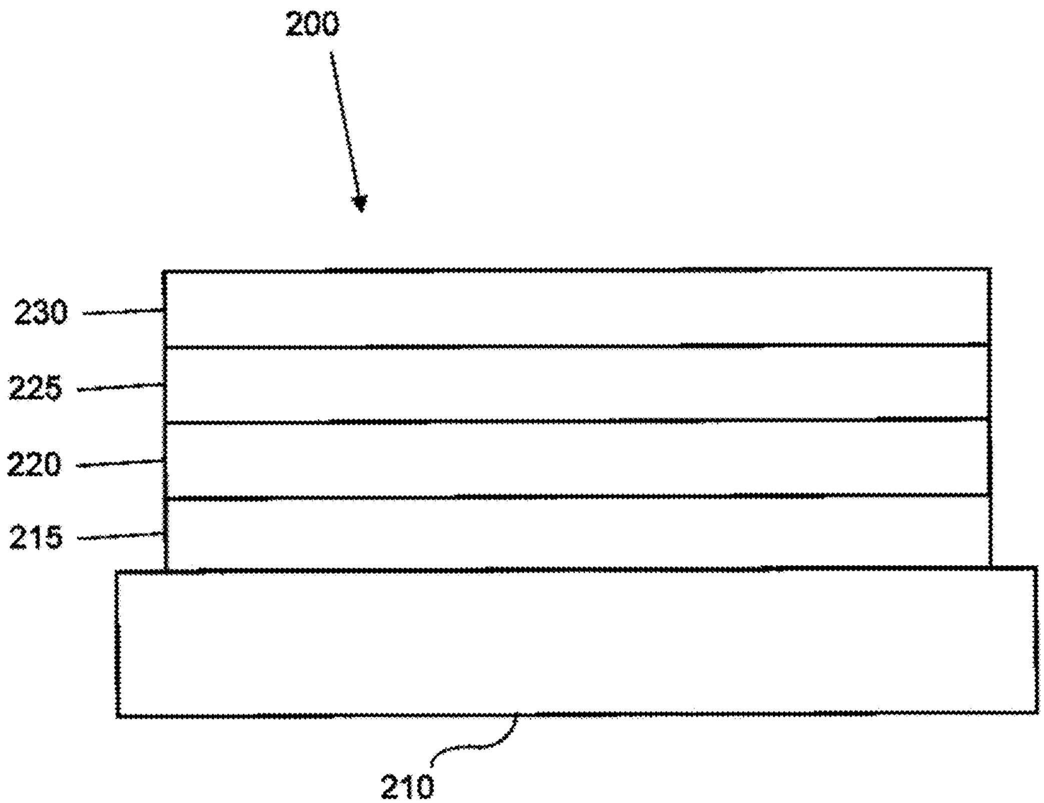
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms "halo," "halogen," and "halide" are used interchangeably and refer to fluorine, chlorine, bromine, and iodine.

The term "acyl" refers to a substituted carbonyl radical ($C(O)—R_s$).

The term "ester" refers to a substituted oxycarbonyl ($—O—C(O)—R_s$ or $—C(O)—O—R_s$) radical.

The term "ether" refers to an —OR radical.

The terms "sulfanyl" or "thio-ether" are used interchangeably and refer to a $—S_s$ radical.

The term "sulfinyl" refers to a $—S(O)—R_s$ radical.

The term "sulfonyl" refers to a $—SO_2—R_s$ radical.

The term "phosphino" refers to a $—P(R_s)_3$ radical, wherein each $R_s$ can be same or different.

The term "silyl" refers to a $—Si(R_s)_3$ radical, wherein each $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H.

Similarly, when $R^1$ represents no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (Reviews) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

Compounds of the Disclosure

In one aspect, the present disclosure relates to a compound represented by the following Formula I Formula I

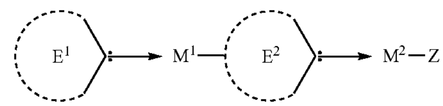

wherein $M^1$ and $M^2$ are independently selected from the group consisting of Au(I), Ag(I), and Cu(I);

$E^1$ is a carbene coordinated to the metal $M^1$;

$E^2$ is an anionic carbene coordinated to the metal $M^1$ and the metal $M^2$;

Z is a monoanionic ligand.

$E^1$, $E^2$, and Z may each be substituted with one or more substituents independently selected from the group consisting of hydrogen, deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ether, ester, vinyl, ketone, sulfinyl, sulfonyl, cyano, phosphino, and combinations thereof; wherein any two adjacent substituents may together join to form a ring.

In one embodiment, Z is selected from the group consisting of an alkyl anion, aryl anion, halide, trifluoromethylsulfonate, amide, alkoxide, sulfide, or phosphide.

In one embodiment, Z is represented by one of the following structures:

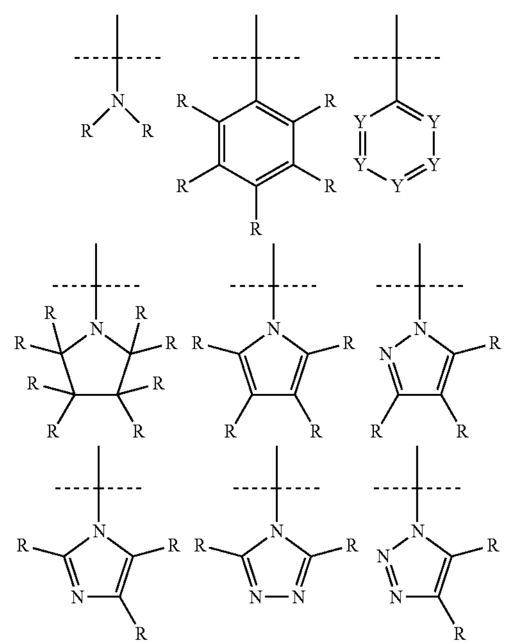

-continued
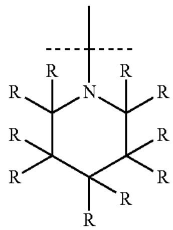
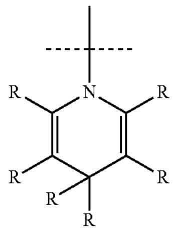
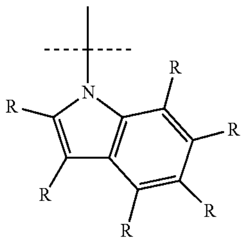
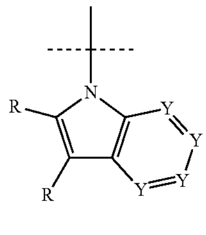
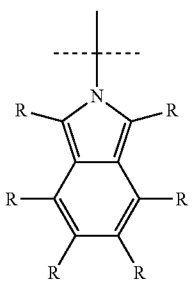
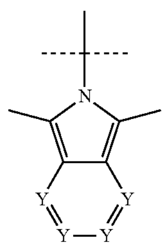
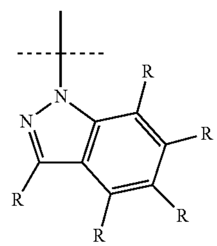
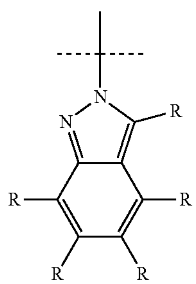
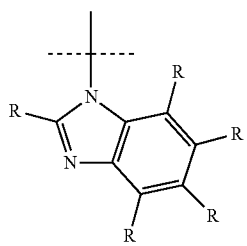
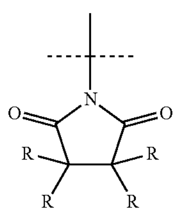
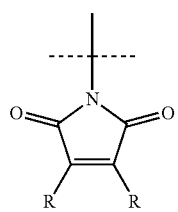
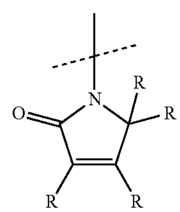
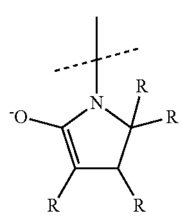
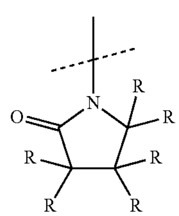
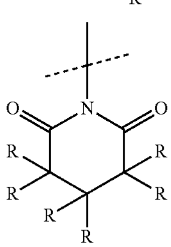
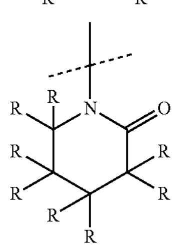
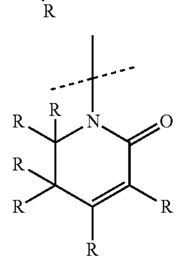
-continued
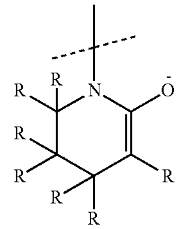
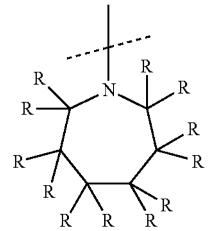
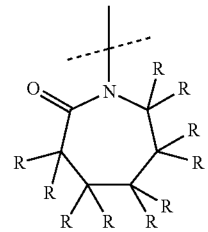
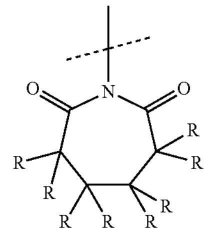
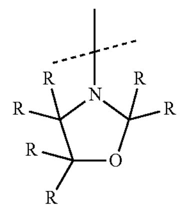
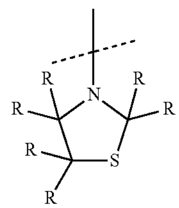
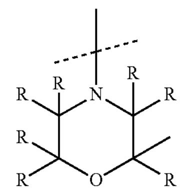
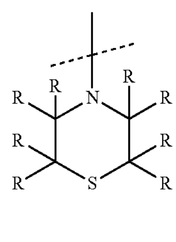
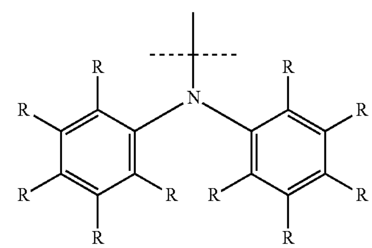
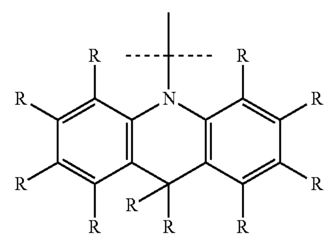
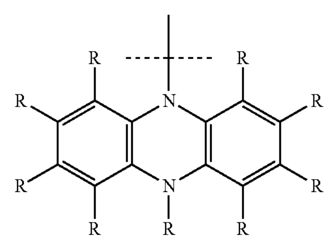
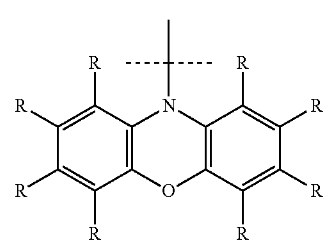

-continued

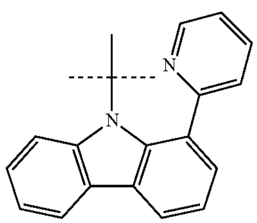

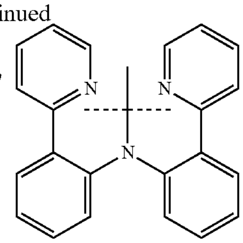

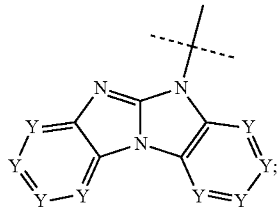

wherein the dashed line indicates the bond to $M^2$; and each occurrence Y is selected from the group consisting of N and CR.

In one embodiment, wherein Z is represented by one of the following structures:

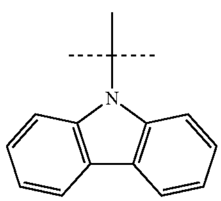

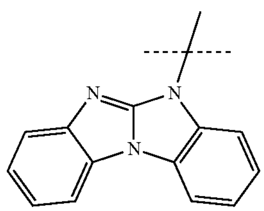

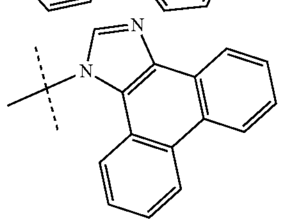

wherein the dashed line indicates the bond to $M^2$

In one embodiment, $E^1$ is selected from the group consisting of Formula A, Formula B, Formula C, Formula D, Formula E, and Formula F:

Formula A

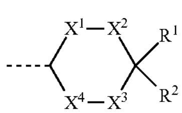

wherein each $X^1$ to $X^4$ independently represents $NR^1$, $CR^1R^2$, C═O, C═S, O, or S; and each occurrence of $R^1$ and $R^2$ is independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein any two adjacent $R^1$ and $R^2$ are optionally joined or fused together to form a ring which is optionally substituted.

Formula B

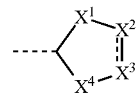

wherein each $X^1$ and $X^4$ independently represents N, $NR^1$, $CR^1$, $CR^1R^2$, $SiR^1$, $SiR^1R^2$, $PR^1$, B, $BR^1$, $BR^1R^2$, O, or S; and each $X^2$ and $X^3$ independently represents $CR^1$, $CR^1R^2$, $SiR^1$, $SiR^1R^2$, N, $NR^1$, P, $PR^1$, B, $BR^1$, O, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein any two adjacent $R^1$ and $R^2$ are optionally joined or fused together to form a ring which is optionally substituted; and the dashed line inside the five-member ring represents zero or one double-bond.

Formula C

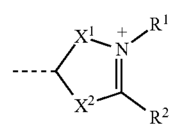

wherein each $X^1$ and $X^2$ independently represents $NR^1$, $CR^1R^2$, O, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted.

Formula D

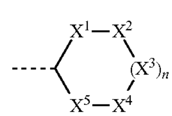

wherein each $X^1$ to $X^5$ independently represents N, P, $NR^1$, $PR^1$, B, $BR^1$, $CR^1$, $SiR^1$, $CR^1R^2$, $SiR^1R^2$, C═O, C═S, O, or S;

n is 0 or 1;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted;

Formula E

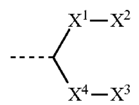

wherein each $X^1$ and $X^4$ independently represents $NR^1$, $CR^1$, $SiR^1$, $CR^1R^2$, $SiR^1R^2$, $PR^1$, $BR^1$, C═O, C═S, O, or S;

each $X^2$ and $X^3$ is independently present or absent, and if present, independently represents H, $NR^1R^2$, $CR^1$, $CR^1R^2$, C═O, C═S, O, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted Formula F

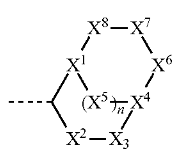

wherein each occurrence of $X^1$ to $X^8$ independently represents N, P, $NR^1$, $PR^1$, B, $BR^1$, $CR^1$, $SiR^1$, $CR^1R^2$, $SiR^1R^2$, C═O, C═S, O, or S;

n is 1 or 2;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted.

In one embodiment, $E^1$ is represented by one of the following structures:

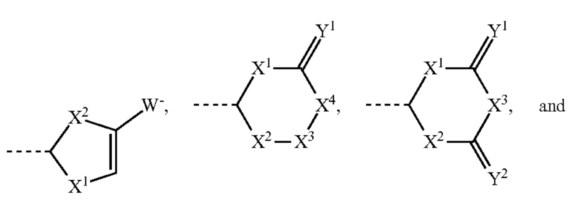

-continued

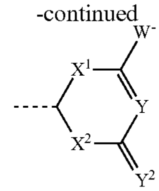

wherein each $X^1$ and $X^2$ independently represents $NR^1$, $CR^1$, $SiR^1$, $CR^1R^2$, $SiR^1R^2$, $PR^1$, $BR^1$, C═O, C═S, O, or S;

each $X^3$ and $X^4$ independently represents N, P, $NR^1$, $PR^1$, B, $BR^1$, $CR^1$, $SiR^1$, $CR^1R^2$, $SiR^1R^2$, C═O, C═S, O, or S;

Y represents N, P, $CR^1$, or $SiR^1$;

each $Y^1$ and $Y^2$ independently represents O, S, $NR^1$, or $CR^1R^2$

W represents O, $NR^1$, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted.

In one embodiment, $E^1$ is represented by one of the following structures:

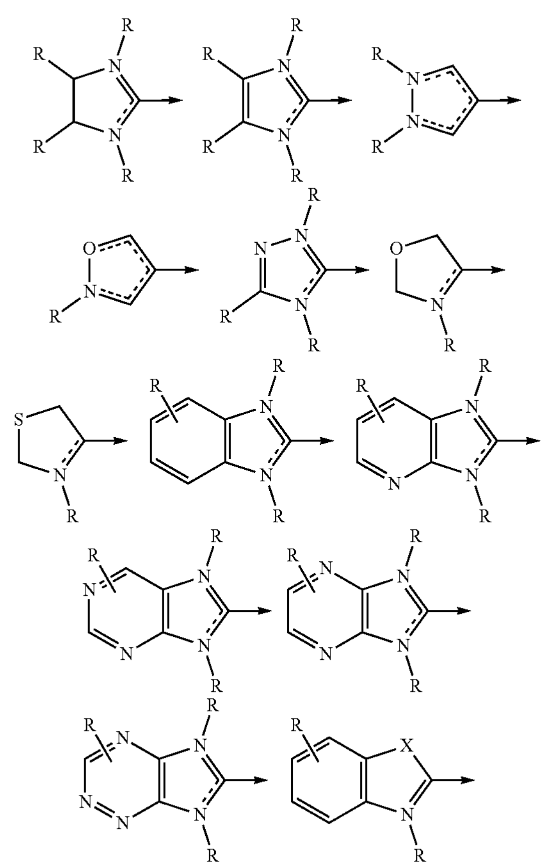

-continued
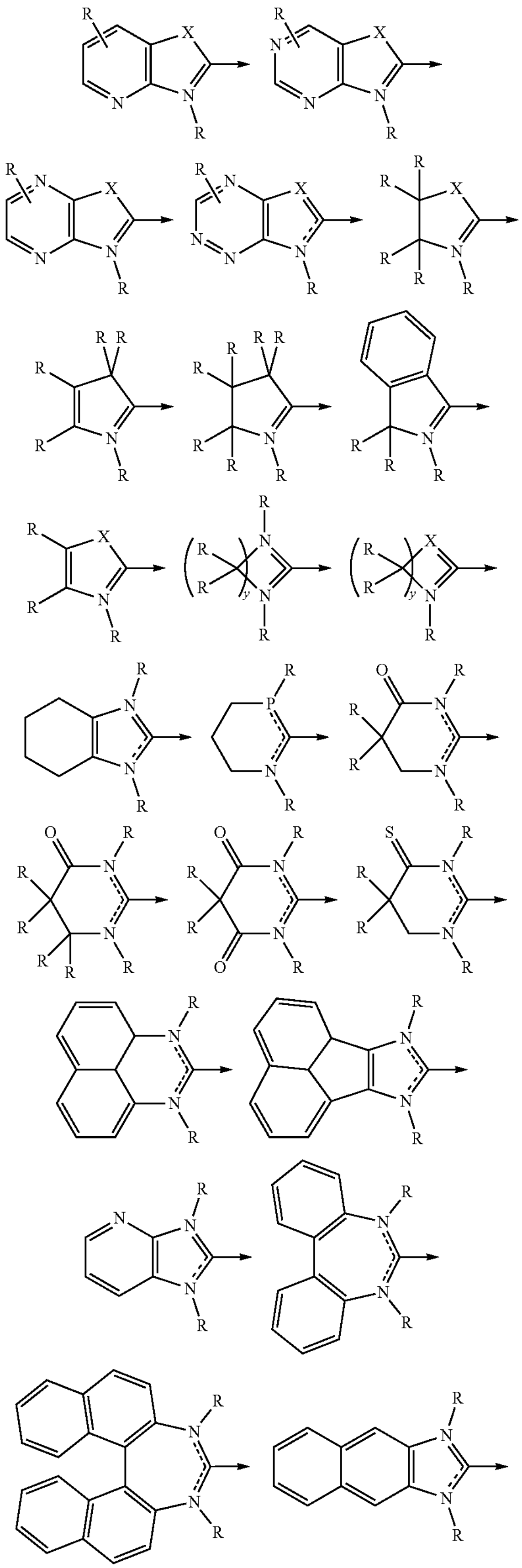
-continued
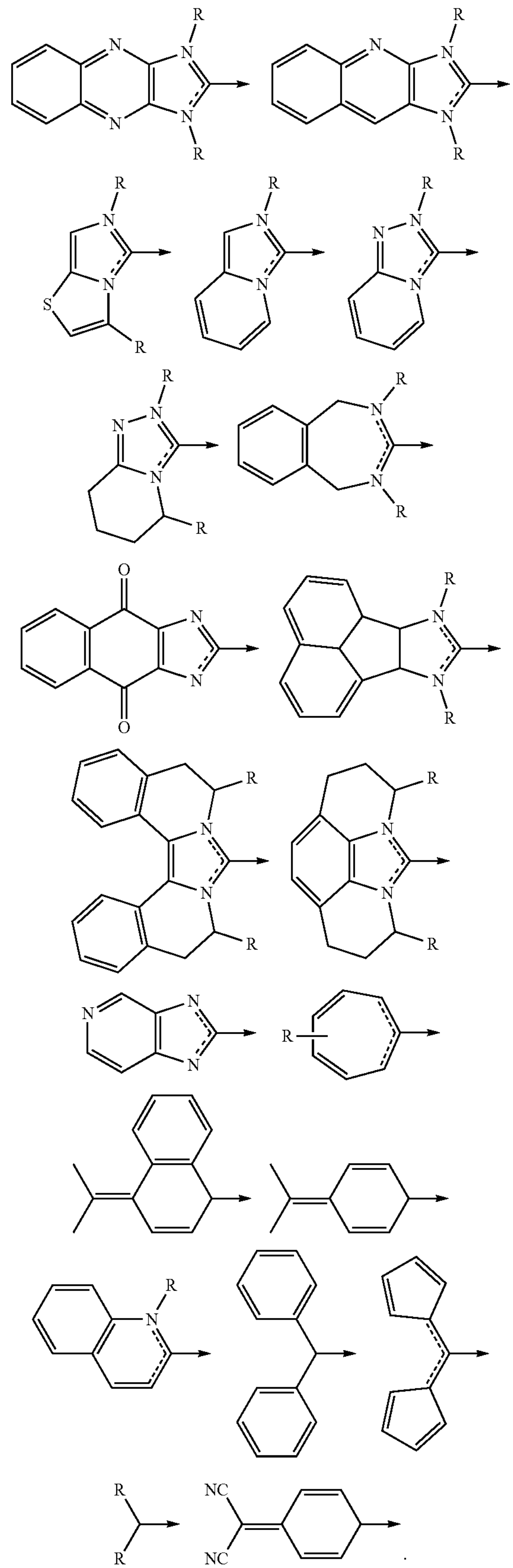
.

In one embodiment, $E^1$ is represented by one of the following structures:

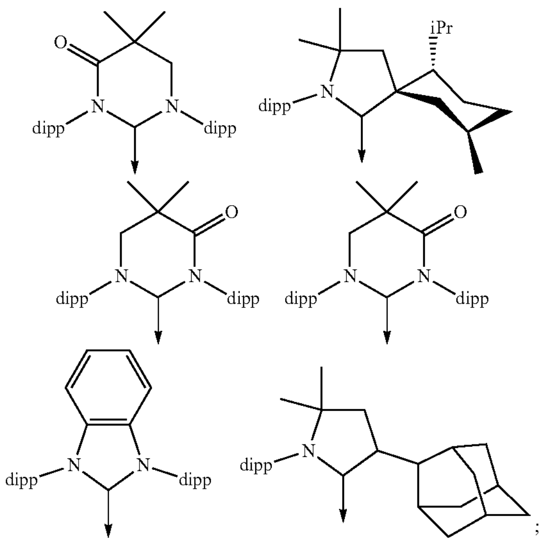

wherein dipp represents 2,6-diisopropylphenyl.

In one embodiment, $E^2$ is selected from the group consisting of Formula A, Formula B, Formula C, Formula D, Formula E, and Formula F:

Formula A

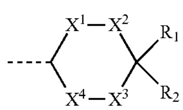

wherein each $X^1$ to $X^4$ independently represents $NR^1$, $CR^1R^2$, C═O, C═S, O, or S; and each occurrence of $R^1$ and $R^2$ is independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein any two adjacent $R^1$ and $R^2$ are optionally joined or fused together to form a ring which is optionally substituted;

provided that one occurrence of $R^1$ and $R^2$, or one substituent bound thereto, represents the bond to metal $M^1$;

Formula B

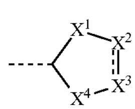

wherein each $X^1$ and $X^4$ independently represents N, $NR^1$, $CR^1$, $CR^1R^2$, $SiR^1$, $SiR^1R^2$, $PR^1$, B, $BR^1$, $BR^1R^2$, O, or S; and each $X^2$ and $X^3$ independently represents $CR^1$, $CR^1R^2$, $SiR^1$, $SiR^1R^2$, N, $NR^1$, P, $PR^1$, B, $BR^1$, O, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein any two adjacent $R^1$ and $R^2$ are optionally joined or fused together to form a ring which is optionally substituted; and the dashed line inside the five-member ring represents zero or one double-bond provided that one occurrence of $R^1$ and $R^2$, or one substituent bound thereto, represents the bond to metal $M^1$;

Formula C

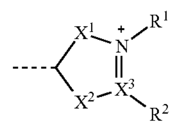

wherein each $X^1$ and $X^2$ independently represents $NR^1$, $CR^1R^2$, O, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted;

provided that one occurrence of $R^1$ and $R^2$, or one substituent bound thereto, represents the bond to metal $M^1$;

Formula D

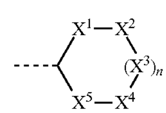

wherein each $X^1$ to $X^7$ independently represents N, P, $NR^1$, $PR^1$, B, $BR^1$, $CR^1$, $SiR^1$, $CR^1R^2$, $SiR^1R^2$, C═O, C═S, O, or S;

n is 0 or 1;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted;

provided that one occurrence of $R^1$ and $R^2$, or one substituent bound thereto, represents the bond to metal $M^1$;

Formula E

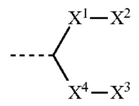

wherein each $X^1$ and $X^4$ independently represents $NR^1$, $CR^1$, $SiR^1$, $CR^1R^2$, $SiR^1R^2$, $PR^1$, $BR^1$, C═O, C═S, O, or S;

each $X^2$ and $X^3$ is independently present or absent, and if present, independently represents H, $NR^1R^2$, $CR^1$, $CR^1R^2$, C═O, C═S, O, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted;

provided that one occurrence of $R^1$ and $R^2$, or one substituent bound thereto, represents the bond to metal $M^1$;

Formula F

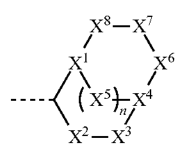

wherein each occurrence of $X^1$ to $X^8$ independently represents N, P, $NR^1$, $PR^1$, B, $BR^1$, $CR^1$, $SiR^1$, $CR^1R^2$, $SiR^1R^2$, C═O, C═S, O, or S;

n is 1 or 2;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted provided that one occurrence of $R^1$ and $R^2$, or one substituent bound thereto, represents the bond to metal $M^1$.

In one embodiment, $E^2$ is represented by one of the following structures:

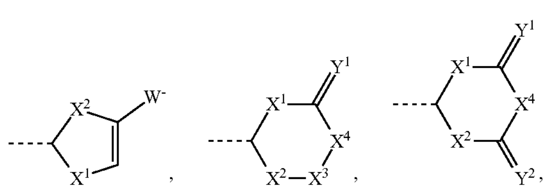

-continued

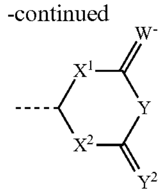

and wherein each $X^1$ and $X^2$ independently represents $NR^1$, $CR^1$, $SiR^1$, $CR^1R^2$, $SiR^1R^2$, $PR^1$, $BR^1$, C═O, C═S, O, or S;

each $X^3$ and $X^4$ independently represents N, P, $NR^1$, $PR^1$, B, $BR^1$, $CR^1$, $SiR^1$, $CR^1R^2$, $SiR^1R^2$, C═O, C═S, O, or S;

Y represents N, P, $CR^1$, or $SiR^1$;

each $Y^1$ and $Y^2$ independently represents O, S, $NR^1$, or $CR^1R^2$

W represents O, $NR^1$, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted;

provided that one occurrence of $R^1$ and $R^2$, or one substituent bound thereto, represents the bond to metal $M^1$.

In one embodiment, $E^2$ is represented by one of the following structures:

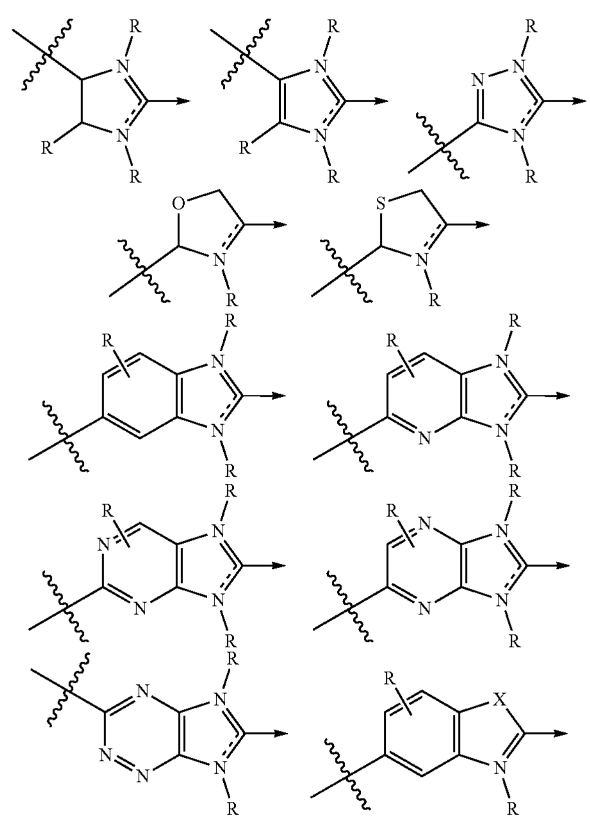

-continued
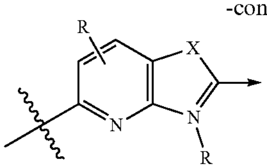
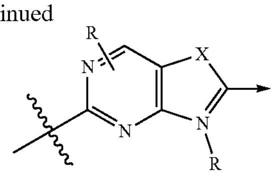
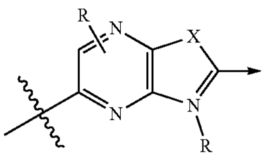
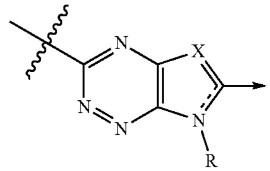
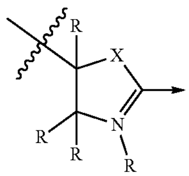
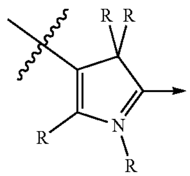
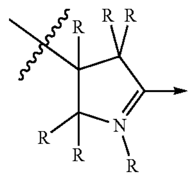
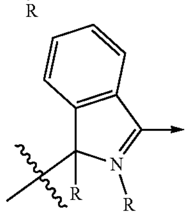
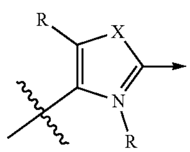
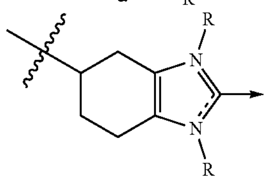
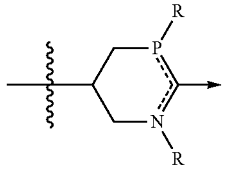
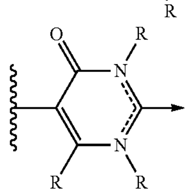
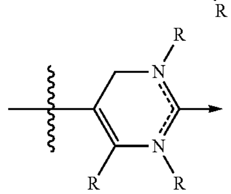
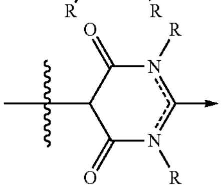
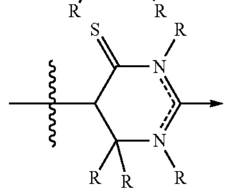
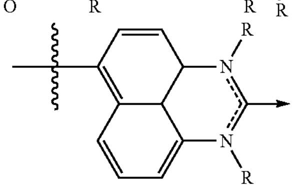
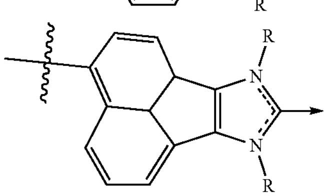
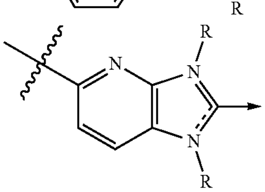
-continued
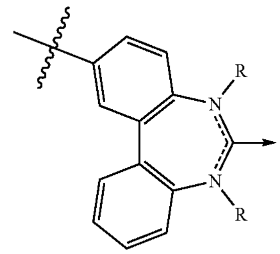
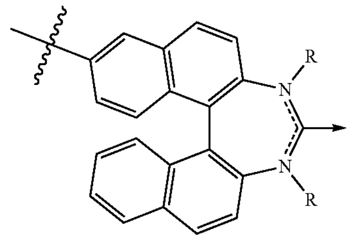
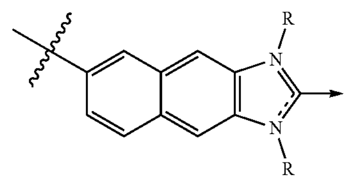
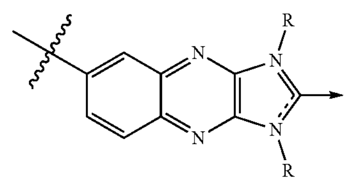
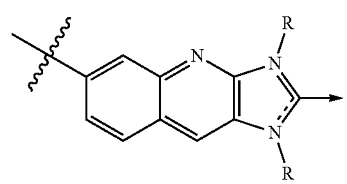
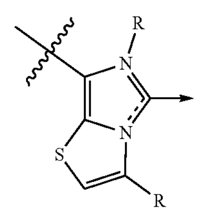
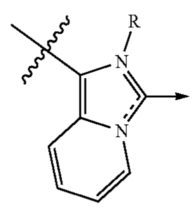
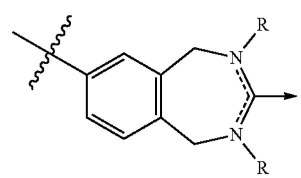
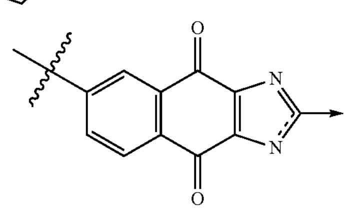
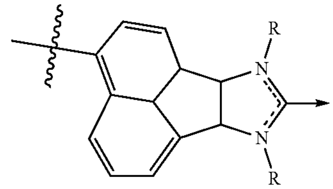

-continued

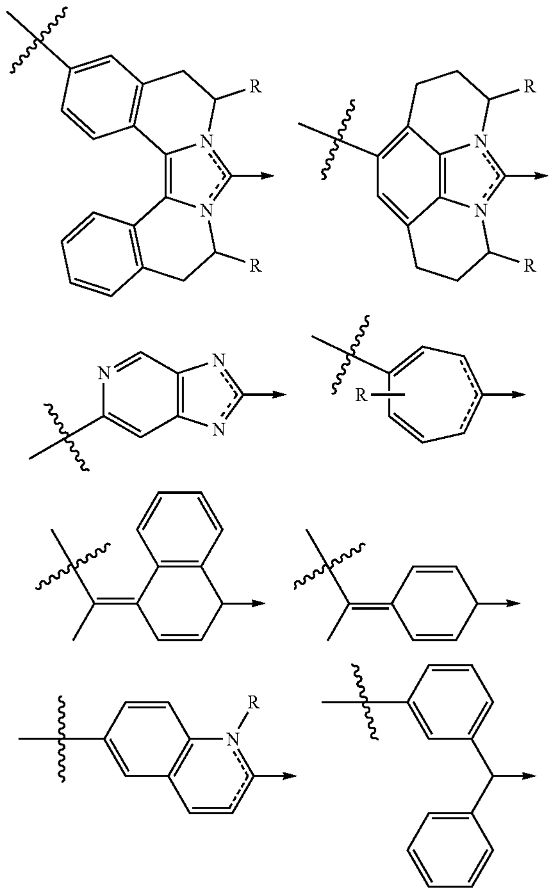

wherein the wavy line indicates the bond to metal $M^1$; and wherein the arrow indicates the bond to metal $M^2$.

In one embodiment, $E^2$ is represented by one of the following structures

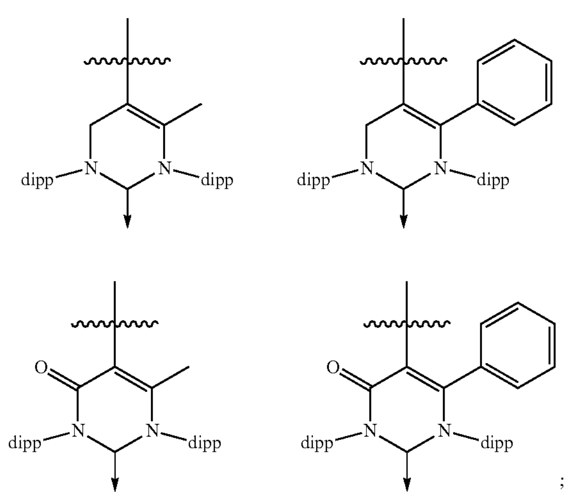

wherein dipp represents 2,6-diisopropylphenyl; the wavy line indicates the bond to $M^1$; and the arrow indicates the bond to $M^2$.

In one embodiment, the compound is represented by one of the following structures

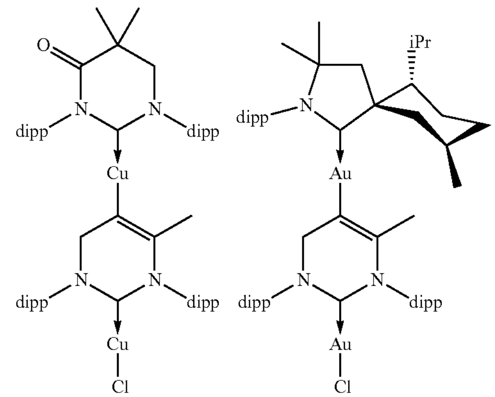

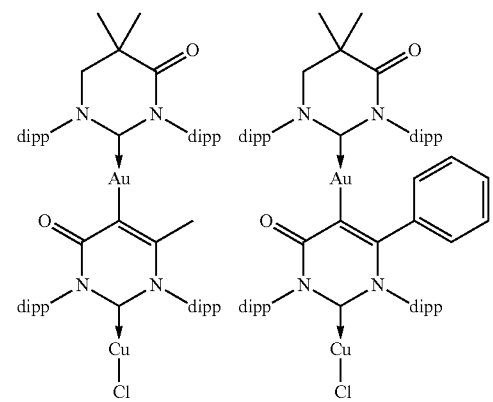

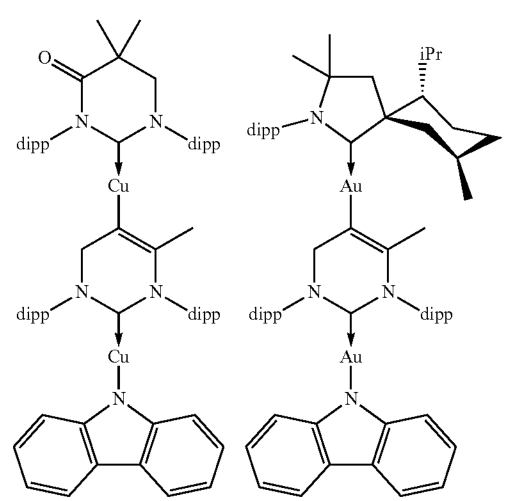

-continued

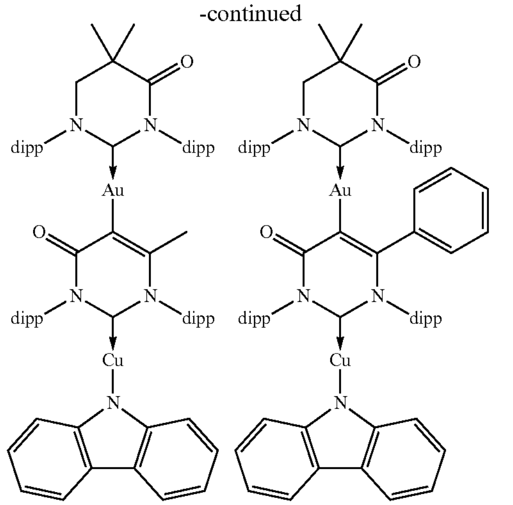

wherein dipp represents 2,6-diisopropylphenyl.

According to another aspect, a formulation comprising the compound described herein is also disclosed.

In another aspect, the present disclosure relates to an organic electroluminescent device (OLED) comprising an anode; a cathode; and an organic layer, disposed between the anode and the cathode, comprising a compound of the present disclosure.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes. In some embodiments, the emissive dopant can be a racemic mixture, or can be enriched in one enantiomer. In some embodiments, the compound is neutrally charged. In some embodiments, the compound can be homoleptic (each ligand is the same). In some embodiments, the compound can be heteroleptic (at least one ligand is different from others). When there are more than one ligand coordinated to a metal, the ligands can all be the same in some embodiments. In some other embodiments, at least one ligand is different from the other ligands. In some embodiments, every ligand can be different from each other. This is also true in embodiments where a ligand being coordinated to a metal can be linked with other ligands being coordinated to that metal to form a tridentate, tetradentate, pentadentate, or hexadentate ligands. Thus, where the coordinating ligands are being linked together, all of the ligands can be the same in some embodiments, and at least one of the ligands being linked can be different from the other ligand(s) in some other embodiments.

In some embodiments, the compound can be used as a phosphorescent sensitizer in an OLED where one or multiple layers in the OLED contains an acceptor in the form of one or more fluorescent and/or delayed fluorescence emitters. In some embodiments, the compound can be used as one component of an exciplex to be used as a sensitizer. As a phosphorescent sensitizer, the compound must be capable of energy transfer to the acceptor and the acceptor will emit the energy or further transfer energy to a final emitter. The acceptor concentrations can range from 0.001% to 100%. The acceptor could be in either the same layer as the phosphorescent sensitizer or in one or more different layers. In some embodiments, the acceptor is a TADF emitter. In some embodiments, the acceptor is a fluorescent emitter. In some embodiments, the emission can arise from any or all of the sensitizer, acceptor, and final emitter.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1$-$Ar_2$, and $C_nH_{2n}{-}Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

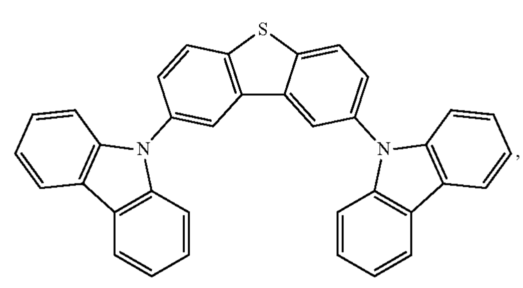

-continued
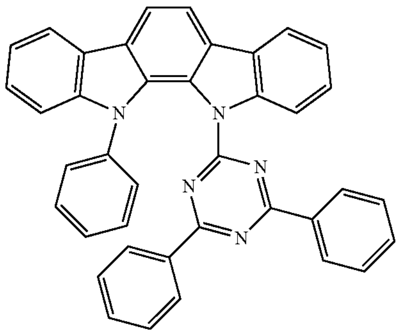
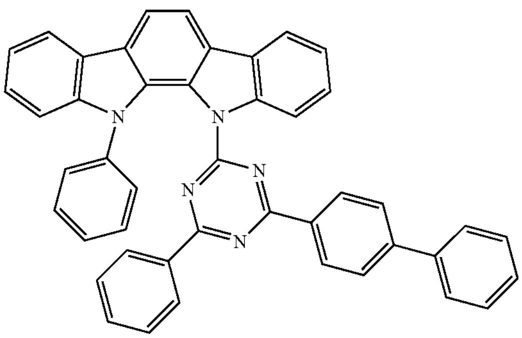
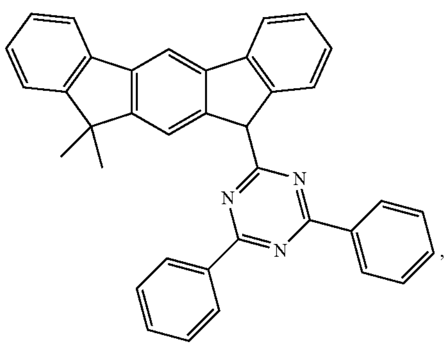
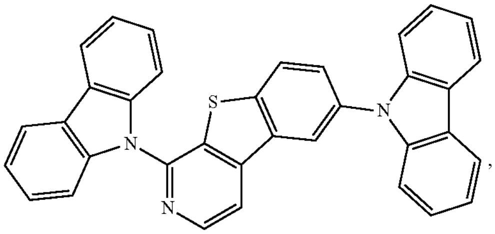
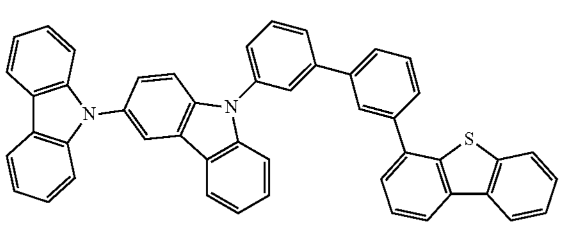
-continued
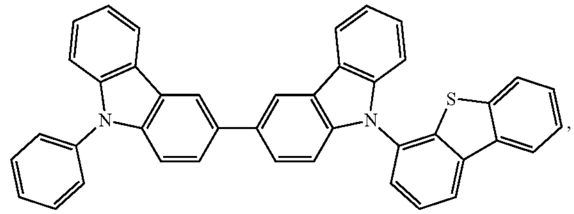
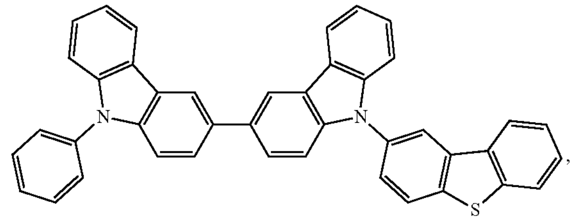
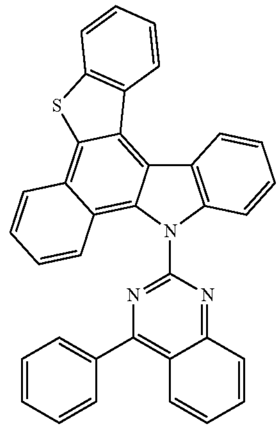
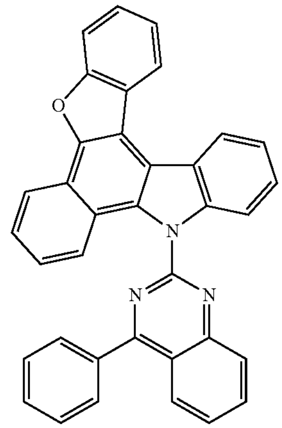
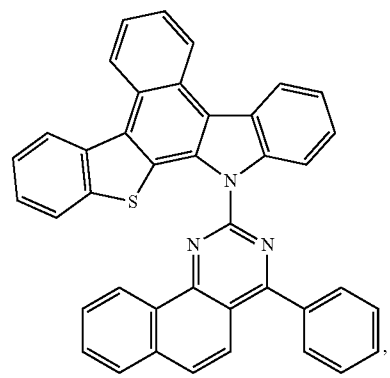
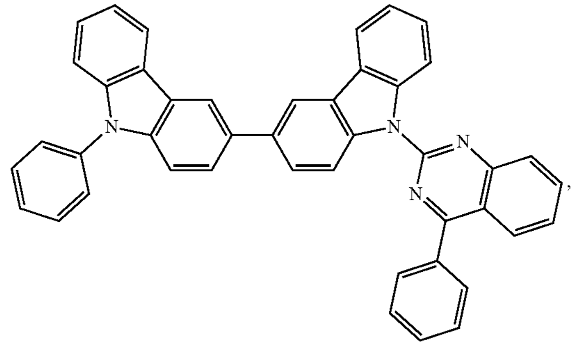

-continued
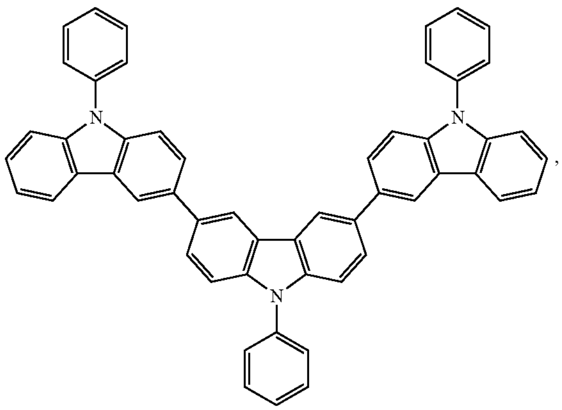
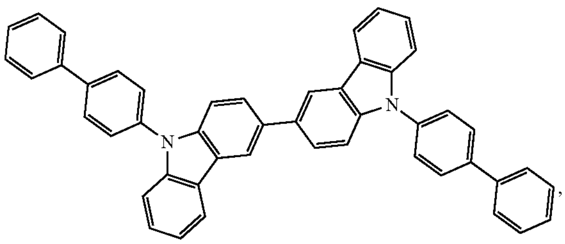
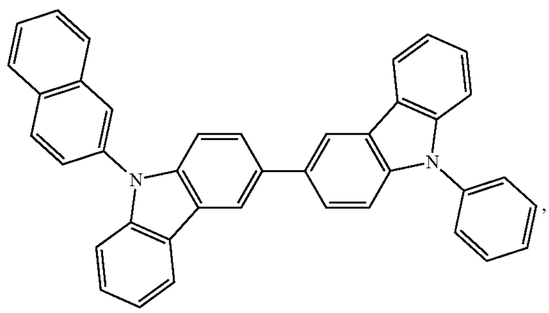
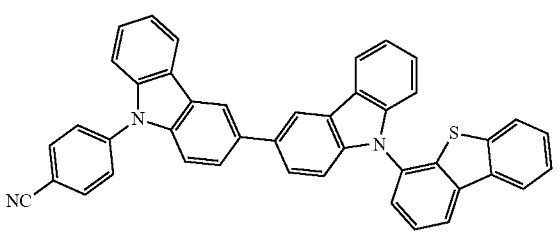
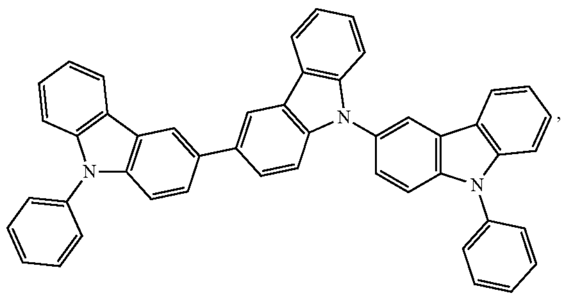
-continued
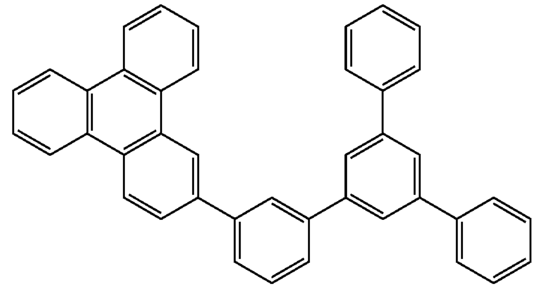
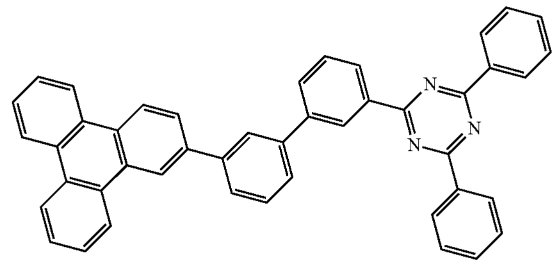
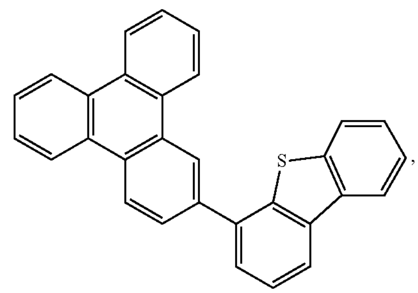
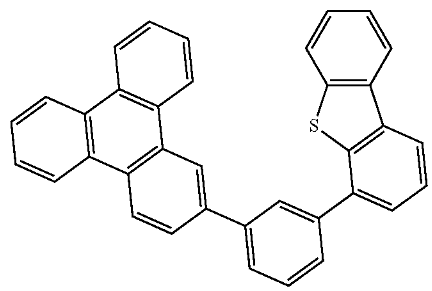
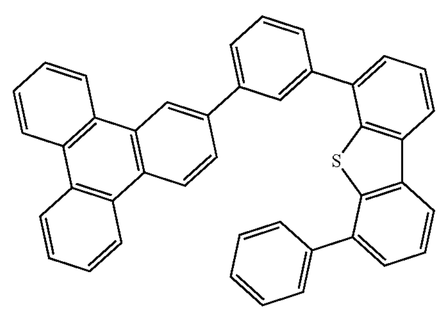
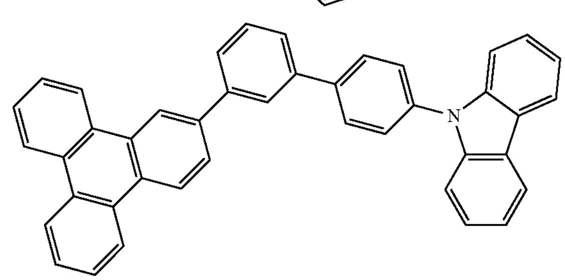

-continued

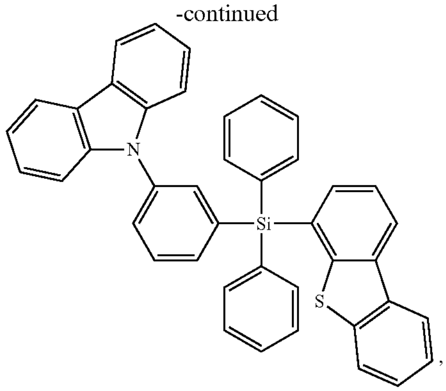

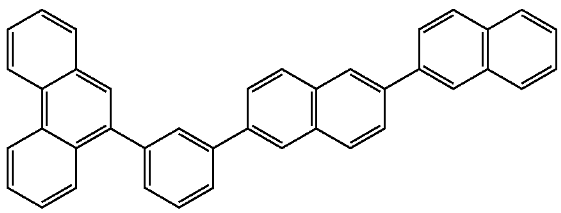

and combinations thereof.

Additional information on possible hosts is provided below.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a "monovalent variant of a compound" refers to a moiety that is identical to the compound except that one hydrogen has been removed and replaced with a bond to the rest of the chemical structure. As used herein, a "polyvalent variant of a compound" refers to a moiety that is identical to the compound except that more than one hydrogen has been removed and replaced with a bond or bonds to the rest of the chemical structure. In the instance of a supramolecule, the inventive compound can also be incorporated into the supramolecule complex without covalent bonds.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

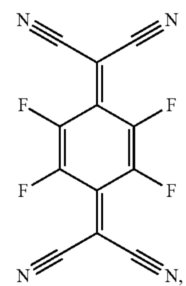

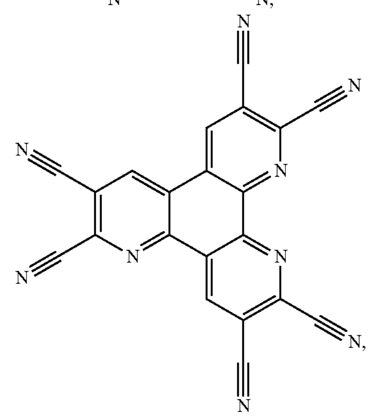

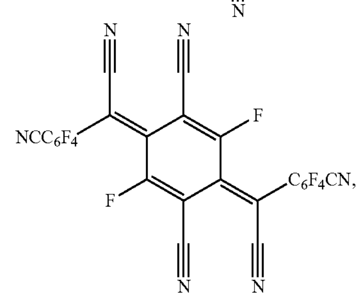

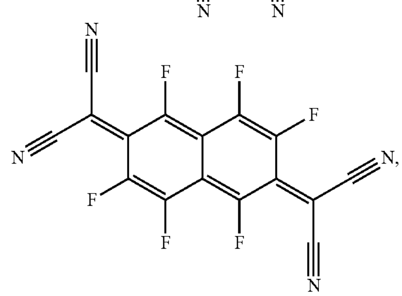

-continued

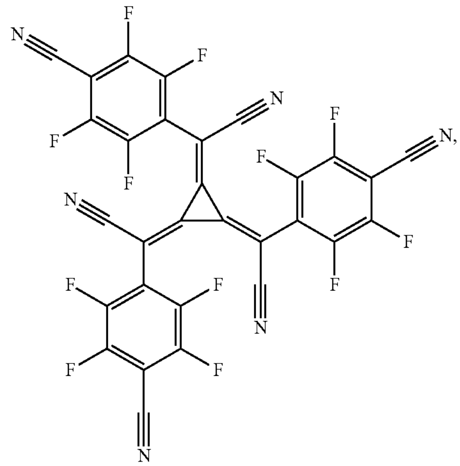

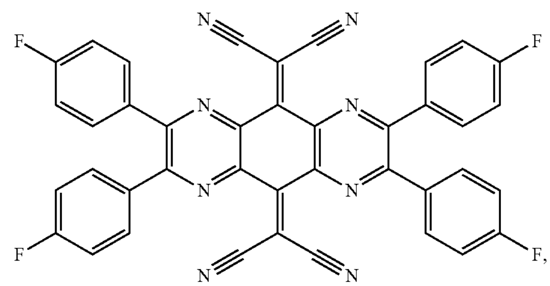

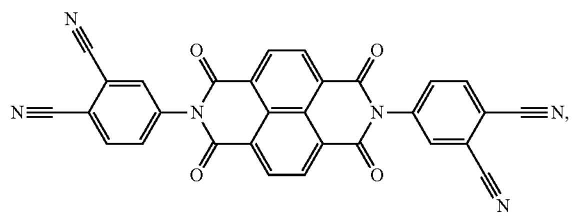

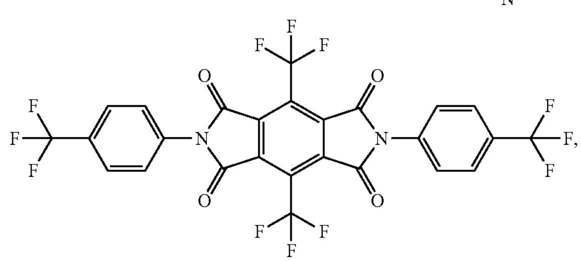

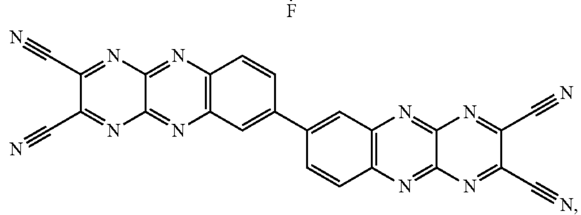

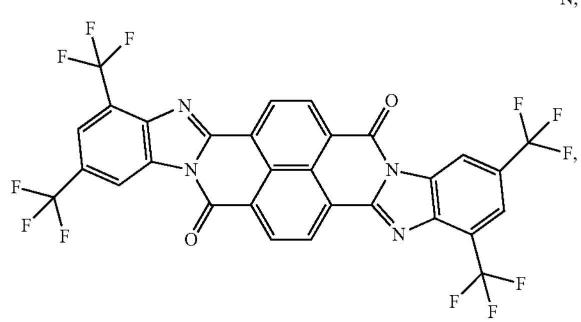

-continued

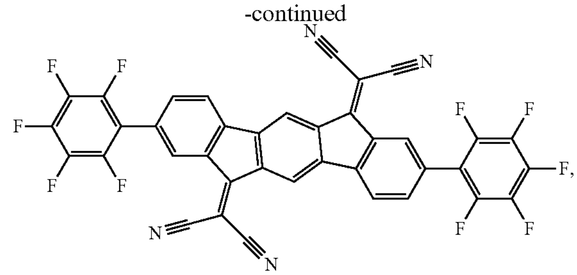

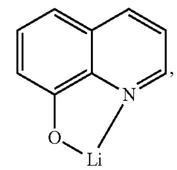

, and

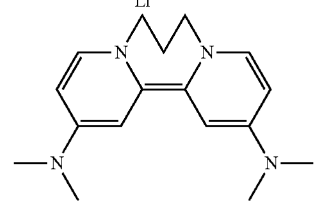

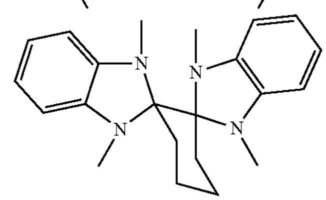

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

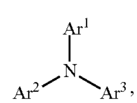

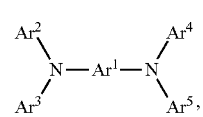

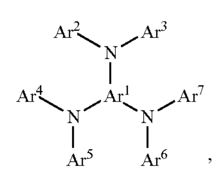

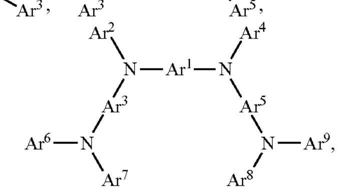

and

-continued

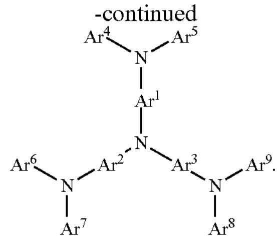

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

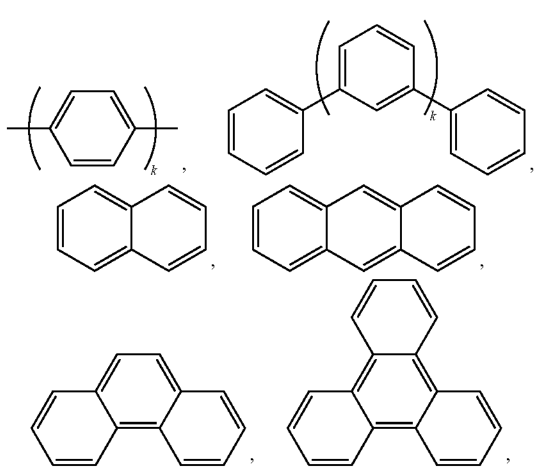

-continued

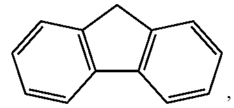

, and

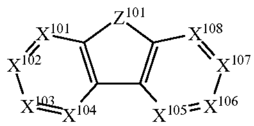

, wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

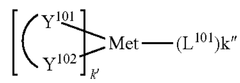

wherein Met is a metal, which can have an atomic weight greater than 40; $(Y^{101}-Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}-Y^{102})$ is a 2-phenylpyridine derivative. In another aspect, $(Y^{101}-Y^{102})$ is a carbene ligand. In another aspect, Met is selected from Ir, Pt, Os, and Zn. In a further aspect, the metal complex has a smallest oxidation potential in solution vs. Fc*/Fc couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

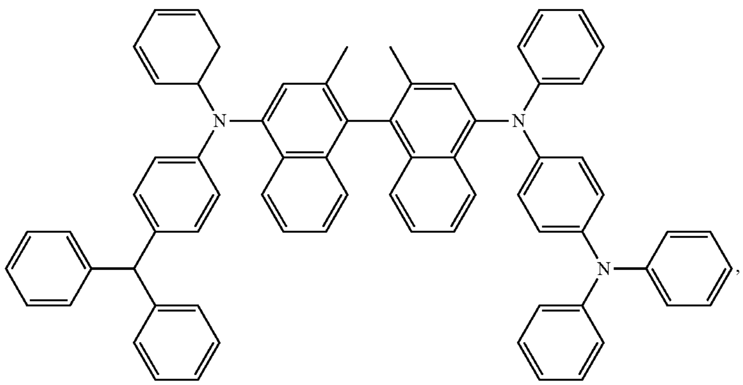
,
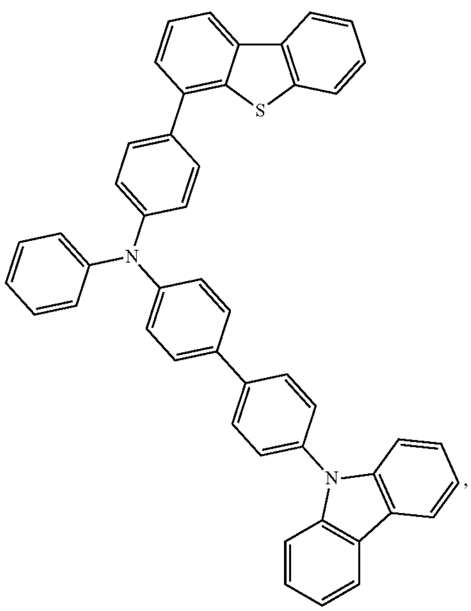
,
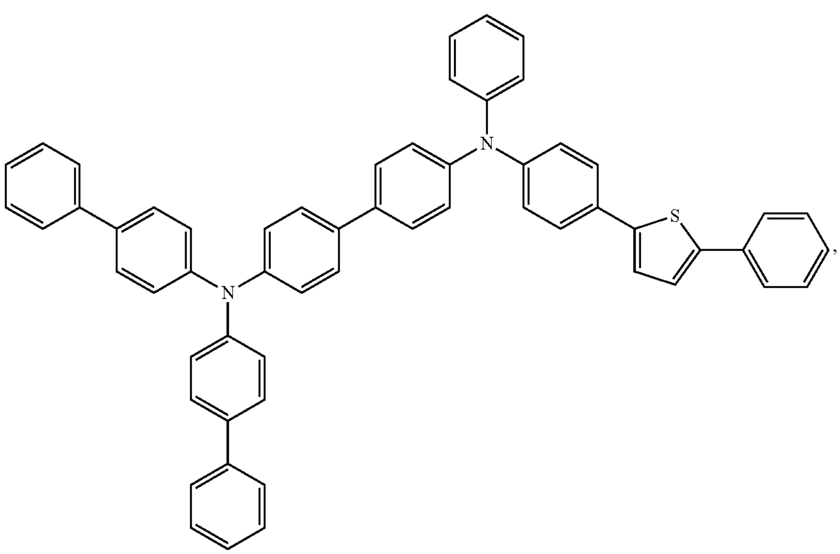
,

-continued
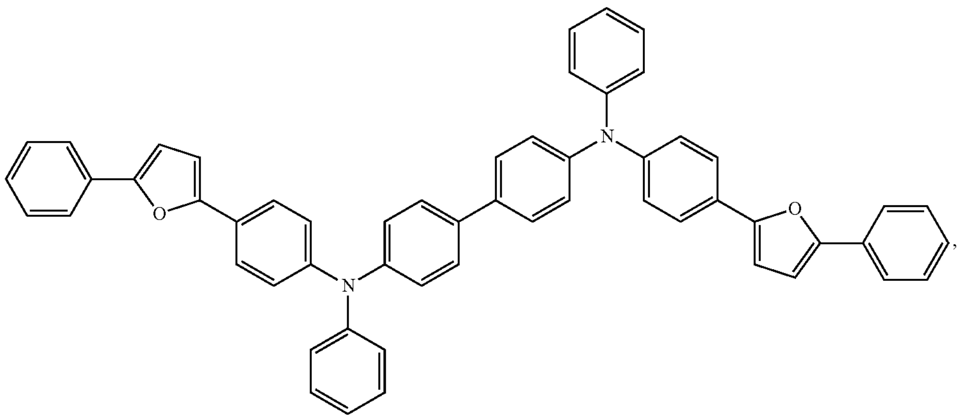
,
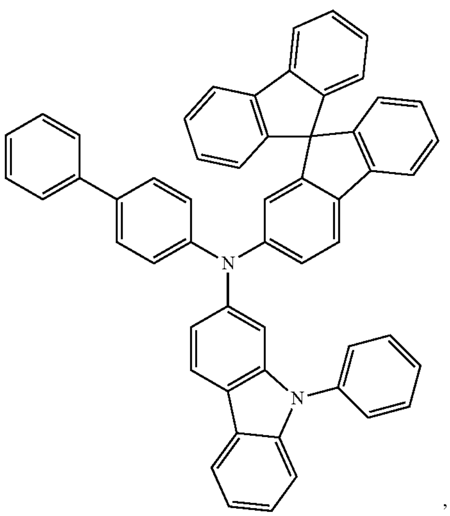
,
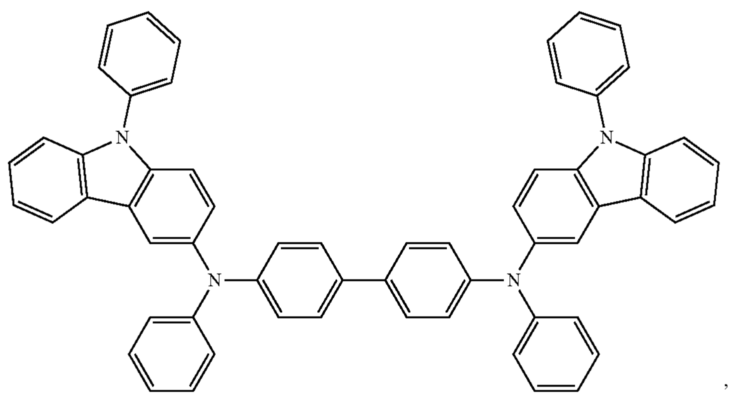
,
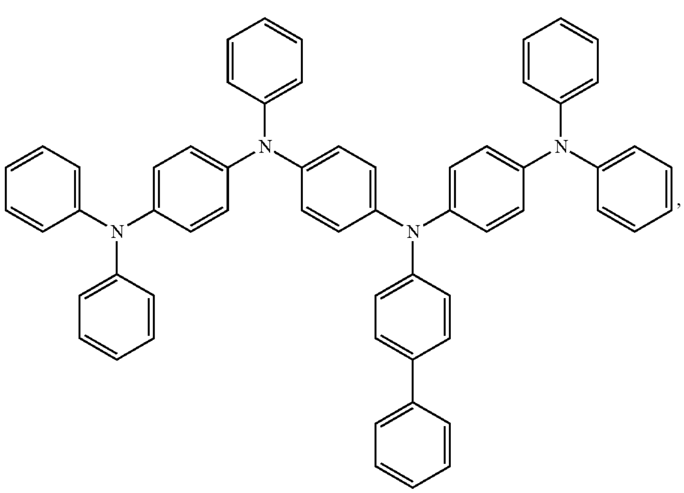
,

-continued
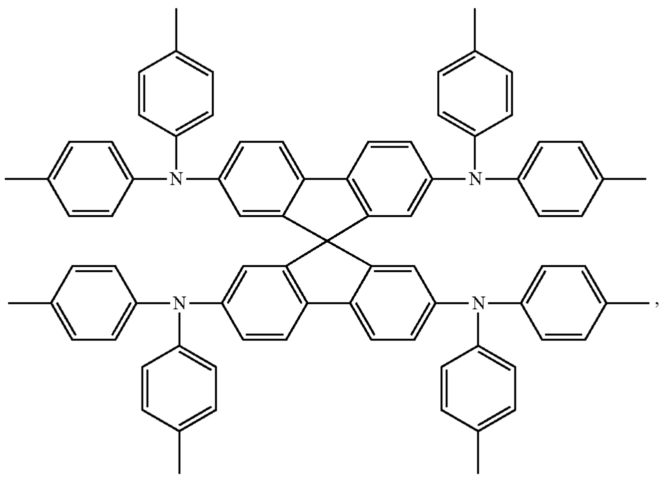
,
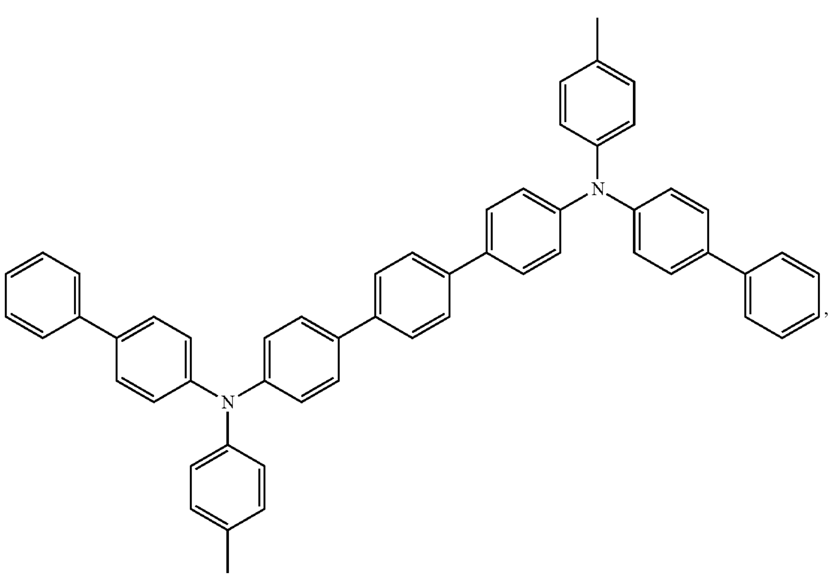
,

-continued
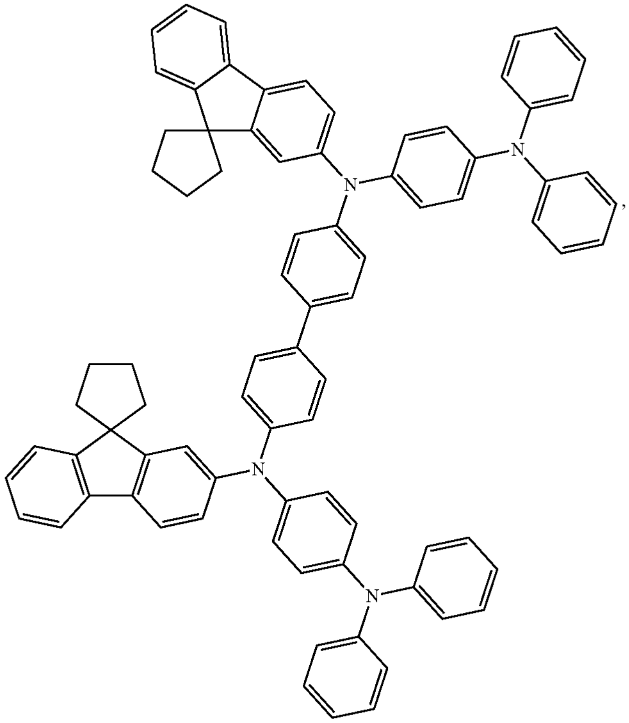
,
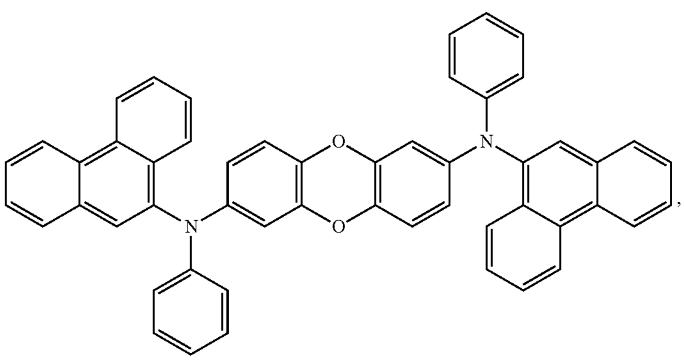
,
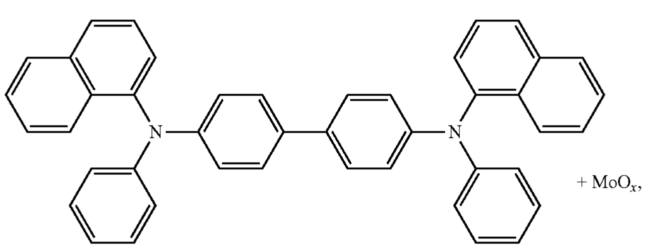
+ $MoO_x$,

-continued
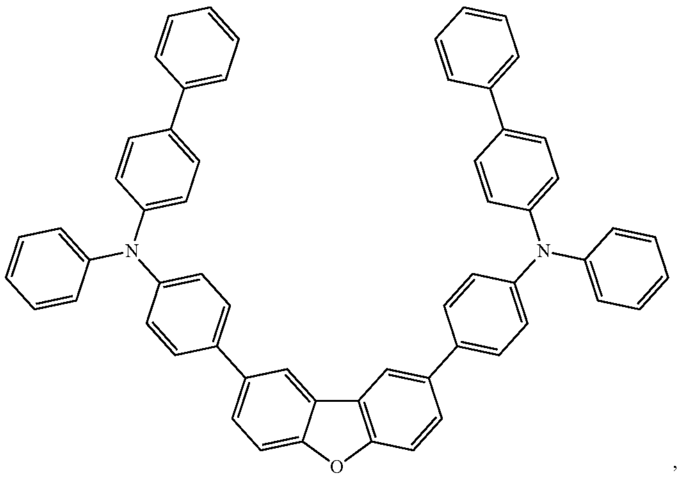
,
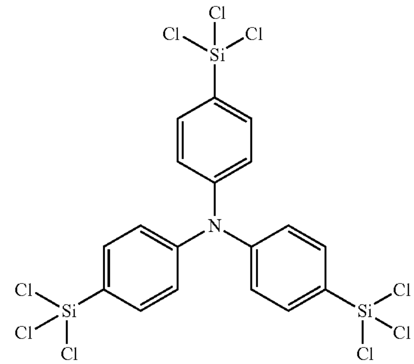
,
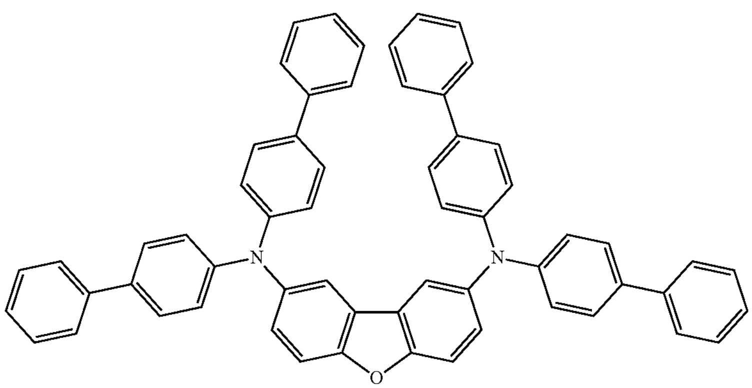
,
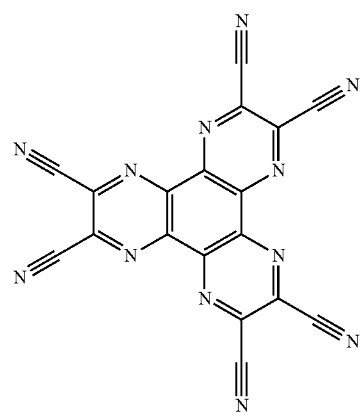
,
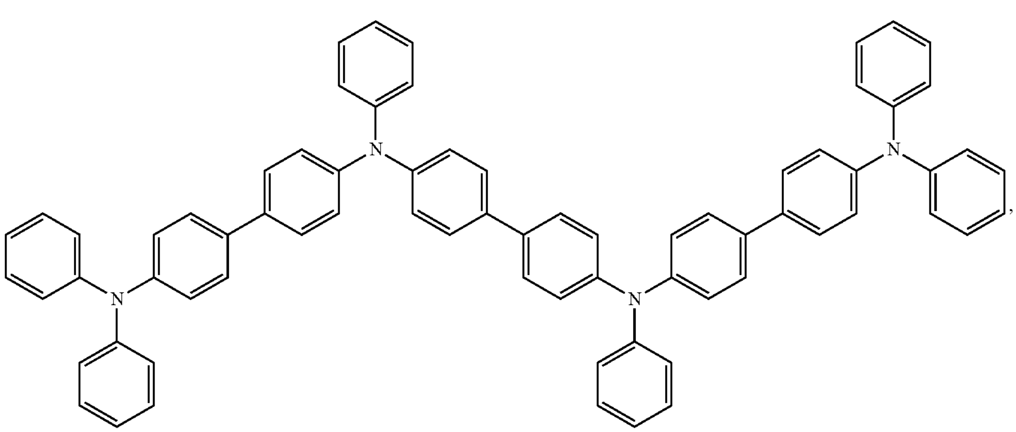
, -continued
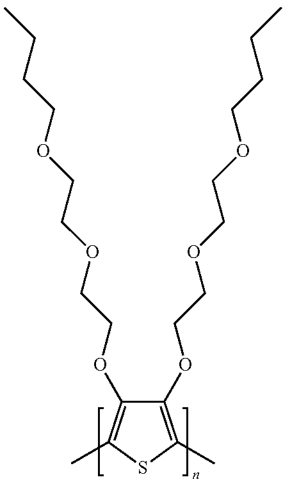
,
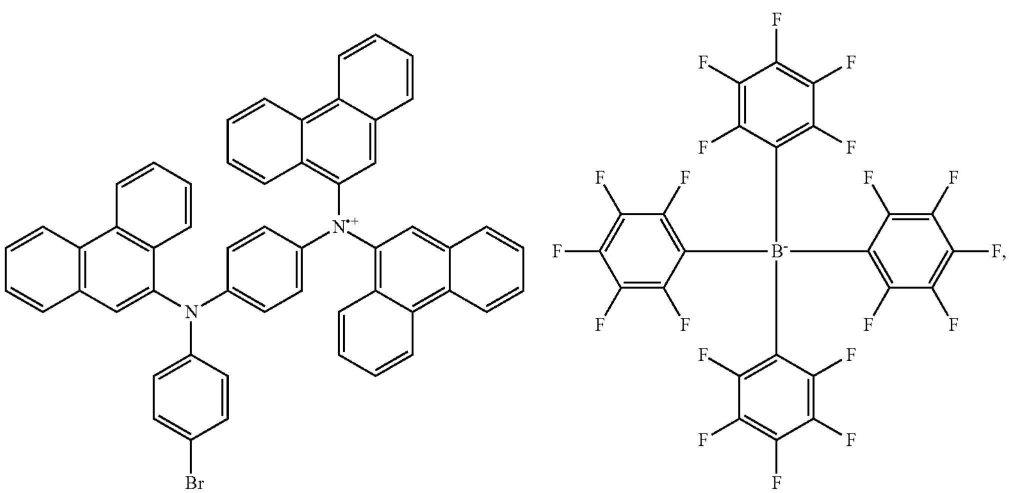
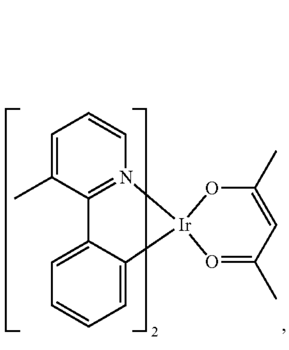
,
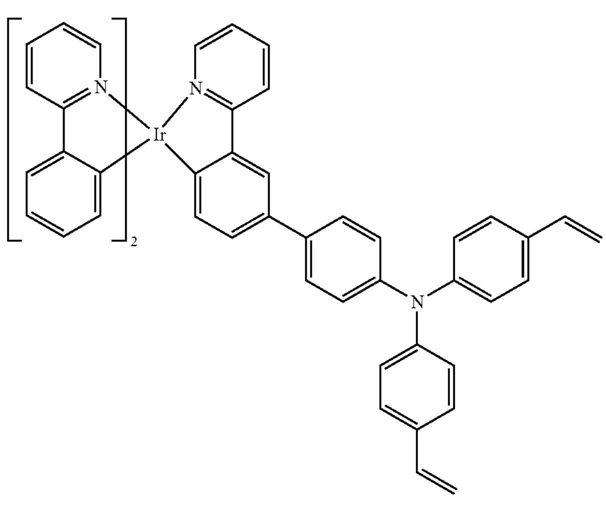
, -continued
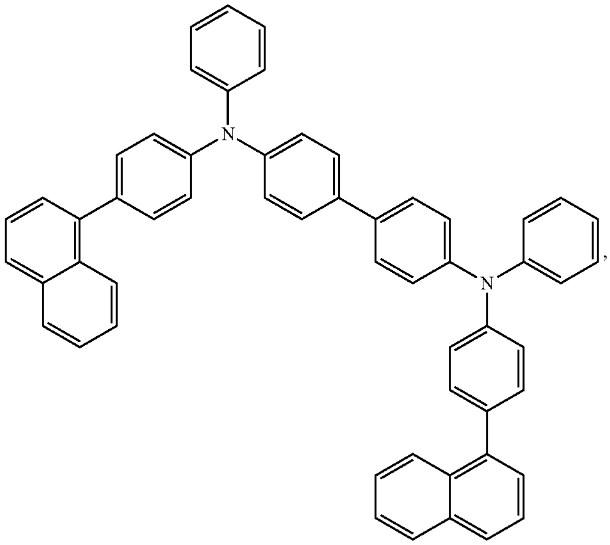
,
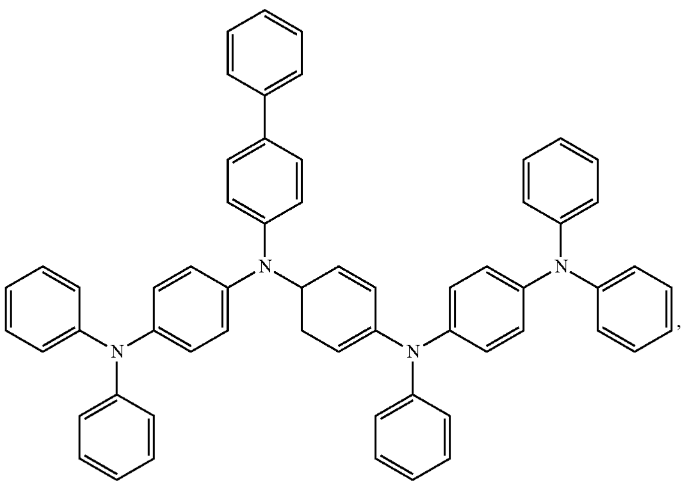
,
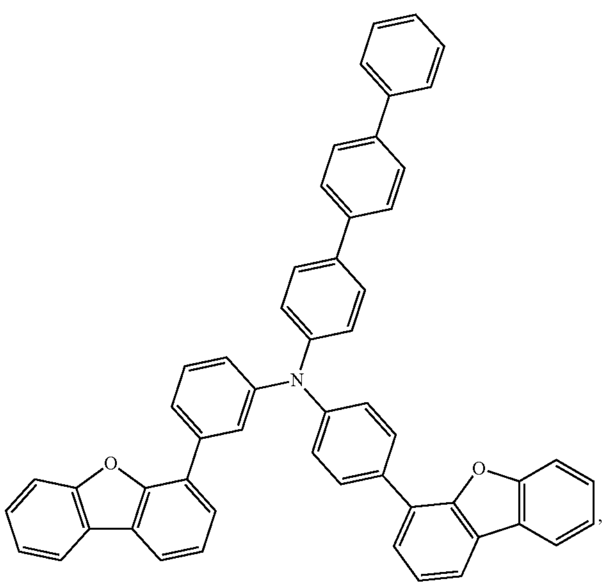
, -continued
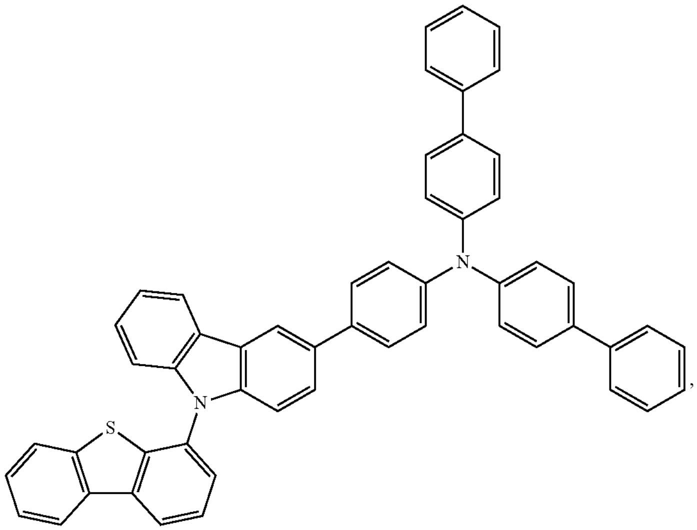
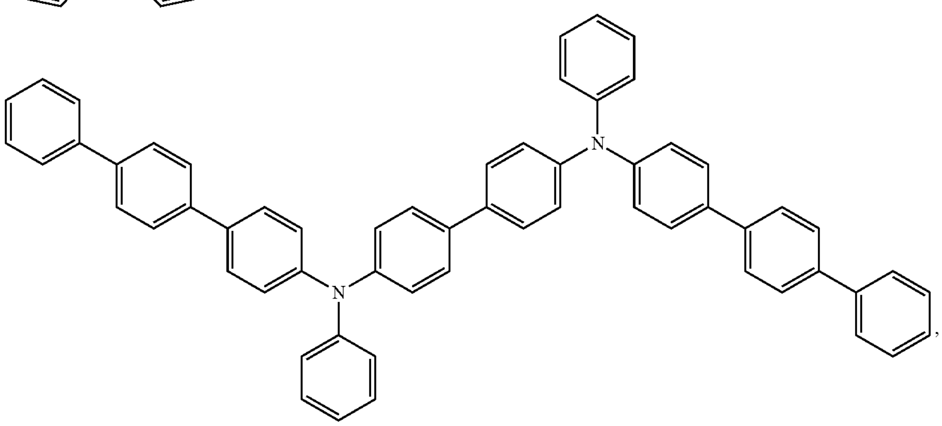
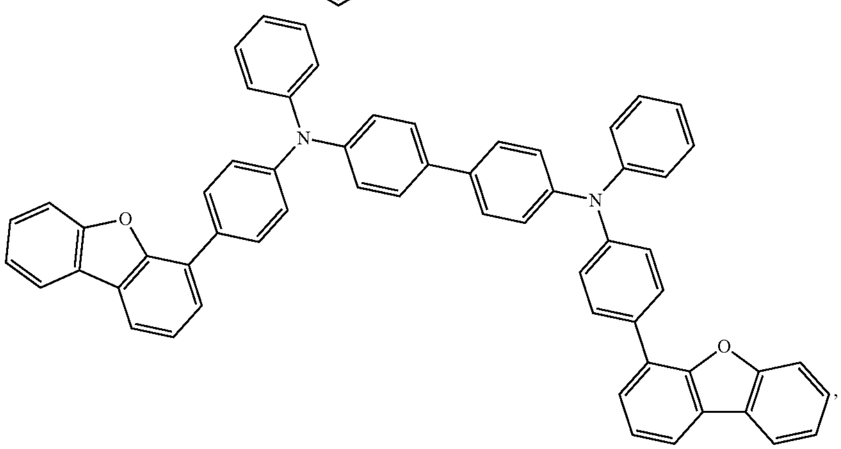
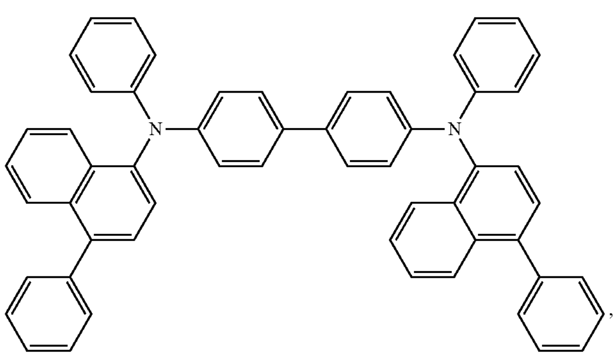

-continued
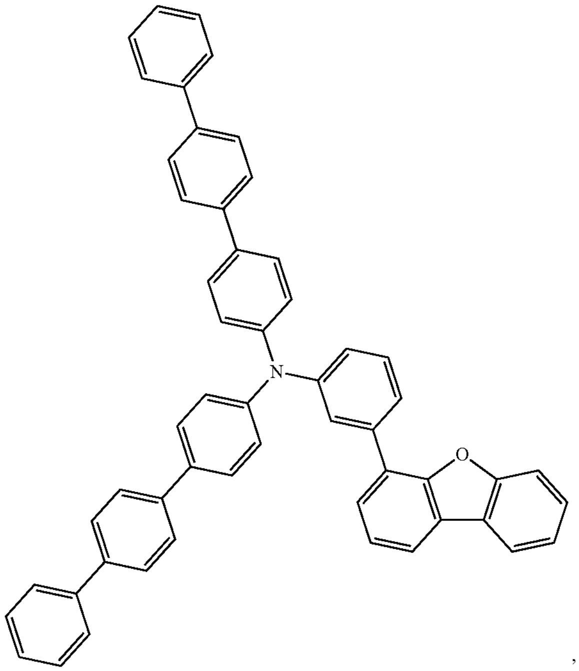
,
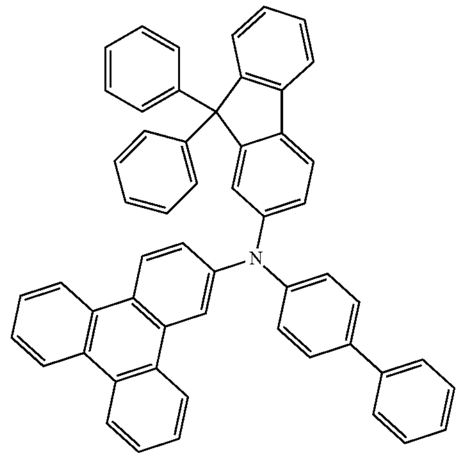
,
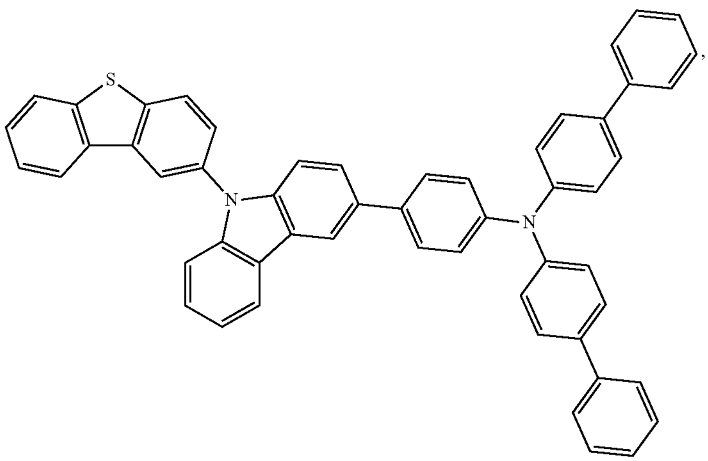
,
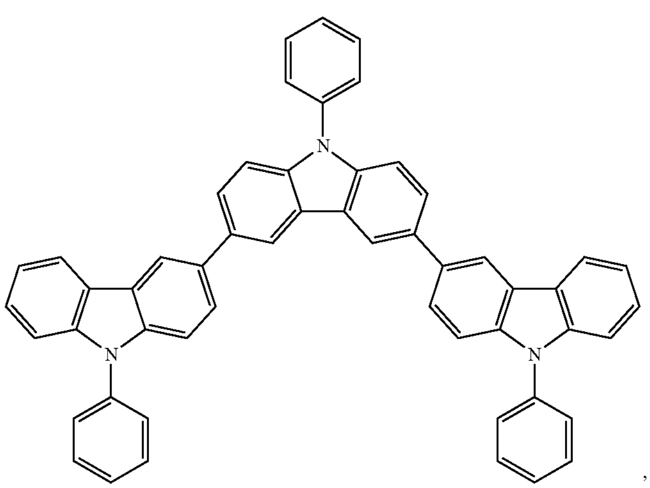
,
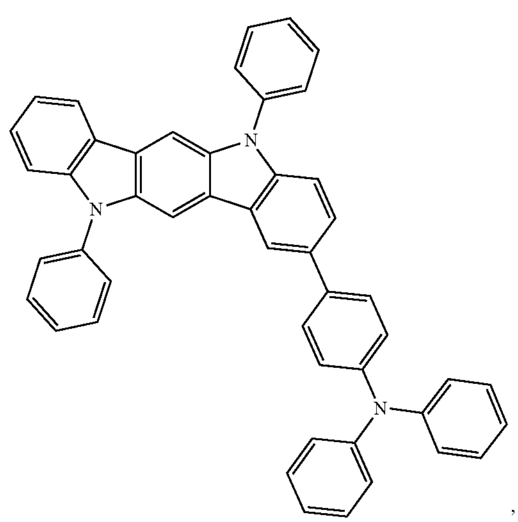
, -continued
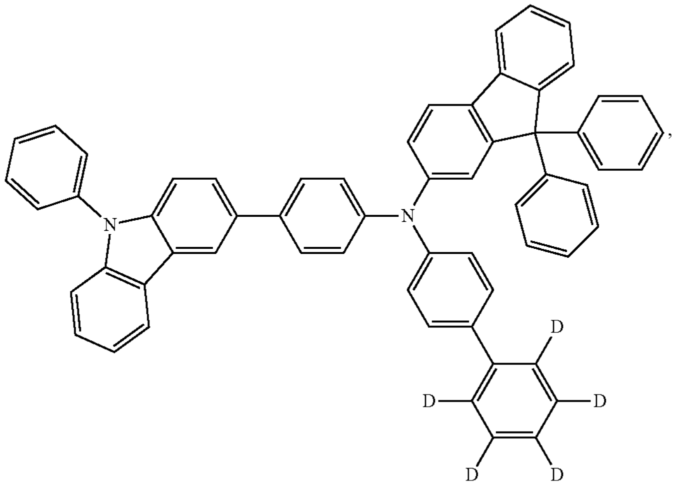
,
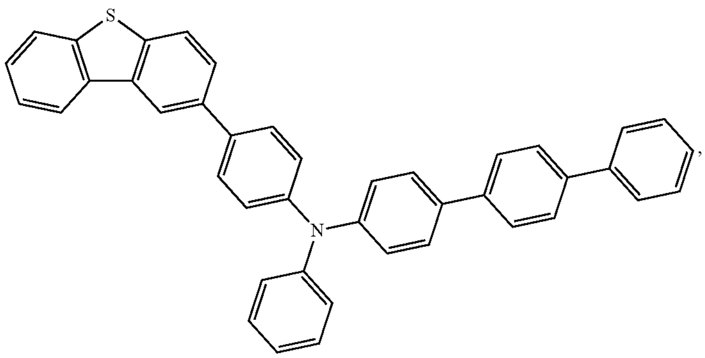
,
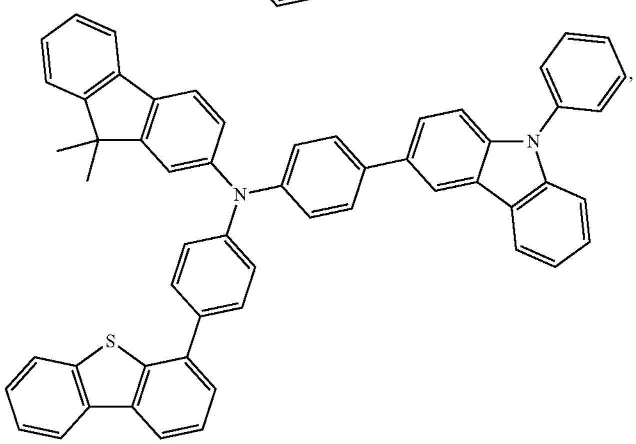
,
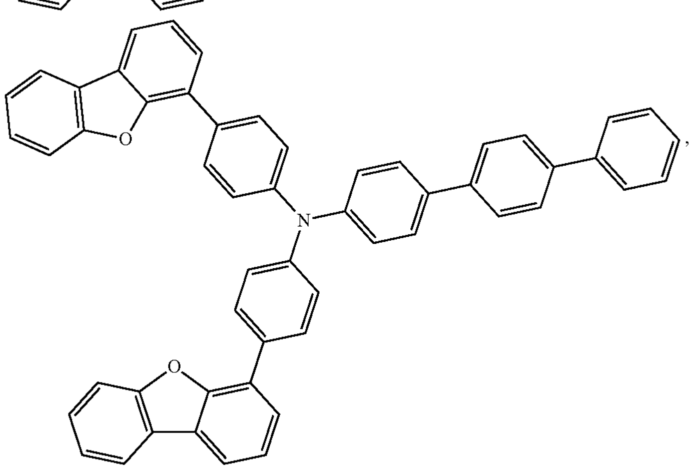
, -continued
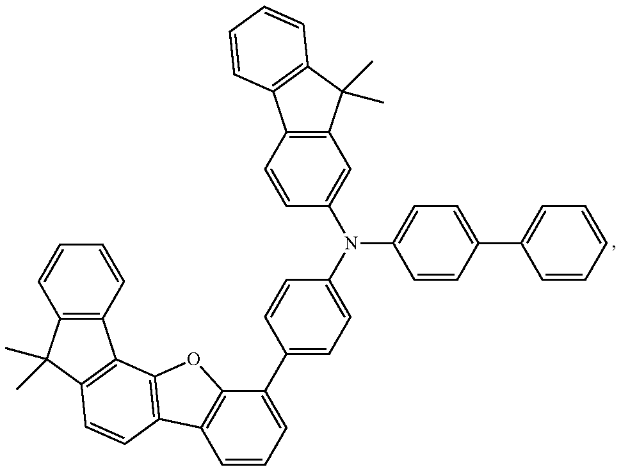
,
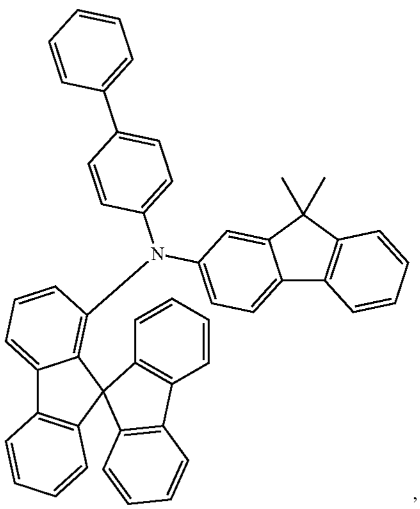
,
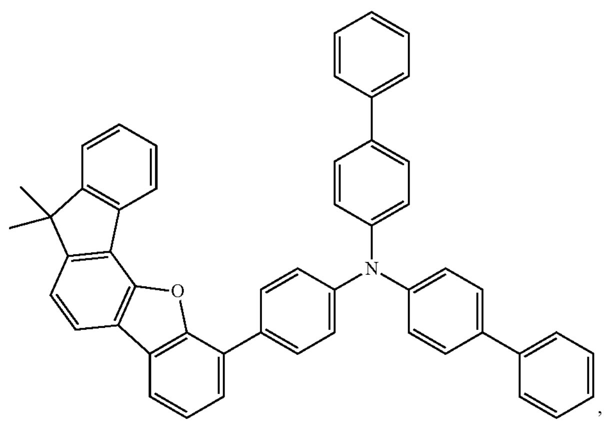
,
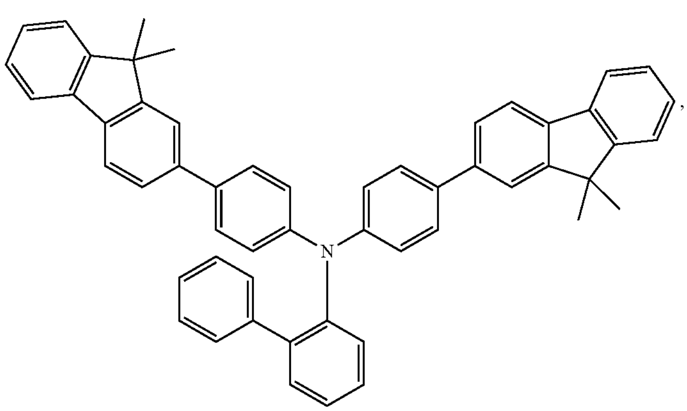
, -continued
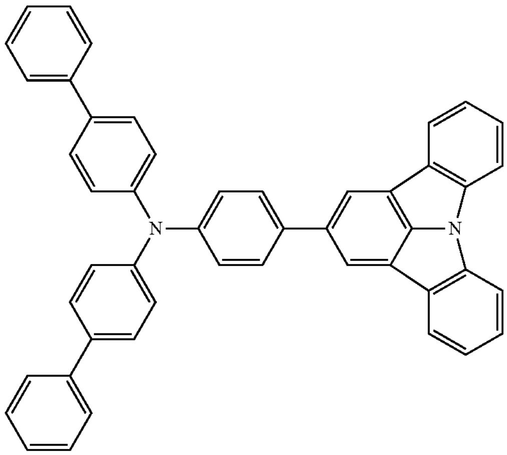
,
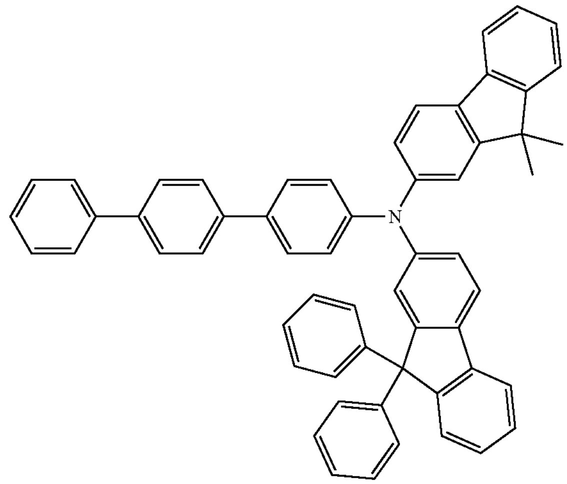
,
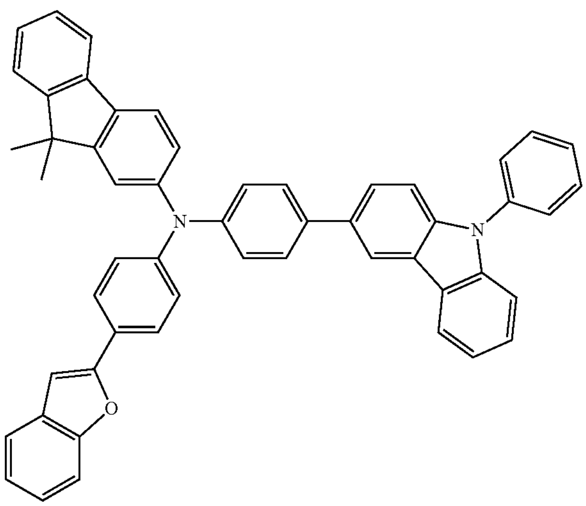
,
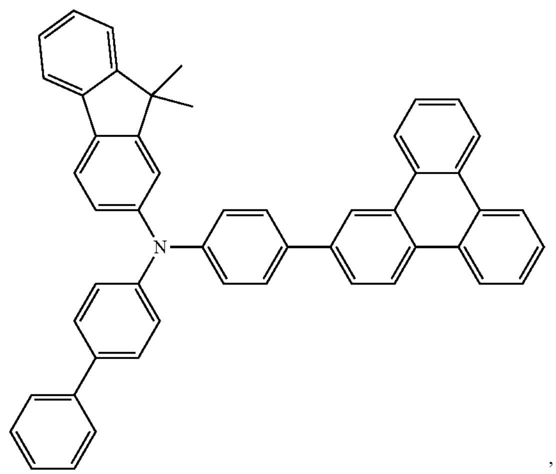
,
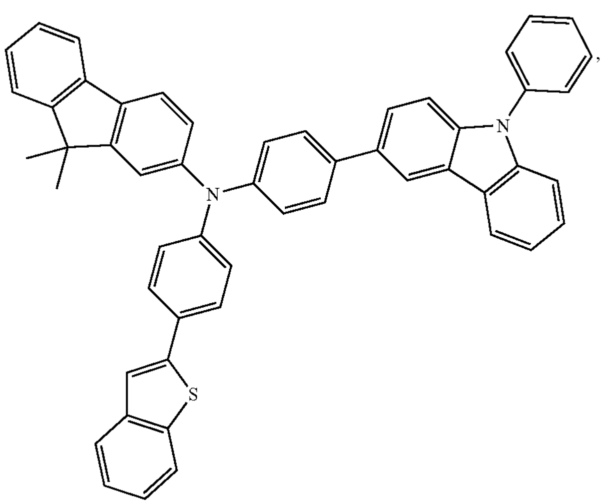
, -continued
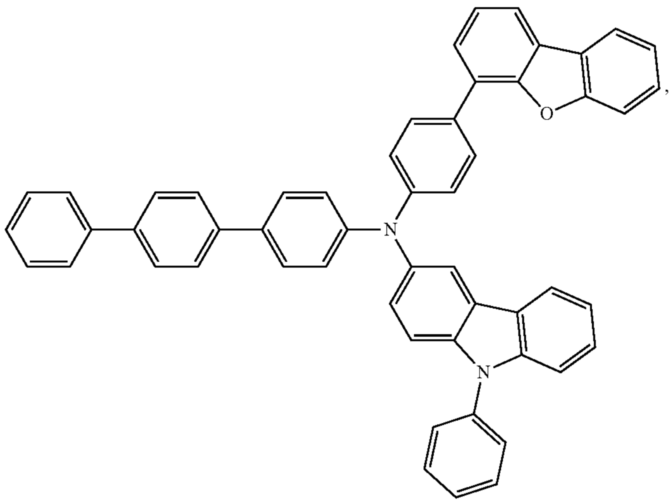
,
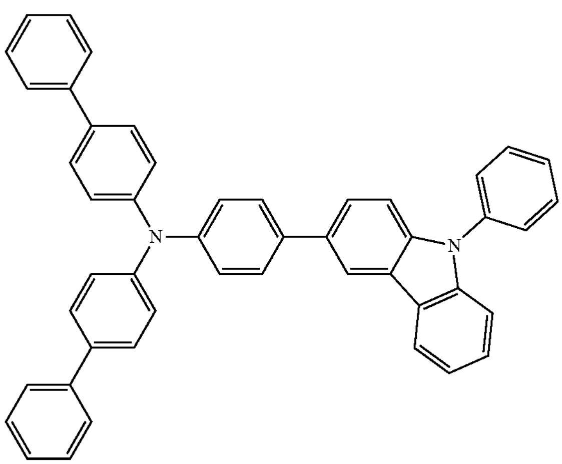
,
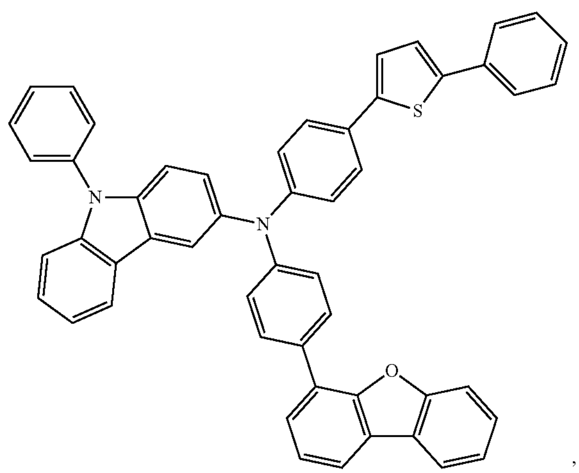
,
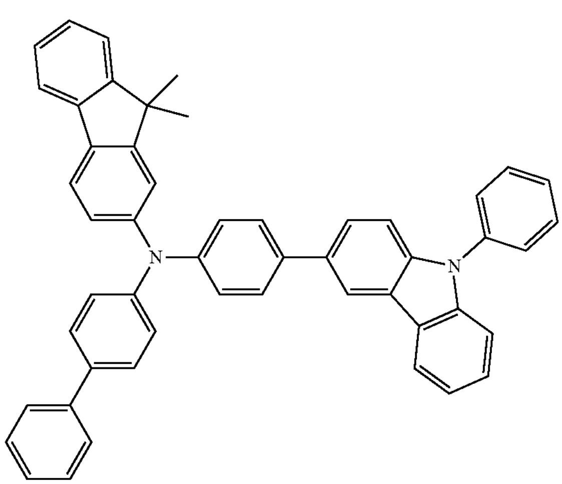
,
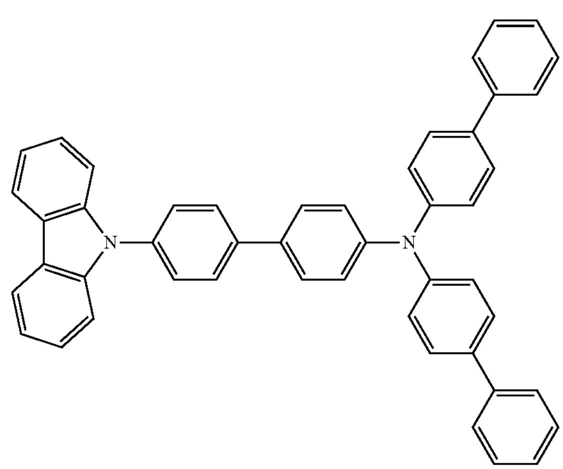
, -continued
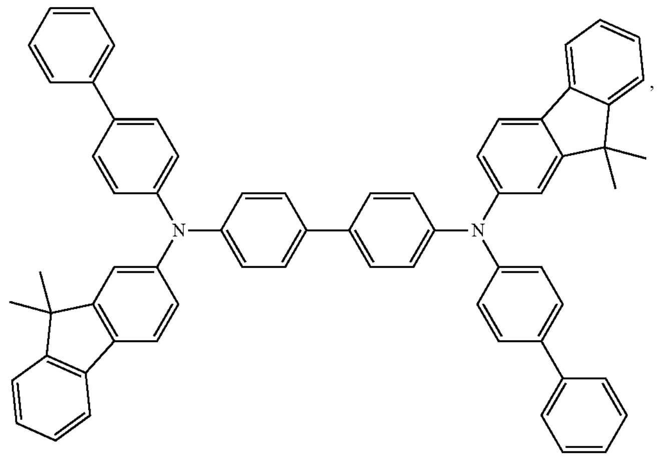
,
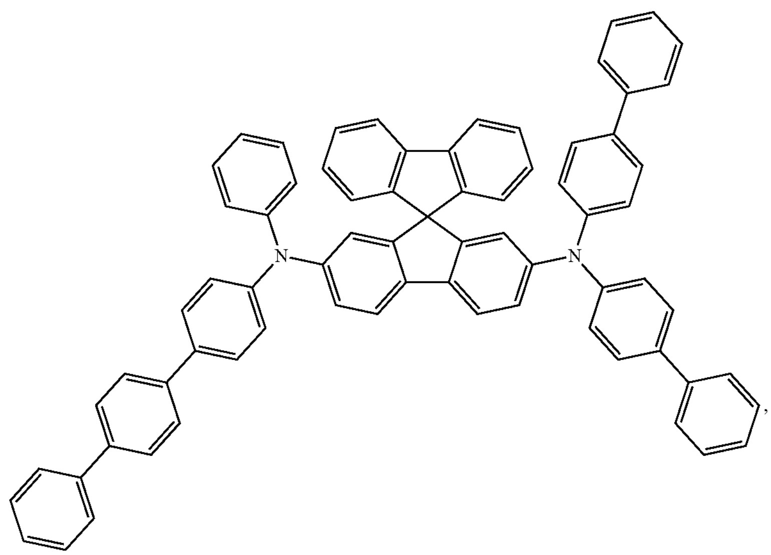
,
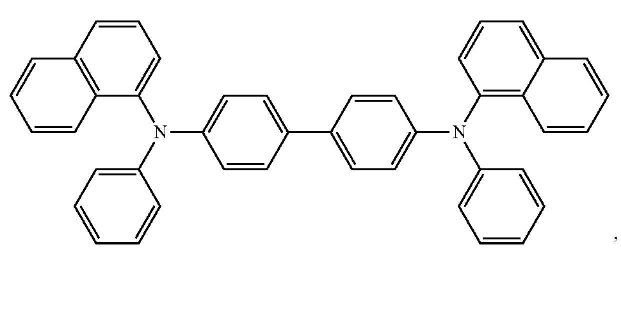
,
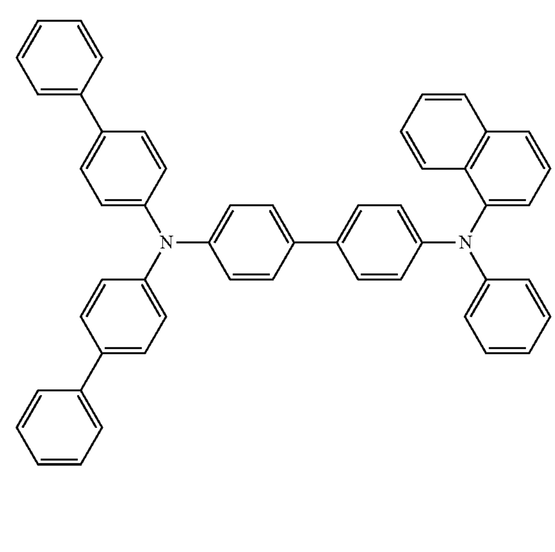
, -continued
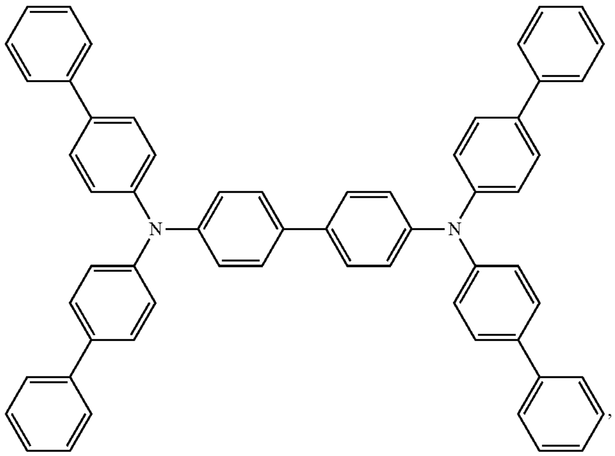,
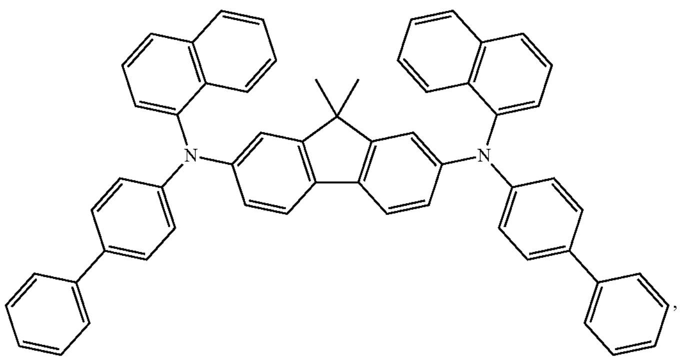,
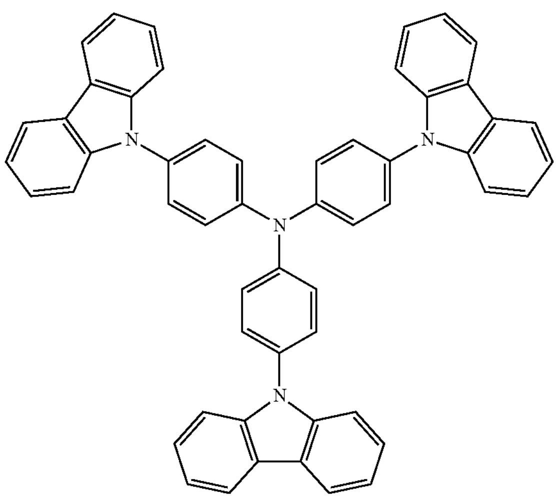,
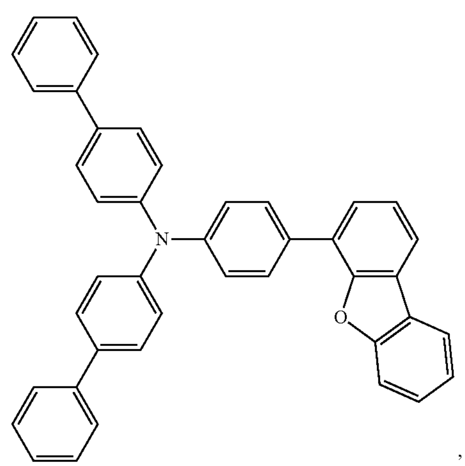, -continued

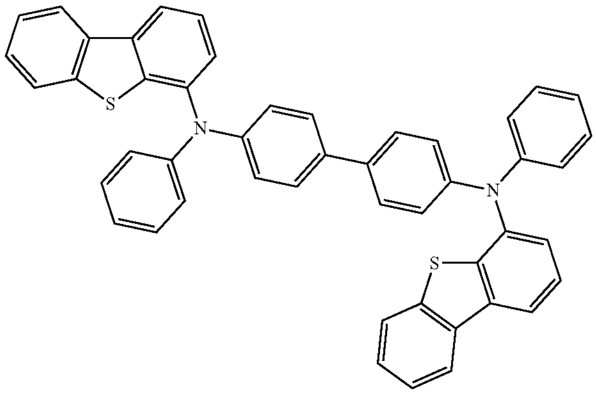

,

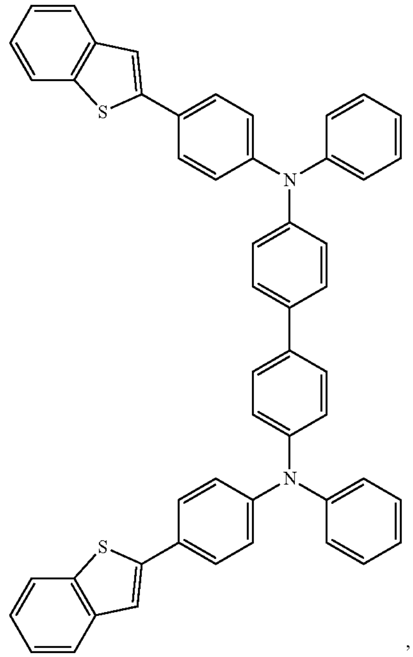

, and

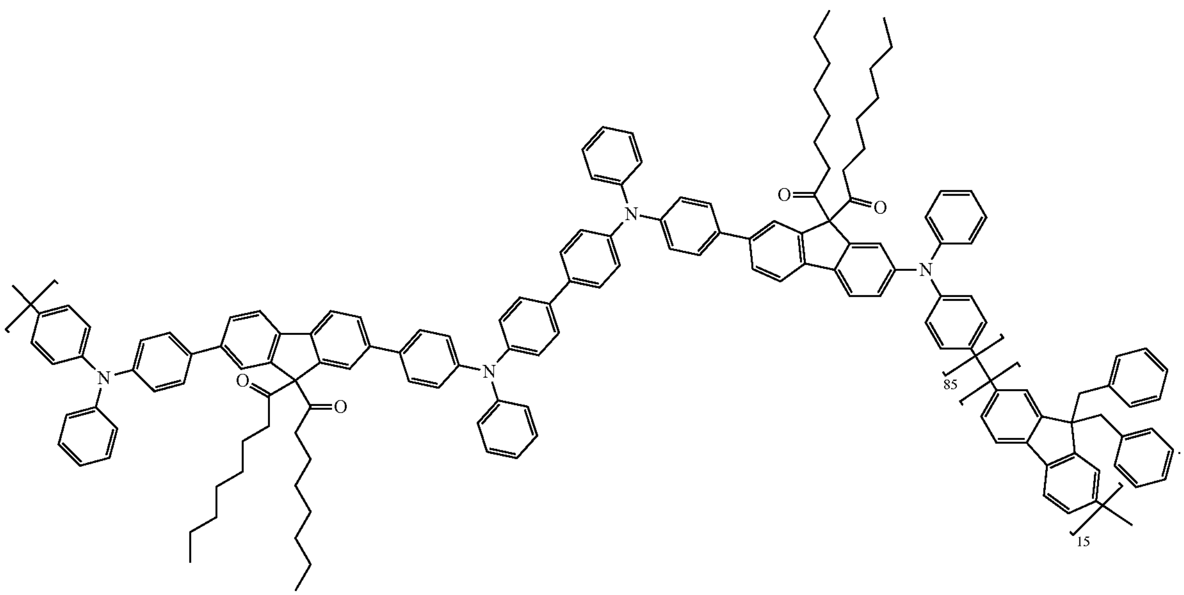

.

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

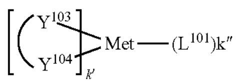

wherein Met is a metal; ($Y^{103}$-$Y^{104}$) is a bidentate ligand, $Y^{103}$ and $Y^{101}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

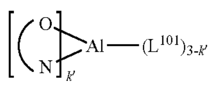

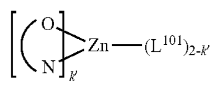

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

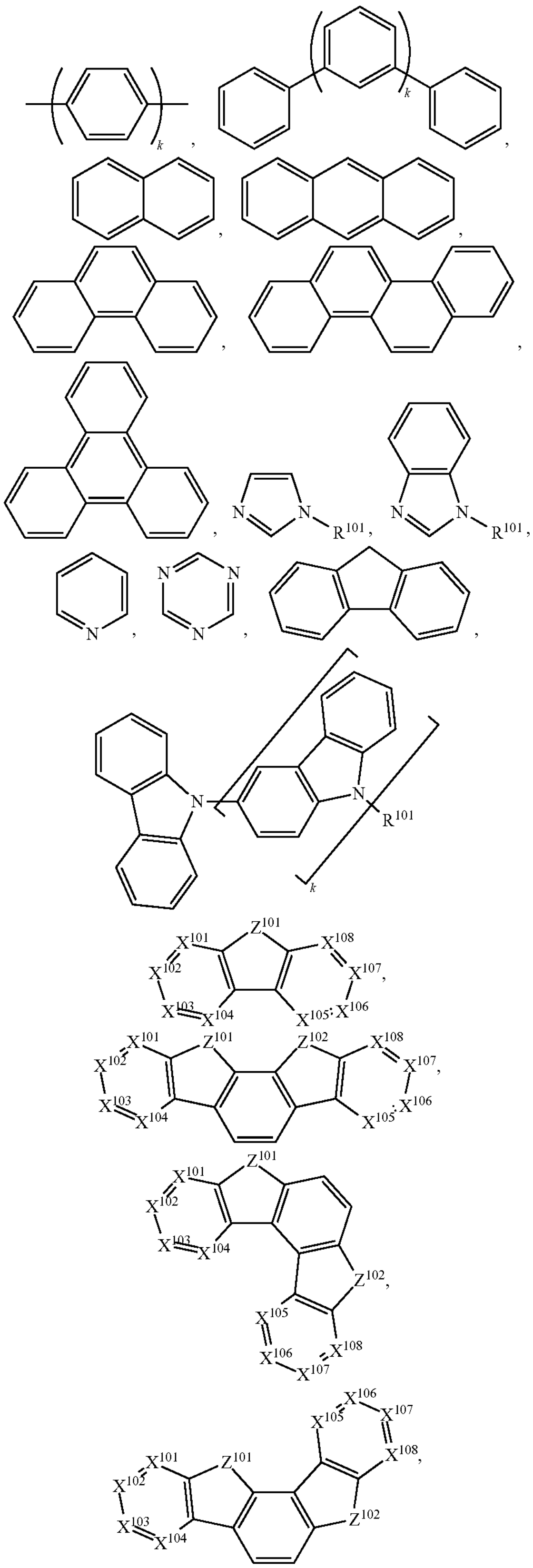

-continued

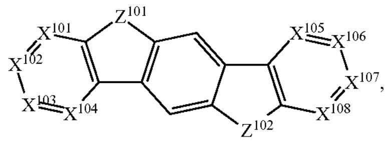

and

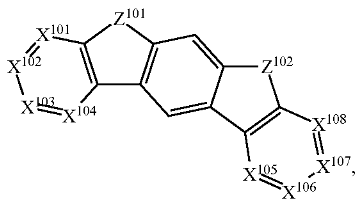

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

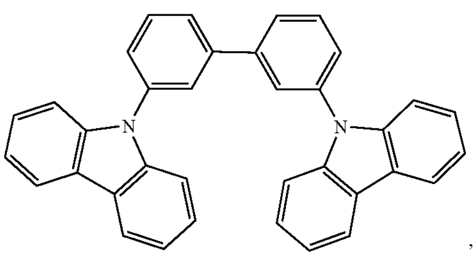

,

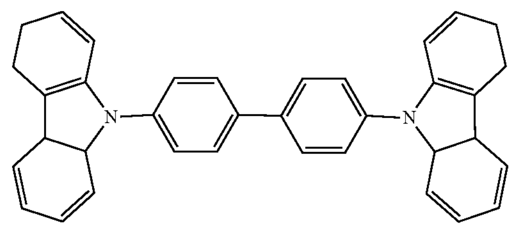

,

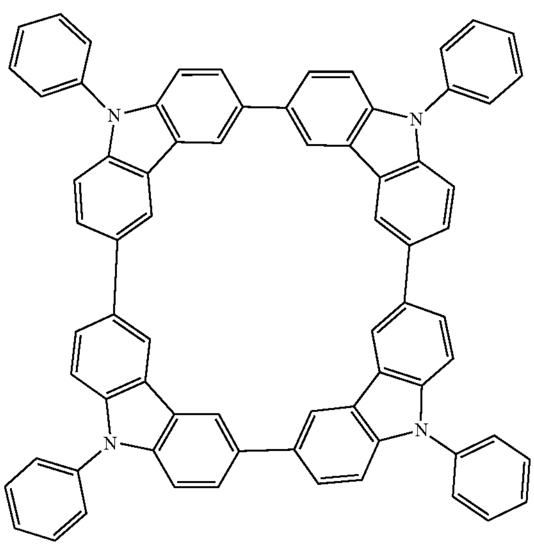

,

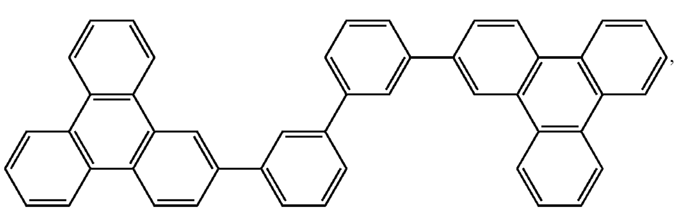

,

-continued
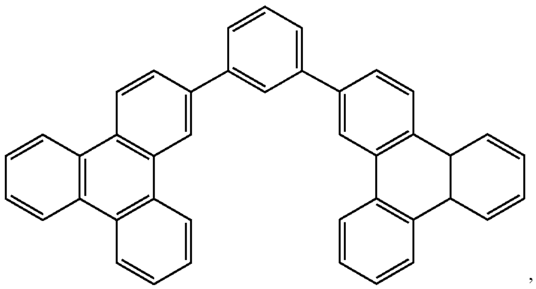
,
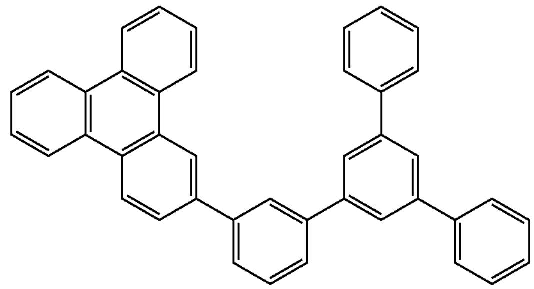
,
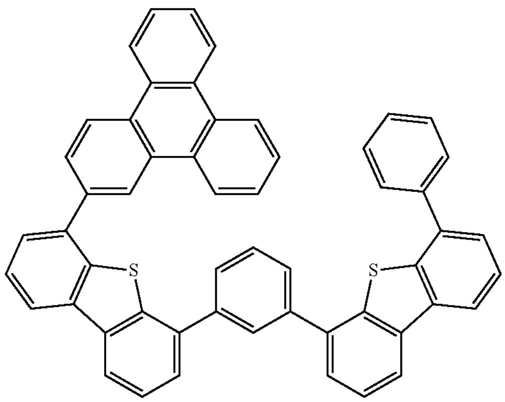
,
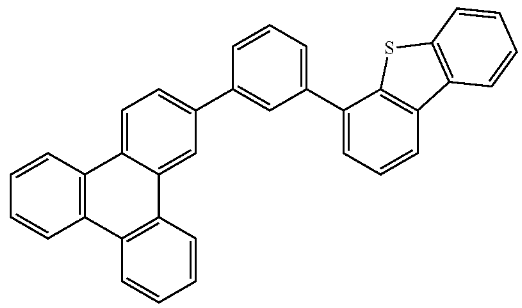
,
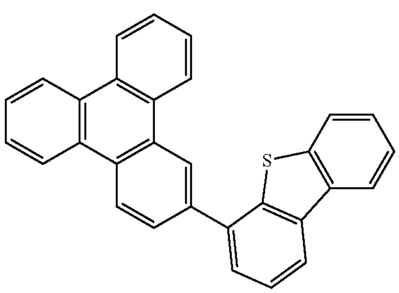
,
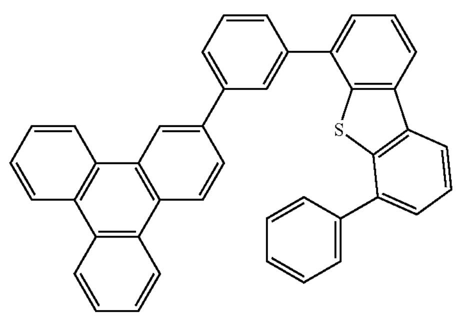
,
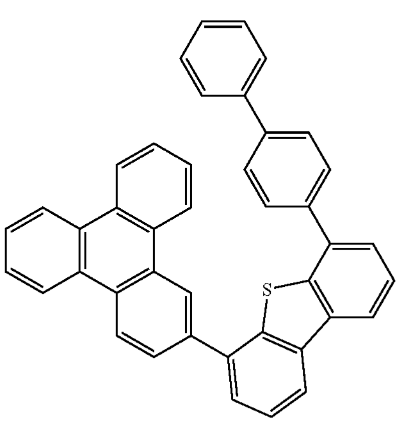
,
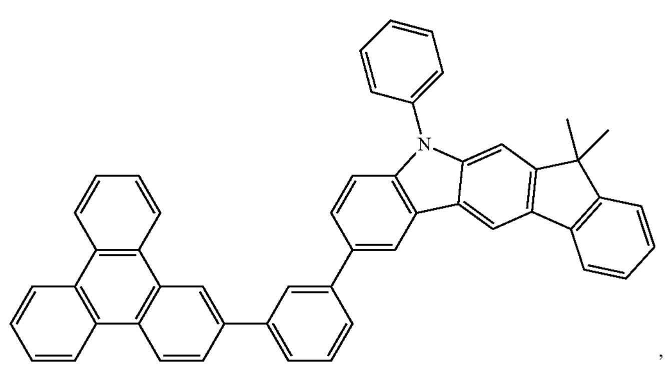
, -continued
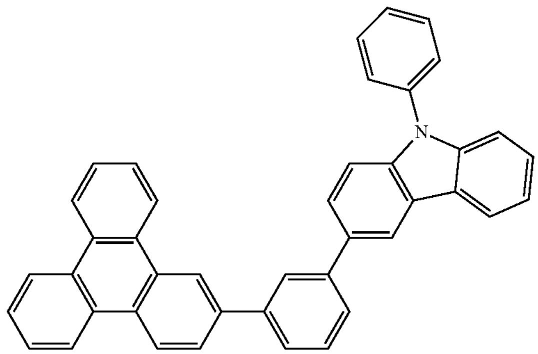
,
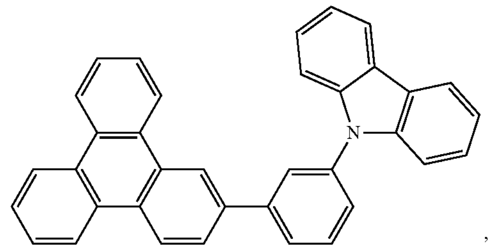
,
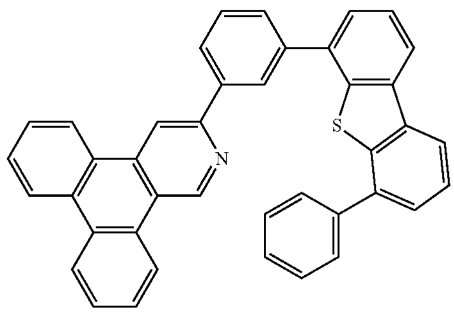
,
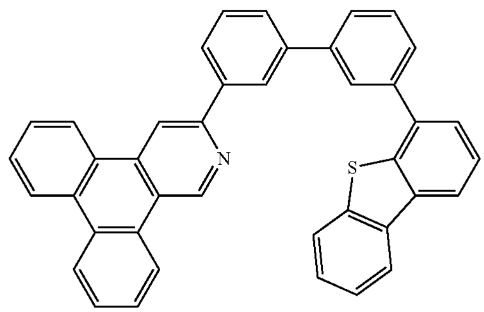
,
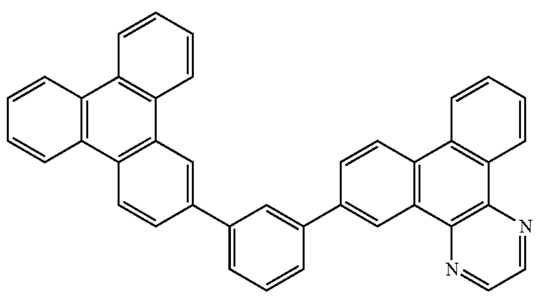
,
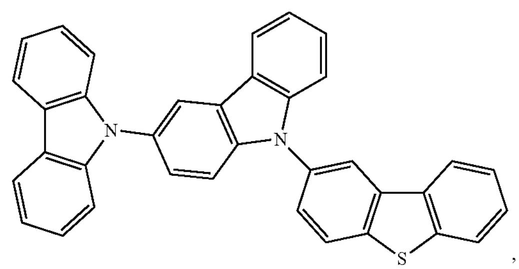
,
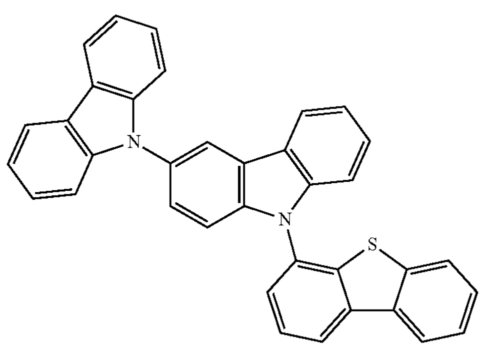
,
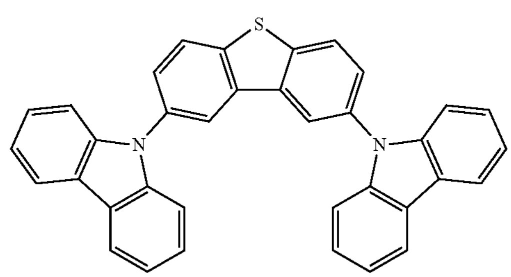
,
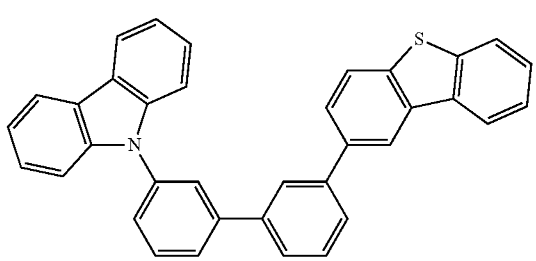
,
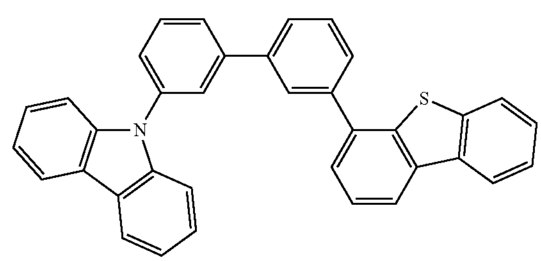
, -continued
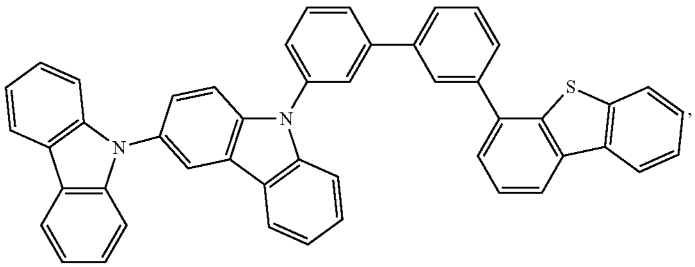
,
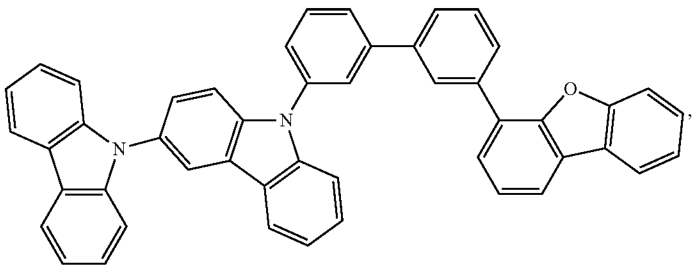
,
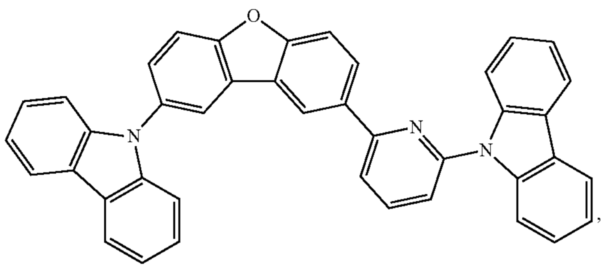
,
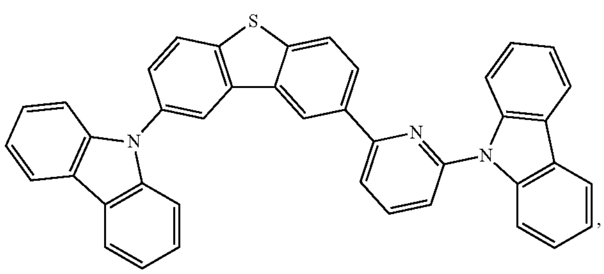
,
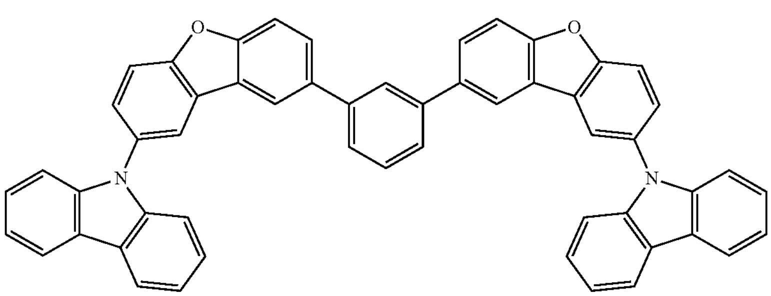
,
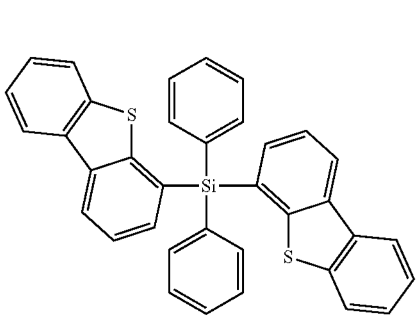
,
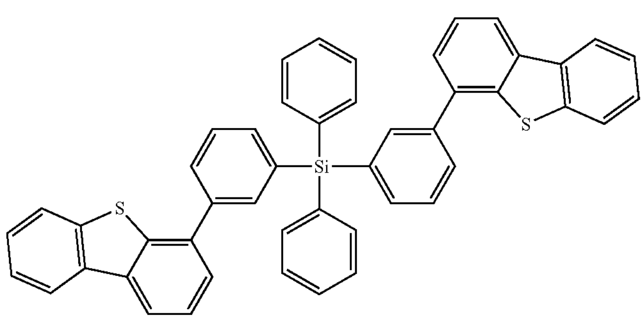
, -continued
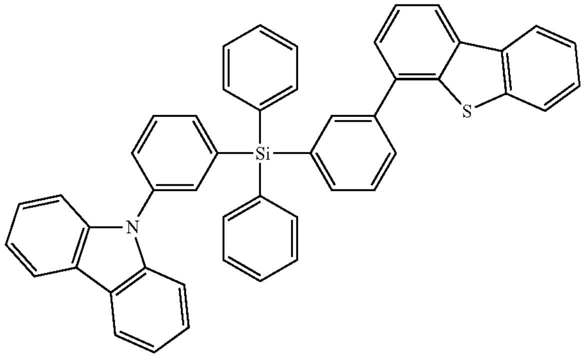
,
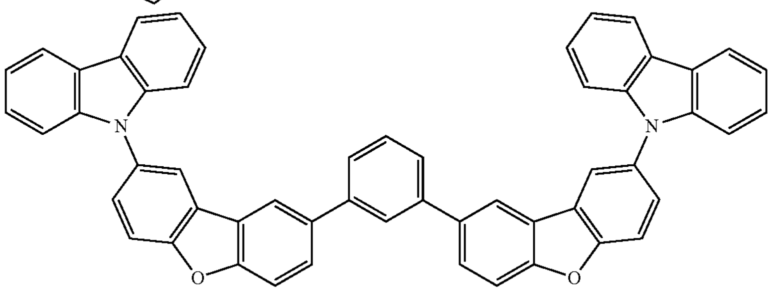
,
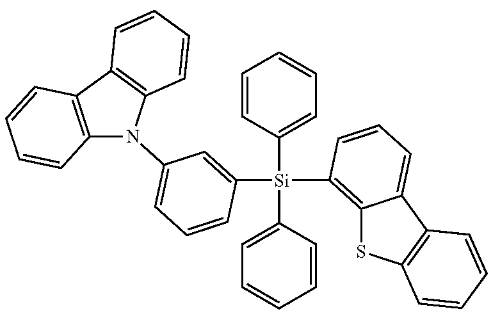
,
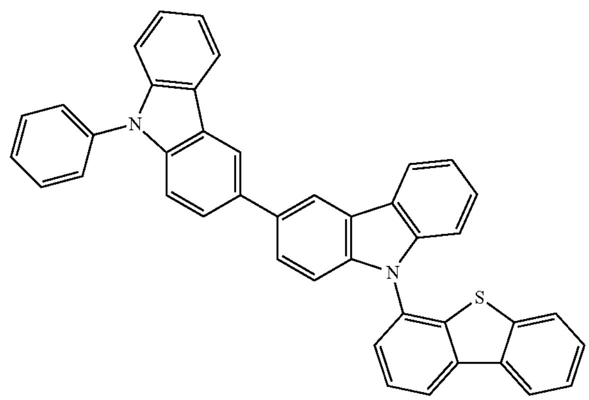
,
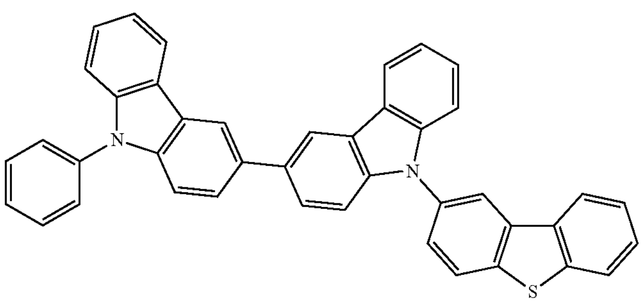
,
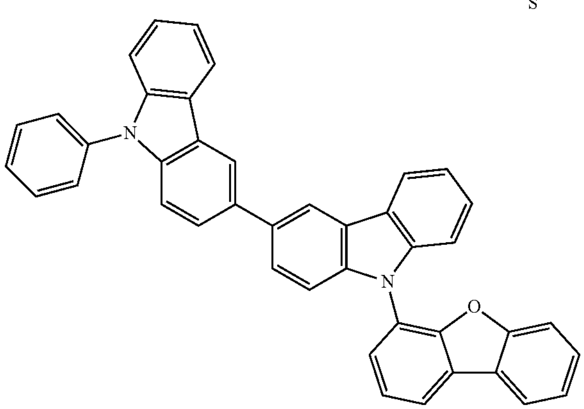
, -continued
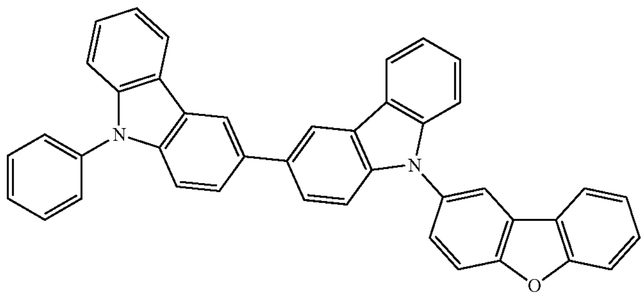
,
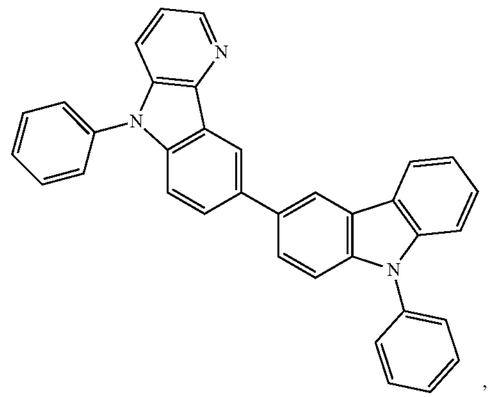
,
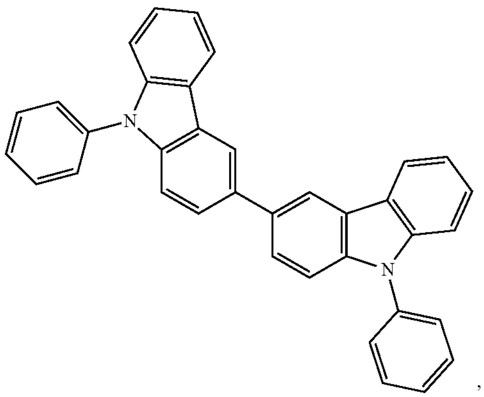
,
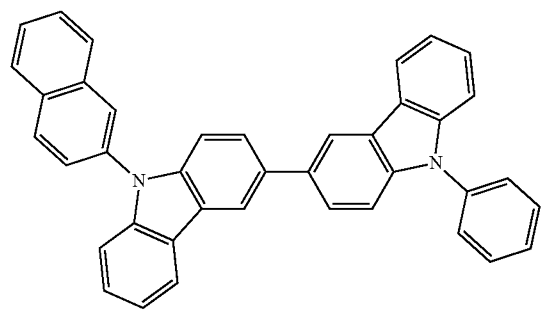
,
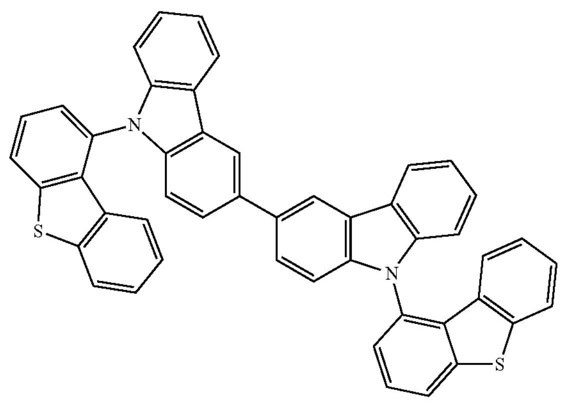
,
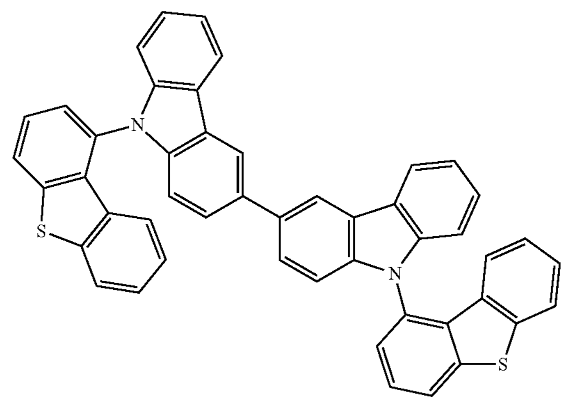
,
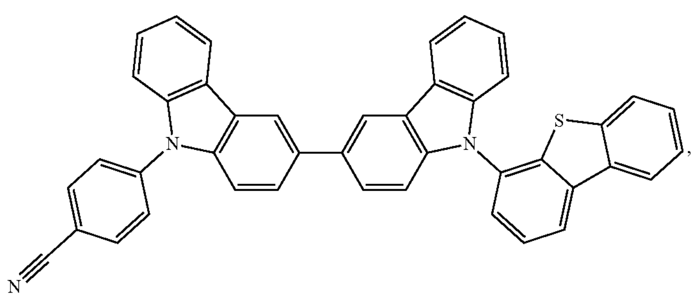
, -continued
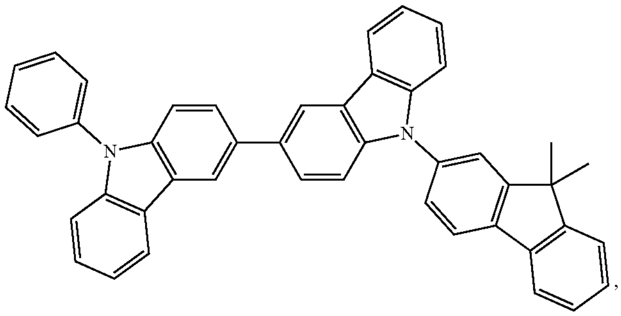
,
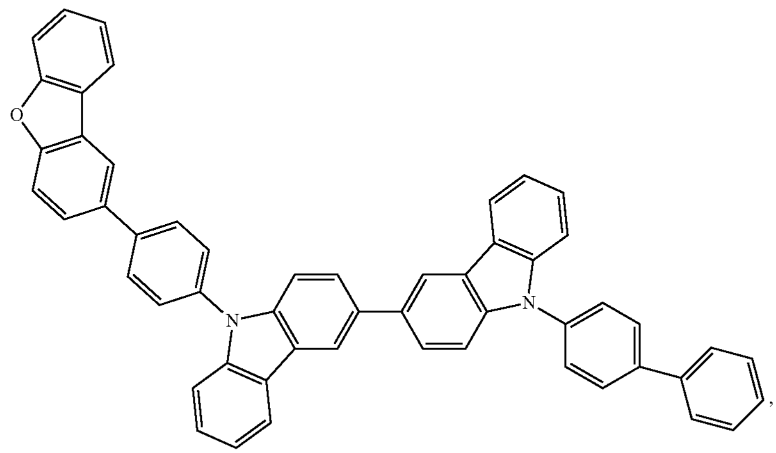
,
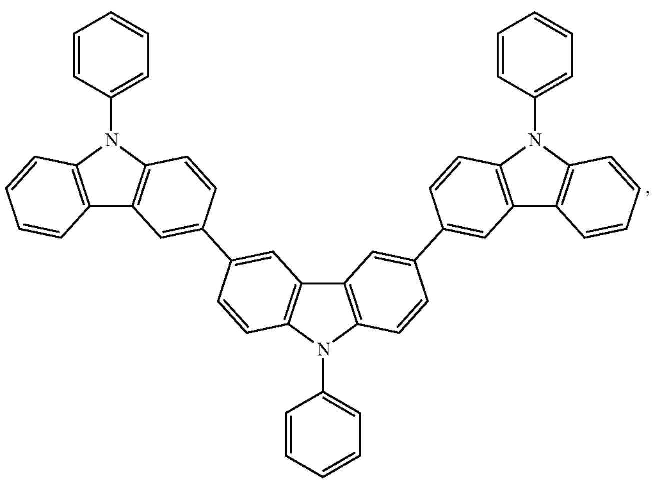
,
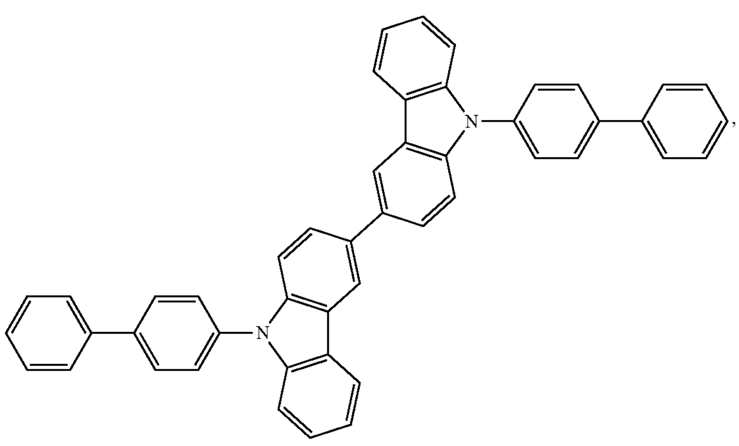
, -continued
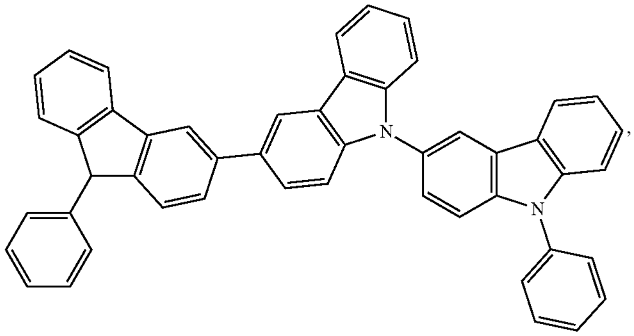
,
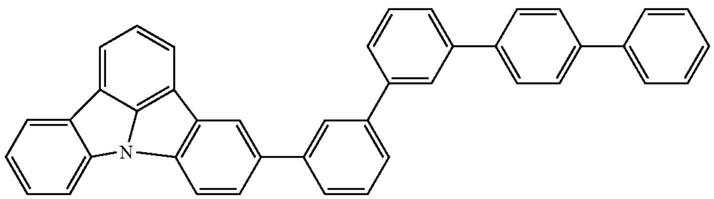
,
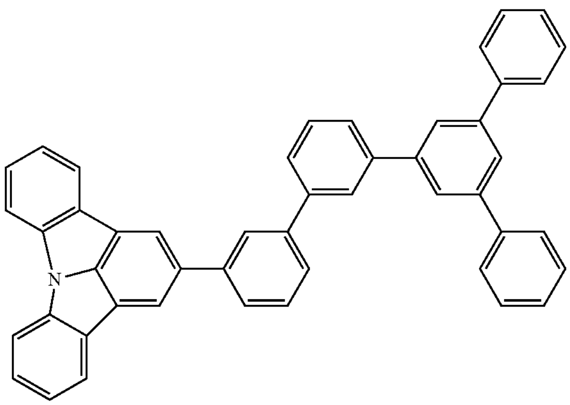
,
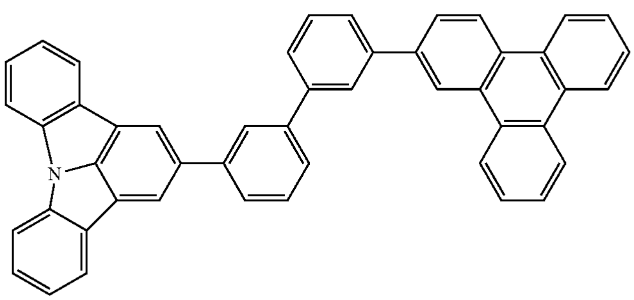
,
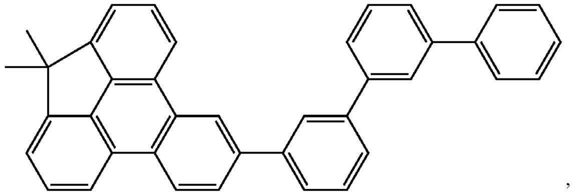
,
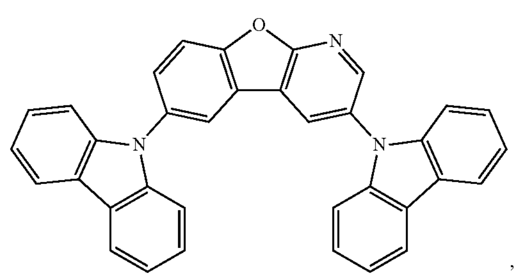
, -continued
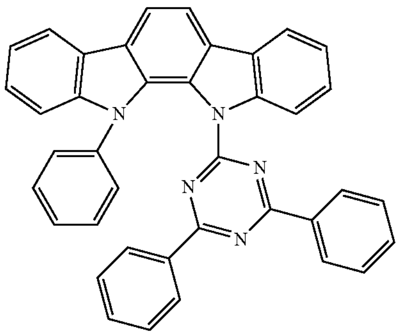
,
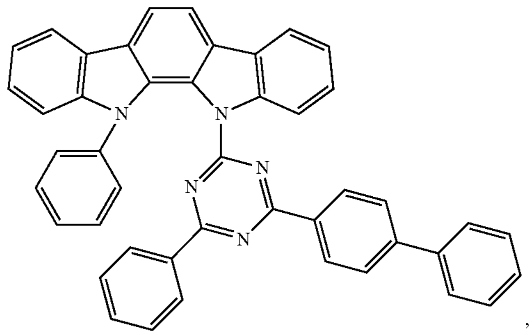
,
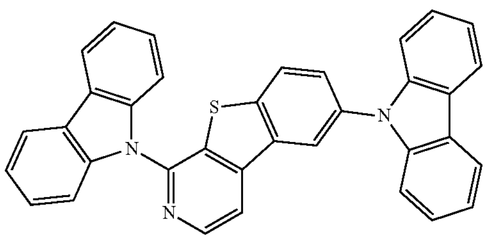
,
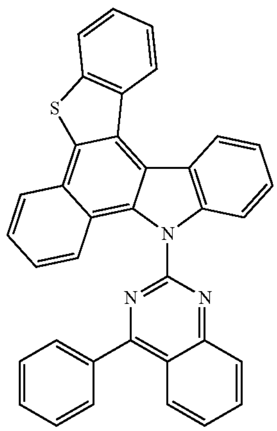
,
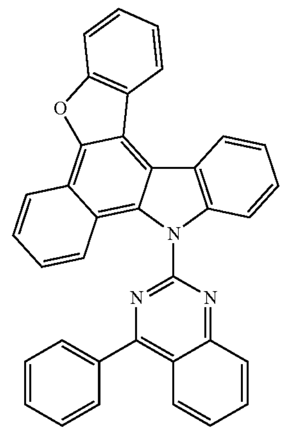
,
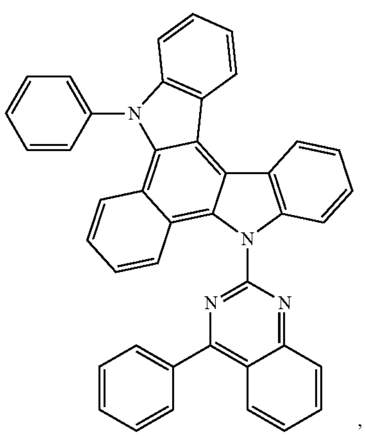
,
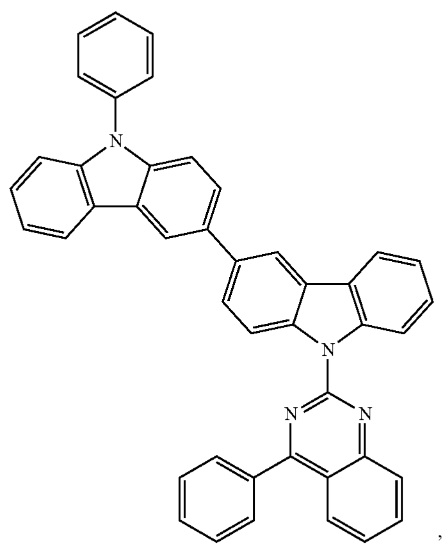
,
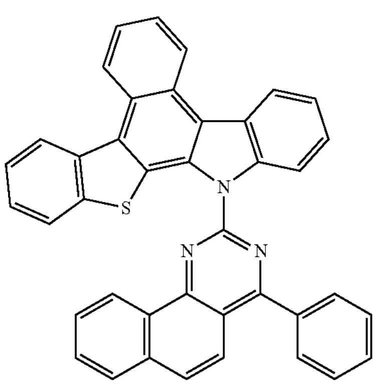
,
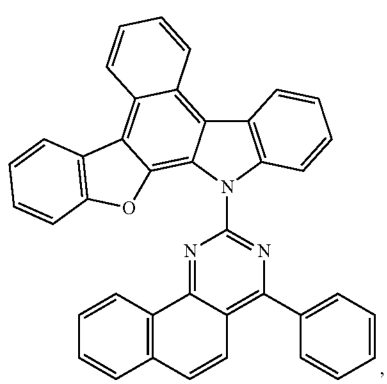
, -continued
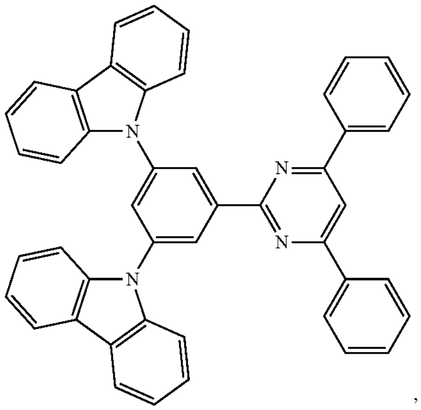
,
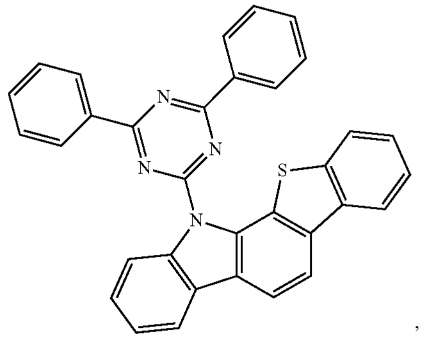
,
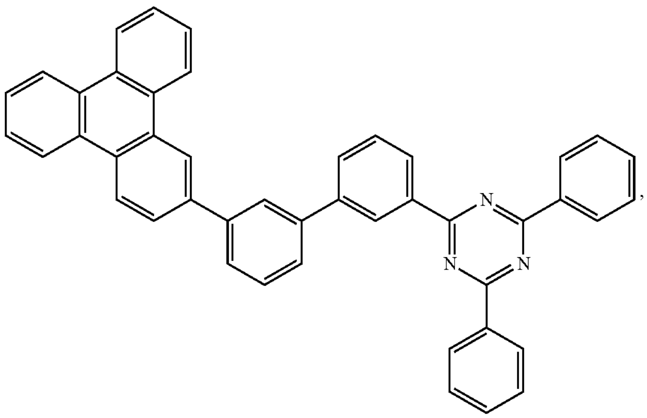
,
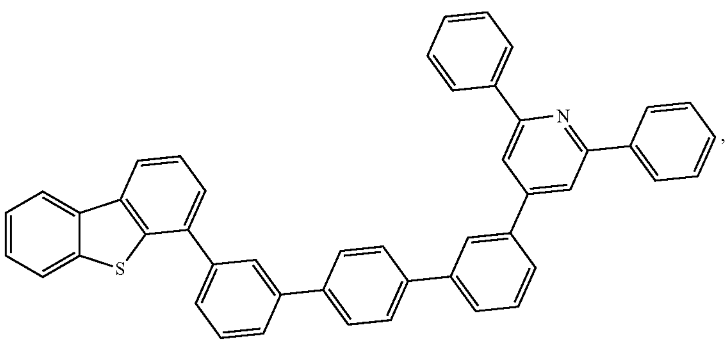
,
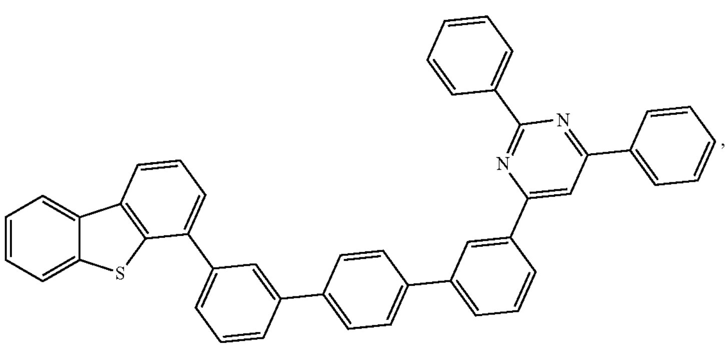
, -continued
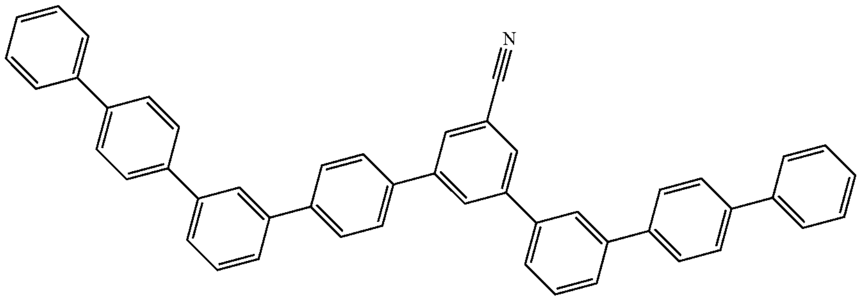,
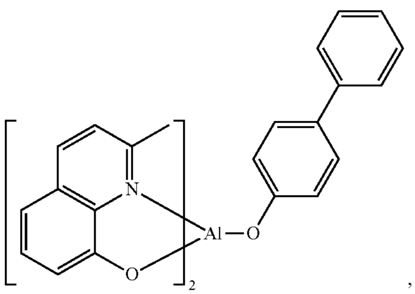,
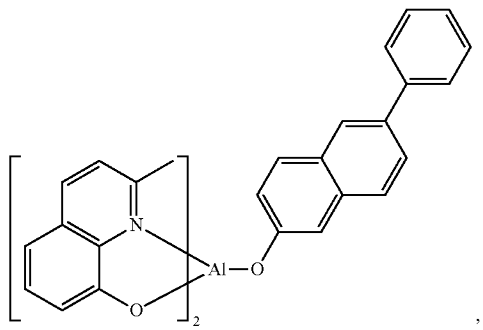,
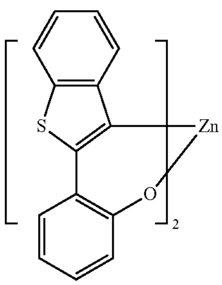,
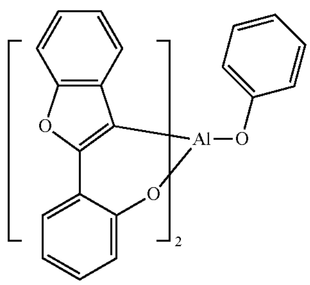,
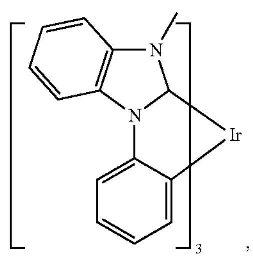,
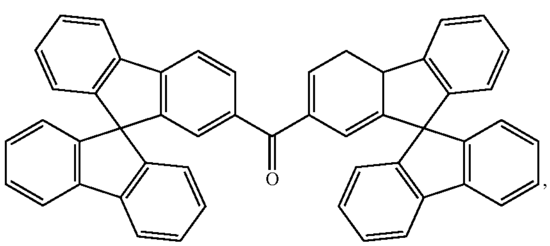,
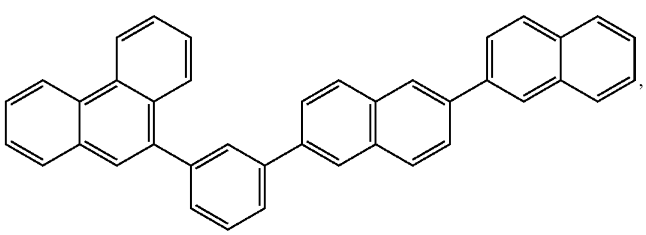,
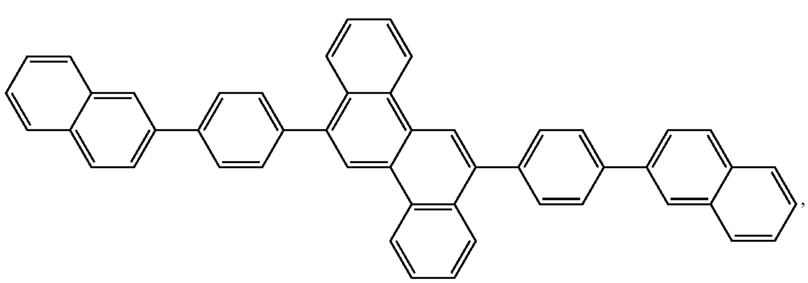, and -continued

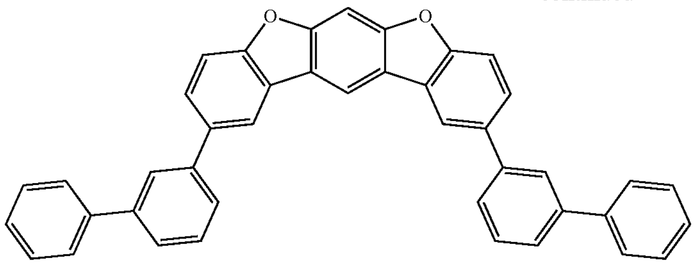

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

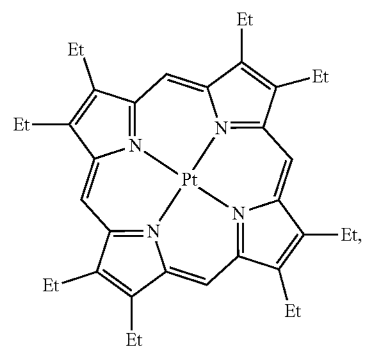

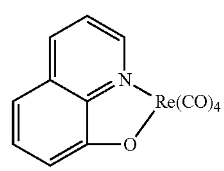

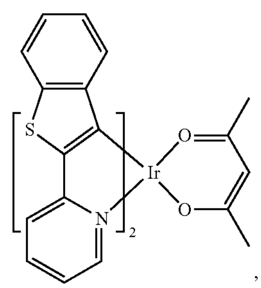

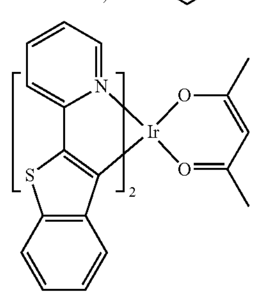

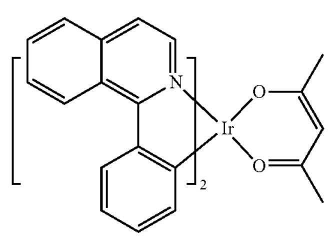

-continued
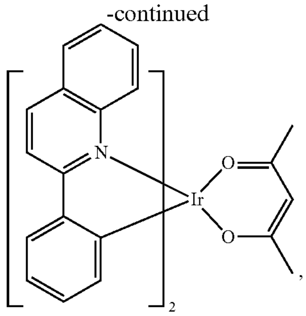
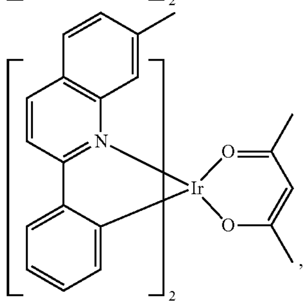
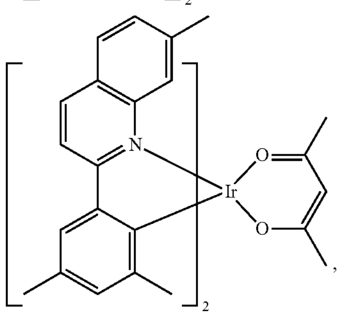
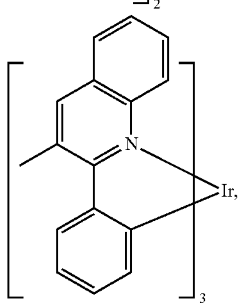
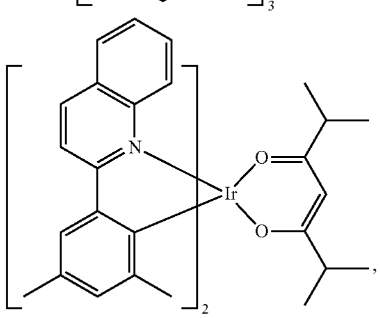
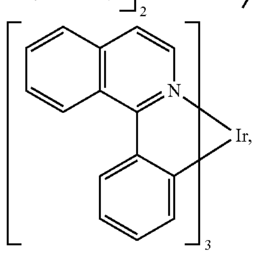
-continued
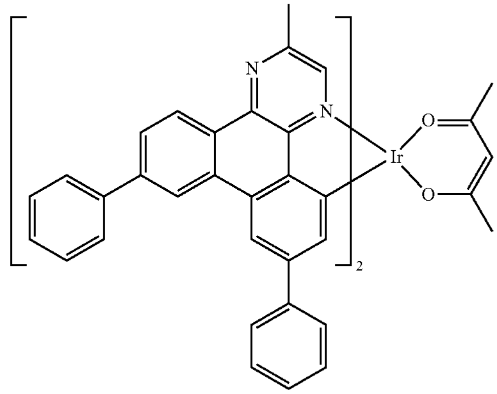
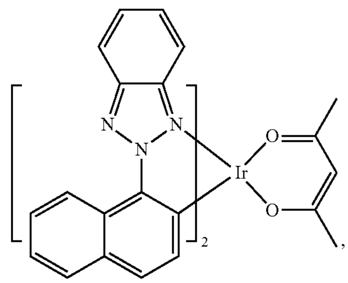
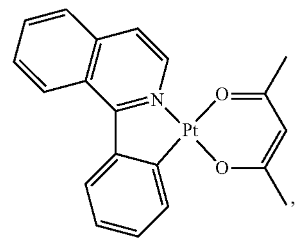
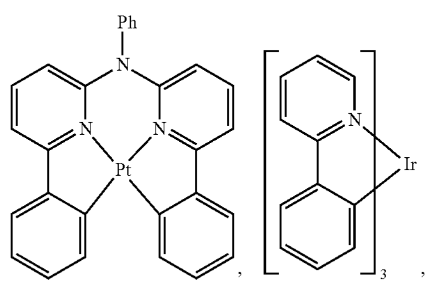
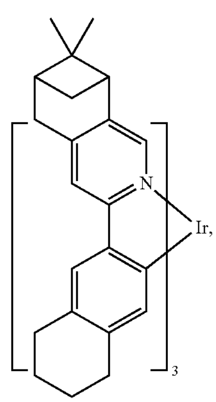
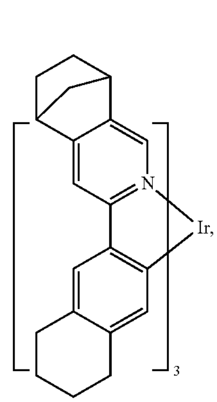

-continued
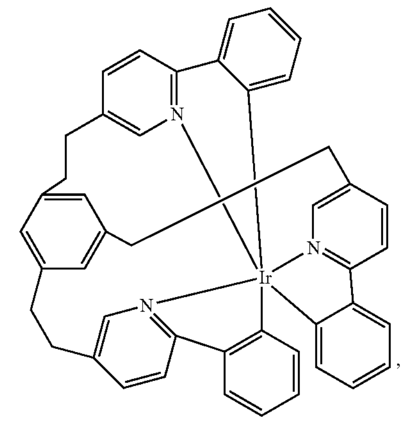
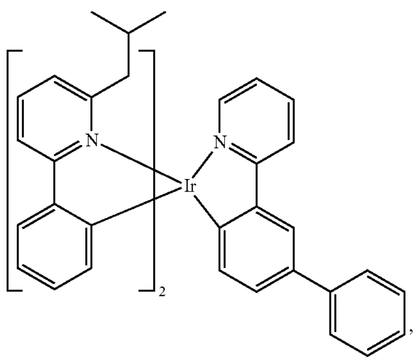
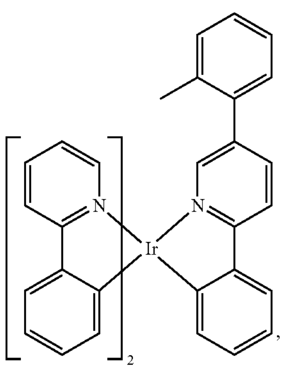
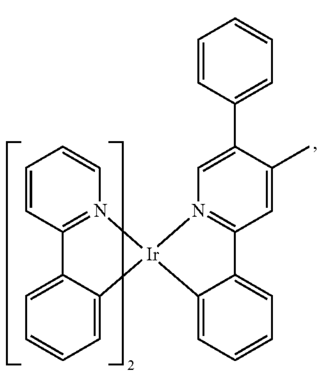
-continued
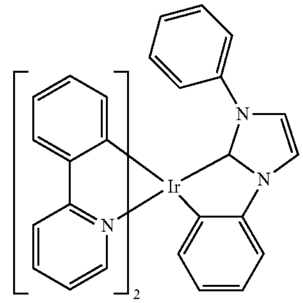
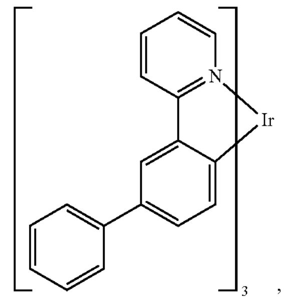
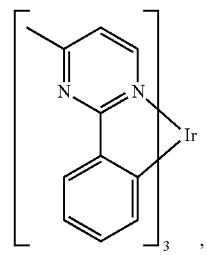
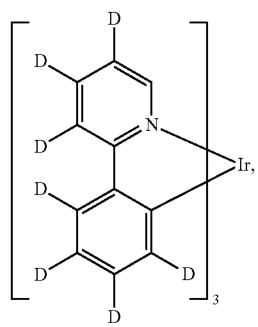
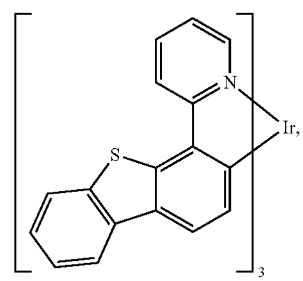
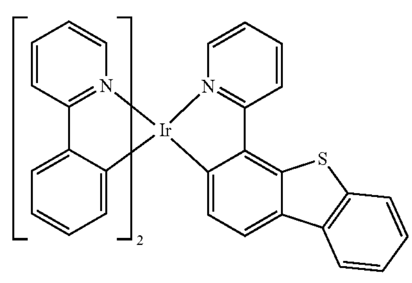

-continued
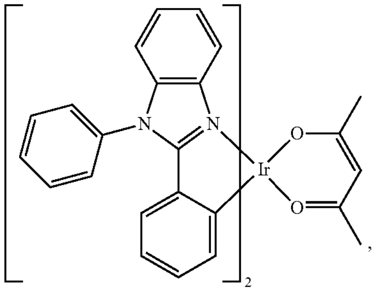
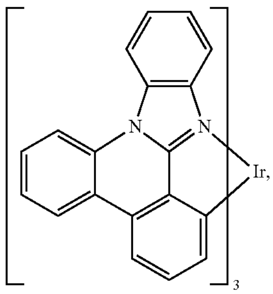
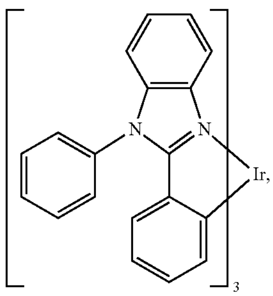
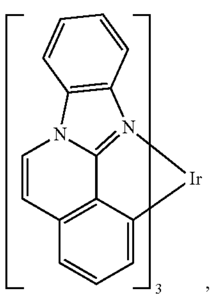
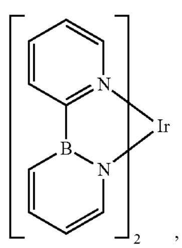
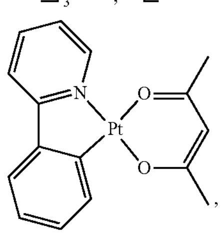
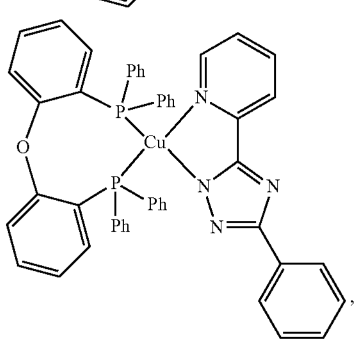
-continued
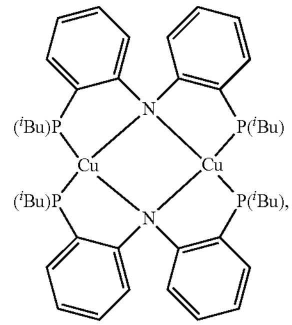
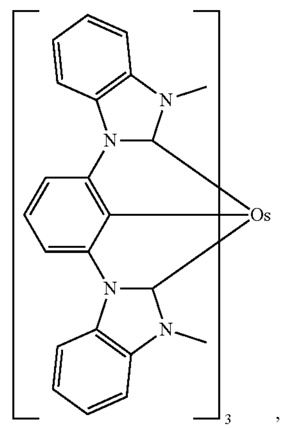
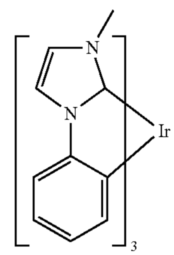
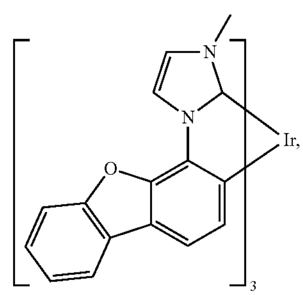
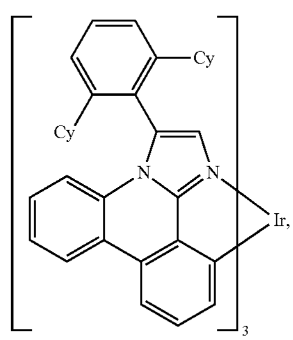
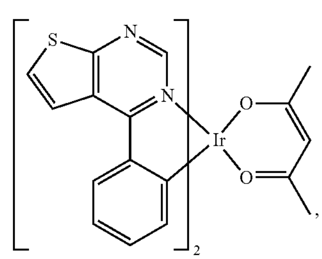

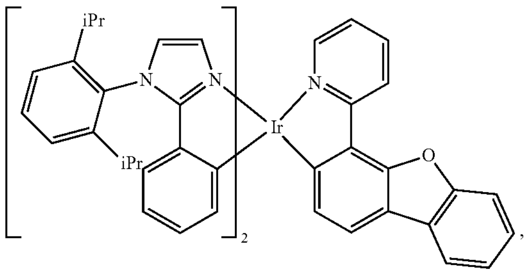
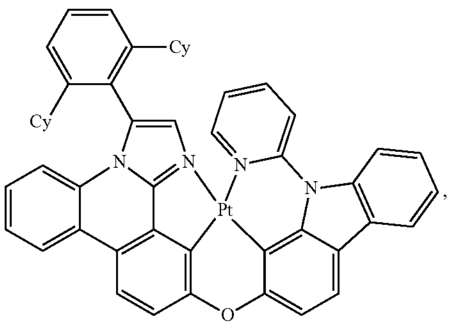
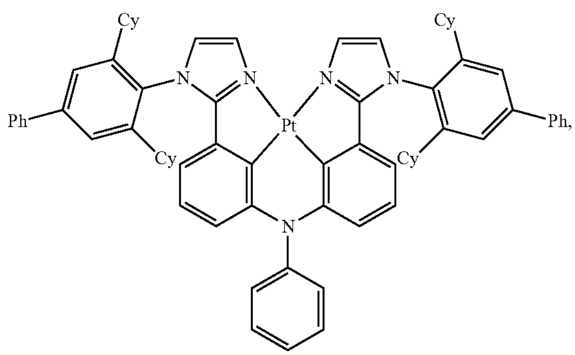
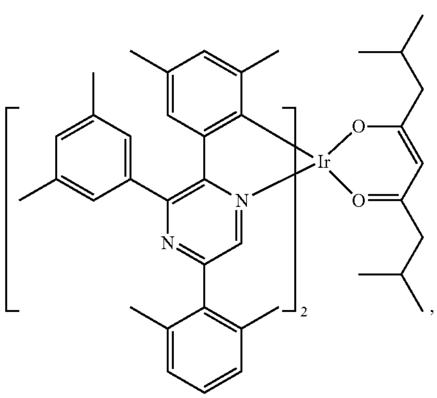
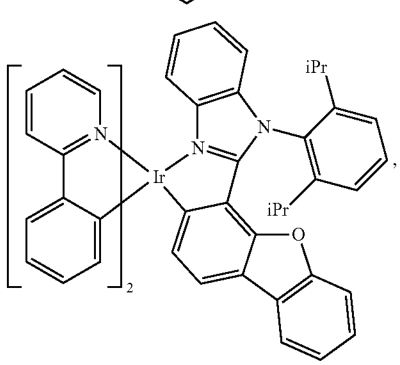
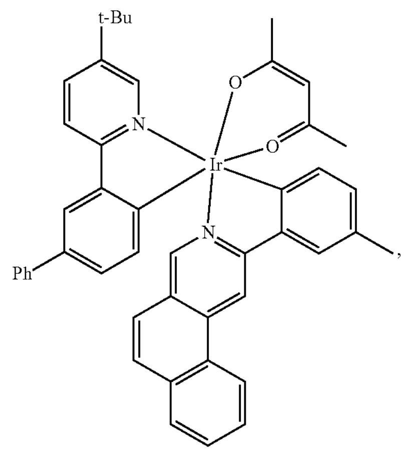
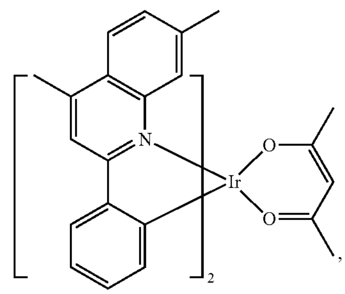
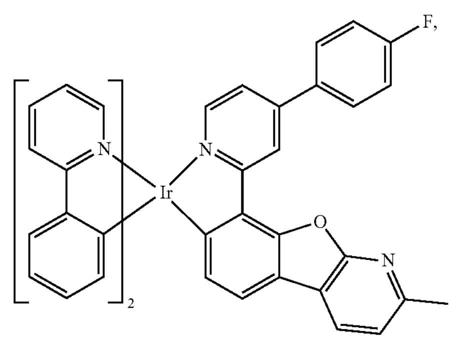
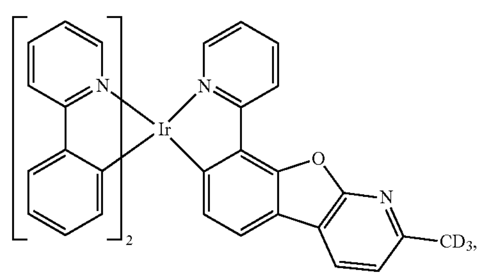
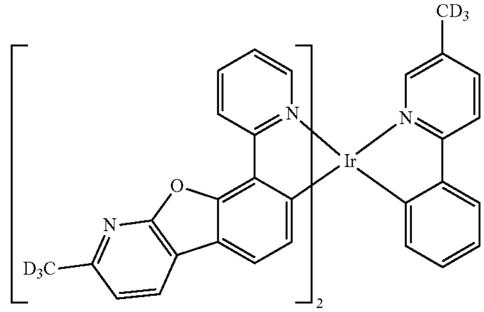

-continued
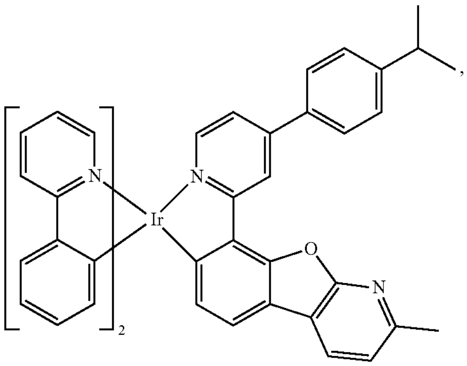
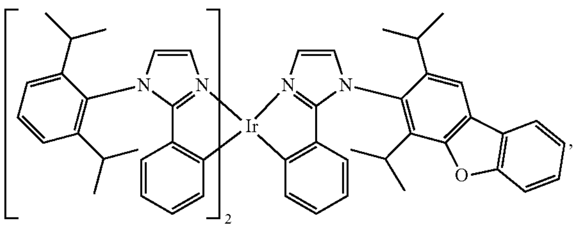
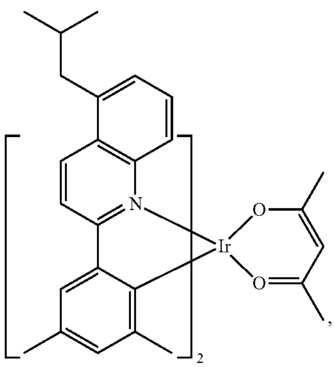
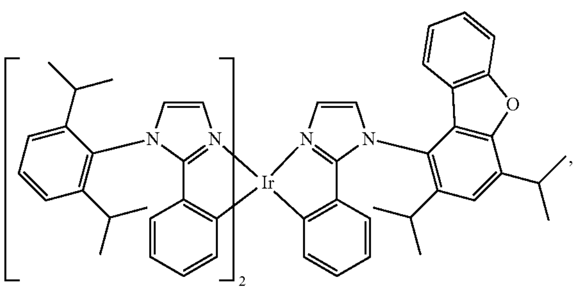
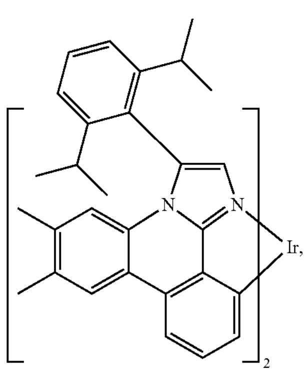
-continued
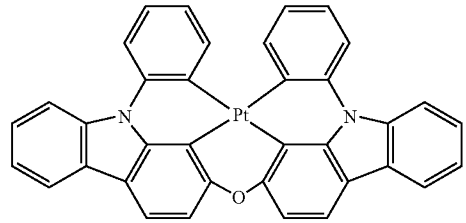
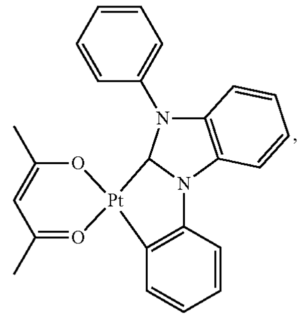
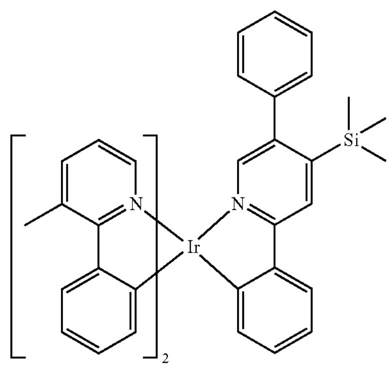
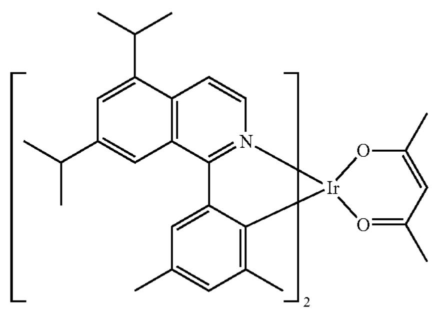
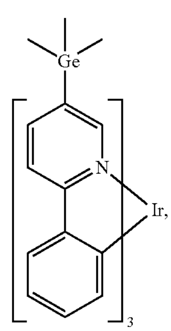

-continued
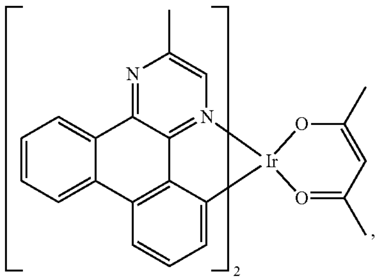
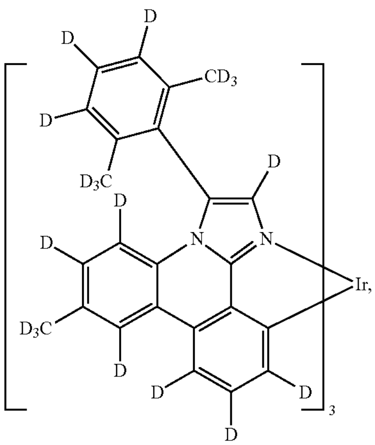
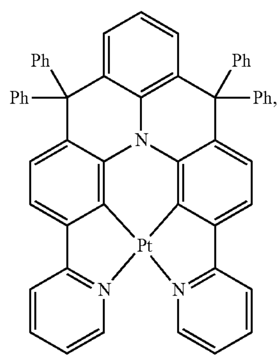
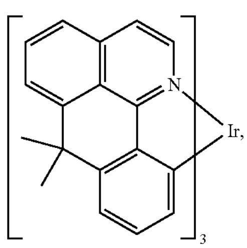
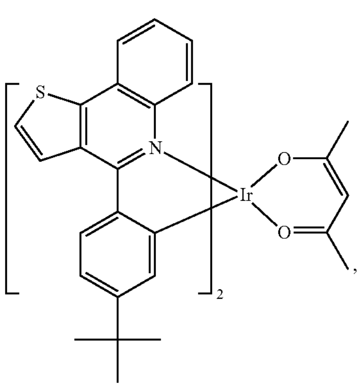
-continued
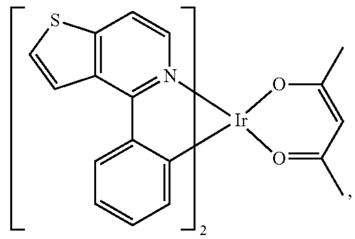
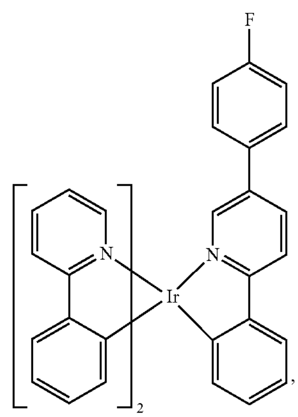
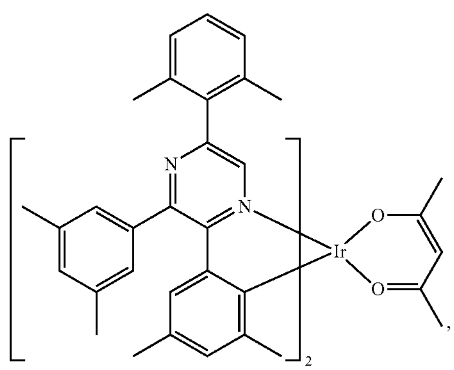
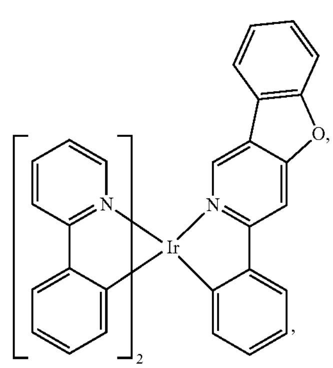

-continued
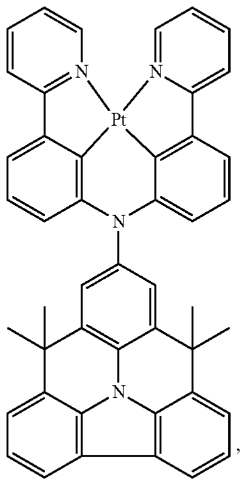
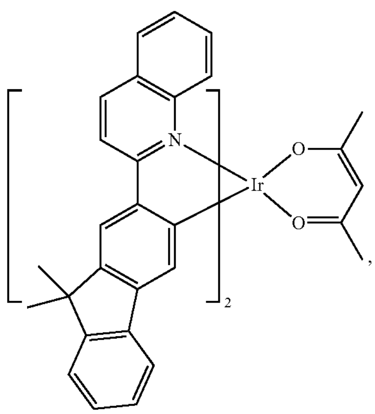
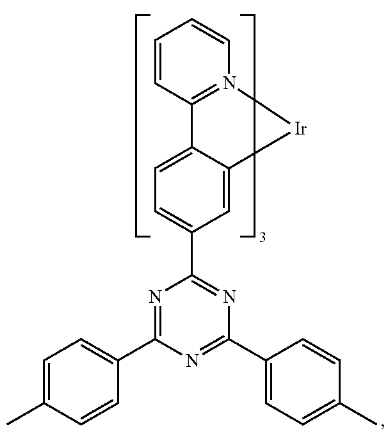
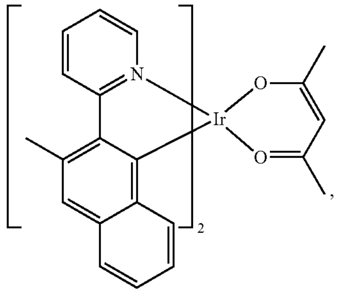
-continued
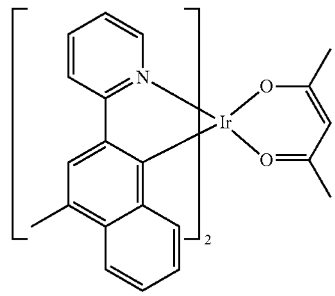
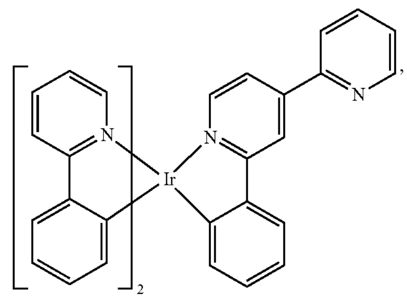
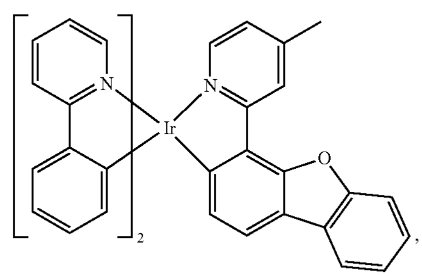
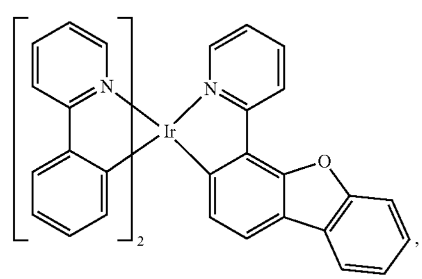
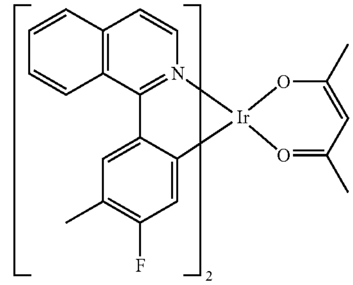

-continued
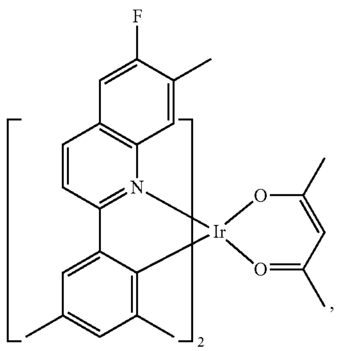
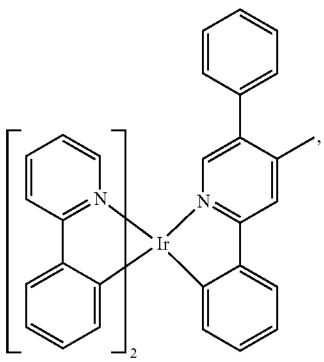
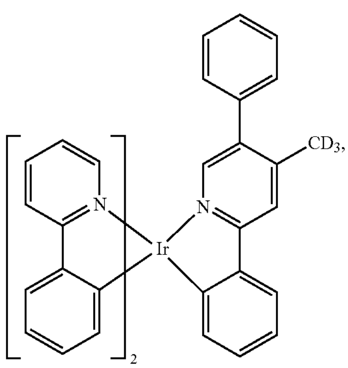
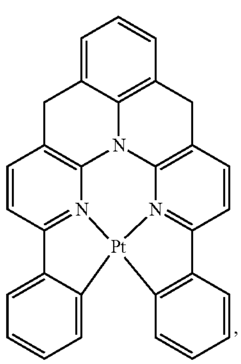
-continued
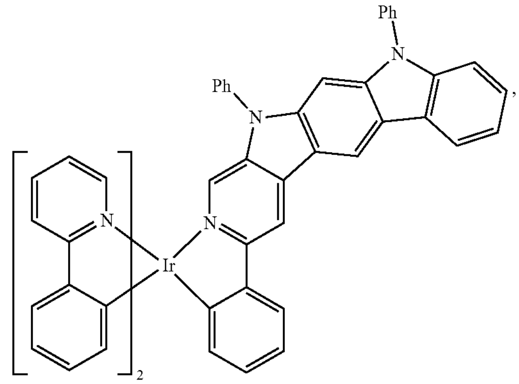
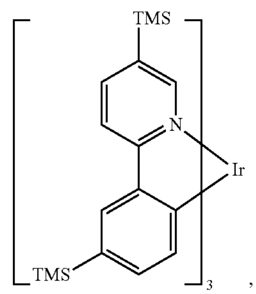
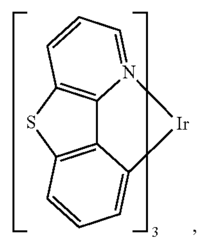
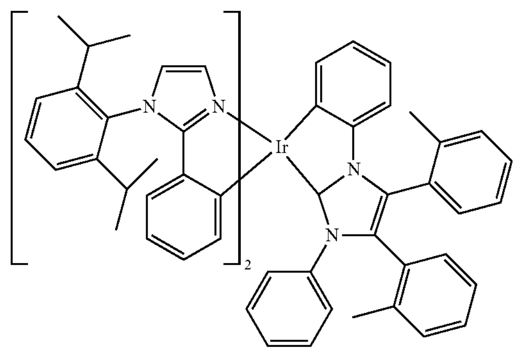
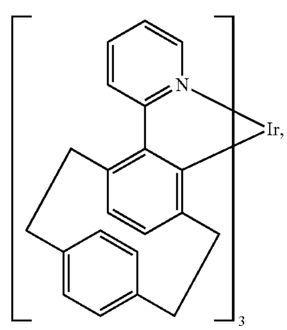
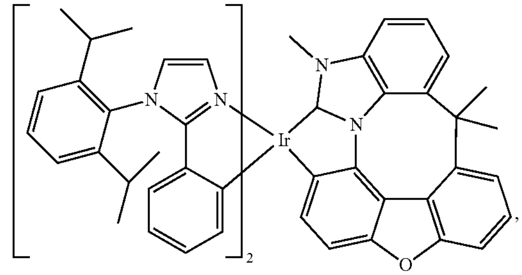

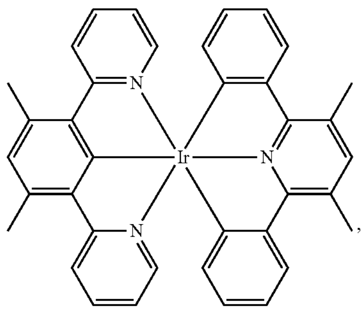
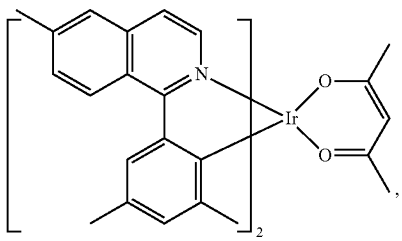
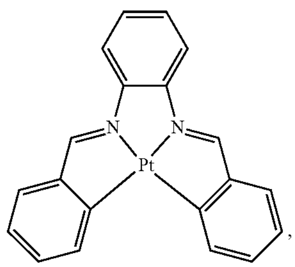
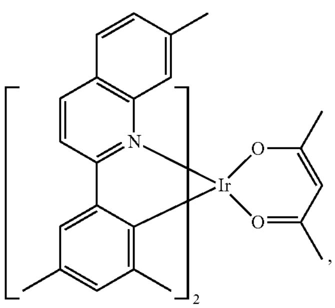
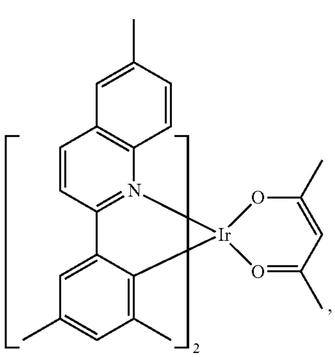
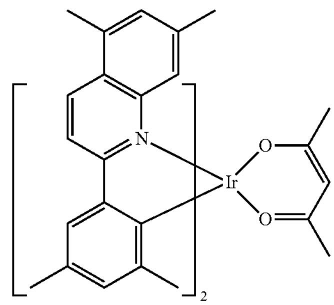
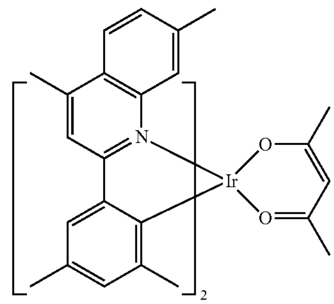
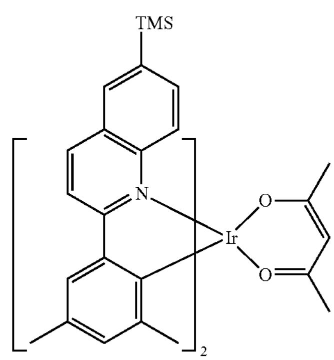
TMS
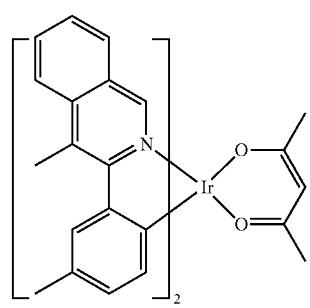
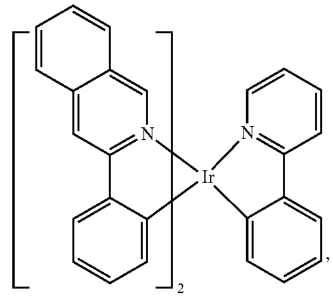

-continued
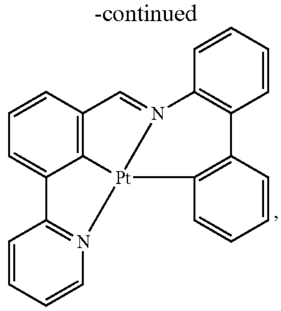
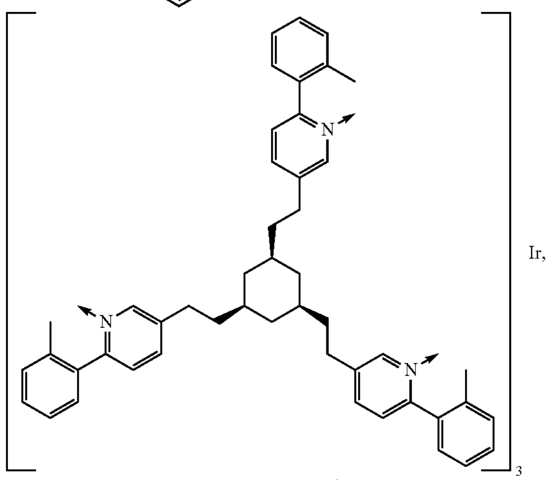
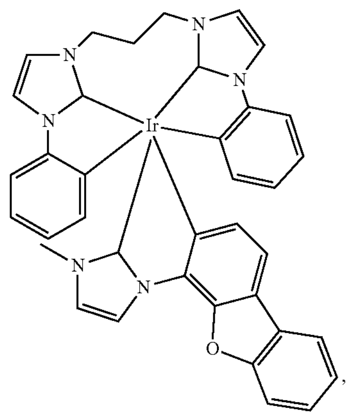
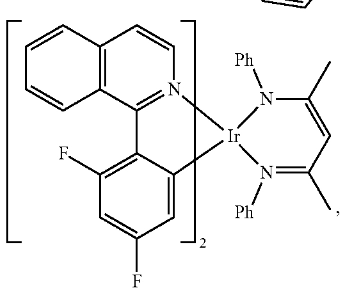
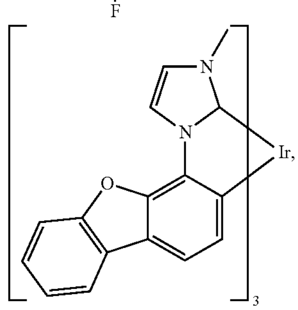
-continued
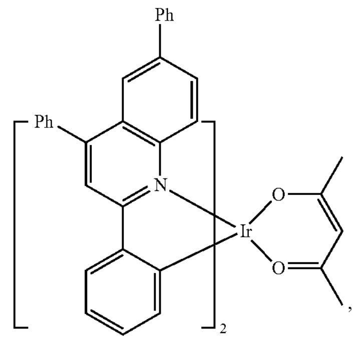
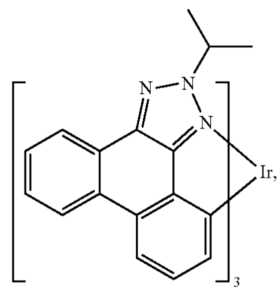
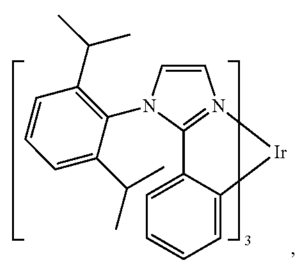
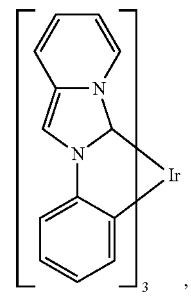
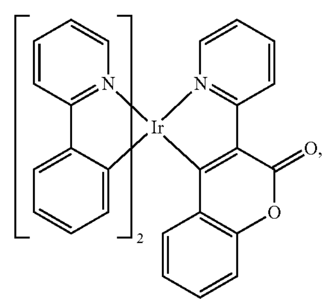
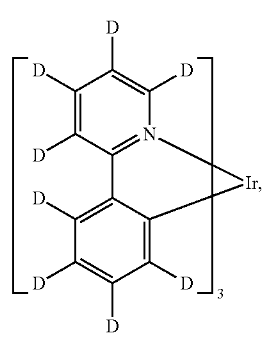
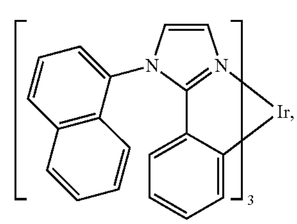

-continued

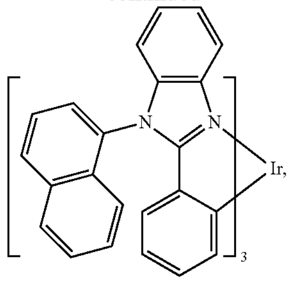

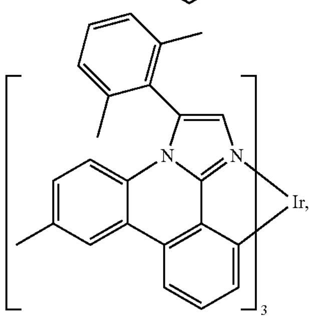

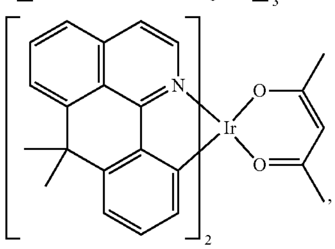

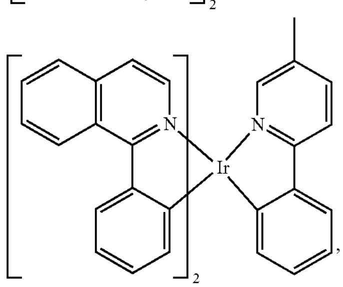

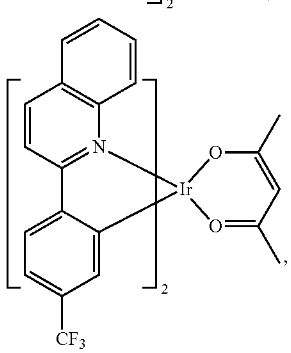

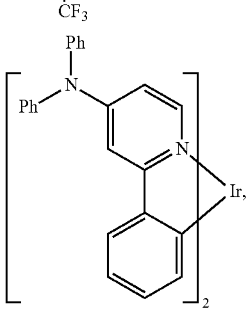

and

-continued

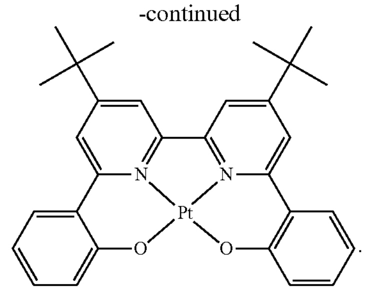

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

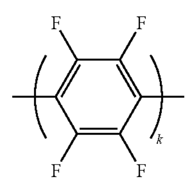

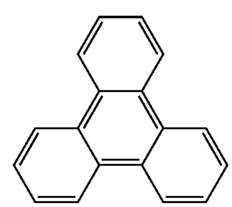

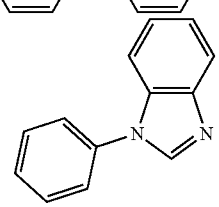

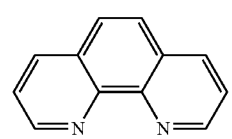

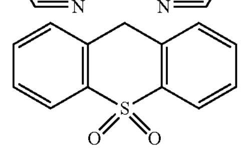

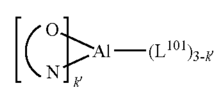

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

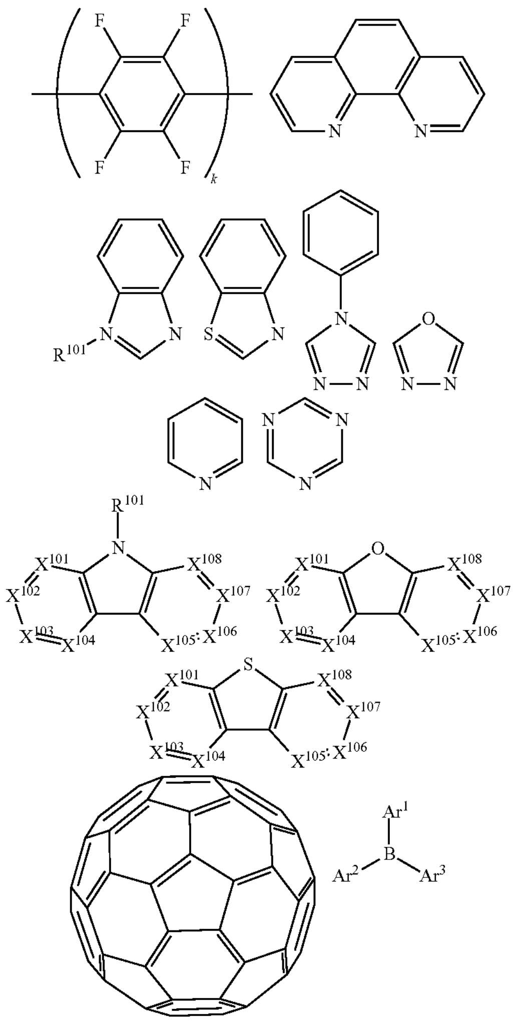

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

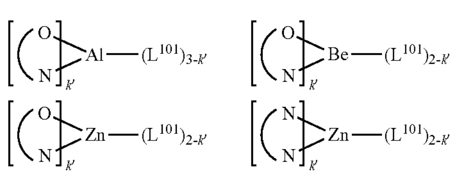

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

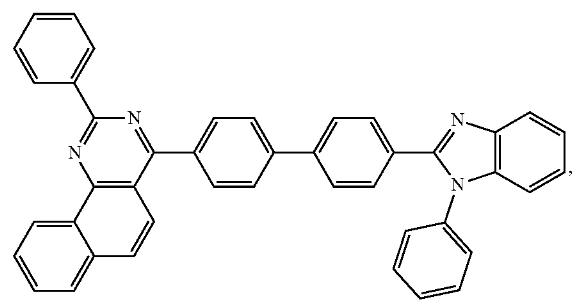

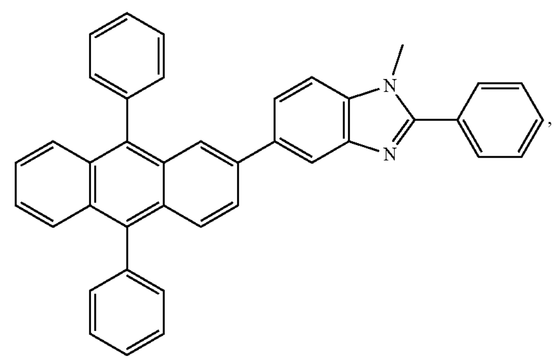

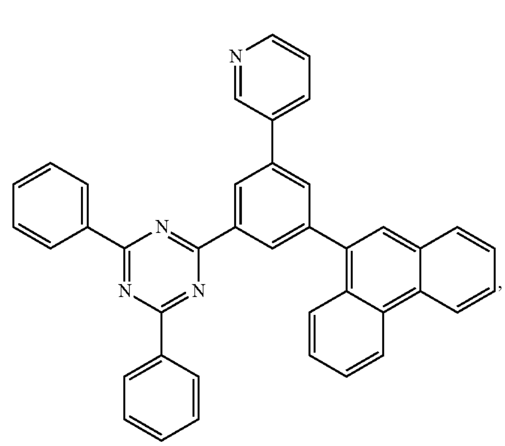

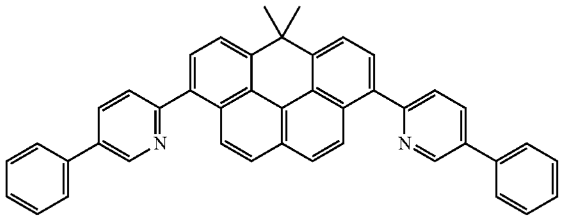
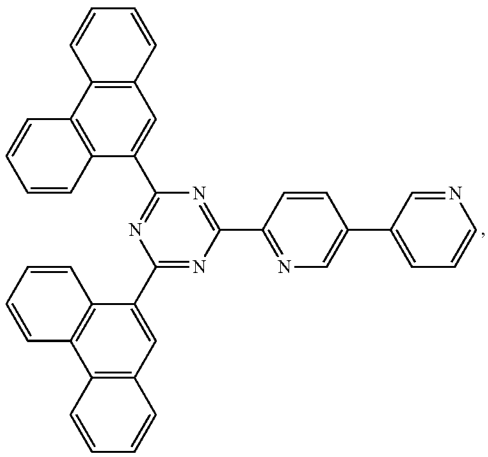
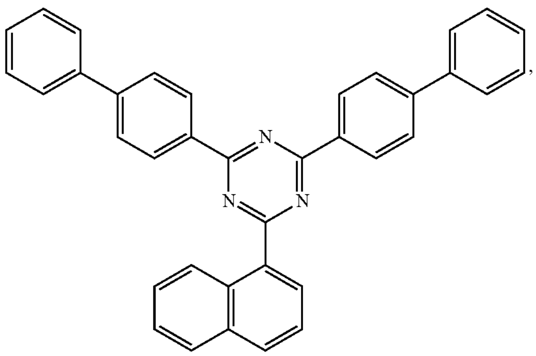
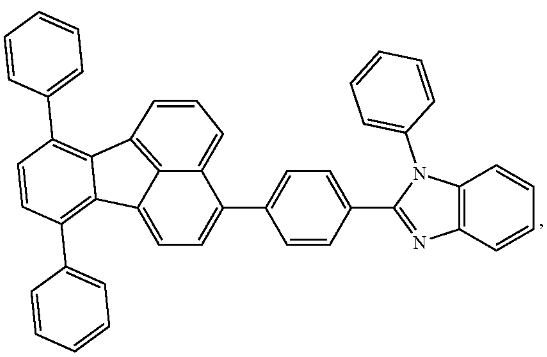
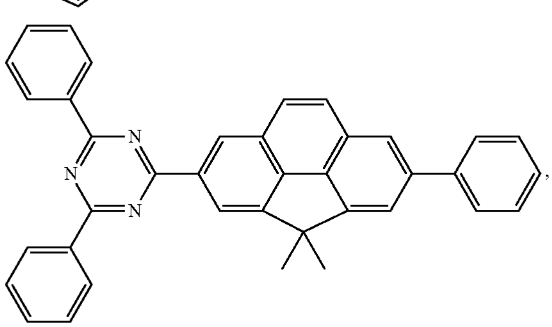
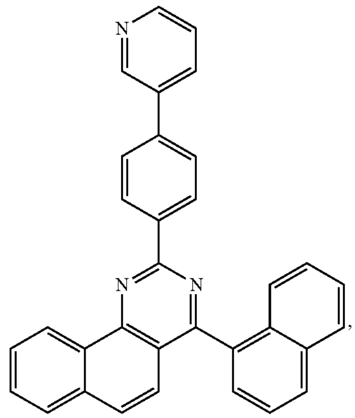
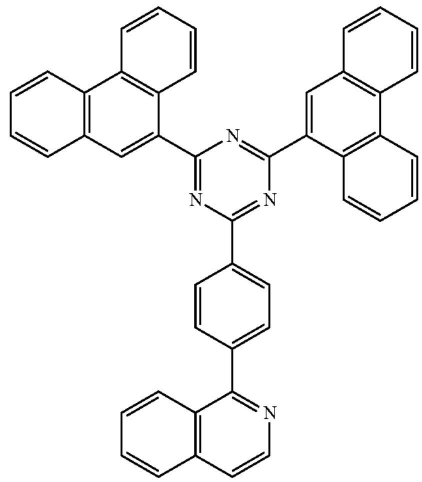
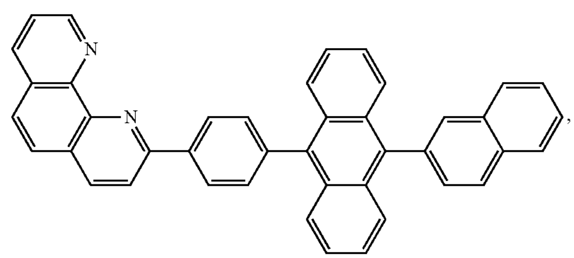
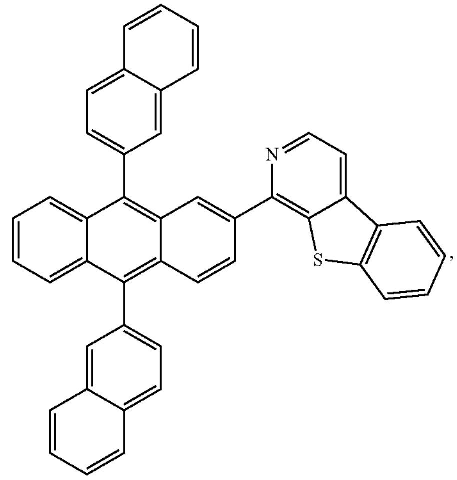

-continued
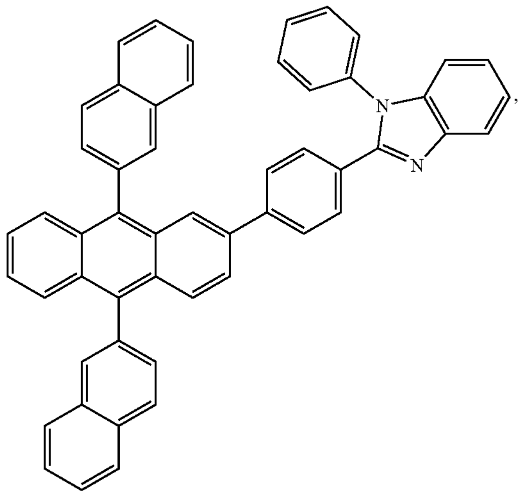
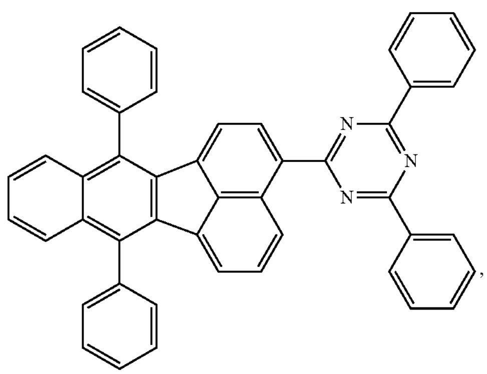
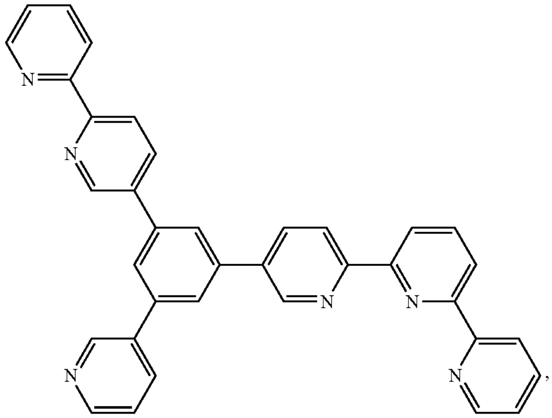
-continued
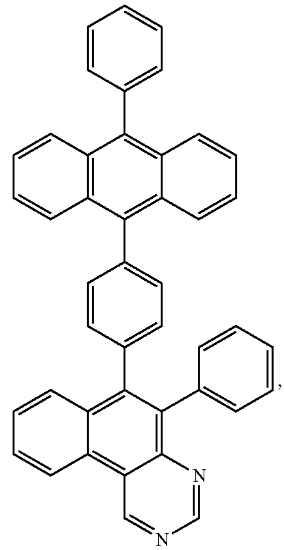
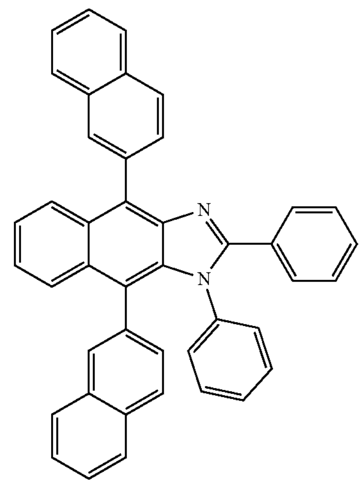
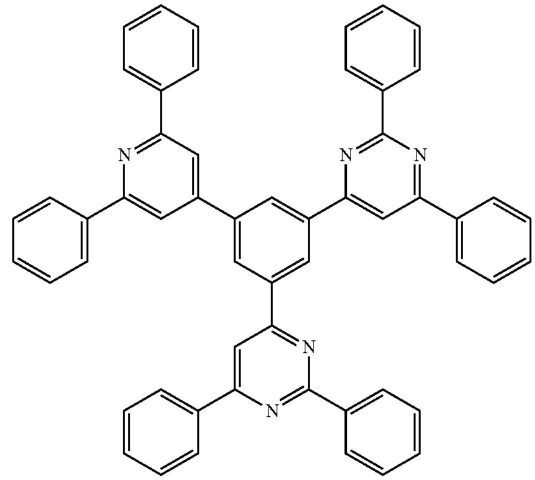

-continued
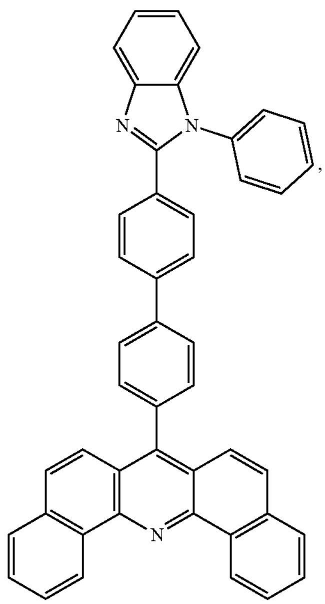
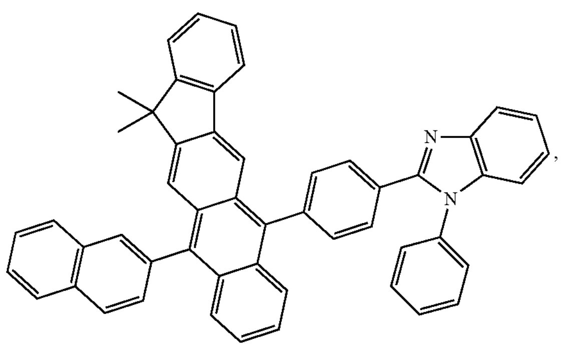
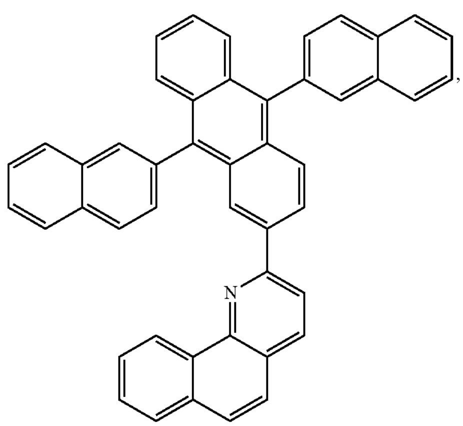
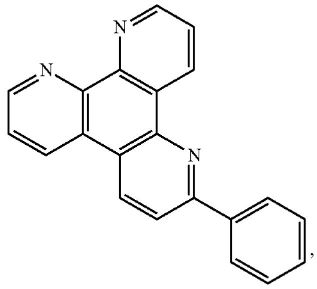
-continued
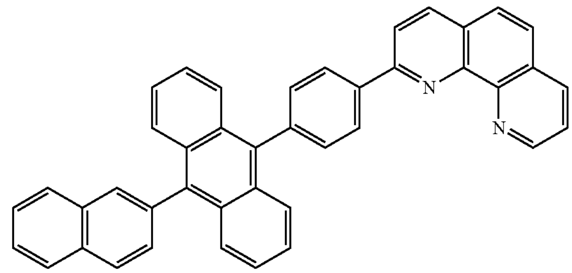
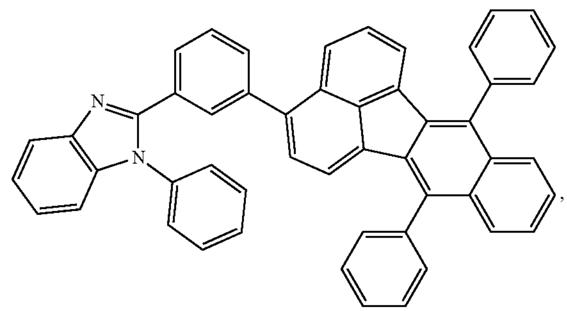
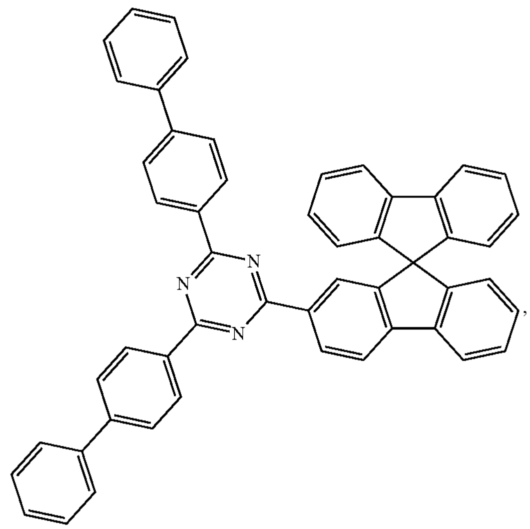
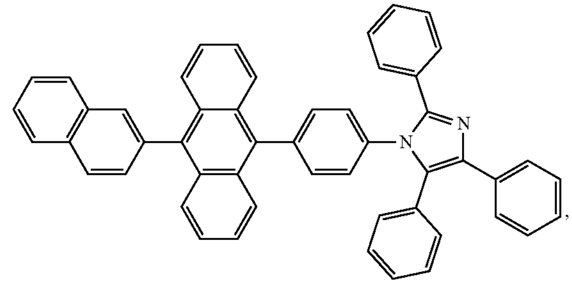
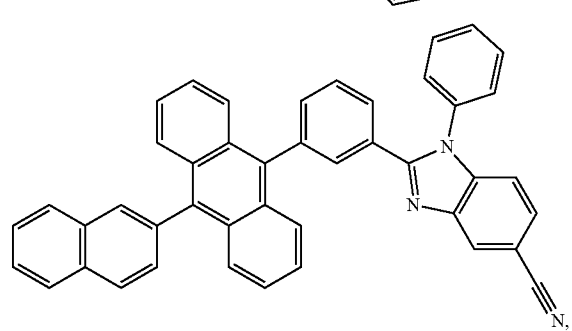

-continued

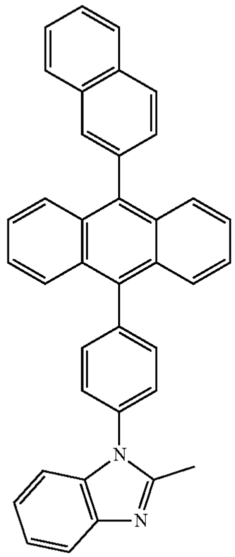

,

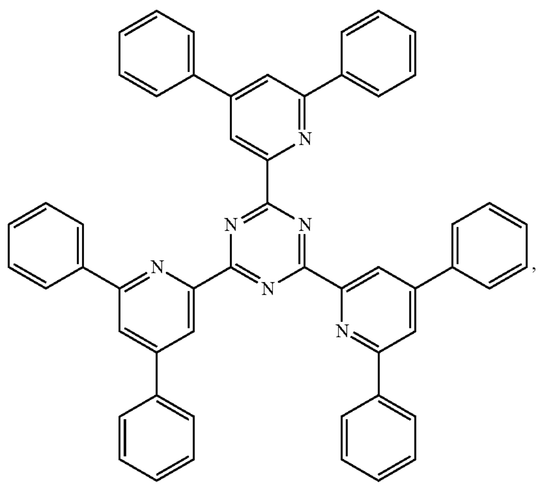

,

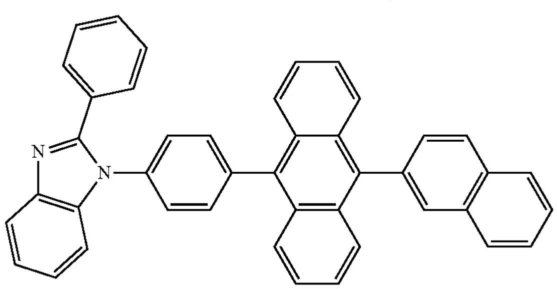

,

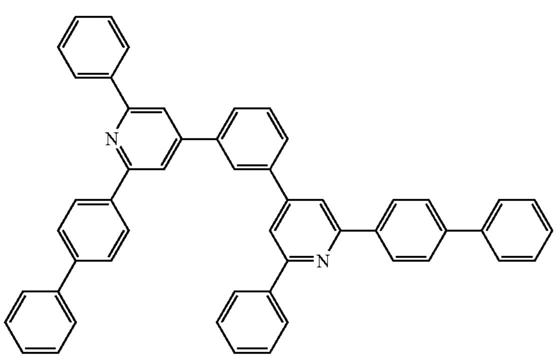

,

-continued

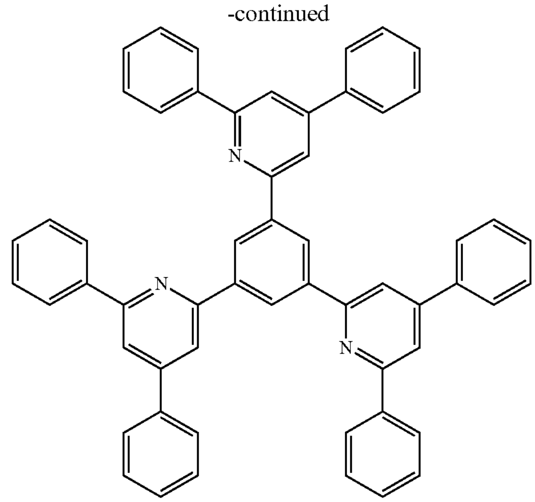

,

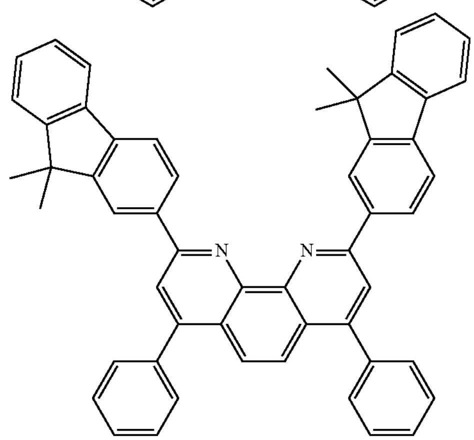

, and

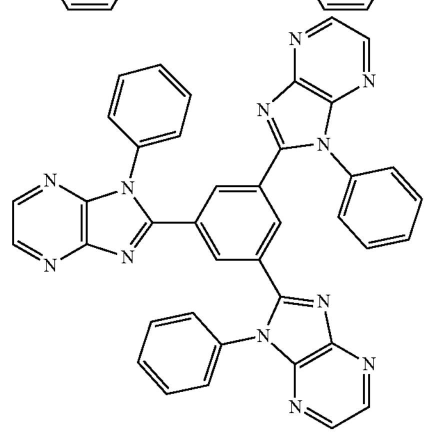

.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL

An exemplary luminescent bimetallic Au(I) complex comprised of N-heterocyclic carbene (NHC) and carbazole (Cz) ligands, i.e. (NHC')Au(NHC)AuCz has been synthesized and studied. Both carbene ligands in the bimetallic complex act as electron acceptors in tandem to increase the energy separation between the ground and excited state, which is higher than those found in either monometallic analog, (NHC)AuCz and (NHC')AuCz. A coplanar geometry designed into the tandem complex ensures sufficient electronic coupling between the n-orbitals of the ligands to impart a strong oscillator strength to the singlet intraligand charge-transfer ($^1$ICT) transition. Theoretical modeling indicates that the ICT excited state involves both NHC ligands. The tandem complex gives blue luminescence ($\lambda_{max}$=480 nm) with a high photoluminescent quantum yield ($\Phi_{PL}$0.80) with a short decay lifetime ($\tau$=0.52 μs). Temperature dependent photophysical studies indicate that emission is via thermally assisted delayed fluorescence (TADF) and give a small singlet-triplet energy difference ($\Delta E_{ST}$=50 meV, 400 $cm^{-1}$) consistent with the short TADF lifetime.

Two-coordinate $d^{10}$ coinage metal (Cu, Ag and Au) complexes are promising photoluminescent materials as they can have high photoluminescent quantum yields ($F_{PL}$), short luminescence decay lifetimes (t), and emission colors tunable over the entire visible spectrum, making this class of luminophores strong competitors to transition metal phosphors that contain Ru, Os, Ir and Pt (Hamze, et al., Science 2019, 363, 601-606; Hamze, et al., J. Am. Chem. Soc. 2019, 141, 8616-8626; Shi, et al., J. Am. Chem. Soc. 2019, 141, 3576-3588; Li, et al., J. Am. Chem. Soc. 2020, 142, 6158-6172; Hamze, et al., Frontiers in Chemistry 2020, 8, 401; Gernert, et al., J. Am. Chem. Soc. 2020, 142, 8897-8909; Chotard, et al., Chem. Mater. 2020, 32, 6114-6122; Romanov, et al., Chem. Sci. 2020, 11, 435-446). Unlike the noble metal phosphors which luminesce solely from triplet states, the coinage metal complexes emit via thermally assisted delayed fluorescence (TADF) (Ravinson and Thompson, Materials Horizons 2020, 7, 1210-1217). These two-coordinate complexes have either an amide or aryl ligand that serves as an electron donor (D) and a NHC ligand that serves as an electron acceptor (A). Luminescence originates from an interligand charge transfer (ICT) transition between these D-A moieties. The energy of the ICT state is relatively insensitive to the identity of the metal atom; however, the radiative rate for emission ($k_r$) increases with the atomic number of the metal atom. The linear geometry leads to a large spatial separation between the ligated atoms (~4 Å), restricting the overlap between the p-orbitals of the D and A ligands, and consequently limiting the energy gap between lowest singlet ($S_1$) and triplet ($T_1$) states ($\Delta E_{ST}$). A small $\Delta E_{ST}$ favors thermal population of the singlet state, which improves the luminescence efficiency for TADF by increasing the radiative rate for emission. Pure organic TADF molecules have distinct lifetimes for prompt (t=1-100 ns) and delayed (t=1-1000 ms) emission that are governed by $\Delta E_{ST}$ and the rate for intersystem crossing (ISC<$10^7$ $s^{-1}$) between singlet and triplet states (Yang, et al., Chem. Soc. Rev. 2017, 46, 915-1016; Li, et al., Angew. Chem. Int. Ed. 2019, 58, 11301-11305; Li, et al., Angew. Chem. Int. Ed. 2019, 58, 9088-9094; Hu, et al., Angew. Chem. Int. Ed. 2019, 58, 8405-8409; Luo, et al., Adv. Mater. 2020, 32, 2001248; Izumi, et al., J. Am. Chem. Soc. 2020, 142, 1482-1491). The slow ISC rates in these organic compounds lead to decreased rates for radiative decay. In contrast, the coinage metal TADF complexes have intersystem crossing rates fast enough (ISC≥$10^{10}$ $s^{-1}$) to outcompete the radiative rates for the $S_1$ state, which leads to extremely fast prompt (t<200 ps) and delayed (t=0.5-3 ms) emission. The radiative decay rates for the two-coordinate complexes can be correspondingly quite high, on the order of $10^5$-$10^6$ $s^{-1}$, which ultimately leads to high luminescence efficiency.

Herein the synthesis and characterization of an exemplary bimetallic Au(I) complex with an electron donor (carbazolyl) and acceptor (tandem-carbene) structure, (MAC)Au(AAC)AuCz ($Au_2^{CC}$, MAC=N,N'-bis(diisopropylphenyl)-5,5-dimethyl-4-keto-tetrahydropyrimidin-2-ylidene, AAC=N,N'-bis(2,6-diisopropylphenyl)-4-methyl-6-keto-dihydropyrimidin-2-ylidene, Cz=N-carbazolyl) and the corresponding mononuclear complex (AAC)AuCz ($Au^C$) (Scheme 1) is described. The increased Cz • • • NHC' donor-acceptor distance in this tandem structure leads to a corresponding decrease in energy for $\Delta E_{ST}$. The resultant bimetallic $Au_2^{CC}$ complex has a high luminescence efficiency ($\Phi_{PL}$=0.8) and fast rate for radiative decay ($k_r$=1.5×$10^6$ $s^{-1}$). Interestingly, the energy of the ICT state for the bimetallic complex is markedly blue-shifted relative to the mono-metallic analog ($Au^C$). Physical and theoretical analysis of these complexes demonstrates that these effects are brought about by properties unique to the tandem-carbene structure.

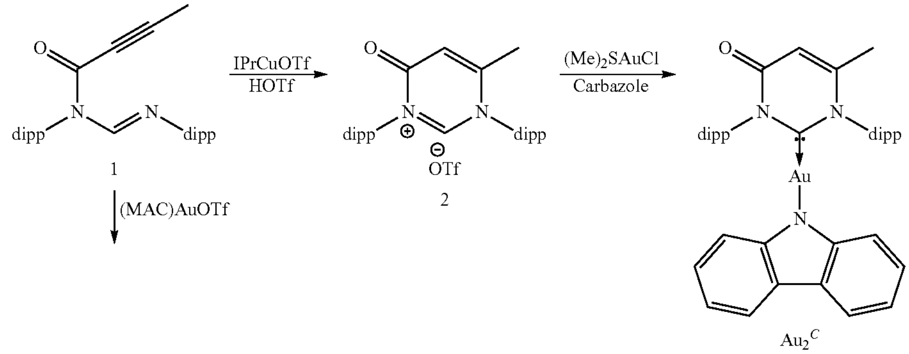

-continued

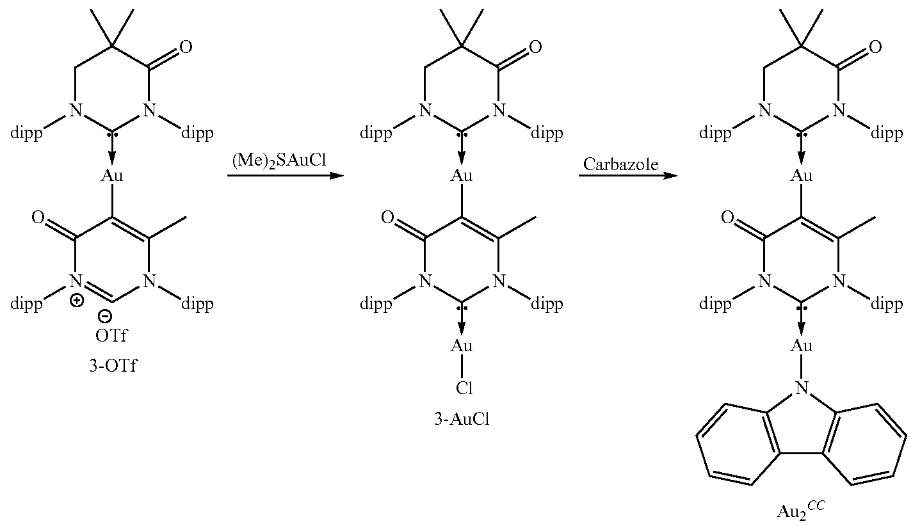

dipp = 2,6-diisopropyl phenyl

Non-radiative decay rate ($k_{nr}$) in coinage metal TADF complexes can be depressed by increasing the molecular rigidity and choosing ligands such that the excited state is not a metal-to-ligand-charge-transfer (MLCT), thus precluding a Renner-Teller distortion and the accompanying non-radiative decay channel (Li, et al., J. Am. Chem. Soc. 2020, 142, 6158-6172). Electronic coupling between the donor and acceptor ligands is favored by coplanar structure for the two ligands. In the absence of an MLCT state, the structure of the ground and excited state is largely controlled by steric interactions, which led to the choice of 2,6-diisopropyl phenyl (dipp) moieties in both NHCs (vide infra). The AAC ligand precursor (2) was synthesized using a 6-endo-dig amidiniumation reaction between N-propargyl formamidine (1) and IPrCuOTf (IPr=1,3-bis(2,6-diisopropylphenyl)imidazol-2-ylidene, OTf=trifluoromethanesulfonate) (Wang, et al., *Nat. Commun.* 2017, 8, 14625). A similar ring closure reaction carried out using stoichiometric amounts of 1 and (MAC)AuOTf provided the mononuclear intermediate complex (3-OTf) as a carbene precursor. No cyclization products are formed using the chloride analogue (MAC)AuCl. The monometallic complex ($Au^C$) was synthesized according to the previous method (Hamze, et al., J. Am. Chem. Soc. 2019, 141, 8616-8626). Treatment of 3-OTf with potassium bis (trimethylsilyl)amide followed by reaction with ($Me_2S$) AuCl provided the binuclear chloride complex (3-AuCl). Reaction of 3-AuCl with NaCz led to formation of the bimetallic complex($Au_2^{CC}$), which was obtained as yellow crystalline solids.

Figure 3:
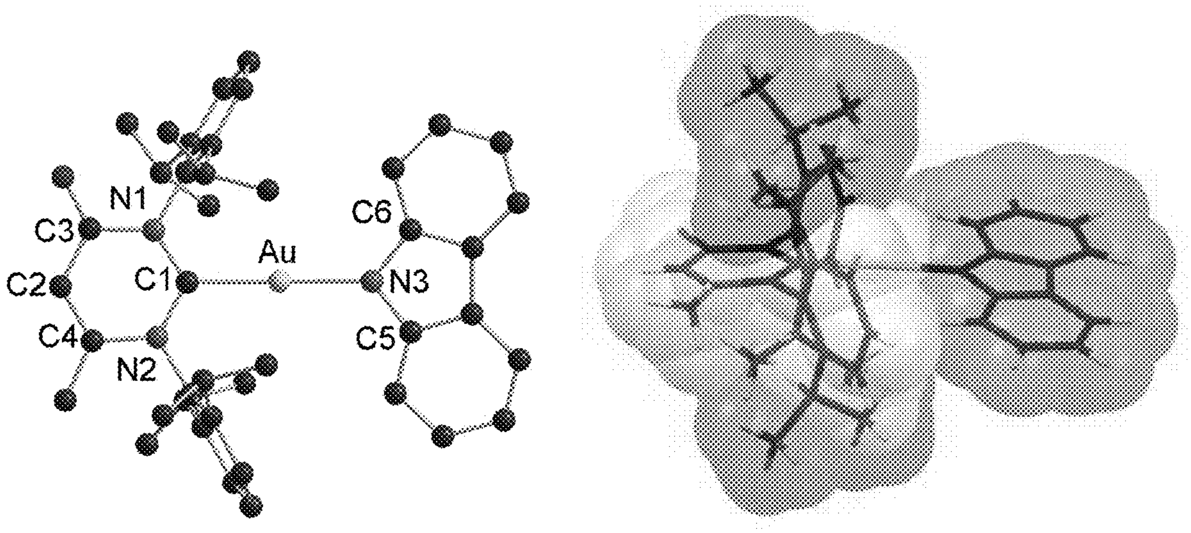
FIG. 3 is a depiction of single crystal structures of $Au^{C}$ and 3-OTf. C: black, N: blue, O: red, Au: gold. Counter ion and solvent molecules are omitted for clarity. In space filling diagrams, the isopropyl moieties (purple), methyl group in AAC (orange) and Cz ligand (green) are highlighted.
Figure 3:
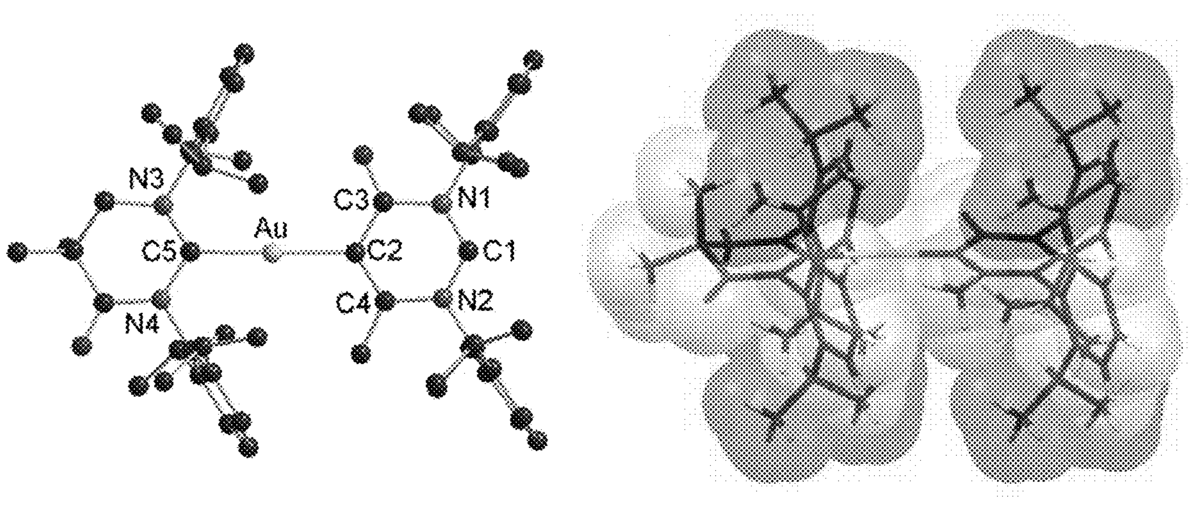
Figure 4:
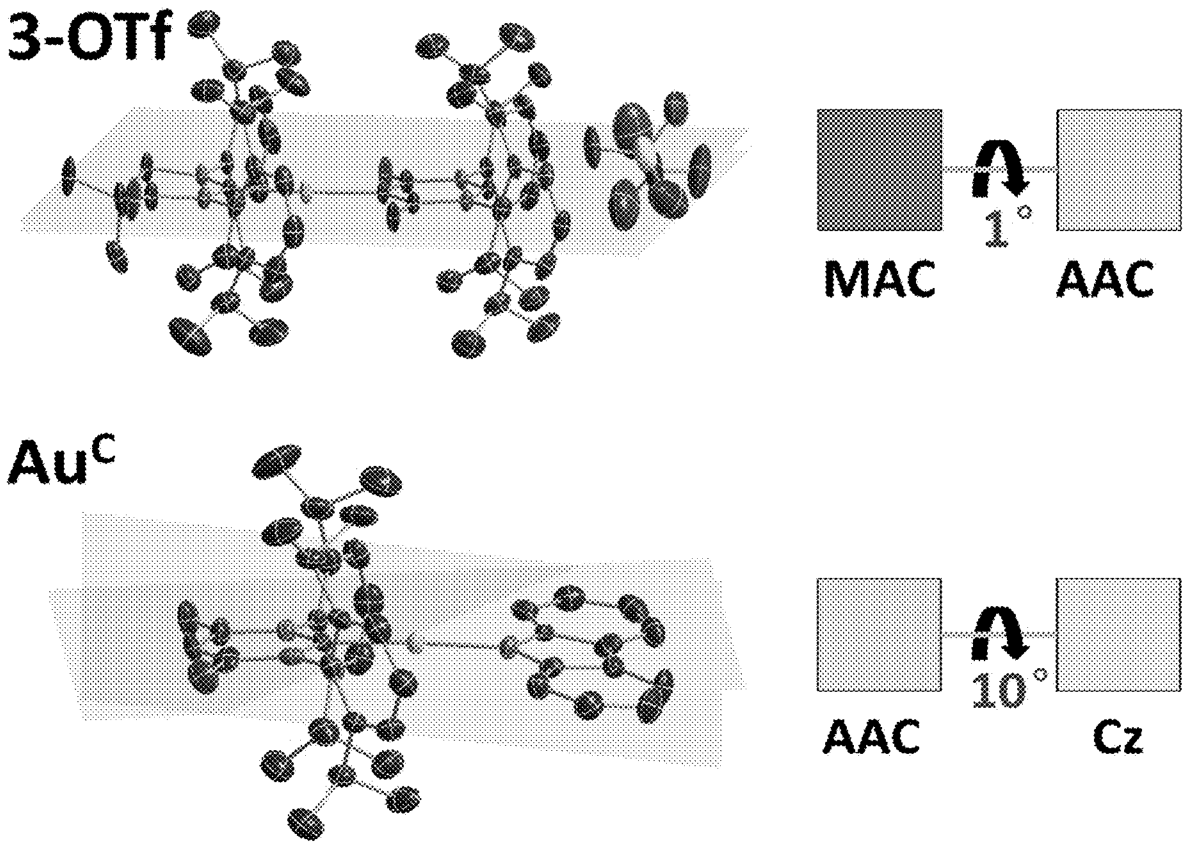
FIG. 4 depicts ORTEP diagrams of 3-OTf and $Au^{C}$ and the dihedral angles between ligands. C: black, N: blue, O: red, Au: gold. The H atoms and solvent molecules are omitted for clarity.

Single crystal X-ray structures were determined for $Au^C$ and 3-OTf. The isopropyl groups of the dipp moieties lie above and below the plane of the carbene (FIG. 3), forming a "pocket" for the adjacent coordinated ligand that stabilizes a coplanar arrangement of the two ligands. The interligand dihedral angles in $Au^C$ and 3-OTf are 11° and ~1°, respectively (FIG. 4). No X-ray quality crystals of $Au_2^{CC}$ were successfully prepared; however, the structures of $Au^C$ and 3-Off represent the two halves of $Au_2^{CC}$ and therefore suggest that a similar coplanar conformation exists for the Cz and two NHC ligands in the bimetallic complex.

Figure 5:
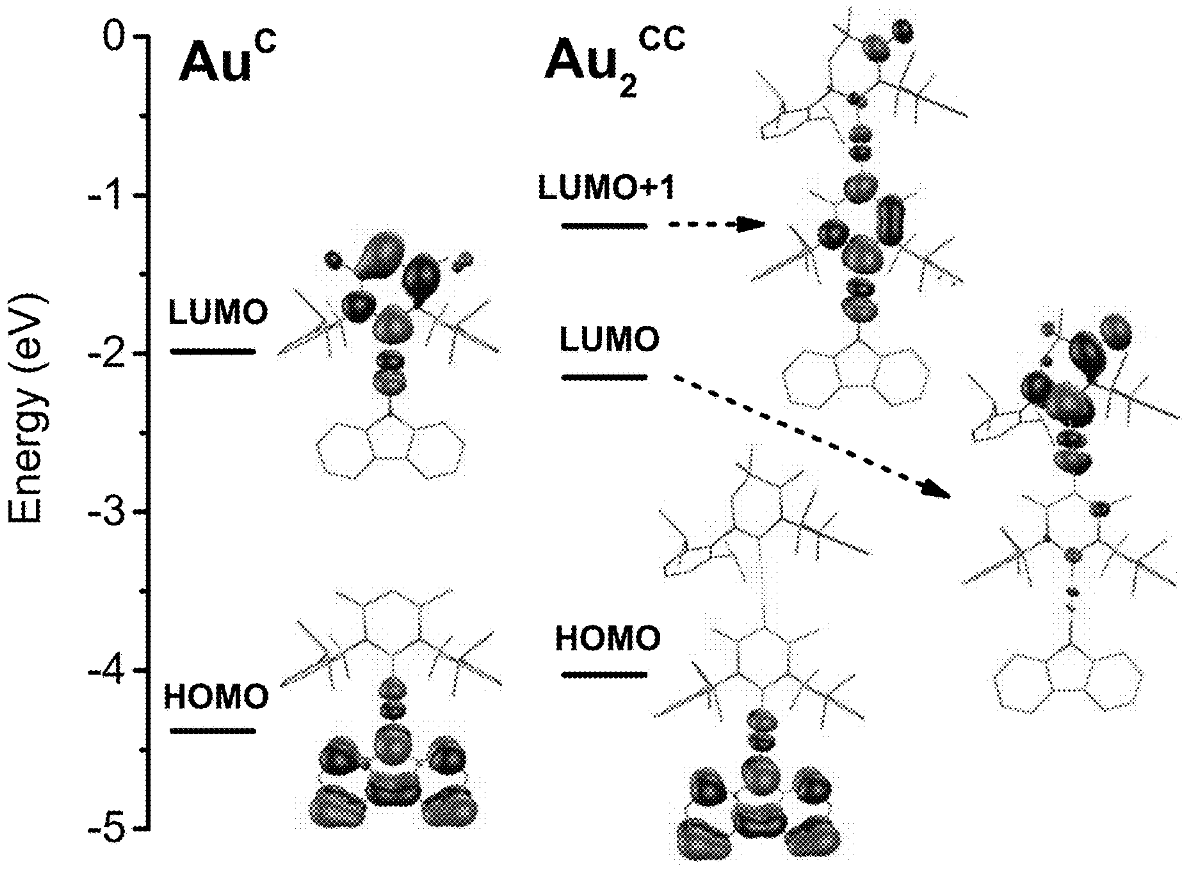
FIG. 5 depicts the calculated frontier molecular orbitals (MOs) of $Au^{C}$ and $Au_2^{CC}$.
Figure 6:
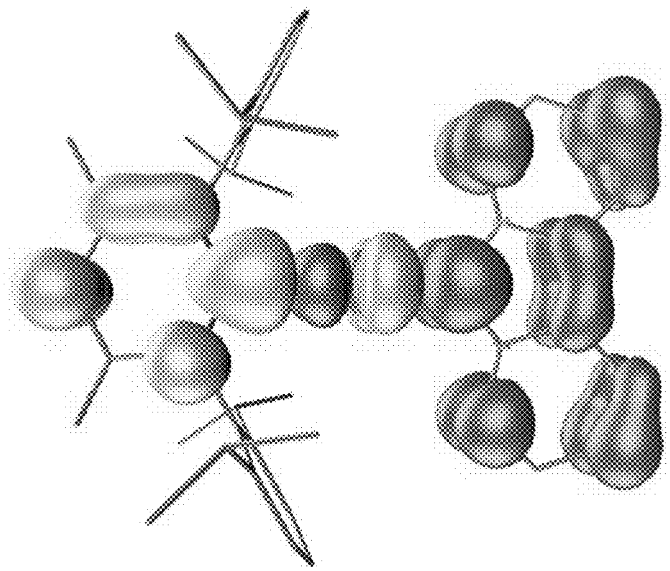
FIG. 6 depicts the natural transition orbitals (NTOs) for the $S_1$ states of $Au^{C}$ and $Au_2^{CC}$.
Figure 6:
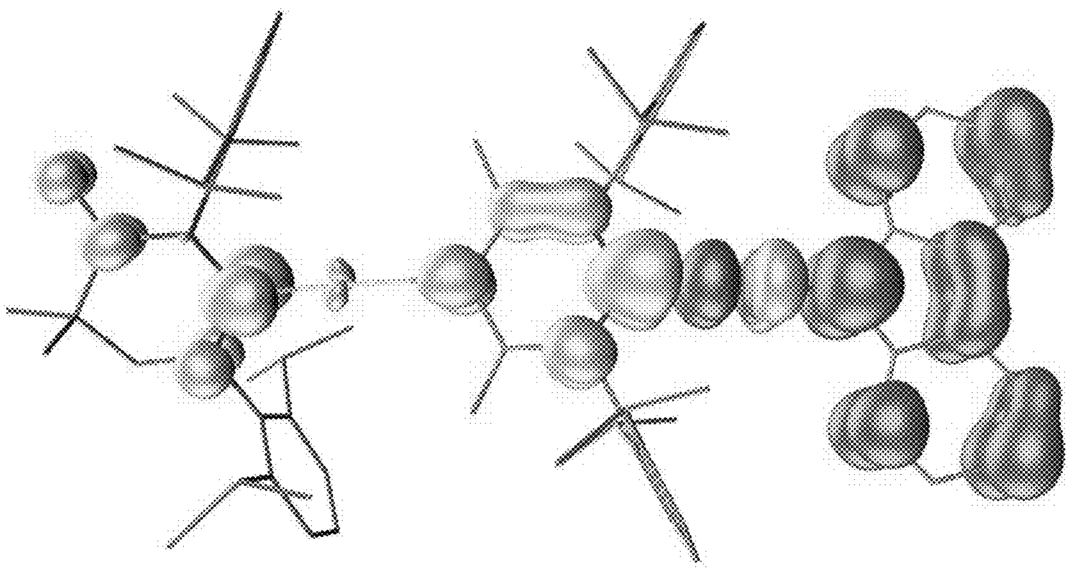
Figure 7:
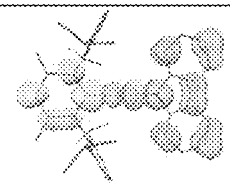
FIG. 7 depicts NTO analyses of $Au^{C}$ and $Au_2^{CC}$ (green: hole, yellow: electron).
Figure 7:
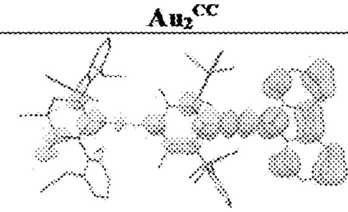
Figure 7:
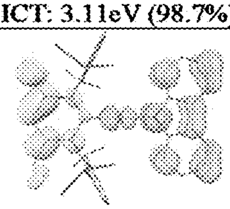
Figure 7:
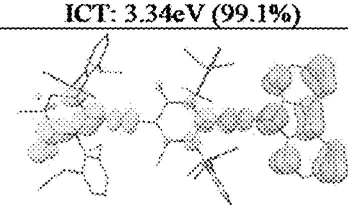
Figure 7:
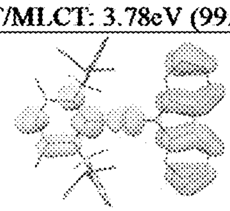
Figure 7:
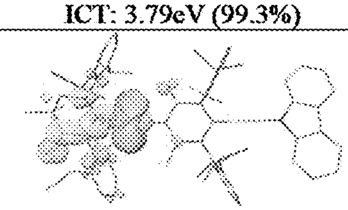
Figure 7:
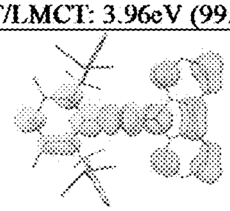
Figure 7:
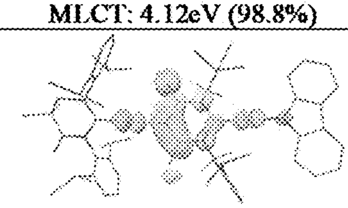
Figure 7:
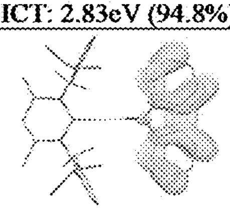
Figure 7:
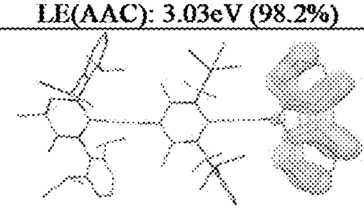
Figure 7:
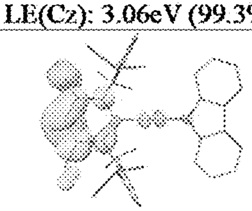
Figure 7:
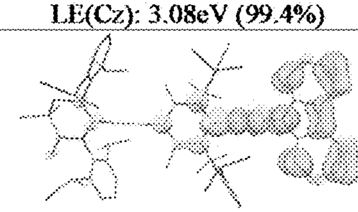
Figure 7:
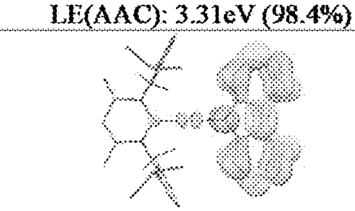
Figure 7:
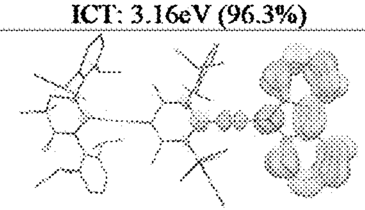
Figure 8:
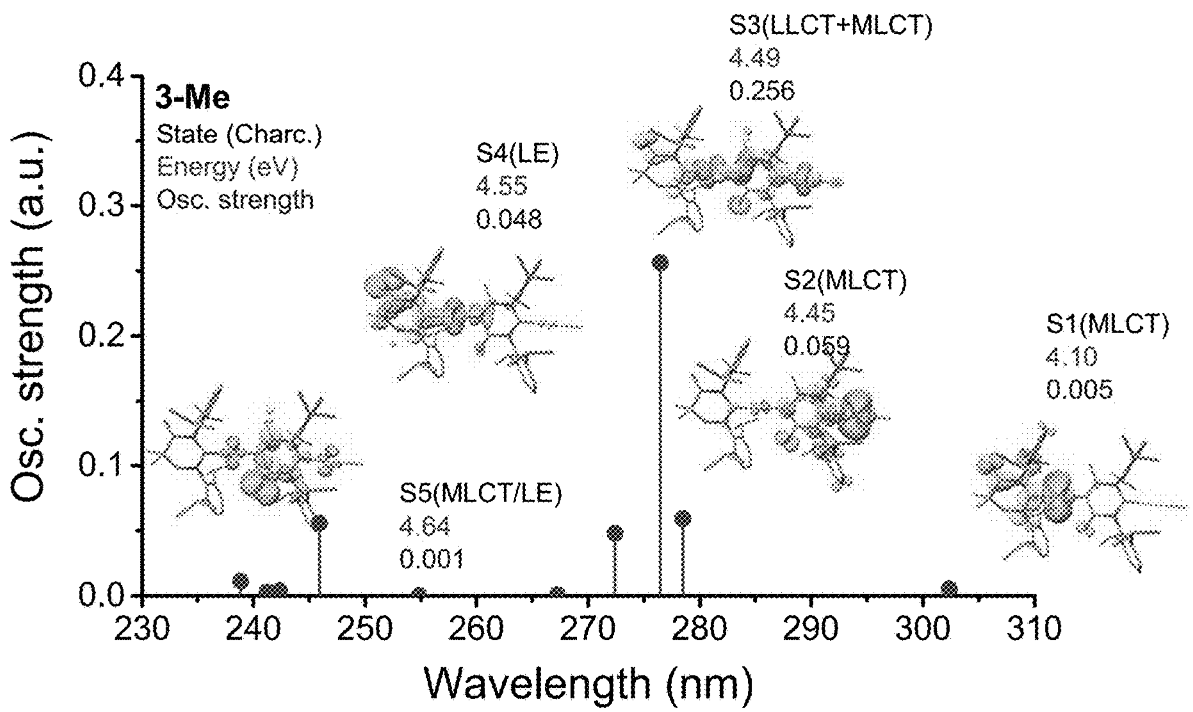
FIG. 8 depicts NTO excited state analyses of 3-AuCl.

The geometry of $Au_2^{CC}$ in the gas phase was optimized using density functional theory (DFT, B3LYP/LACVP*). The calculated conformation matches one suggested by the crystallographic studies, with near coplanar dihedral angles for the ligands around each metal center (AAC-Cz=2°) and (MAC-AAC=21°). The frontier molecular orbitals (MOs) for $Au^C$ and $Au_2^{CC}$ derived from these DFT calculations are illustrated in FIG. 5. The highest occupied molecular orbital (HOMO) in both molecules is localized on the electron rich Cz ligand. The lowest occupied molecular orbital (LUMO) is primarily on the AAC ligand in $Au^C$ and the terminal MAC ligand in $Au_2^{CC}$. The next highest MO (LUMO+1) in $Au_2^{CC}$ is localized predominantly on the bridging AAC ligand and significantly destabilized (E=−1.20 eV) relative to the LUMO in $Au^C$ (E=−1.99 eV), due to inductive electron donation from the Au(MAC) moiety (Carden, et al., Chem. Eur. J. 2017, 23, 17992-18001). Time dependent DFT (TD-DFT, CAM-B3LYP/LACVP*) calculations show that the $S_1$ and $T_1$ states of both complexes are principally ICT in character. Natural transition orbital (NTO) analyses for $Au^C$ locate the hole and electron NTOs on the respective HOMO and LUMO of the ground state (FIG. 6; see full analysis in FIG. 7). In contrast, the electron NTO for $Au_2^{CC}$ does not match the frontier molecular orbitals. While the hole NTO resembles the HOMO of the ground state, the electron NTO is spread over both carbene ligands. Thus, the exciton formed in the ICT state is predicted to be spatially extended in $Au_2^{CC}$. Moreover, the small (albeit essential) overlap between hole and electron NTOs mediated by the Au d-orbitals in both complexes imparts a high oscillator strength ($Au^C$:f=0.1804, $Au_2^{CC}$:f=0.2145) to the $^1$ICT state. The high oscillator strength in both complexes is attributed to their coplanar molecular geometries (Hamze, et al., Science 2019, 363, 601-606). Selected vertical transitions of $Au^C$ and $Au_2^{CC}$ are shown in Table 1. An NTO excited state analysis of 3-AuCl is shown in FIG. 8.

TABLE 1

| Selected vertical transitions of $AU^C$ and $Au_2^{CC}$ | | | | | |
|---|---|---|---|---|---|
| Complex | State | Energy (eV) | λ (nm) | Osc. | Main contribution |
| $AU^C$ | $S_1$ (ICT) | 3.11 | 399 | 0.1804 | HOMO→LUMO (82.4%)<br>HOMO→LUMO + 1 (14.5%) |
| | S2 (ICT) | 3.78 | 328 | 0.0086 | HOMO→LUMO (15.4%)<br>HOMO→LUMO + 1 (83.1%) |
| | $S_3$ (ICT) | 3.96 | 313 | 0.000003 | HOMO-1→LUMO (85.8%)<br>HOMO-1→LUMO + 1 (12.8%) |
| | $T_1$ (ICT) | 2.83 | 438 | 0 | HOMO→LUMO (73.6%)<br>HOMO→LUMO + 1 (16.7%) |
| | $T_2$ ($LE_{CZ}$) | 3.06 | 405 | 0 | HOMO-2→LUMO + 6 (8.4%)<br>HOMO-1→LUMO + 6 (47.0%)<br>HOMO-1→LUMO + 7 (5.9%)<br>HOMO→LUMO + 10 (22.5%) |
| | $T_3$ ($LE_{AAC}$ + $LE_{Cz}$) | 3.31 | 375 | 0 | HOMO-8→LUMO (35.7%)<br>HOMO-8→LUMO + 1 (26.4%)<br>HOMO→LUMO + 6 (12.8%) |
| | $T_4$ ($LE_{Cz}$ + $LE_{AAC}$) | 3.35 | 370 | 0 | HOMO-8→LUMO (5.6%)<br>HOMO-8→LUMO + 1 (6.2%)<br>HOMO→LUMO + 6 (65.1)<br>HOMO-2→LUMO + 10 (5.3%) |
| $Au_2^{CC}$ | $S_1$ (ICT) | 3.34 | 371 | 0.2145 | HOMO→LUMO (51.2%)<br>HOMO→LUMO + 1 (42.7%) |
| | $S_2$ (ICT) | 3.79 | 327 | 0.0491 | HOMO→LUMO (47.3%)<br>HOMO→LUMO + 1 (41.2%)<br>HOMO→LUMO + 2 (5.0%) |
| | $S_3$ (MLCT) | 4.12 | 301 | 0.0060 | HOMO-3→LUMO (66.4%)<br>HOMO-6→LUMO (10.5%)<br>HOMO-17→LUMO (5.4%) |
| | $T_1$ ($LE_{AAC}$ + ICT) | 3.03 | 409 | 0 | HOMO-4→LUMO (7.5%)<br>HOMO-4→LUMO + 1 (17.1%)<br>HOMO-4→LUMO + 2 (35.2%)<br>HOMO→LUMO (8.1%)<br>HOMO→LUMO + 1 (13.5%) |
| | $T_2$ ($LE_{Cz}$) | 3.08 | 403 | 0 | HOMO-7→LUMO + 31 (5.0%)<br>HOMO-3→LUMO + 12 (8.7%)<br>HOMO-1→LUMO + 12 (48.5%)<br>HOMO→LUMO + 18 (23.4%) |
| | $T_3$ (ICT + $LE_{AAC}$) | 3.16 | 392 | 0 | HOMO-4→LUMO + 2 (15.2%)<br>HOMO→LUMO (15.2%)<br>HOMO→LUMO + 1 (32.5%)<br>HOMO→LUMO + 2 (5.1%)<br>HOMO→LUMO + 12 (14.4%) |
| | $T_4$ ($LE_{Cz}$ + ICT) | 3.33 | 372 | 0 | HOMO→LUMO (9.6%)<br>HOMO→LUMO + 1 (8.3%)<br>HOMO→LUMO + 12 (64.7%) |

Calculated $S_0$ and $S_1$ dipole moments of $Au^C$ and $Au_2^{CC}$ are presented in Table 2. All the dipole moments values were obtained from TD-DFT calculations using the CAM-B3LYP/LACVP* method based on the optimized geometries in vacuum and are reported in Debye. Data in the brackets are the projections of the dipole moment along the Au—N bond axis. Negative values indicate the dipole moments are opposite in direction from that in the ground state.

TABLE 2

| Calculated $S_0$ and $S_1$ dipole moments of $Au^C$ and $Au_2^{CC}$ | | | |
|---|---|---|---|
| $Au^C$ | | $Au_2^{CC}$ | |
| μ ($S_0$) | μ ($S_1$) | μ ($S_0$) | μ ($S_1$) |
| 9.6 (8.1) | 15.1(−14.6) | 17.6 (17.5) | 15.9 (−15.8) |

Figure 9:
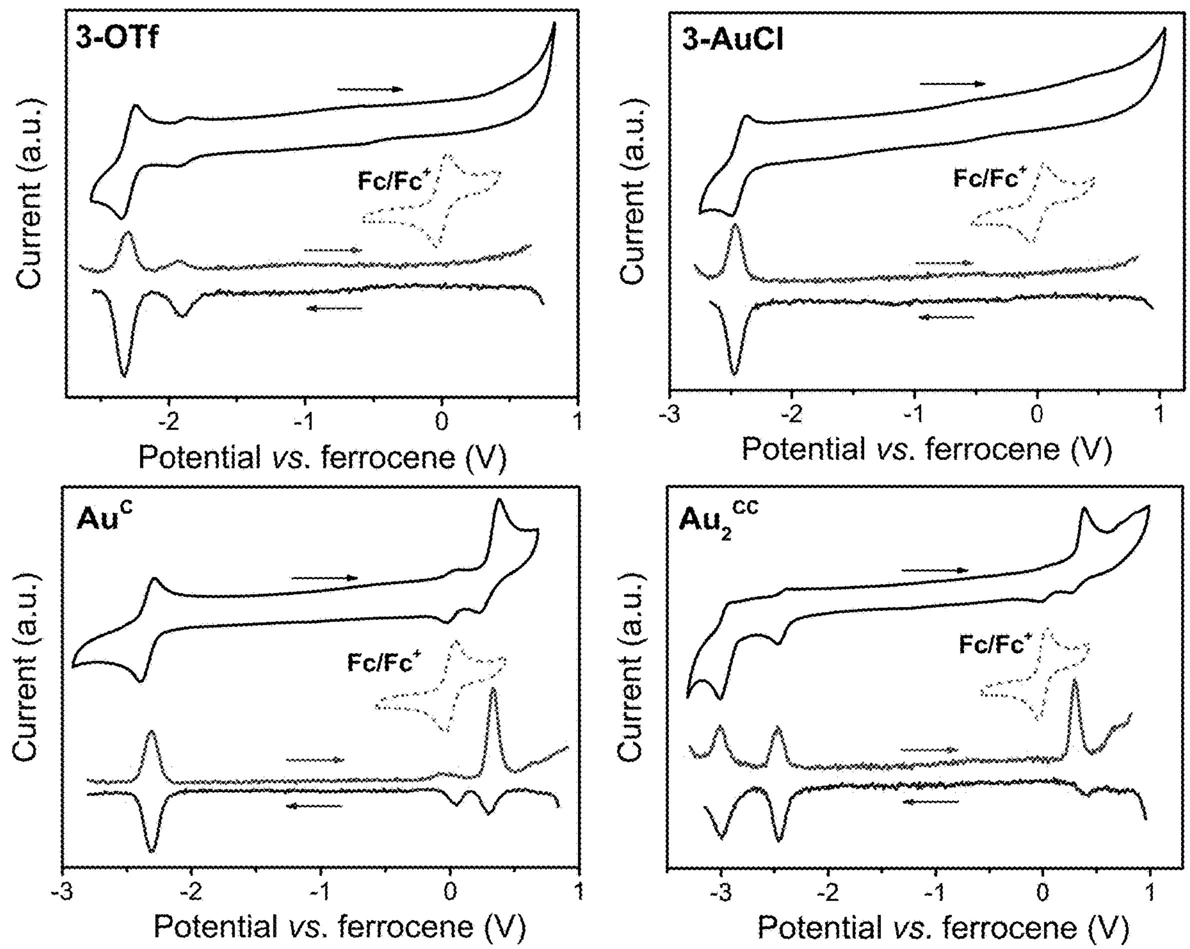
FIG. 9 is a series of CV (top) and DPV curves (middle: oxidation, bottom: reduction) in DMF versus ferrocene.
Figure 10:
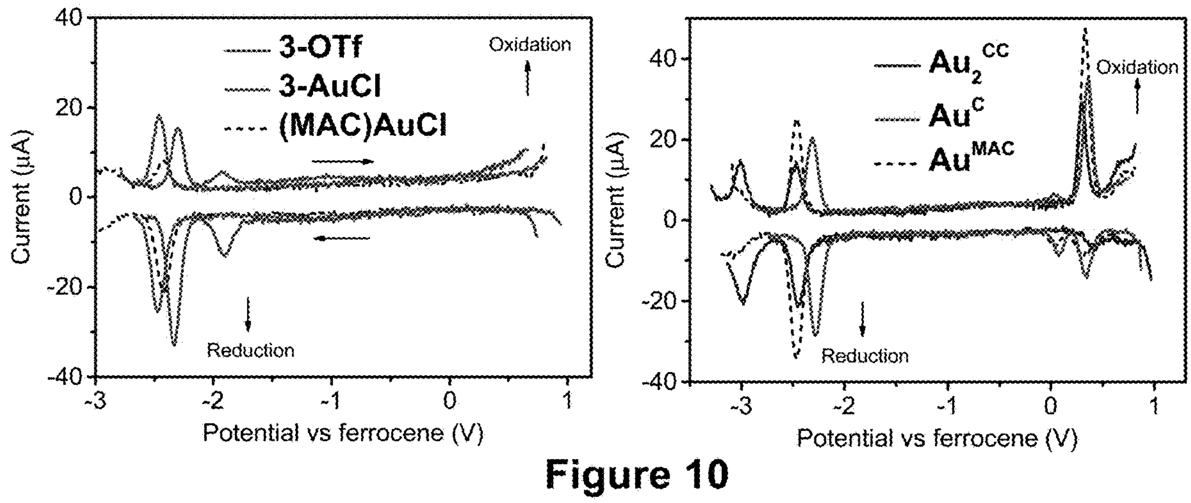
FIG. 10 shows DPV curves of 3-OTf, 3-AuCl, $Au^{C}$ and $Au_2^{CC}$ with the reference complexes (MAC)AuCl and $Au^{MAC}$.
Figure 11:
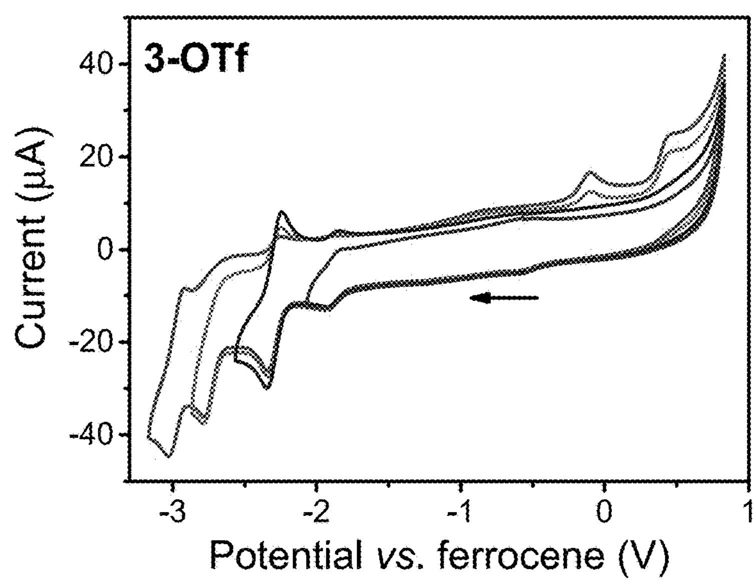
FIG. 11 shows CV curves of 3-OTf in DMF with different negative scan window.

Electrochemical properties for all the complexes were investigated using cyclic voltammetry (CV) and differential pulse voltammetry (DPV) (Table 3). The CV measurements show all oxidations to be irreversible and the reductions are either reversible or quasi-reversible (FIG. 9). The first oxidation peaks for $Au^C$ ($E_{ox}$=0.34 V) and $Au_2^{CC}$ ($E_{ox}$=0.30 V) are close to that for the known complex (MAC)AuCz ($Au^{MAC}$), and are assigned to oxidation of the Cz ligand (Shi, et al., *J. Am. Chem. Soc.* 2019, 141, 3576-3588). No oxidation peaks were observed within the potential window of N,N-dimethylformamide (DMF) for 3-OTf and 3-AuCl. Reduction waves for the mononuclear $Au^C$ ($E_{red}$=−2.32 V) and $Au^{MAC}$ ($E_{red}$=−2.46 V) are assigned to the respective NHC ligands. Cationic 3-OTf gives two reversible reductions; the first ($E_{red}$=−1.90 V) is assigned to the AAC ligand and forms the neutral radical, whereas the second ($E_{red}$=−2.33 V) is close to that observed in $Au^{MAC}$ and assigned to the MAC ligand. The first cathodic potentials for 3-AuCl and $Au_2^{CC}$ ($E_{red}$=−2.47 and −2.45 V, respectively) are close to that observed in $Au^{MAC}$ and are likewise assigned to reduction of the MAC ligand. A second cathodic wave observed in $Au_2^{CC}$ ($E_{red}$=−3.00 V) is assigned to reduction of the AAC ligand on the basis of DFT calculations (vida supra). The significant destabilization of the π* orbital in AAC ligand from $Au^C$ to $Au_2^{CC}$ can be attributed to the introduction of the (MAC)Au moiety in the latter. DPV curves of 3-OTf, 3-AuCl, $Au^C$ and $Au_2^{CC}$ with the reference complexes (MAC)AuCl and $Au^{MAC}$ are presented in FIG. 10. CV curves of 3-OTf in DMF with different negative scan window are presented in FIG. 11. When cathodic scans were stopped before −2.5 V, two reversible reduction peaks are observed (the first reduction is weaker than the second), and no oxidation peak was found within the DMF positive potential window. However, if the scan went to further negative potentials, two additional quasi-reversible reduction peaks were observed, one at −2.6 V and the other at −2.9 V. In this case, two new irreversible oxidation peaks also appeared at 0 V and 0.5 V. This response indicates a new compound was formed electrochemically (ECE).

TABLE 3

| Electrochemical properties of the complexes | | | |
|---|---|---|---|
| Complex | $E_{ox}$ (V) [a] | $E_{red}$ (V) [a] | $E_{ox}$ − $E_{red}$ (V) |
| $Au^{MAC}$ | 0.33 | −2.46 | 2.79 |
| $Au^{C}$ | 0.34 | −2.32 | 2.66 |
| 3-OTf | —[b] | −1.90, −2.33 | — |
| 3-AuCl | —[b] | −2.47 | — |
| $Au_2^{CC}$ | 0.30 | −2.45, −3.00 | 2.75 |

[a] Redox potential were obtained from DPV measurements using ferrocene (Fc) as an internal reference and reported relative to $Fc^+/Fc$ = 0 V;
[b] Not observed within the potential window of the solvent (DMF).

Figure 12:
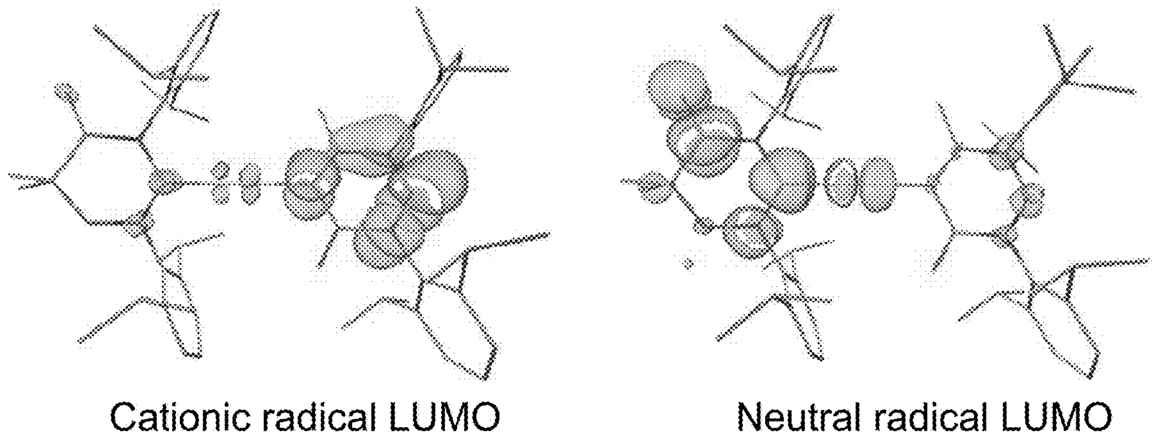
FIG. 12 depicts the calculated LUMO of cationic (left) and the neutral radical (right) 3-OTf.
Figure 13:
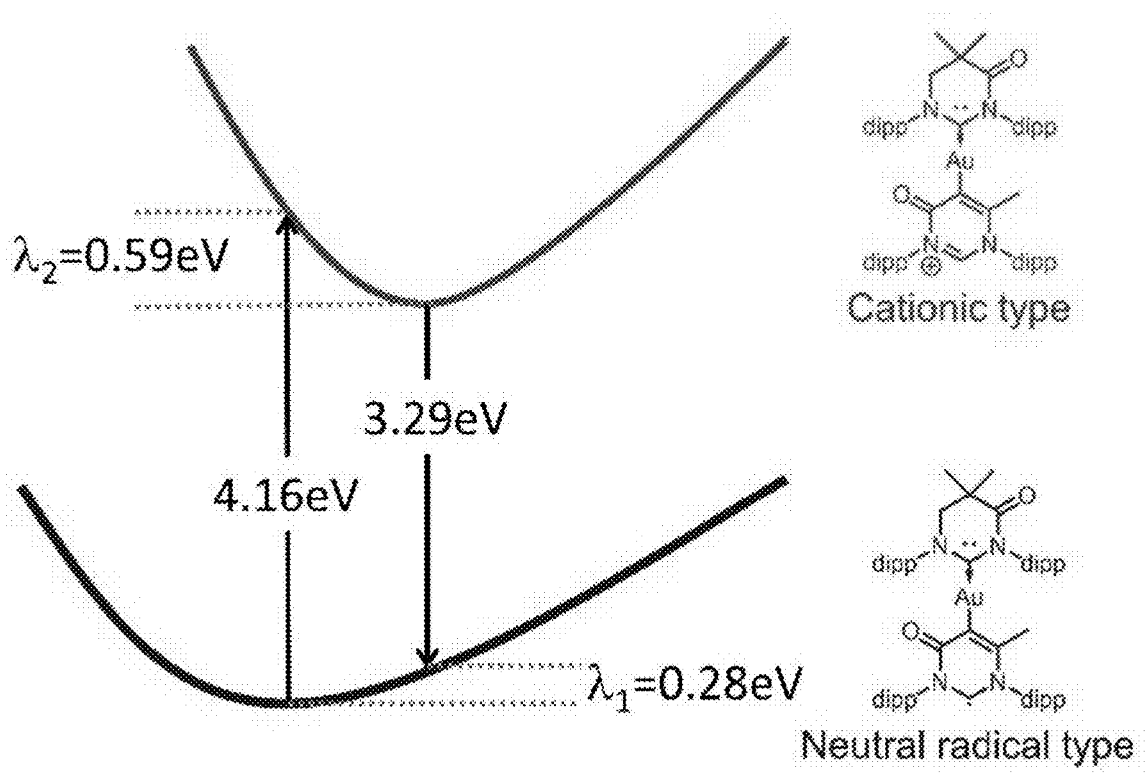
FIG. 13 is a schematic illustration of the potential surface of 3-OTf in cationic and neutral radical type.

The first reduction of 3-OTF converts the cation into a neutral radical and with electron localized on the AAC ligand (see the LUMO depicted in FIG. 12). The second reduction occurs on the MAC ligand as the LUMO of the neutral radical $(3\text{-OTF})^{\bullet}$ is localized there. DFT calculations indicate the reorganization energy from the cationic to neutral radical type is 0.59 eV and 0.28 eV for the reverse process; see FIG. 13 for a schematic illustration of the potential surface of 3-OTf in cationic and neutral radical type. Such high reorganization energies are assigned to the bending distortion of the C—H bond on the AAC ligand, making the first reduction a slow kinetic process. The high reorganization energy explains the lower intensity for the first reduction wave in 3-OTF than for the second wave in both CV and DPV measurements.

Figure 14:
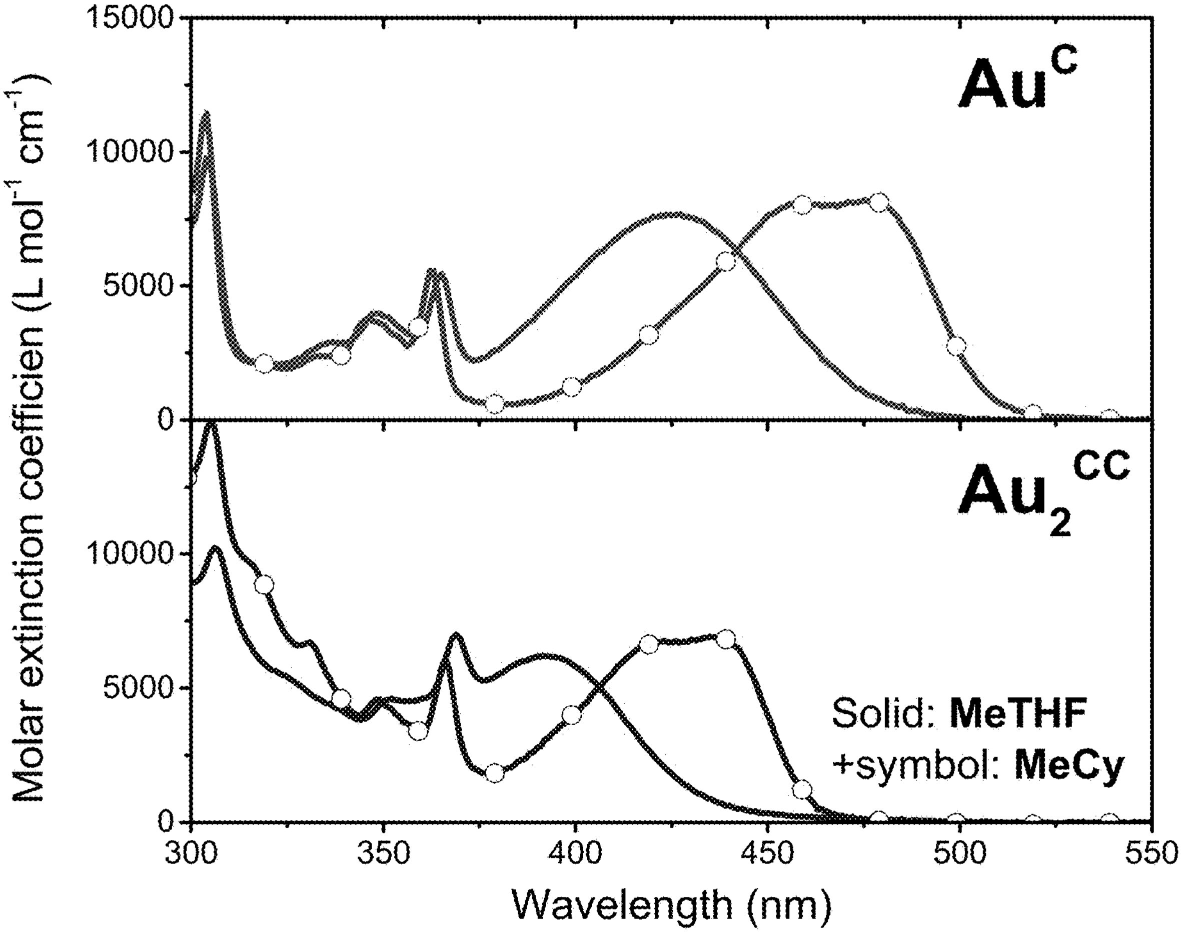
FIG. 14 is a plot of absorption spectra of $Au^{C}$ and $Au_2^{CC}$ in MeTHF and MeCy solution at 298 K.
Figure 15:
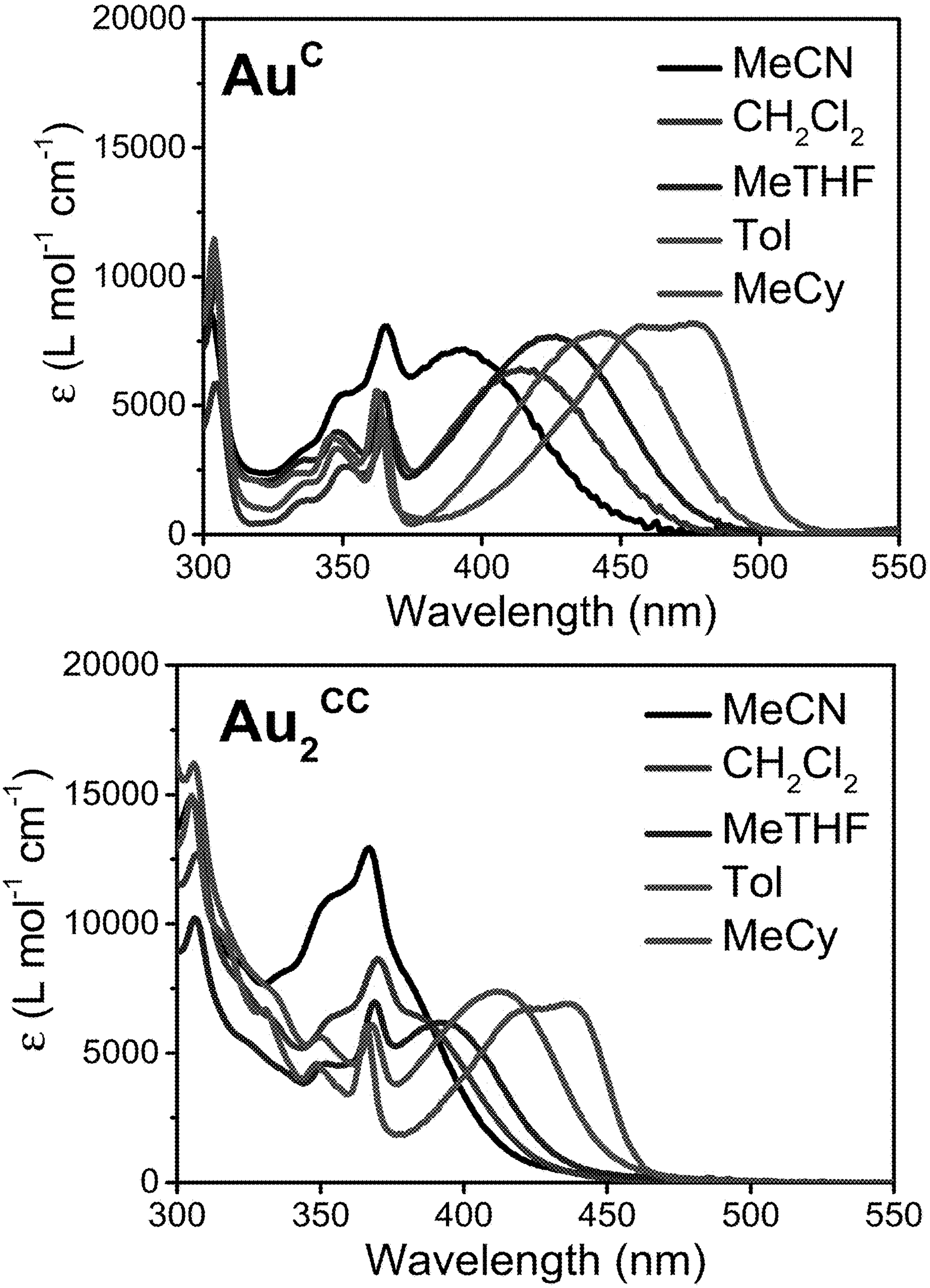
FIG. 15 is a plot of absorption spectra of $Au^{C}$ (top) and $Au_2^{CC}$ (bottom) in different solvents.
Figure 16:
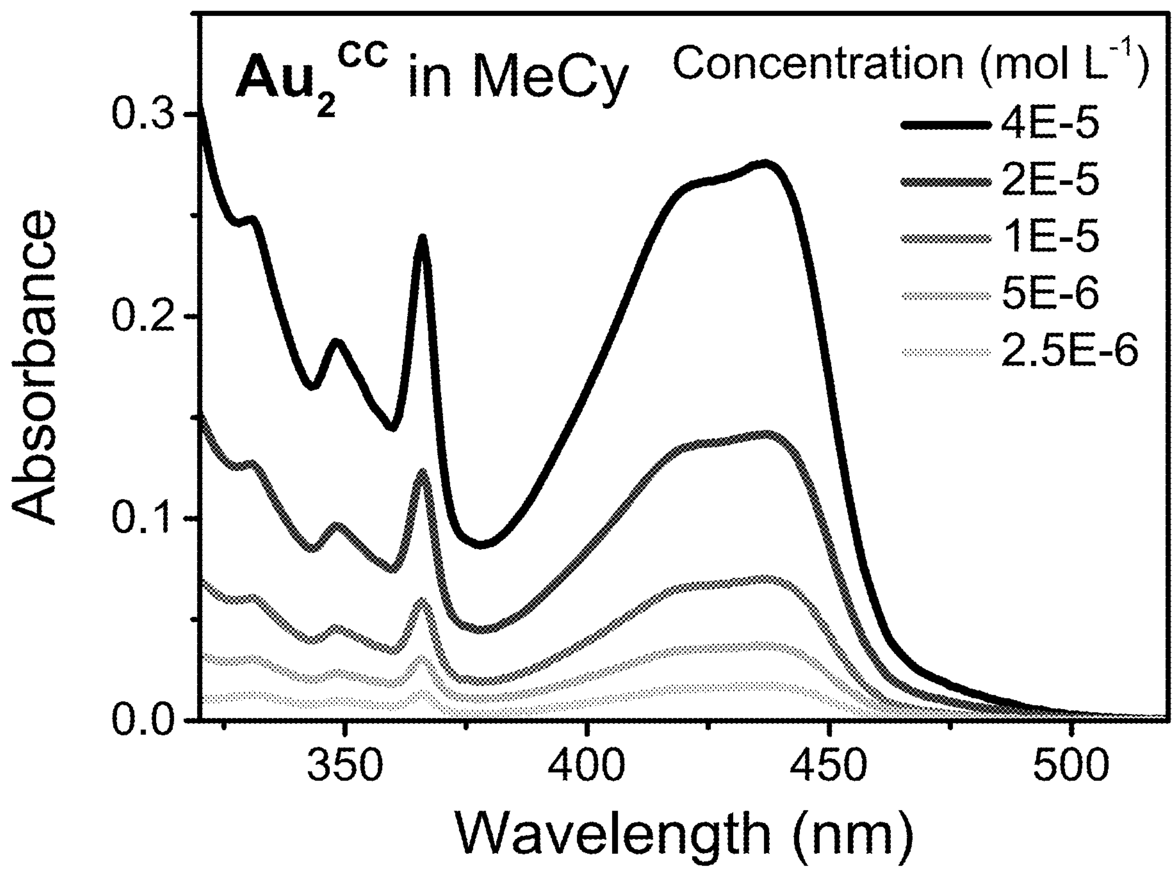
FIG. 16 is a plot of absorption spectra of $Au_2^{CC}$ in MeCy with different concentration.

The UV-visible spectra of $Au^{C}$ and $Au_2^{CC}$ were recorded in 2-methyltetrahydrofuran (MeTHF) and methylcyclohexane (MeCy) (FIG. 14). Spectra in additional solvents are shown in FIG. 15. Spectra in MeCy at various concentrations are shown in FIG. 16. Absorption bands at high energy (λ<350 nm) are assigned to π-π* transitions on the carbene ligand, whereas structured bands at lower energy (λ=300-375 nm) to transitions on the Cz ligand. These transitions are weakly solvatochromic, as expected for such localized excited (LE) states. Broad absorption bands (λ>375 nm) are assigned to the Cz-to-carbene ICT transitions. These ICT bands have high extinction coefficients (ε=6000-8000 $M^{-1}$ $cm^{-1}$) indicating that electronic coupling between the n orbitals of the ligands is effective, consistent with the coplanar conformation determined from molecular models. The ICT bands in $Au^{c}$ and $Au_2^{CC}$ are negative solvatochromic as they undergo hypsochromic shifts with increasing solvent polarity. This behavior indicates that the dipole moment for the excited state opposes that of the ground state in these complexes. In particular, dipole moments calculated for $Au_2^{CC}$ in the ground ($\mu_g$=17.4 D) and excited ($\mu_e$=−15.9 D) states predict a large transition moment ($\mu_{eg}$=33.5 D) for the tandem complex.

Figure 17:
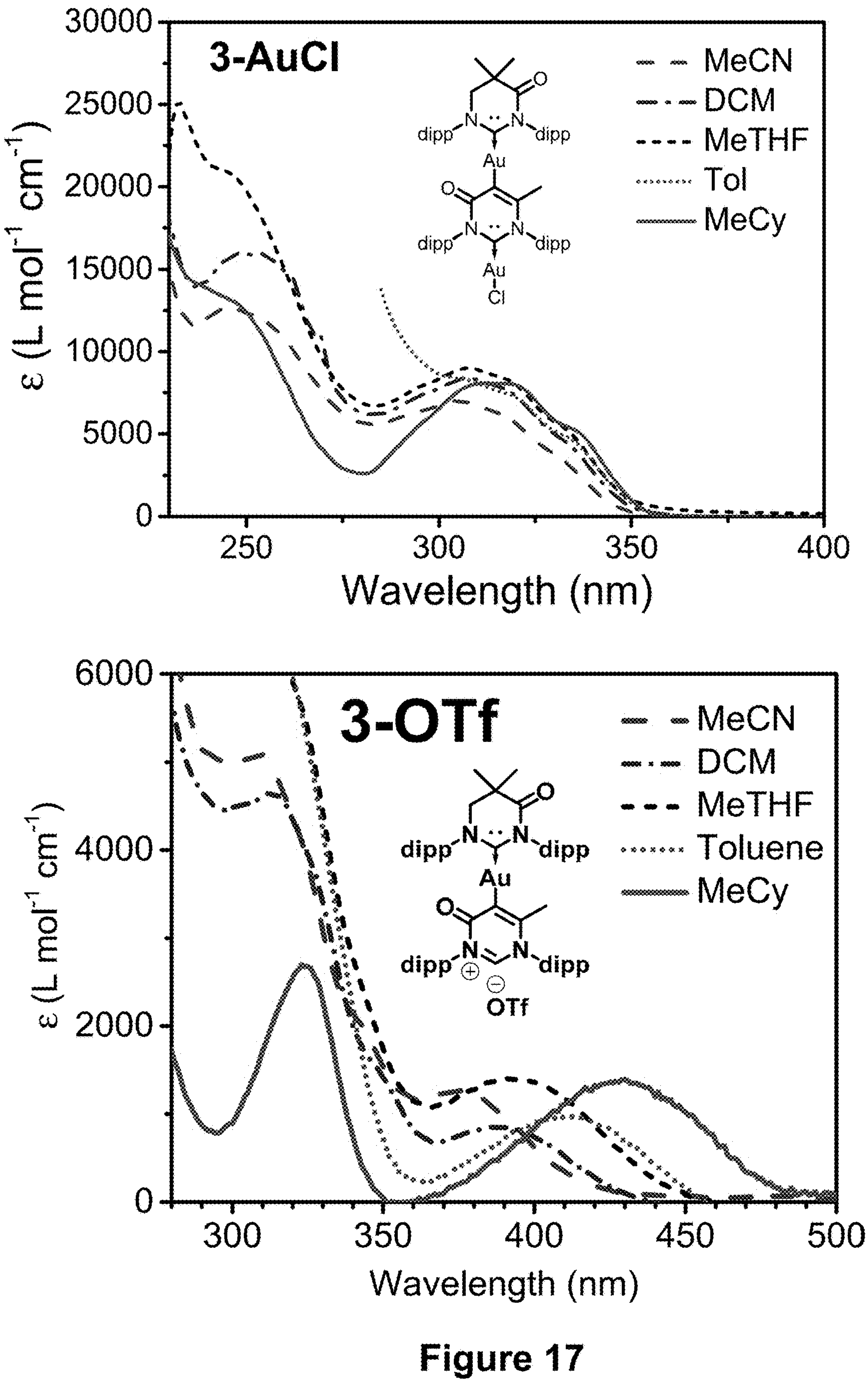
FIG. 17 is a plot of absorption spectra of 3-AuCl (top) and 3-OTf (bottom) in different solvents.

Absorption spectra for 3-OTf and 3-AuCl are shown in FIG. 17. The poor solubility of 3-OTf in MeCy is responsible for the corresponding inaccuracy of the extinction coefficient. The moderate absorption band for 3-OTf from 300 to 350 nm with subtle solvatochromism is assigned to a transition on the AAC ligand, whereas the weak band with obvious solvatochromism beyond 300 nm is identified as the MLCT transition according to the TD-DFT calculations. Absorption spectra for 3-AuCl in solvents with different polarity are similar, consisting of two main bands, an intense one from 230 to 275 nm and a moderate one from 275 to 350 nm. Both bands present negligible solvatochromism. The high energy band is assigned to the ligand based π-π* transition. The other bands contain a series of transitions with differing character according to the TD-DFT calculations, dominated by an $S_0 \rightarrow S_3$ transition that has a mixed LLCT and MLCT configuration. Photophysical properties of 3-OTf and 3-AuCl are presented below in Table 4.

TABLE 4

| Photophysical properties of 3-OTf and 3-AuCl | | | | | | | |
|---|---|---|---|---|---|---|---|
| | RT | | | | | 77 K | |
| complex | $\lambda_{em}$ (nm) | Φ | τ (μs) | $k_r$ ($10^5$ $s^{-1}$) | $k_{nr}$ ($10^5$ $s^{-1}$) | $\lambda_{em}$ (nm) | τ (μs) |
| MeTHF | | | | | | | |
| 3-OTf | 540 | 0.02 | 0.060 | 3 | 2 × $10^2$ | 440 | 71 |
| 3-AuCl | 491 | <0.01 | 2.8 | <0.05 | >3 | 431, 457, 487 | 48 |
| MeCy | | | | | | | |
| 3-OTf | 530 | 0.05 | 0.19 | 3 | 5 × $10^1$ | 440 | 89 |
| 3-AuCl | 458 | <0.01 | 1.8 | <0.06 | >5 | 434sh, 458, 488 | 49 |
| 1 wt % doped PS film | | | | | | | |
| 3-OTf | 495 | 0.55 | 0.62 | 8.9 | 7.3 | 480 | 56 |
| 3-AuCl | 429sh, 456, 481 | 0.66 | 58 | 0.11 | 0.059 | 428, 458, 486 | 64 |

The blue shift observed for the ICT transition in $Au_2^{CC}$ upon introduction of a second electron accepting NHC' ligand is in contrast to a red shift that typically occurs for the lowest CT transition in organic A-A'-D chromophores with a related dual acceptor structure (Wang, et al., Chem. Asian J. 2020, 15, 2520-2531; Qu, et al., J. Mater. Chem. C 2020, 8, 3846-3854; Li, et al., J. Am. Chem. Soc. 2019, 141, 18204-18210; Shi, et al., Chem. Mater. 2018, 30, 7988-8001). Strong electronic coupling between A' and A in the organic molecules stabilizes the LUMO and decreases the energy of the CT state. However, electronic coupling between the carbene ligands in the (MAC)Au(AAC) part of $Au_2^{CC}$ is disrupted by the bridging Au atom. In addition, the π* orbital of AAC ligand is destabilized by inductive electron donation from the flanking Au atoms and shifts to higher energy than the MAC ligand. The net result is a higher ICT energy for $Au_2$ than for either $Au^C$ or $Au^C$. The NTO density on the AAC ligand in $Au_2^{CC}$ is partially due to Coulombic attraction of the electron to the positively charged Cz ligand. The TD-DFT calculations predict comparable contributions of the LUMO (51%) and LUMO+1 (43%) to the ICT state of $Au_2^{CC}$. Therefore, the LUMOs on both NHC ligands work in tandem to blue shift the ICT absorption of $Au_2^{CC}$.

Figure 18:
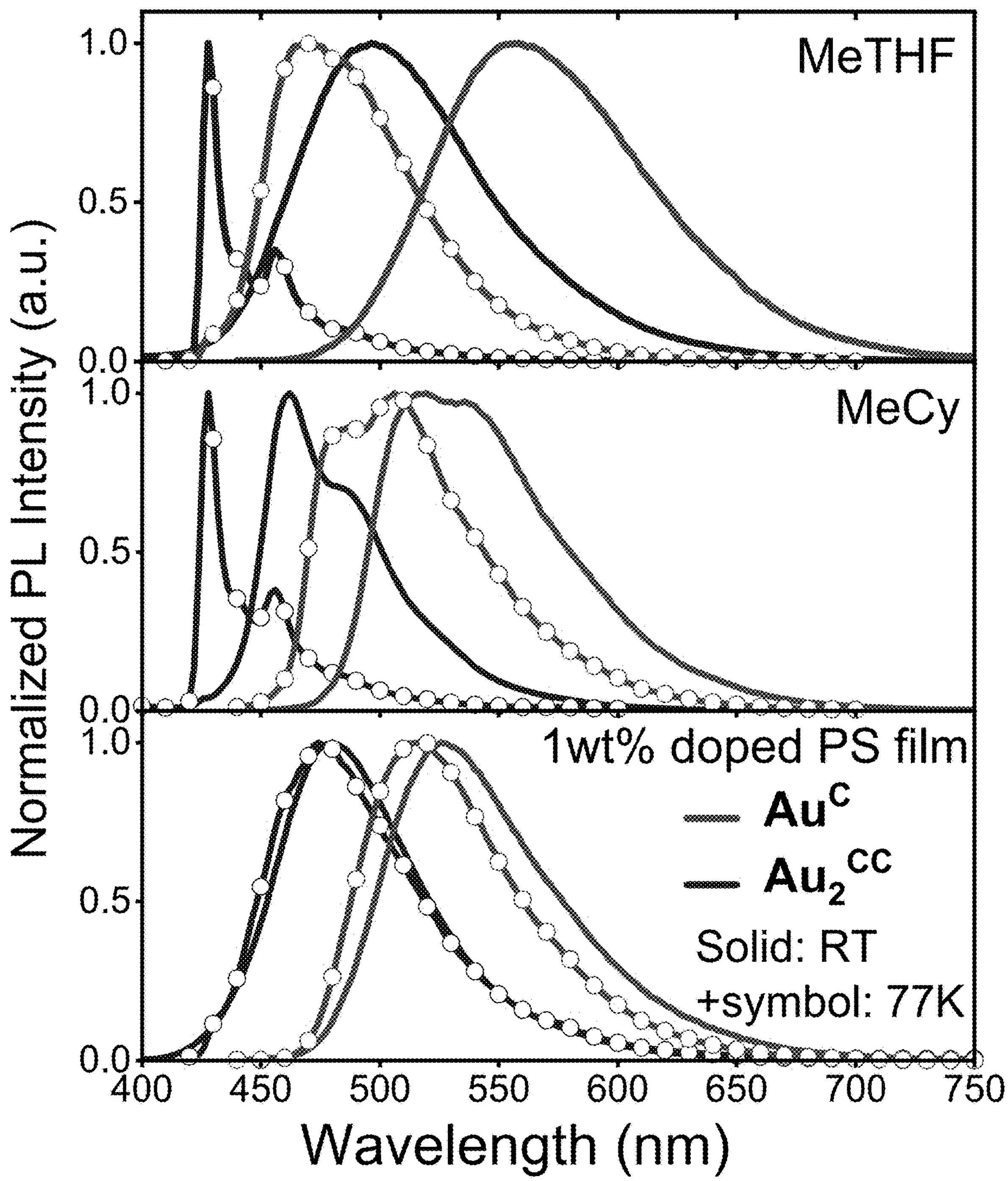
FIG. 18 depicts the emission spectra of $Au^{C}$ and $Au_2^{CC}$ in MeTHF and MeCy solution and in PS film.

Luminescence from both $Au^C$ and $Au_2^{CC}$ is broad and featureless in MeTHF at room temperature, whereas emission is structured in MeCy (FIG. 18). The spectra red shift with increasing solvent polarity and undergo rigidochromic blue shifts on cooling to 77 K. These changes are due to the opposing dipole moments of $S_0$ and $S_1$ states in the complexes. Luminescence spectra for $Au^C$ remain broad and largely featureless at 77 K, consistent with emission from an ICT state. In contrast, luminescence from $Au_2^{CC}$ narrows and displays pronounced vibronic structure in both solvents at 77 K, along with a long emission lifetime (τ>300 μs). The luminescence for $Au_2^{CC}$ at 77 K is assigned to $^3$LE emission from the carbazolyl ligand. The difference in emission properties between the two complexes is due to their ICT energies relative to the $^3$LE state of carbazolyl. The blue shift of the ICT state for $Au_2^{CC}$ places it close in energy to the $^3$LE. At 77 K the dipolar solvent molecules are frozen in an arrangement that stabilizes the ground state $Au_2^{CC}$ and thus destabilizes its ICT state, shifting the ICT to the blue of the $^3$LE of carbazole. The same rigidochromic phenomenon has been observed for other (NHC)MCz complexes (Hamze, et al., Science 2019, 363, 601-606; Hamze, et al., J. Am. Chem. Soc. 2019, 141, 8616-8626; Shi, et al., J. Am. Chem. Soc. 2019, 141, 3576-3588). Luminescence from $Au^C$ in doped polystyrene (PS) films is yellow ($\lambda_{max}$=526 nm), whereas $Au_2^{CC}$ emits blue ($\lambda_{max}$=480 nm). The spectra in PS display featureless ICT emission bands at both room temperature and 77 K, with negligible hypsochromic shifts upon cooling, as observed for other (NHC)MCz complexes (Li, et al., J. Am. Chem. Soc. 2020, 142, 6158-6172).

Figure 19:
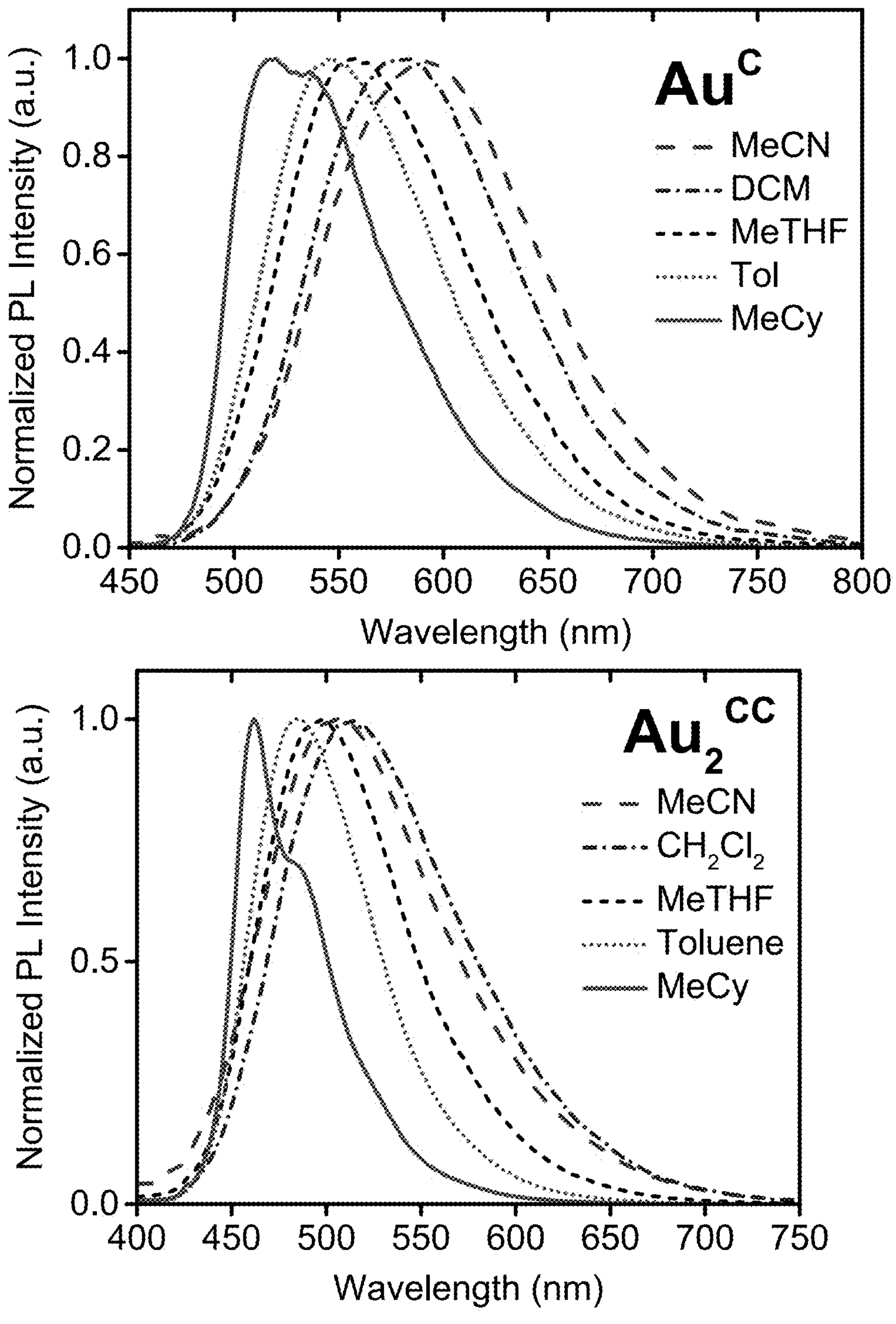
FIG. 19 depicts the normalized emission spectra of $Au^{C}$ and $Au_2^{CC}$ in different solvents.

The luminescence efficiencies for $Au_2^{CC}$ and $Au^C$ in fluid solution are comparable despite the fact that rates of non-radiative decay for the bimetallic complex are much higher than for $Au^C$ (Table 5). The rates of non-radiative decay for $Au_2^{CC}$ are likely enhanced due to the additional rotational degrees of freedom introduced by the second metal-carbene moiety. However, non-radiative decay is considerably mitigated for $Au_2^{CC}$ in a stiff, nonpolar matrix such that both compounds show similar values for $k_{nr}$ in PS films. It is noteworthy that the luminescence efficiency for $Au_2^{CC}$ ($\Phi_{PL}$=0.80) exceeds that for $Au^C$ ($\Phi_{PL}$=0.62) in PS film. The high efficiency for $Au_2^{CC}$ in PS is brought about by a rate of radiative decay ($k_r$ of $1.5\times10^6$ s$^{-1}$) that is over two-fold higher than for $Au^C$ ($k_r$ of $6.7\times10^5$ s$^{-1}$). The change is not simply due to the higher emission energy for $Au_2^{CC}$, as dependence to the third power of energy ($k_r \alpha E^3$) (Turro, et al., University Science Book, Sausalito, California, 2009) would only cause a 1.3-fold increase to the rate of radiative decay. Instead, the rate of radiative decay in $Au_2^{CC}$ is likely being enhanced by a change in energy separation between the $S_1$ and $T_1$ states. Normalized emission spectra of $Au^C$ and $Au_2^{CC}$ in different solvents are presented in FIG. 19. The photophysical properties of $Au^C$ and $Au_2^{CC}$ in different solutions are presented in Table 6.

TABLE 5

Photophysical properties of $Au^C$, $Au^{MAC}$ and $Au_2^{CC}$

| complex | RT $\lambda_{em}$ (nm) | Φ | τ (μs) | $k_r$ ($10^5$ s$^{-1}$) | $k_{nr}$ ($10^5$ s$^{-1}$) | 77 K $\lambda_{em}$ (nm) | τ (μs) |
|---|---|---|---|---|---|---|---|
| MeTHF | | | | | | | |
| $Au^C$ | 558 | 0.36 | 0.77 | 4.7 | 8.3 | 470 | 69 |
| $Au^{MAC}$ | 544 | 0.50 | 0.79 | 6.3 | 6.3 | 428 | 260 |
| $Au_2^{CC}$ | 496 | 0.20 | 0.21 | 9.5 | 38 | 428, 456, 485sh | 310 |
| MeCy | | | | | | | |
| $Au^C$ | 520, 536 | 0.57 | 1.1 | 5.2 | 3.9 | 488, 506 | 84 |
| $Au^{MAC}$ | 522 | 0.88 | 1.1 | 8.0 | 1.1 | 456 | 68 |
| $Au_2^{CC}$ | 462, 485sh | 0.52 | 0.41 | 13 | 12 | 428, 456, 485sh | 360 |
| 1 wt % doped PS film | | | | | | | |
| $Au^C$ | 526 | 0.62 | 0.93 | 6.7 | 4.1 | 516 | 82 |
| $Au^{MAC}$ | 512 | 0.85 | 0.83 | 10 | 1.8 | 506 | 43 |
| $Au_2^{CC}$ | 480 | 0.80 | 0.52 | 15 | 3.8 | 474 | 46 |

TABLE 6

Photophysical properties of $Au^C$ and $Au_2^{CC}$ in different solution

| Solvent | $Au^C$ $\lambda_{em}$ (nm) | Φ | τ (μs) | $k_r$ ($10^5$ s$^{-1}$) | $k_{nr}$ ($10^5$ s$^{-1}$) | $Au_2^{CC}$ $\lambda_{em}$ (nm) | Φ | τ (μs) | $k_r$ ($10^5$ s$^{-1}$) | $k_{nr}$ ($10^5$ s$^{-1}$) |
|---|---|---|---|---|---|---|---|---|---|---|
| MeCN | 590 | 0.06 | 0.19 | 3 | 50 | 505 | 0.02 | 1.0 | 0.2 | 9.8 |
| $CH_2Cl_2$ | 581 | 0.20 | 0.46 | 4.3 | 17 | 513 | 0.43 | 0.81 | 5.3 | 7.0 |
| MeTHF | 558 | 0.36 | 0.77 | 4.7 | 8.3 | 496 | 0.20 | 0.21 | 9.5 | 38 |
| Toluene | 546 | 0.51 | 0.89 | 5.7 | 5.5 | 485 | 0.58 | 0.40 | 15 | 10 |
| MeCy | 520, 536 | 0.57 | 1.1 | 5.2 | 3.9 | 462, 485 | 0.52 | 0.41 | 13 | 12 |

Figure 20:
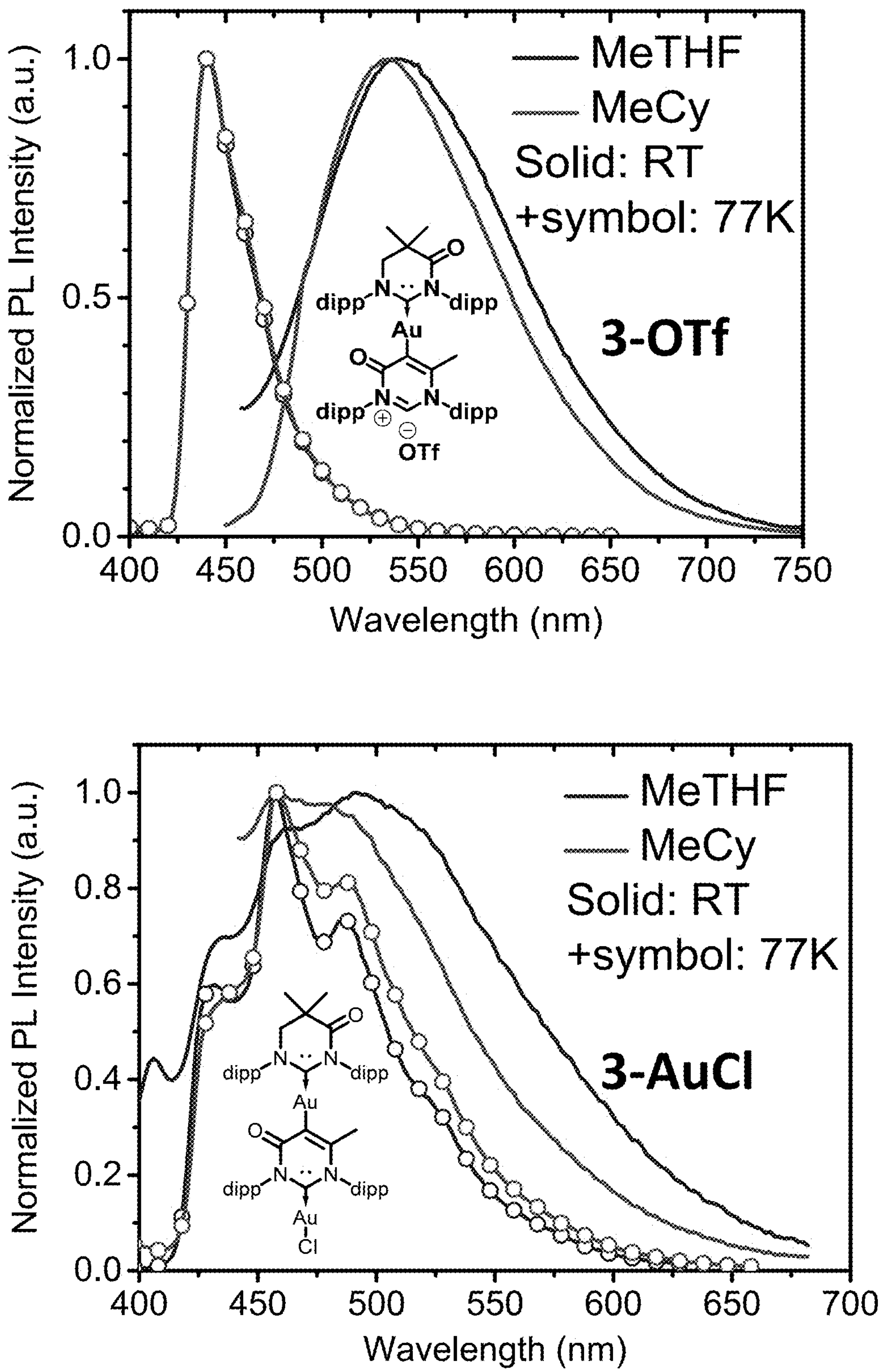
FIG. 20 depicts the emission spectra of cationic complex 3-OTf (top) and chloride complex 3-AuCl (bottom) in dilute solution.

Emission spectra of 3-OTf and 3-AuCl are presented in FIG. 20. Luminescence spectra for 3-OTf in solution are broad, peaking around 530 to 540 nm in both MeTHF and MeCy with a PLQY less than 0.05. This emission can be assigned to an MLCT phosphorescent transition. The low PLQY is blamed on geometric distortion in the excited state for MLCT emitters, which is also evidenced by the much higher $k_{nr}$ than the $k_r$. The 3-AuCl complex is poorly emissive in fluid solution at room temperature. This low efficiency is due to a low radiative decay rate, reflected in the small oscillator strength of $S_0 \rightarrow S_1$ transition revealed by the TD-DFT calculations, and also to the high non-radiative decay rate owing to the Renner-Teller bending distortion in the MLCT excited state. Emission from 3-AuCl peaks at 455 nm in MeTHF and MeCy at 77 K. The vibronically structured emission has a lifetime of 50 μs, indicating phosphorescence from a $^{3}$LE excited state localized on the AAC ligand according to the TD-DFT calculations.

Figure 21:
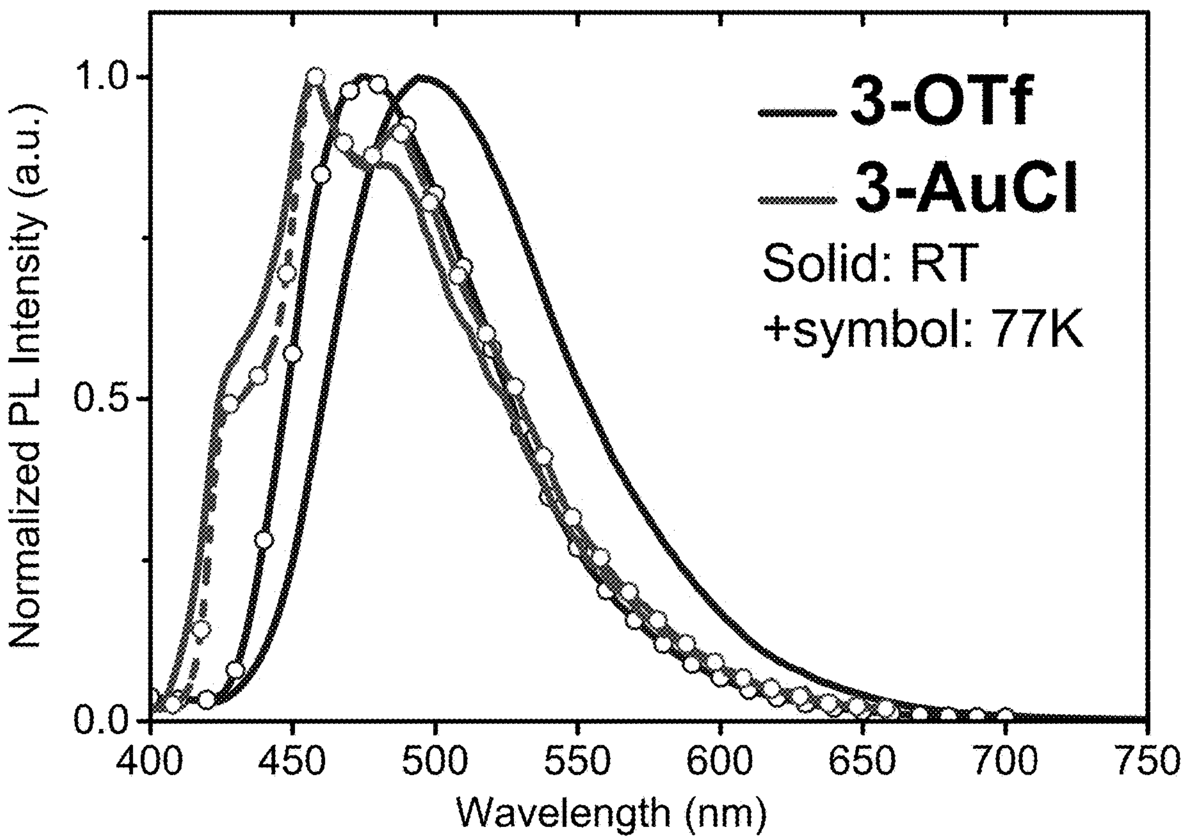
FIG. 21 is a plot of the normalized emission spectra of 3-OTf and 3-AuCl in PS film.

Normalized emission spectra of 3-OTf and 3-AuCl in PS film are shown in FIG. 21. In PS film, 3-OTf presents a broad band peaking at 495 nm with a PLQY of 0.55. The greatly decreased $k_{nr}$ for 3-OTf indicates the molecular bending distortion is well suppressed in the rigid polymer matrix. The 3-AuCl complex in PS film presents a structured emission band at room temperature and 77 K, indicating LC phosphorescence. Owing to the significantly depressed $k_{nr}$, a PLQY of 0.66 with a long lifetime of 58 μs is found at room temperature.

Figure 22:
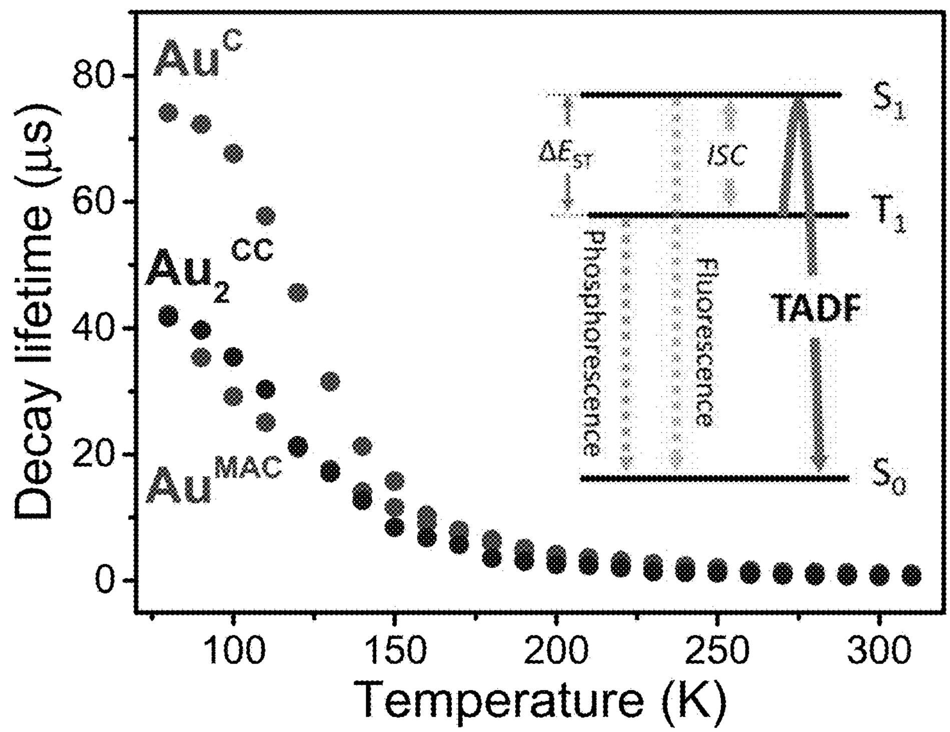
FIG. 22 is a plot of temperature dependent lifetime of $Au^{C}$, $Au^{MAC}$ and $Au_2^{CC}$ in PS film (inset is a simplified schematic for the TADF mechanism).
Figure 23:
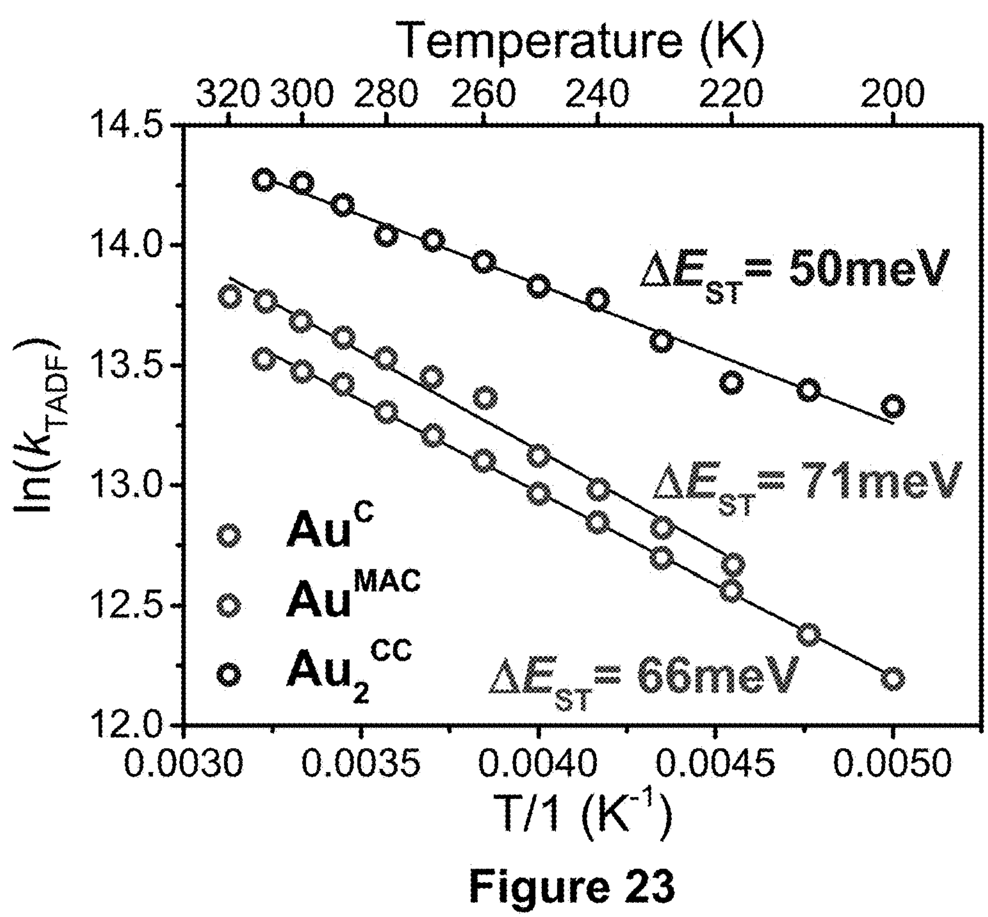
FIG. 23 is a plot of the full kinetic modeling data from the temperature dependent lifetime of $Au^{C}$, $Au^{MAC}$ and $Au_2^{CC}$.
Figure 24:
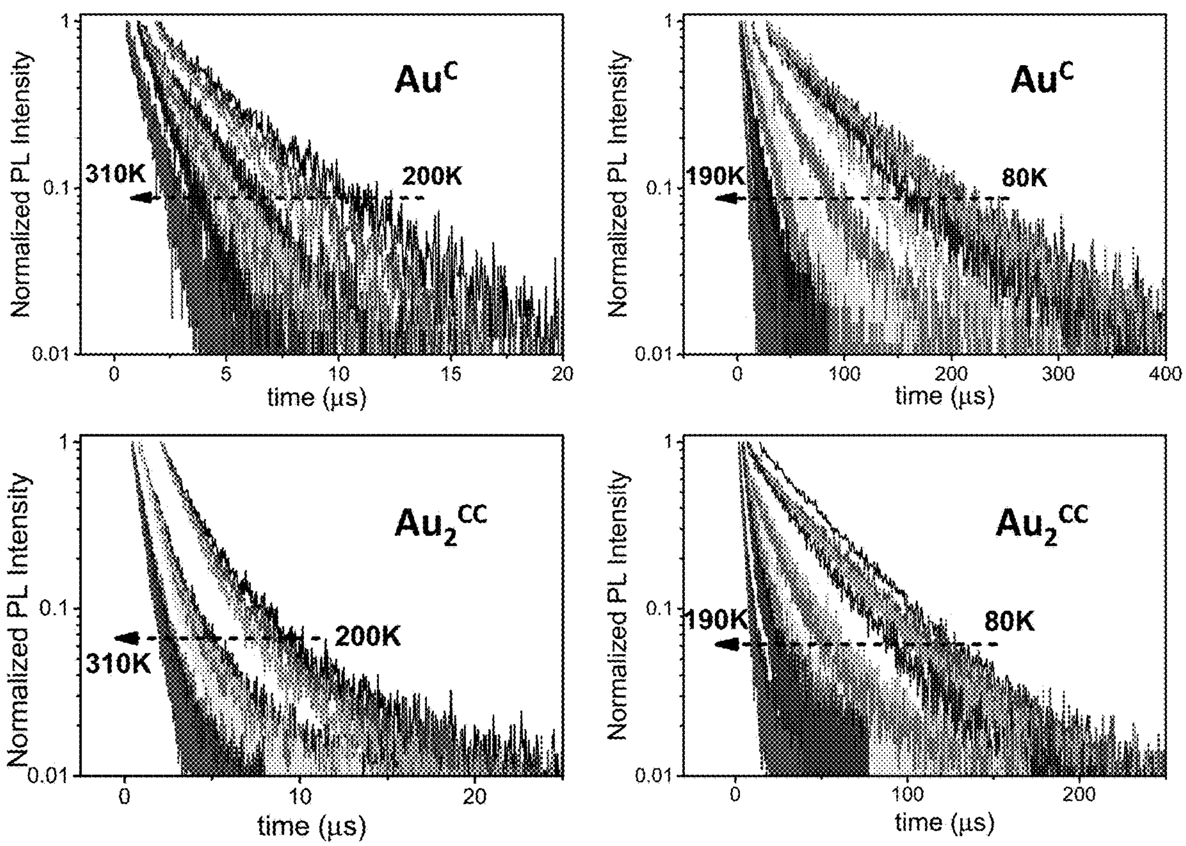
FIG. 24 is a plot of emission decay trace at different temperature of $Au^{C}$ (top) and $Au_2^{CC}$ (bottom).

To probe the origin of the high radiative rate for $Au_2^{CC}$, temperature dependent photophysical measurements were carried out in PS films from 80 to 310 K (FIGS. 22 and 23). Emission lifetimes of $Au^{C}$ and $Au_2^{CC}$ increase gradually upon cooling whereas the quantum efficiency remains relatively stable, behavior consistent with emission via TADF (FIG. 22). The emission decay traces at each temperature were fit to a mono-exponential function. Large errors are introduced when fitting data to a Boltzmann model that includes the low temperature region, i.e. <200 K (FIG. 24), since below this temperature both zero field splitting and $\Delta E_{ST}$ impact the photophysical properties (Yersin, et al., ChemPhysChem 2017, 18, 3508-3535). Therefore, an Arrhenius model for emission decay (Equation 1) was used to fit data in the temperature region where TADF is the sole mechanism for emission (T=200-310 K, FIG. 23) (Hamze, et al., J. Am. Chem. Soc. 2019, 141, 8616-8626). The $Au^{C}$ and $Au^{MAC}$ complexes are found to have similar energies for singlet-triplet splitting ($\Delta E_{ST}$=66 meV, 530 $cm^{+1}$ and $\Delta E_{ST}$=71 meV, 570 $cm^{-1}$, respectively). In contrast, the energy for singlet-triplet splitting for the bimetallic $Au_2^{CC}$ ($\Delta E_{ST}$=50 meV, 400 $cm^{-1}$) is lower than in either of the mono-metallic complex. The decrease in $\Delta E_{ST}$ for $Au_2^{CC}$ is consistent with its high radiative rate (Ravinson and Thompson, Materials Horizons 2020, 7, 1210-1217), and demonstrates the weaker interaction between donor and acceptor induced by the tandem-carbene structure. Temperature dependent photophysical properties of $Au^{C}$ and $Au_2^{CC}$ are presented in Table 7.

$$\ln(k_{TADF}) = A - \left(\frac{\Delta E_{ST}}{k_B}\right)\frac{1}{T} \quad (1)$$

TABLE 7

Temperature dependent photophysical properties of $Au^{C}$ and $Au_2^{CC}$ in PS film.

| T (K) | $Au^{C}$ $\Phi_{PL}^{a}$/τ (μs) | $Au^{C}$ $k_{TADF}$ ($10^5 s^{-1}$)/ln($k_{TADF}$) | $Au_2^{CC}$ $\Phi_{PL}^{a}$/τ (μs) | $Au_2^{CC}$ $k_{TADF}$ ($10^5 s^{-1}$)/ln($k_{TADF}$) |
|---|---|---|---|---|
| 200 | 0.72/3.6 | 2.0/12.2 | 1.0/1.6 | 6.2/13.3 |
| 210 | 0.71/3.0 | 2.4/12.4 | 1.0/1.5 | 6.6/13.4 |
| 220 | 0.70/2.5 | 2.9/12.6 | 0.97/1.4 | 6.8/13.4 |
| 230 | 0.69/2.1 | 3.3/12.7 | 0.96/1.2 | 8.1/13.6 |
| 240 | 0.68/1.8 | 3.8/12.8 | 0.94/0.98 | 9.6/13.8 |
| 250 | 0.67/1.6 | 4.3/13.0 | 0.92/0.91 | 10/13.8 |
| 260 | 0.66/1.4 | 4.9/13.1 | 0.89/0.79 | 11/13.9 |
| 270 | 0.65/1.2) | 5.4/13.2 | 0.85/0.70 | 12/14.0 |
| 280 | 0.64/1.1 | 6.0/13.3 | 0.81/0.65 | 13/14.0 |

TABLE 7-continued

Temperature dependent photophysical properties of $Au^{C}$ and $Au_2^{CC}$ in PS film.

| T (K) | $Au^{C}$ $\Phi_{PL}^{a}$/τ (μs) | $Au^{C}$ $k_{TADF}$ ($10^5 s^{-1}$)/ln($k_{TADF}$) | $Au_2^{CC}$ $\Phi_{PL}^{a}$/τ (μs) | $Au_2^{CC}$ $k_{TADF}$ ($10^5 s^{-1}$)/ln($k_{TADF}$) |
|---|---|---|---|---|
| 290 | 0.62/0.92 | 6.7/13.4 | 0.80/0.56 | 14/14.2 |
| 300 | 0.61/0.86 | 7.1/13.5 | 0.80/0.51 | 16/14.3 |
| 310 | 0.60/0.80 | 7.5/13.5 | 0.79/0.51 | 16/14.3 |

In conclusion, a new luminescent two-coordinate coinage metal chromophore with a tandem-carbene structure was designed and synthesized. The tandem-carbene complex $Au_2^{CC}$ has a coplanar arrangement of π-systems for the three ligands. Theoretical and photophysical analyses show that ICT emission from $Au_2^{CC}$ is from the electron donating carbazolyl ligand to both electron accepting carbene ligands. Luminescence from the $Au_2^{CC}$ complex is blue ($\lambda_{max}$=480 nm) and efficient ($\Phi_{PL}$=0.80) with a fast emission lifetime (τ=0.52 μs). The radiative rate for $Au_2^{CC}$ ($k_r$=1.5×$10^6$ $s^{-1}$) is over two-times higher than for the monometallic reference complex $Au^{C}$. The increase in the radiative rate is attributed to a decrease in the energy of the singlet-triplet gap caused by spatially extending the ICT exciton over both carbene ligands. These results demonstrate that a tandem-carbene strategy can be used in two-coordinate coinage metal complexes to enhance the luminescence efficiency of TADF by increasing the radiative rate for emission. Moreover, the tandem-carbene approach demonstrated here is amenable to synthetic modifications that should enable further decreases in the energy of the singlet-triplet gap, and thus even faster radiative rates for emission.

Materials and Methods

Syntheses and Characterizations

The commercially available reactants were used as received without further purifications. The MAC carbene ligand, and (MAC)AuCl were prepared according to the reported method.[1] All the reactions were carried out using standard Schlenk line under $N_2$ atmosphere, and purification of both the intermediate and final products were carried out under air. All the solvents were used as received from commercial sources except where individually mentioned. $^{1}$H NMR and $^{13}$C NMR spectra were recorded on a Varian Mercury 400 instrument. Elemental analyses were performed using a Thermo Scientific FlashSmart CHNS elemental analyzer. Mass spectra were detected using a Bruker Autoflex Speed MALDI mass spectrometer.

General Synthesis of N-Propargyl Formamidines 1

Figure 25:
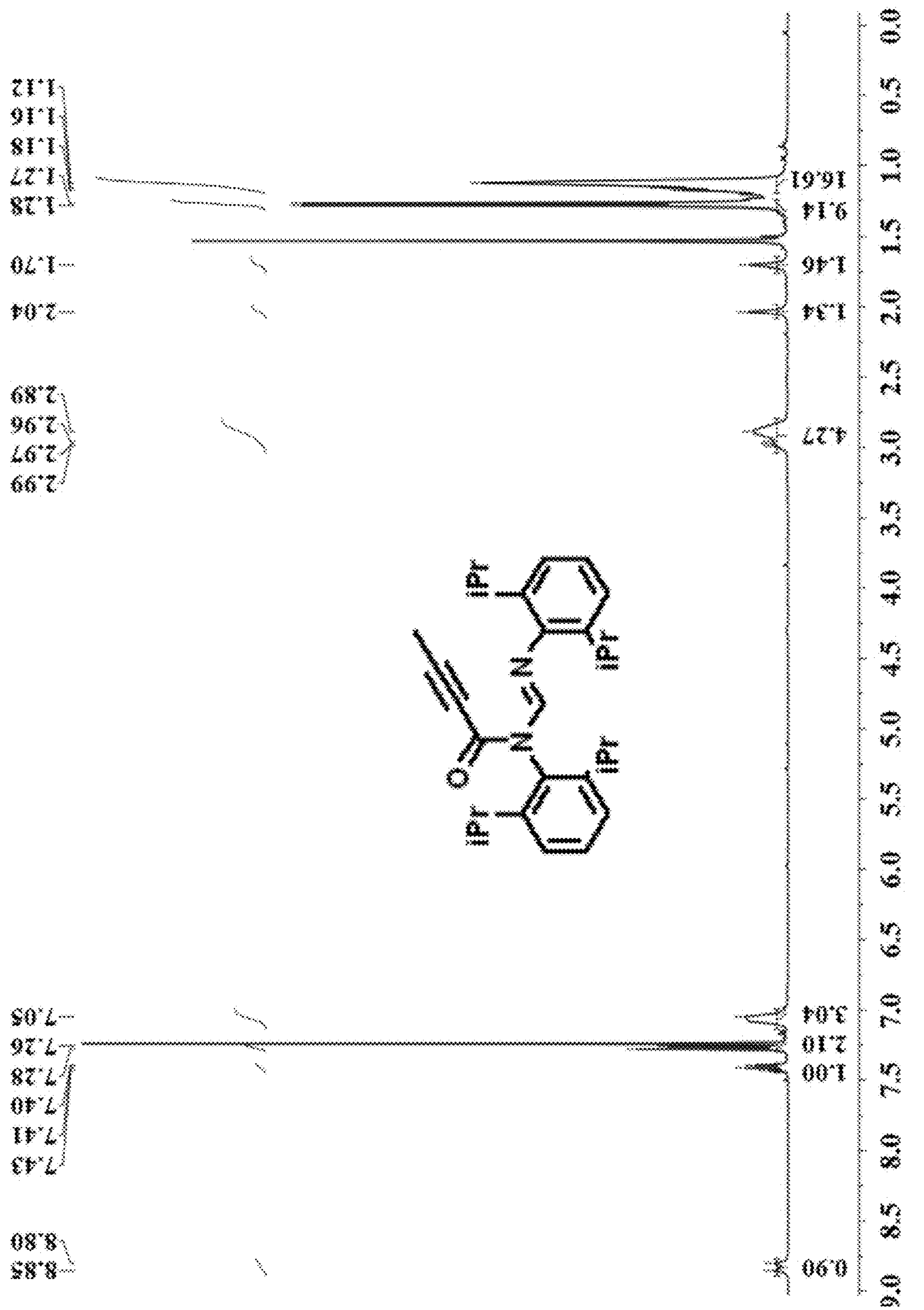
FIG. 25 is a $^{1}$H NMR spectrum of N-propargyl formamidine 1.

A mixture of N,N'-bis(2,6-diisopropylphenyl) formamidine (500 mg, 1.4 mmol, 1 equiv.), butynoic acid (127 mg, 1.5 mmol, 1.1 equiv) and N,N'-dicyclohexylcarbodiimide (DCC, 311 mg, 1.5 mmol, 1.1 equiv.) was dissolved in excess amount of anhydrous and deaerated $CH_2Cl_2$ at 0° C. Then, catalytic amount of 4-dimethylaminopyridine (DMAP, 17 mg, 0.14 mmol, 0.1 equiv.) was added in one portion. After stirring at 0° C. for 2 h and at room temperature for 1 h, the raw suspension mixture was filtered through a Celite pad to remove the insoluble side products. The filtrate was condensed and purified using flash chromatography (silicon, eluent: ethyl acetate/hexane=1/30, v/v) to provide the desired product as a colorless dense oil. The oily product was transformed into a flocculent white powder under vacuum. white powder, 380 mg, yield 64%. $^{1}$H NMR (400 MHz, $CDCl_3$, FIG. 25) δ 8.83 (d, J=20.7 Hz, 1H), 7.41

(t, J=7.7 Hz, 1H), 7.27 (d, J=7.7 Hz, 2H), 7.05 (br, 3H), 2.95 (dd, J=24.5, 17.8 Hz, 4H), 2.04 (s, 1.5H), 1.70 (s, 1.5H), 1.28 (d, J=6.8 Hz, 8H), 1.20-1.08 (m, 16H).

Synthesis of Au$^C$

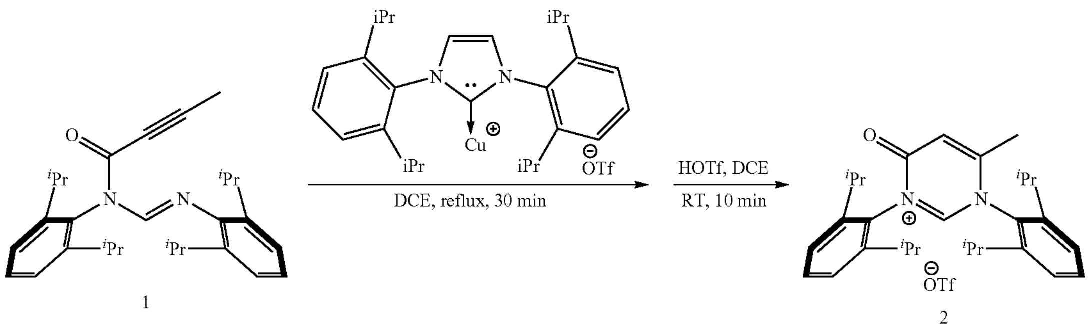

To a DCE solution of IPrCuOTf (0.60 g, 1 mmol), a DCE solution of 1 (0.49 g, 1 mmol) was added at reflux. After stirring at reflux for 30 min, the clear solution was dried under vacuum and excess amount of diethyl ether was added to produce a yellow precipitate which was isolated by filtration. The yellow powder was dissolved in 5 ml DCE and HOTf was added dropwise until the color of the solution turned from yellow to light yellow. After stirring at room temperature for 10 min, the solution was dried under vacuum and excess diethyl ether was added to precipitate 2 as a light-yellow powder (0.47 g, yield 81%). $^1$H NMR (400 MHz, $CDCl_3$) δ 10.05 (s, 1H), 7.61 (t, J=7.8 Hz, 1H), 7.54 (t, J=7.8 Hz, 1H), 7.38 (d, J=7.8 Hz, 2H), 7.33 (d, J=7.8 Hz, 2H), 6.96 (s, 1H), 2.53 (tt, J=13.3, 6.7 Hz, 4H), 2.19 (s, 3H), 1.31 (d, J=6.7 Hz, 6H), 1.26 (d, J=6.8 Hz, 12H), 1.19 (d, J=6.7 Hz, 6H).

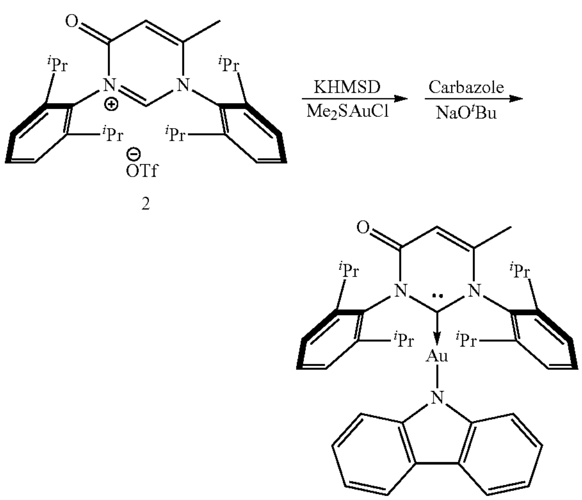

Au$^C$

Figure 26:
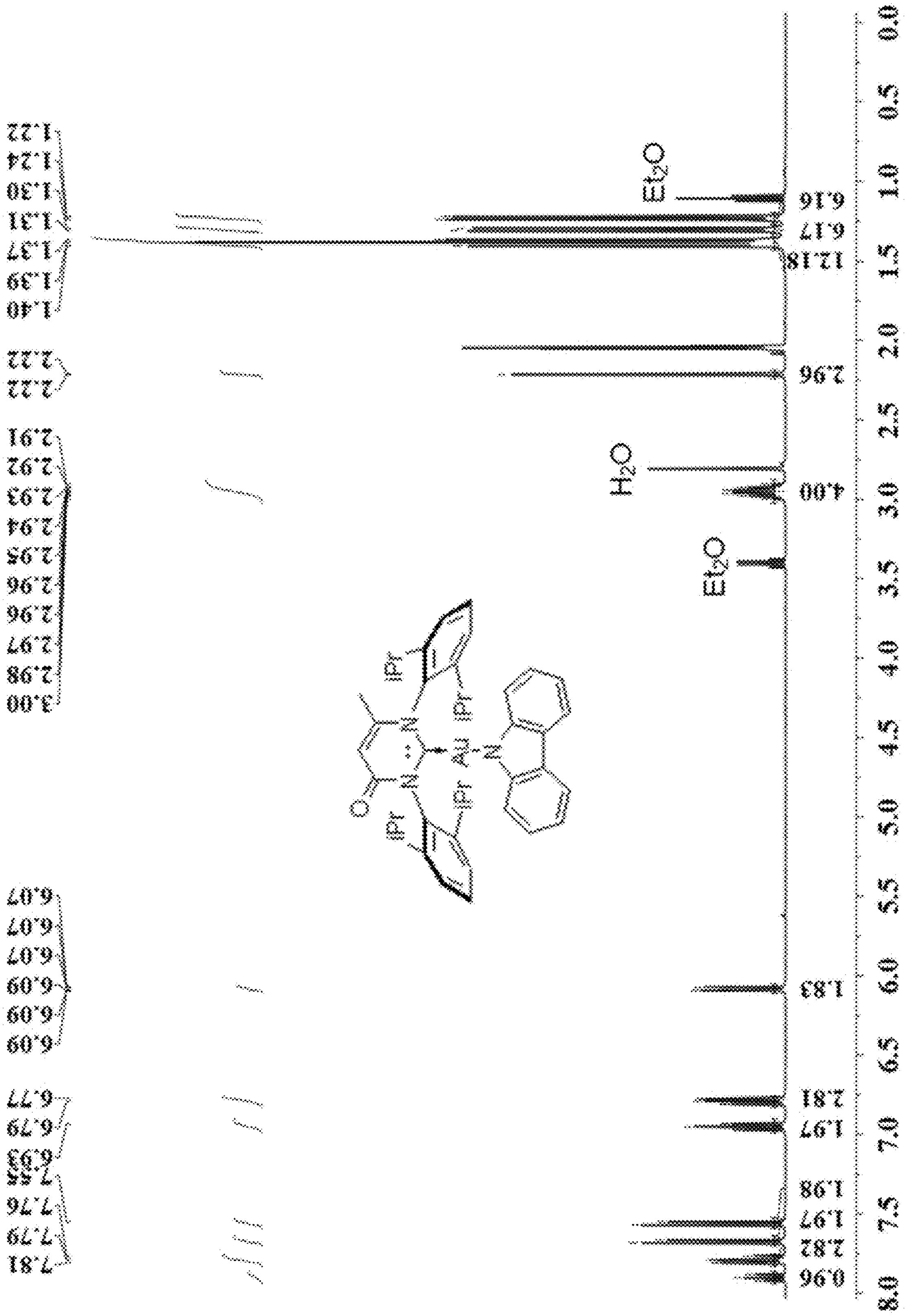
FIG. 26 is a $^{1}$H NMR spectrum of $Au^{C}$.
Figure 27:
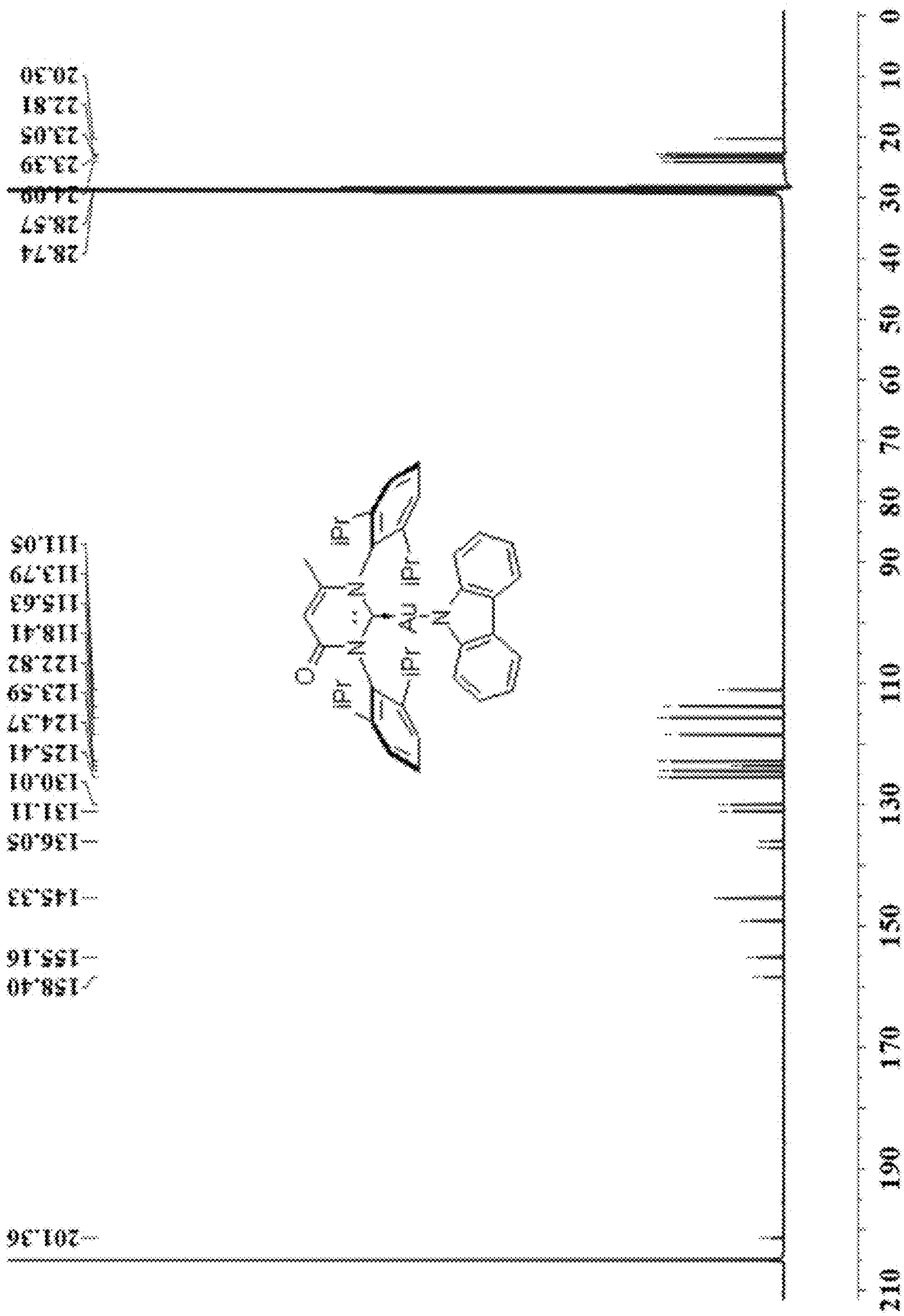
FIG. 27 is a $^{13}$C NMR spectrum of $Au^{C}$.

The AAC precursor 2 (200 mg) was dissolved in anhydrous and air-free THF, and KHMDS (0.76 ml, 0.5 M, 1.1 equiv.) was added dropwise at −77° C. The solution was stirred at −77° C. for 3 h. Then, dimethylsulfide gold chloride (112 mg, 1.1 equiv.) was added in one portion and the mixture was allowed to warm up to room temperature. After stirring overnight, the solvent was removed under reduced pressure and the residue washed with diethyl ether. The intermediate chloride product was isolated as a beige precipitate and added to a mixed THF solution of carbazole and NaO$^t$Bu (1.1 equiv. for both). The mixture was stirred at room temperature for 3 h. After removing the solvent, diethyl ether was added dropwise, and the raw product was converted into a fine powder using an ultrasonic bath. The final product was isolated as fine yellow powder (65 mg, yield 24%). $^1$H NMR (400 MHz, acetone, FIG. 26) δ 7.90 (t, J=7.8 Hz, 1H), 7.82-7.75 (m, 3H), 7.67 (d, J=7.8 Hz, 2H), 7.56 (d, J=7.8 Hz, 2H), 6.95 (ddd, J=8.2, 7.0, 1.3 Hz, 2H), 6.82-6.75 (m, 3H), 6.08 (dt, J=8.2, 0.9 Hz, 2H), 3.02-2.88 (m, 4H), 2.22 (d, J=1.0 Hz, 3H), 1.39 (dd, J=6.8, 5.7 Hz, 12H), 1.30 (d, J=6.9 Hz, 6H), 1.23 (d, J=6.8 Hz, 6H). $^{13}$C NMR (101 MHz, acetone, FIG. 27) δ 201.36, 158.40, 155.16, 149.16, 145.44, 145.33, 137.11, 136.05, 131.11, 130.01, 125.41, 124.37, 123.59, 122.82, 118.41, 115.63, 113.79, 111.05, 28.74, 28.57, 24.09, 23.39, 23.05, 22.81, 20.30. Elemental analysis calculated for $C_{41}H_{46}AuN_3O$: C, 62.04%, H, 5.84%, N, 5.29%; found C, 62.18%, H, 6.09%, N, 5.36%.

Synthesis of (NHC)Au$^{(I)}$ Triflate Salt

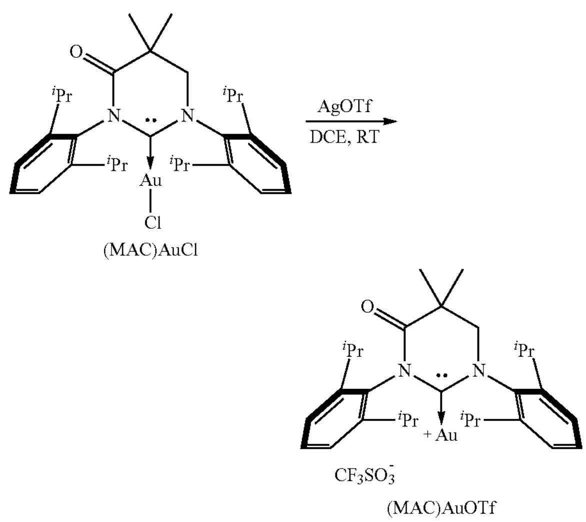

(MAC)AuCl (1.0 g, 1 equiv.) and silver triflate (0.38 g, 1 equiv.) were dissolved in DCE. After stirring at room temperature for 1 h, the reaction mixture was filtered through a Celite pad to remove the insoluble side products. The light-yellow clear filtrate was concentrated under vacuum and an excess amount of pentane is added to precipitate the desired product as a beige crystalline powder (0.11 g, yield 94%). The product was used directly in the following reactions without further purification.

Synthesis of $Au_2^{CC}$

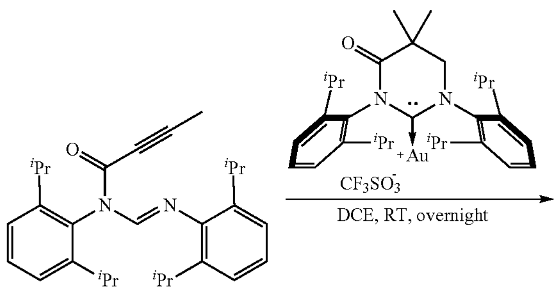

1

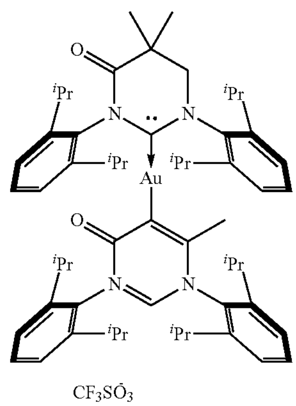

3-OTf

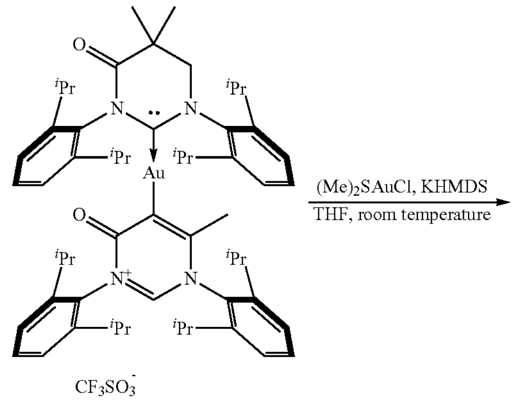

3-OTf

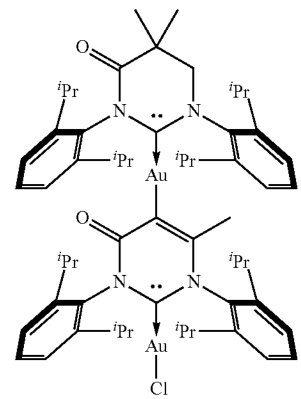

3-AuCl

Figure 28:
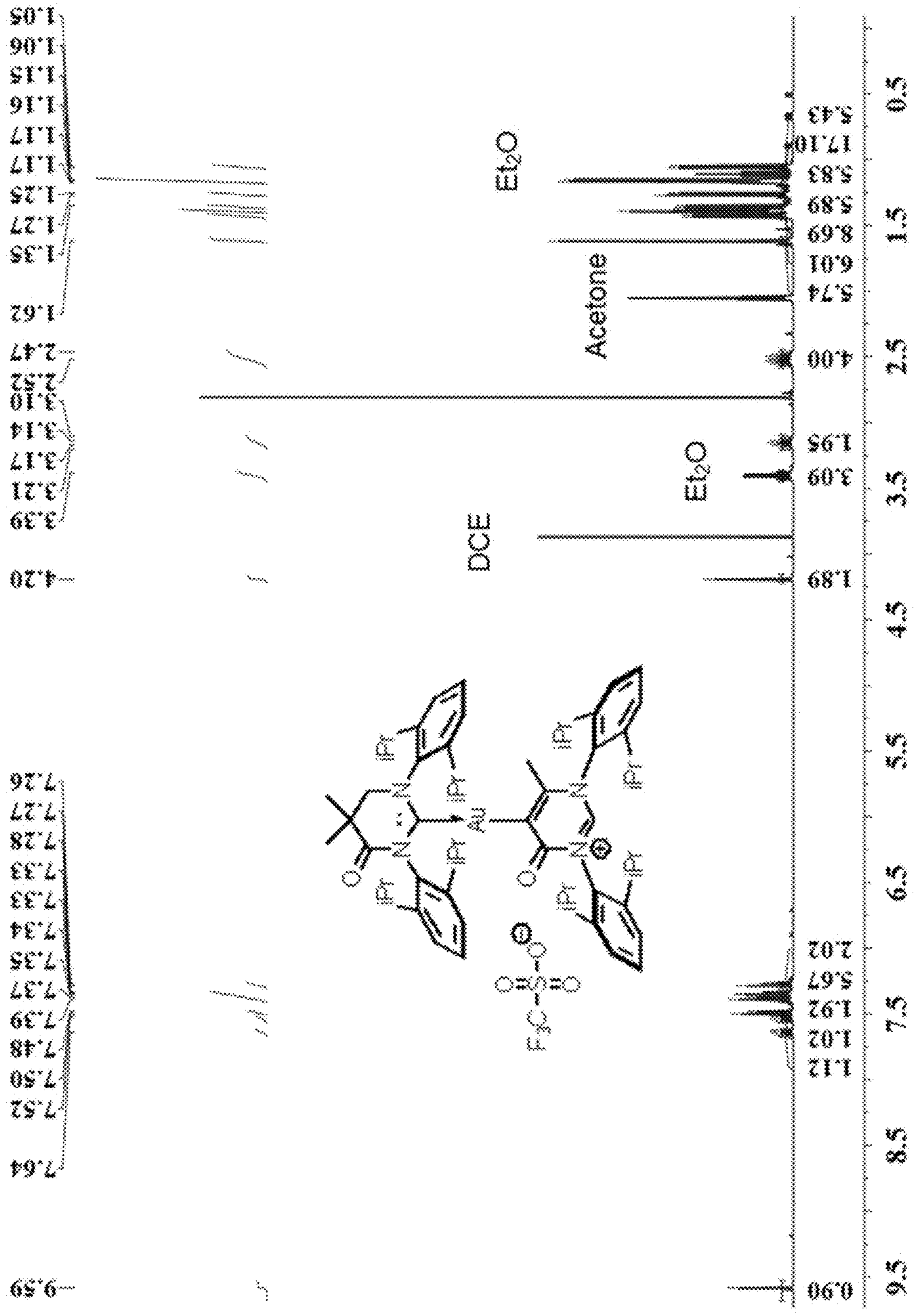
FIG. 28 is a $^{1}$H NMR spectrum of 3-OTf.
Figure 29:
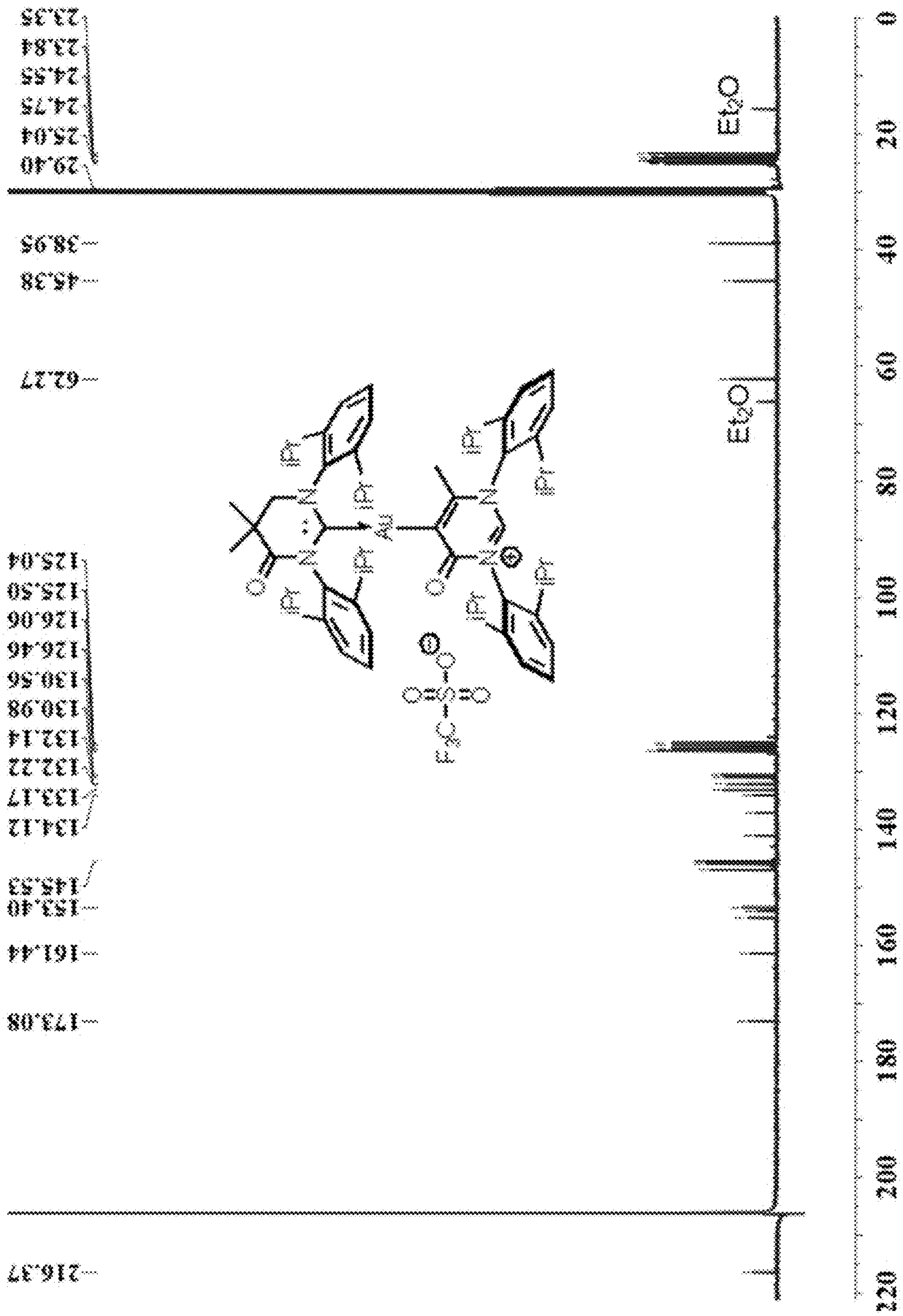
FIG. 29 is a $^{13}$C NMR spectrum of 3-OTf.

A mixture of (MAC)AuOTf (100 mg, 1 equiv.) and 1 (82 mg, 1.5 equiv.) was dissolved in 5 ml DCE and stirred overnight at room temperature. The raw solution was filtered through a Celite pad and the clear light-yellow filtrate was concentrated under vacuum. 3-OTf was taken up in pentane and the beige precipitate was collected and dried under vacuum (145 mg, yield 93%). $^1H$ NMR (400 MHz, acetone, FIG. 28) δ 9.57 (s, 1H, NCHN), 7.63 (t, J=7.7 Hz, 1H, p-ArH), 7.52 (t, J=7.9 Hz, 1H, p-ArH), 7.47 (d, J=7.8 Hz, 2H, m-ArH), 7.39-7.30 (m, 6H, p-ArH and m-ArH), 7.28-7.24 (m, 2H, m-ArH), 4.18 (s, 2H, $NCH_2C$), 3.39 (sept, J=6.8 Hz, 2H, $CH(CH_3)_2$), 3.14 (sept, J=6.8 Hz, 2H, $CH(CH_3)_2$), 2.58-2.44 (m, 4H, $CH(CH_3)_2$), 1.60 (s, 6H, $C(CH_3)_2$), 1.41 (d, J=6.8 Hz, 6H, $CH(CH_3)_2$)), 1.38 (s, 3H, $CCH_3$) 1.37 (d, J=6.8 Hz, 6H, $CH(CH_3)_2$)), 1.34 (d, J=6.8 Hz, 6H, $CH(CH_3)_2$)), 1.25 (d, J=6.7 Hz, 6H, $CH(CH_3)_2$)), 1.15 (d, J=6.8 Hz, 6H, $CH(CH_3)_2$)), 1.14 (d, J=6.8 Hz, 12H, $CH(CH_3)_2$)), 1.04 (d, J=6.7 Hz, 6H, $CH(CH_3)_2$)). $^{13}C$ NMR (101 MHz, acetone, FIG. 29) δ 216.37, 173.08, 161.44, 155.26, 154.05, 153.40, 146.91, 145.91, 145.53, 145.43, 141.04, 137.16, 134.12, 133.17, 132.22, 132.14, 130.98, 130.56, 126.46, 126.06, 125.50, 125.04, 62.27, 45.38, 38.95, 29.87, 29.40, 25.12, 25.04, 24.88, 24.75, 24.60, 24.55, 24.10, 23.84, 23.74, 23.35.

Figure 30:
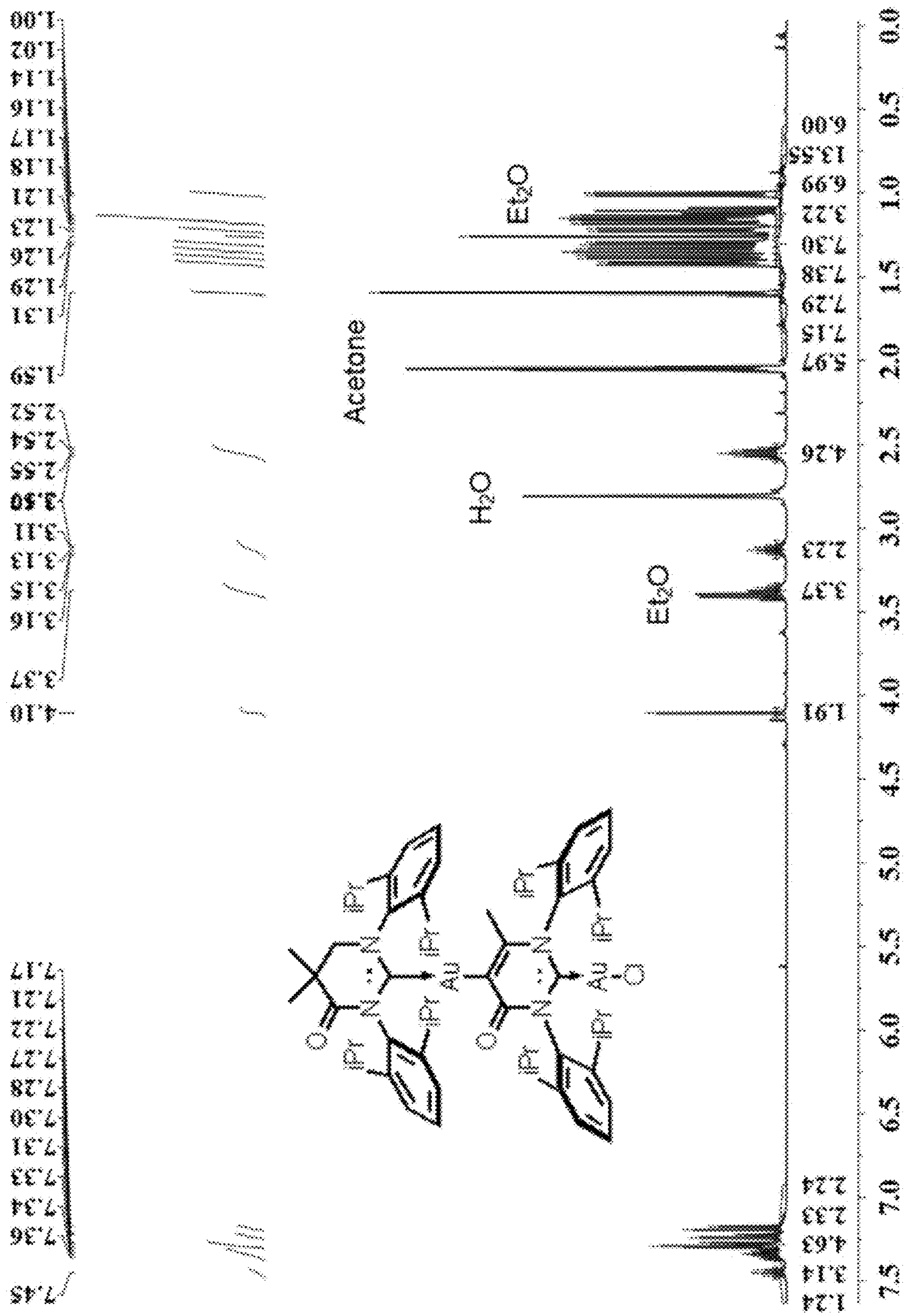
FIG. 30 is a $^{1}$H NMR spectrum of 3-AuCl.
Figure 31:
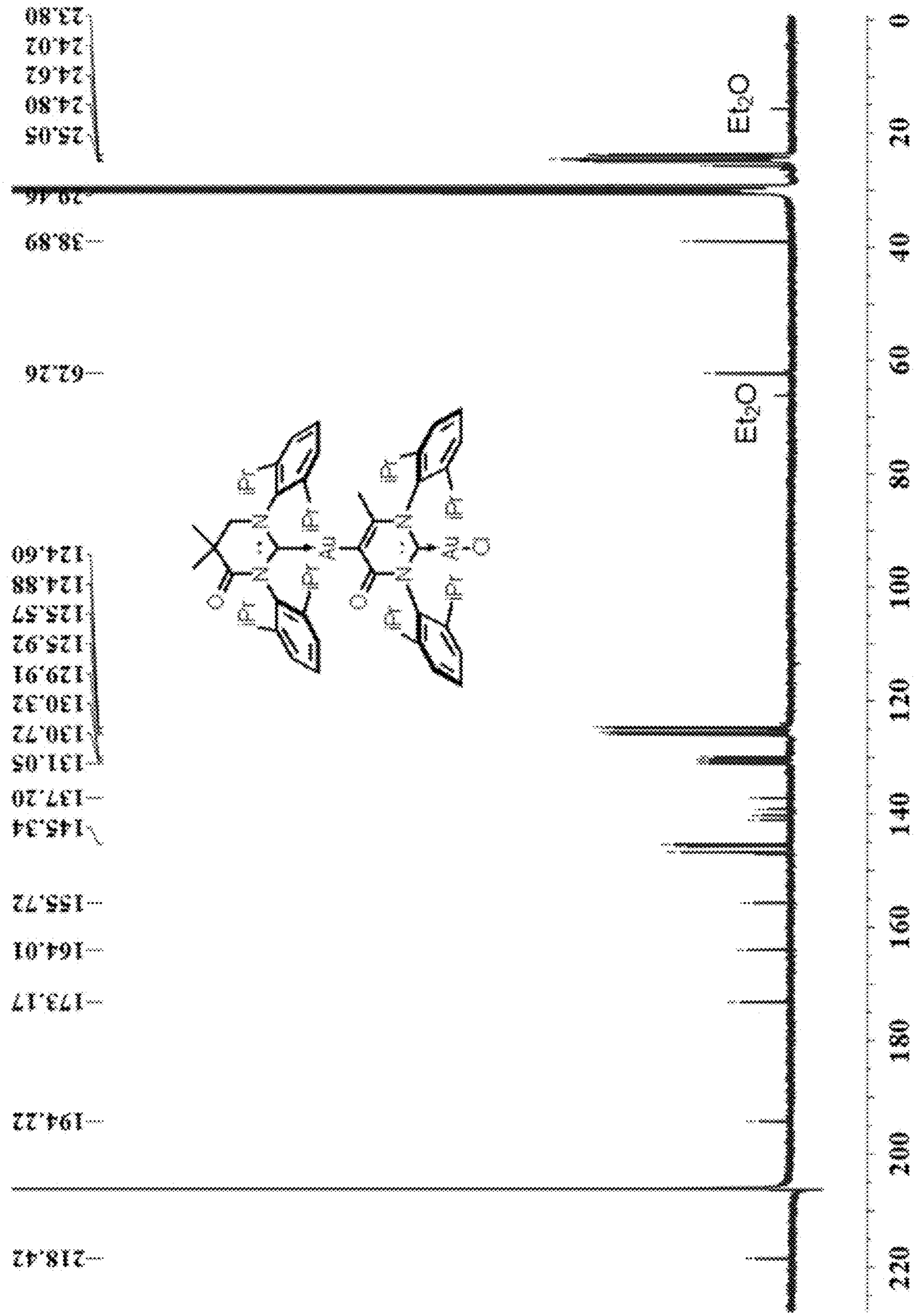
FIG. 31 is a $^{13}$C NMR spectrum of 3-AuCl.

3-OTf (145 mg) was dissolved in an excess amount of anhydrous and de-aerated THF and cooled in a dry ice bath. A solution of KHMDS in toluene (0.26 ml, 0.5 M, 1.1 equiv.) was added dropwise, the solution was stirred at −77° C. for 3 h. Solid dimethylsulfide Au chloride (35 mg, 1 equiv.) was then added in one portion against a stream of $N_2$ at −77° C. and the solution was allowed to warm to room temperature overnight. The raw solution was filtered through a Celite pad to remove insoluble side products and the yellow filtrate was dried under vacuum. The obtained precipitate was washed with small amount of diethyl ether. 3-AuCl was isolated as a beige solid by filtration (130 mg, yield 84%). $^1H$ NMR (400 MHz, acetone, FIG. 30) δ 7.45 (t, J=7.8 Hz, 1H, p-ArH), 7.38-7.30 (m, 3H, p-ArH and p-ArH), 7.30-7.26 (m, 4H, m-ArH), 7.25-7.21 (m, 2H, m-ArH), 7.18 (d, J=7.7 Hz, 2H, m-ArH), 4.10 (s, 2H, $NCH_2C$), 3.38 (sept, J=6.8 Hz, 2H, $CH(CH_3)_2$)), 3.13 (sept, J=6.8 Hz, 2H, $CH(CH_3)_2$)), 2.55 (sept, J=6.9 Hz 4H, $CH(CH_3)_2$)), 1.60 (s, 6H, $C(CH_3)_2$), 1.42 (d, J=6.8 Hz, 6H, $CH(CH_3)_2$)), 1.38 (d, J=6.9 Hz, 6H, $CH(CH_3)_2$)), 1.34 (d, J=6.9 Hz, 6H, $CH(CH_3)_2$)), 1.30 (d, J=6.8 Hz, 6H, $CH(CH_3)_2$)), 1.26 (s, 3H, $CCH_3$), 1.22 (d, J=6.9 Hz, 6H, $CH(CH_3)_2$)), 1.16 (dd, J=10.5, 6.8 Hz, 12H, $CH(CH_3)_2$)), 1.01 (d, J=6.8 Hz, 6H, $CH(CH_3)_2$)). $^{13}C$ NMR (101 MHz, acetone, FIG. 31) δ 218.42, 194.22, 173.17, 164.01, 155.72, 147.16, 146.76, 145.74, 145.41, 145.34, 141.11, 140.30, 139.21, 137.20, 131.05, 130.72, 130.32, 129.91, 125.92, 125.57, 124.88, 124.60, 62.26, 38.89, 29.46, 29.39, 29.24, 25.81, 25.05, 25.01, 24.80, 24.76, 24.62, 24.51, 24.02, 23.93, 23.80.

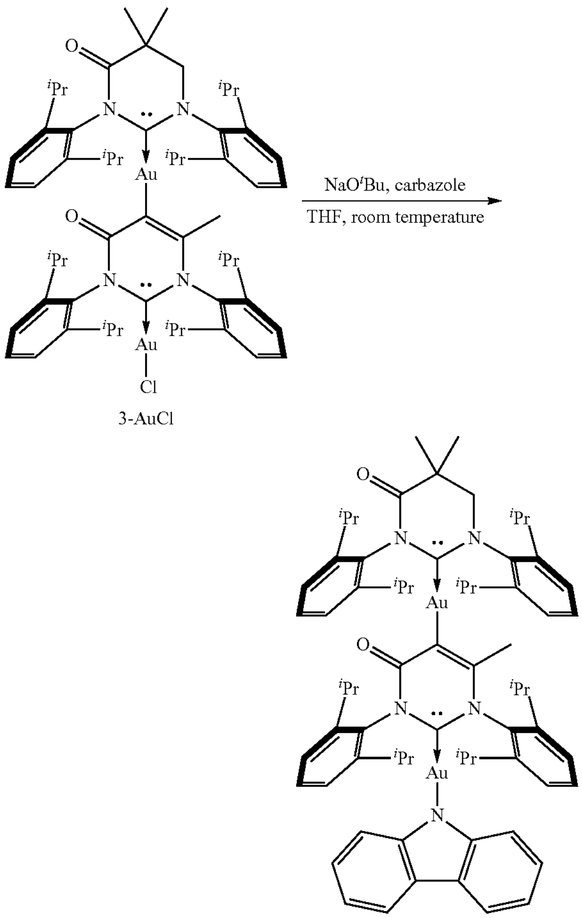

3-AuCl $Au_2{}^{CC}$

Figure 32:
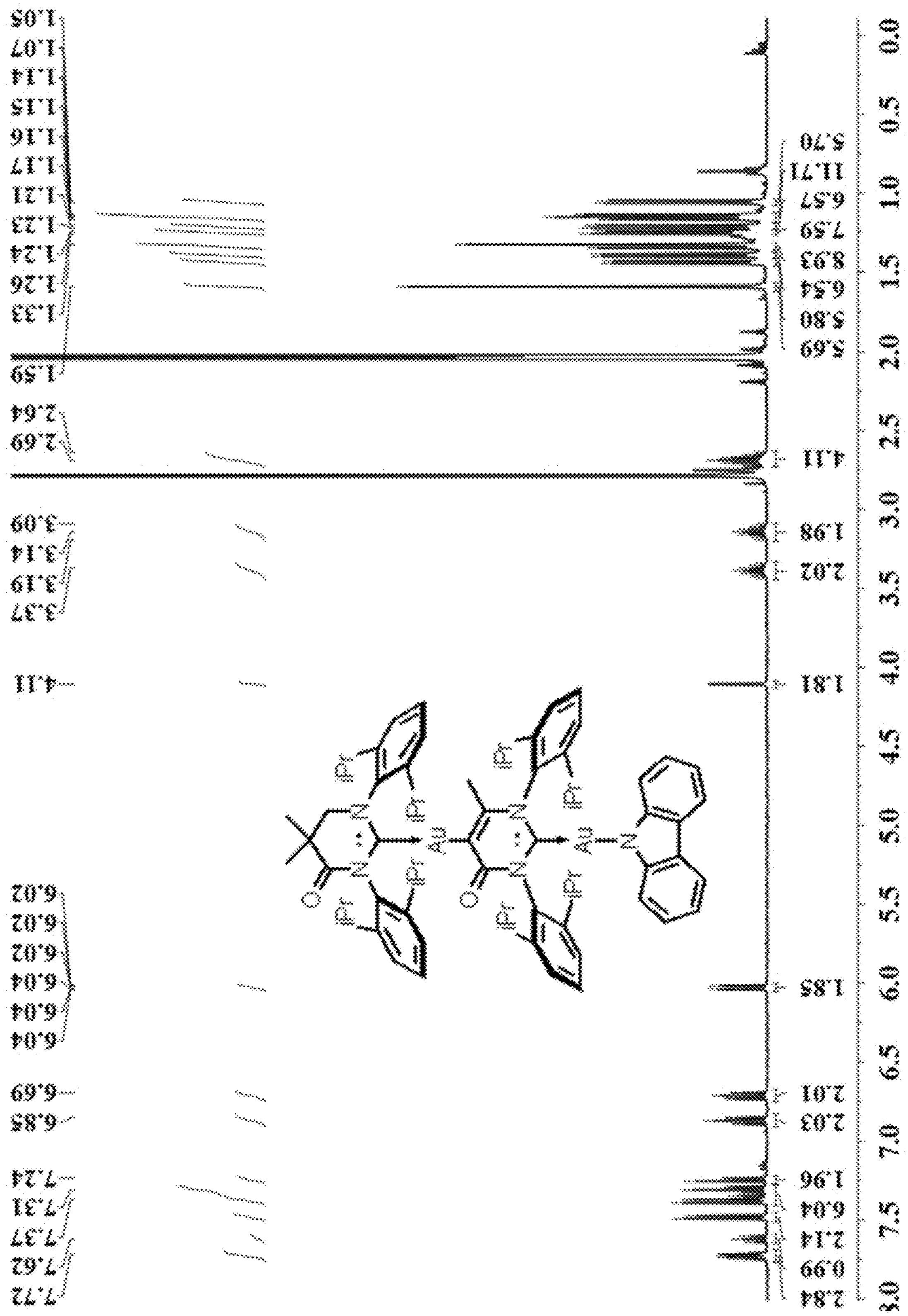
FIG. 32 is a $^{1}$H NMR spectrum of $Au_2^{CC}$.
Figure 33:
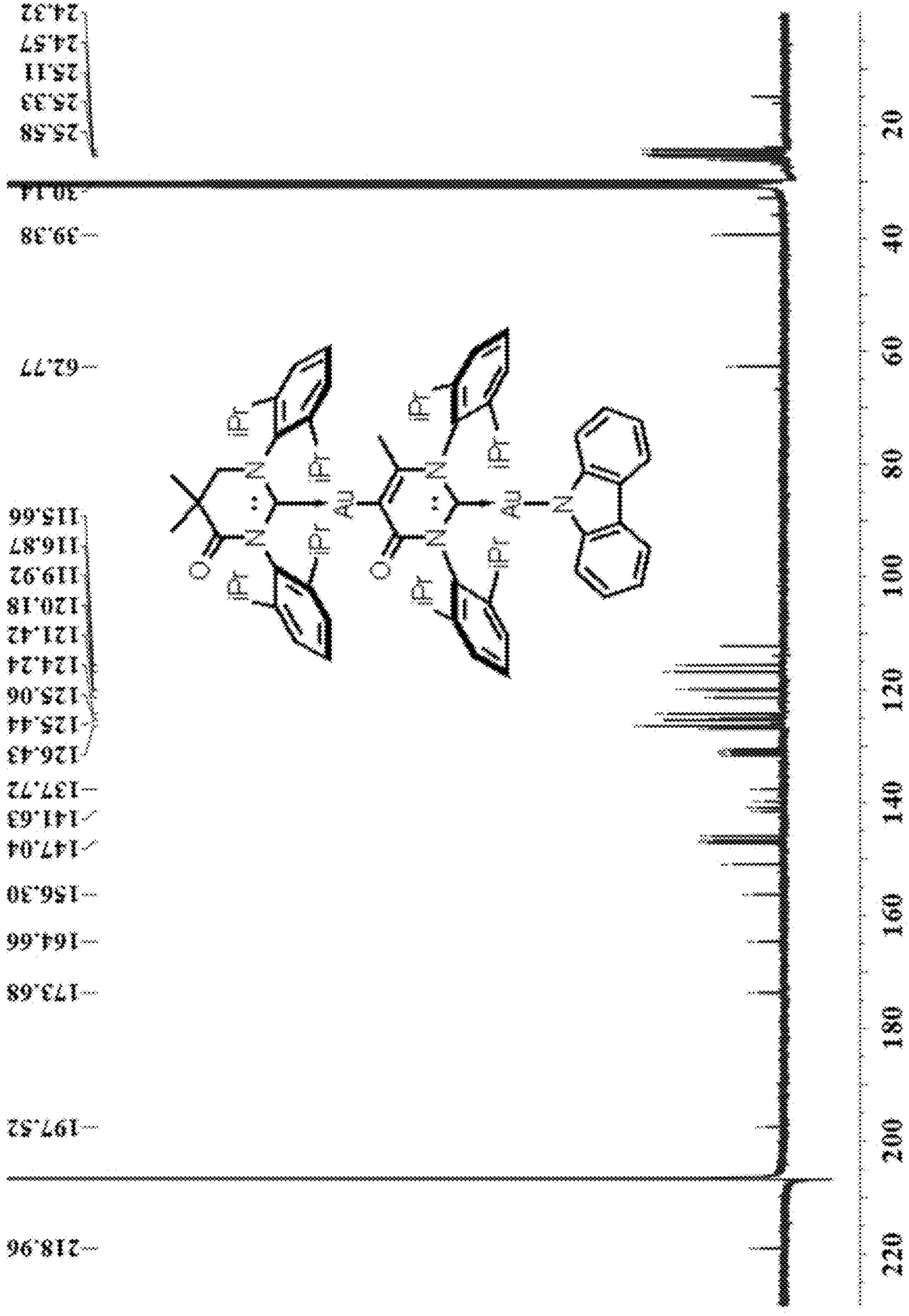
FIG. 33 is a $^{13}$C NMR spectrum of $Au_2^{CC}$.

A mixture of carbazole (18 mg, 1.1 equiv.) and NaO$^t$Bu (11 mg, 1.1 equiv.) were dissolved in anhydrous and deaerated THF. After stirring at room temperature for 3 h, 3-AuCl (130 mg) was added to the solution in one portion against a stream of $N_2$. The yellow solution was then stirred at room temperature overnight. The solution was next filtered through a Celite pad and the filtrate dried under vacuum. The raw product was taken up in diethyl ether and pentane was layered on top for recrystallization. The final product was obtained as a bright yellow powder (120 mg, yield 84%). $^1$H NMR (400 MHz, acetone, FIG. 32) δ 7.73, (t, J=7.8 Hz, 1H, p-ArH), 7.73 (ddd, J=0.7, 1.2, 7.7 Hz, 2H, $CH^4$(Cz)), 7.62 (t, J=7.8 Hz, 1H, p-ArH), 7.48 (d, J=7.8 Hz, 2H, m-ArH), 7.41-7.28 (m, 6H, m-ArH and p-ArH), 7.27-7.22 (m, 2H, m-ArH), 6.87 (ddd, J=8.2, 7.0, 1.3 Hz, 2H, $CH^2$(Cz)), 6.71 (ddd, J=7.8, 7.0, 1.0 Hz, 2H, $CH^3$(Cz)), 6.03 (dt, J=8.2, 0.9 Hz, 2H, $CH^1$(Cz)), 4.11 (s, 2H, $NCH_2C$), 3.39 (sept, J=6.8 Hz, 2H, $CH(CH_3)_2$)), 3.14 (sept, J=6.8 Hz, 2H, $CH(CH_3)_2$)), 2.69 (sept, J=6.9 Hz, 4H, $CH(CH_3)_2$)), 1.59 (s, 6H, $C(CH_3)_2$), 1.44 (d, J=6.8 Hz, 6H, $CH(CH_3)_2$)), 1.40 (d, J=6.9 Hz, 6H, $CH(CH_3)_2$)), 1.34 (d, J=6.8 Hz, 6H, $CH(CH_3)_2$)) 1.33 (s, 3H, $CCH_3$), 1.25 (d, J=6.8 Hz, 6H, $CH(CH_3)_2$)), 1.22 (d, J=6.8 Hz, 6H, $CH(CH_3)_2$)), 1.16 (dd, J=6.8, 5.4 Hz, 12H, $CH(CH_3)_2$)), 1.06 (d, J=6.8 Hz, 6H, $CH(CH_3)_2$)). $^{13}$C NMR (101 MHz, acetone, FIG. 33) δ 218.96, 197.52, 173.68, 164.66, 156.30, 150.98, 147.28, 147.04, 146.61, 145.93, 141.63, 140.98, 139.85, 137.72, 131.67, 131.24, 130.84, 130.55, 126.95, 126.43, 125.44, 125.06, 124.24, 121.42, 120.18, 119.92, 116.87, 115.66, 62.77, 39.38, 30.14, 29.93, 29.90, 26.15, 25.58, 25.55, 25.33, 25.26, 25.11, 25.02, 24.57, 24.54, 24.32. MALDI-TOF m/z$^+$ calculated for $C_{71}H_{88}Au_2N_5O_2{}^+$ as 1436.6, found 1436.2. Elemental analysis calculated for $C_{71}H_{87}Au_2NAO_2$: C, 59.37%, H, 6.11%, N, 4.88%; found C, 59.48%, H, 5.90%, N, 4.67%.

Crystallographic Measurements and Results

Single crystal samples suitable for X-ray diffraction measurements were grown by slow diffusion of pentane into DCM solution of 3-OTf and acetone solution of $Au^C$. The crystallographic data files have been deposited in the Cambridge Crystallographic Data Center (CCDC)

For 3-OTf: Diffraction images were taken on a Bruker APEX DUO system equipped with a TRIUMPH curved crystal monochromator and a Mo $K_\alpha$ fined-focus tube (λ=0.71073 Å). All of the samples were measured at 100 K controlled by an Oxford Cryosystems Cryostream 700 apparatus. Crystal samples were mounted on a Cryo-Loop by Paratone oil. The Bruker SAINT software was used to integrate the frames. Absorption correction of the data set was done using the multiscan method (SADABS). All of the non-hydrogen atoms are refined anisotropically and hydrogen atoms were mounted theoretically using the SHELXTL software.

For $Au^C$: X-ray diffraction data were collected on a Bruker SMART APEX II system equipped with a graphite crystal monochromator and a Mo $K_\alpha$ fine-focus tube (λ=0.71073 Å). All of the samples were measured at 180 K controlled by an Oxford Cryosystems Cryostream 700 apparatus. Crystal samples were mounted on a Cryo-Loop by Protol oil. The frames were integrated by using the Bruker SAINT software and the data were corrected for absorption by using the multiscan method (SADABS). The structures were solved by using direct methods and standard difference map techniques, and were refined by full-matrix least-squares procedures on $F^2$ with SHELXTL (Version 2014/7). All of the non-hydrogen atoms were refined anisotropically and hydrogen atoms were placed in calculated positions using the SHELXTL software.

TABLE 8

Crystallographic data of 3-OTf and $Au^C$

| Complex | 3-OTf | $AU^C$ |
|---|---|---|
| Formula | $C_{59}H_{80}AuN_4O_2{\bullet}CF_3O_3S{\bullet}CH_2Cl_2$ | $C_{41}H_{46}AuN_3O{\bullet}C_3H_6O$ |
| Formula weight | 1308.23 | 851.86 |
| Temperature | 100K | 180K |
| Wavelength | 0.71073 Å | 0.71073 Å |
| Crystal system | triclinic | orthorhombic |
| Space group | $P\bar{1}$ | Pna2/1 |
| a (Å) | 11.119(13) | 24.2050(9) |
| b (Å) | 16.696(19) | 8.8239(3) |
| c (Å) | 19.31(2) | 36.5453(13) |

TABLE 8-continued

| Crystallographic data of 3-OTf and $Au^C$ | | |
|---|---|---|
| Complex | 3-OTf | $AU^C$ |
| α (deg) | 66.827(13) | 90 |
| β (deg) | 73.934(17) | 90 |
| γ (deg) | 85.31(2) | 90 |
| Volume ($Å^3$) | 3165.(6) | 7805.4(5) |
| Z | 2 | 4 |
| F(000) | 1344 | 3456 |
| θ (deg) for collection | 2.23 to 30.33 | 2.37 to 30.50 |
| Index range | $-15 \le h \le 15$ | $-34 \le h \le 34$ |
| | $-23 \le k \le 23$ | $-12 \le k \le 12$ |
| | $-27 \le l \le 27$ | $-52 \le l \le 52$ |
| Reflections measured | 79876 | 124298 |
| Unique ($R_{int}$) | 9795 (0.0594) | 9928 (0.0462) |
| Goodness of Fit | 1.029 | 1.274 |
| Final R indices | $R_1 = 0.0405$ | $R_1 = 0.0487$ |
| [I > 2σ(I)] | $wR_2 = 0.0905$ | $wR_2 = 0.0963$ |
| R indices (all data) | $R_1 = 0.0576$ | $R_1 = 0.0533$ |
| | $wR_2 = 0.0973$ | $wR_2 = 0.0975$ |
| CCDC number | 2027006 | 2027007 |

TABLE 9

| Selected structural data on 3-OTf and $Au^C$ | | | |
|---|---|---|---|
| 3-OTf | | AUC | |
| Bond length (Å) | | Bond length (Å) | |
| C5-Au | 2.016(4) | C1-Au | 2.000(8) |
| Au-C2 | 2.031(4) | Au-N3 | 2.000(7) |
| Bond angle (°) | | Bond angle (°) | |
| C5-Au-C2 | 177 6(1) | C1-Au-N3 | 177 2(3) |
| N3-C5-N4 | 117.5(3) Σ = 360.0 | N1-C1-N2 | 117.7(7) Σ = 359.9 |
| N3-C5-Au | 121.7(2) | N2-C1-Au | 119.5(6) |
| N4-C5-Au | 120.8(2) | N1-C1-Au | 122.7(6) |
| C3-C2-C4 | 119.7(3) Σ = 360.0 | C5-N3-C6 | 106.3(7) Σ = 360 |
| C3-C2-Au | 119.2(2) | C5-N3-Au | 126.8(6) |
| C4-C2-Au | 121.1(2) | C6-N3-Au | 126.9(6) |
| N1-C1-N2 | 121.6(3) | C3-C2-C4 | 123.0(9) |
| Dihedral angle (°) | | Dihedral angle (°) | |
| N3-C5-C2-C3 | 1.2(1) | N2-C1-N3-C5 | 10.5(2) |

Electrochemistry Studies

Cyclic voltammetry (CV) and differential pulsed voltammetry (DPV) were performed using a VersaSTAT 3 potentiostat in anhydrous DMF under $N_2$ atmosphere. A standard three-electrode system, a glassy carbon rod working electrode, a platinum wire counter electrode and a silver wire reference electrode, was equipped to conduct the measurements in absolute acetonitrile. Tetra-n-butyl ammonium hexafluorophosphate (TBAF) was used as supporting electrolyte on a concentration of 0.1 M. Ferrocene was used as internal reference. The redox potentials were reported by adjusting the ferrocene redox potentials to 0 V.

Theoretical Calculations

All of theoretical calculations were performed using Q-Chem 5.2 software. The ground state geometries were optimized at a B3LYP/LACVP* level by DFT method. Time-dependent DFT (TD-DFT) calculations were carried out based on the optimized ground state geometry at a CAM-B3LYP/LACVP* level (ω=0.175) for vertical transition energies.

Photophysical Characterizations

The UV-vis absorption spectra were measured on a Hewlett-Packard 8453 diode array spectrometer. Photoluminescent emission spectra were recorded using a Photon Technology International QuantaMaster model C-60 fluorometer. Emission decay lifetimes were determined by the time-correlated single-photon counting method (TCSPC) using an IBH Fluorocube instrument. Absolute emission quantum yields were measured using a Hamamatsu C9920 system equipped with a xenon lamp, calibrated integrating sphere and model C10027 photonic multichannel analyzer (PMA). All of the solution samples in 2-methyltetrahydrofuran (MeTHF) and methylcyclohexane (MeCy) were deaerated by extensive sparging with a stream of $N_2$. The thin film samples were prepared from 1 wt % mixed polystyrene (PS, average Mw=192000) solution in toluene and were dried under vacuum.

Figure 34:
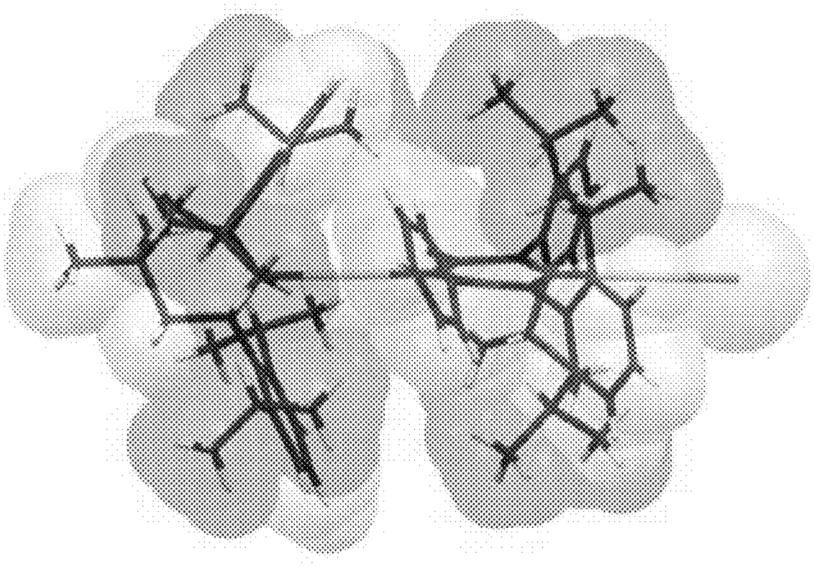
FIG. 34 is a space-filling model of the single crystal structures of AuPhCl (top) and AuPhCz (bottom).
Figure 34:
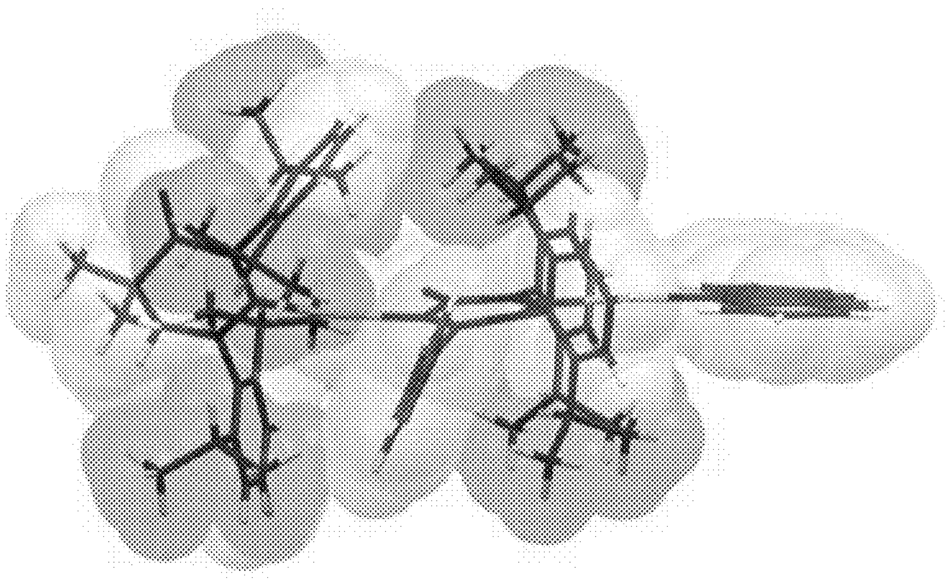
Figure 35:
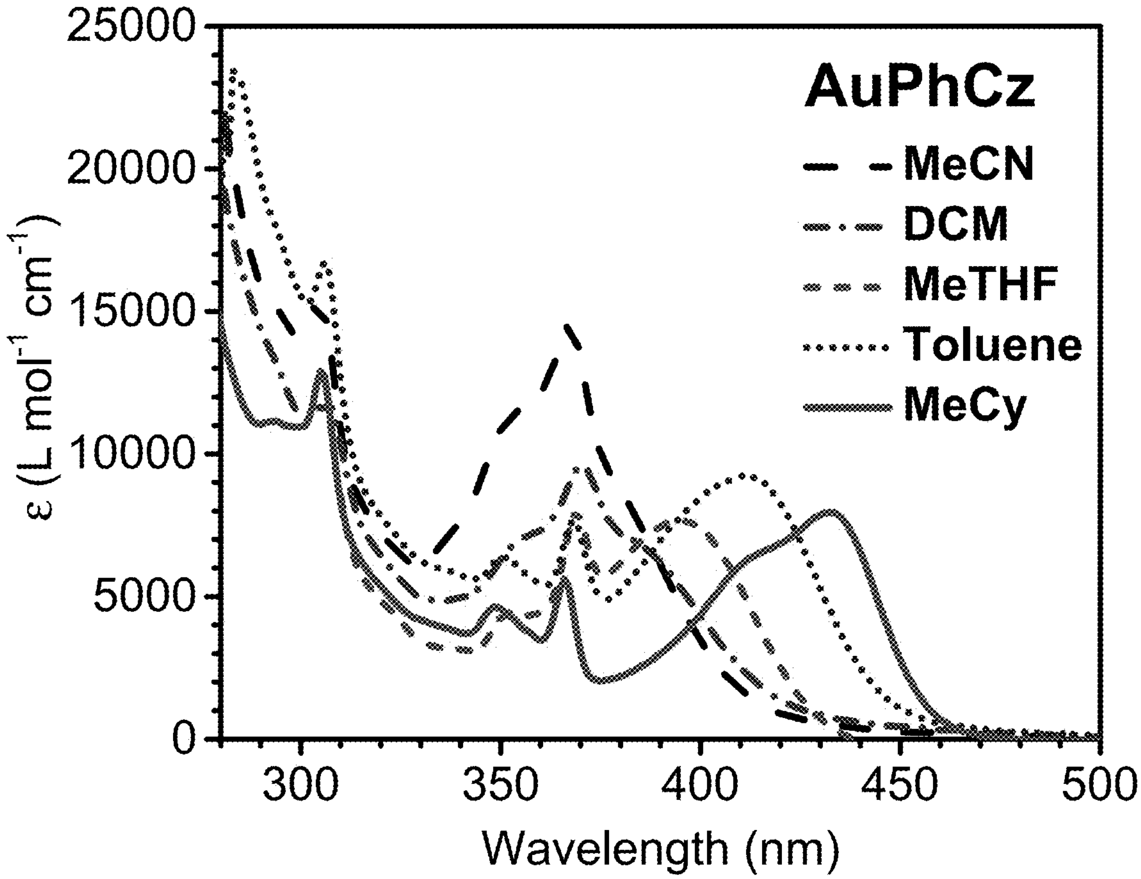
FIG. 35 is a plot of the absorption spectra of AuPhCz in different solvents.
Figure 36:
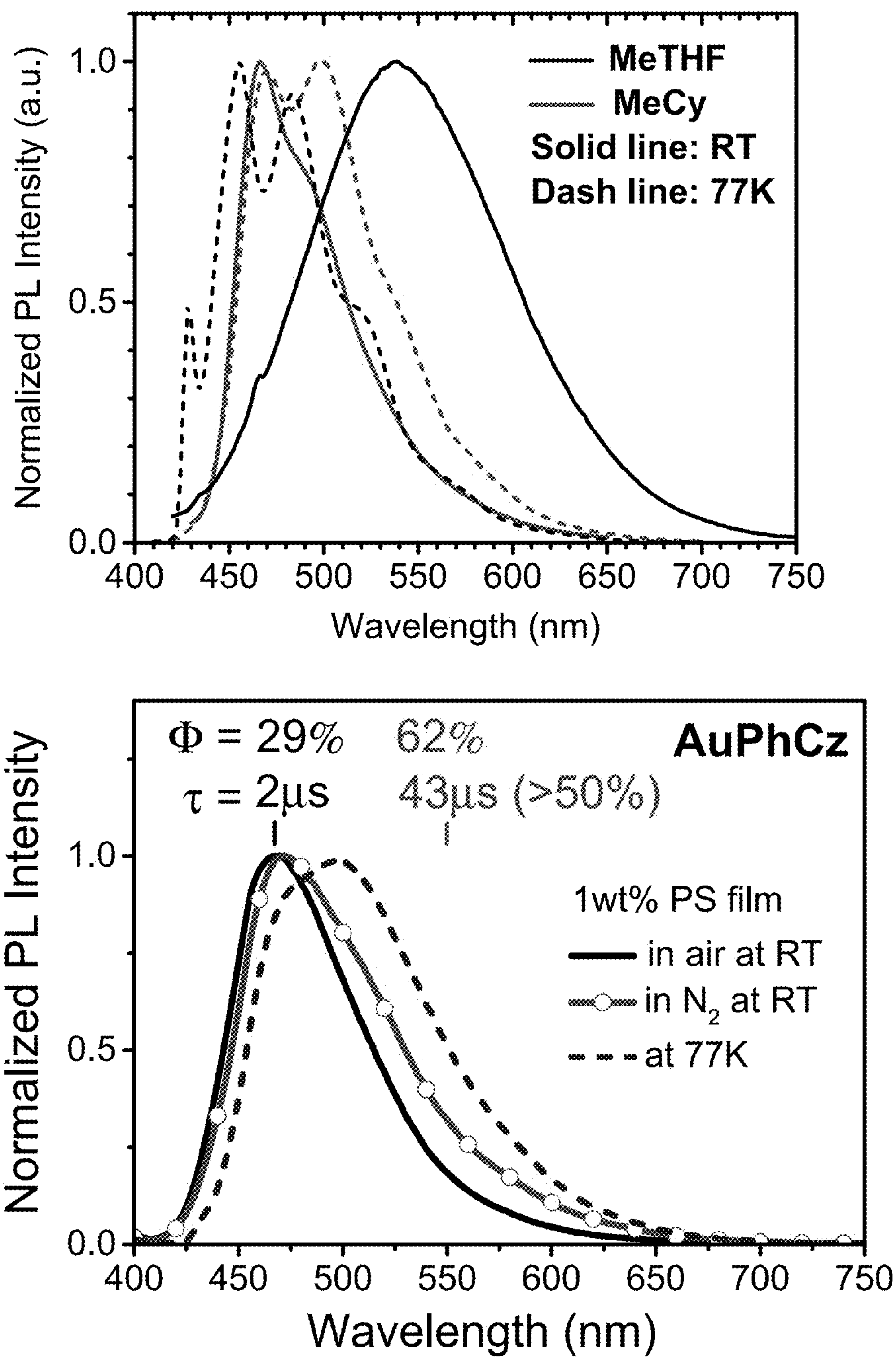
FIG. 36 depicts the emission spectra of AuPhCz in solution (top) and PS film (bottom)
Figure 37:
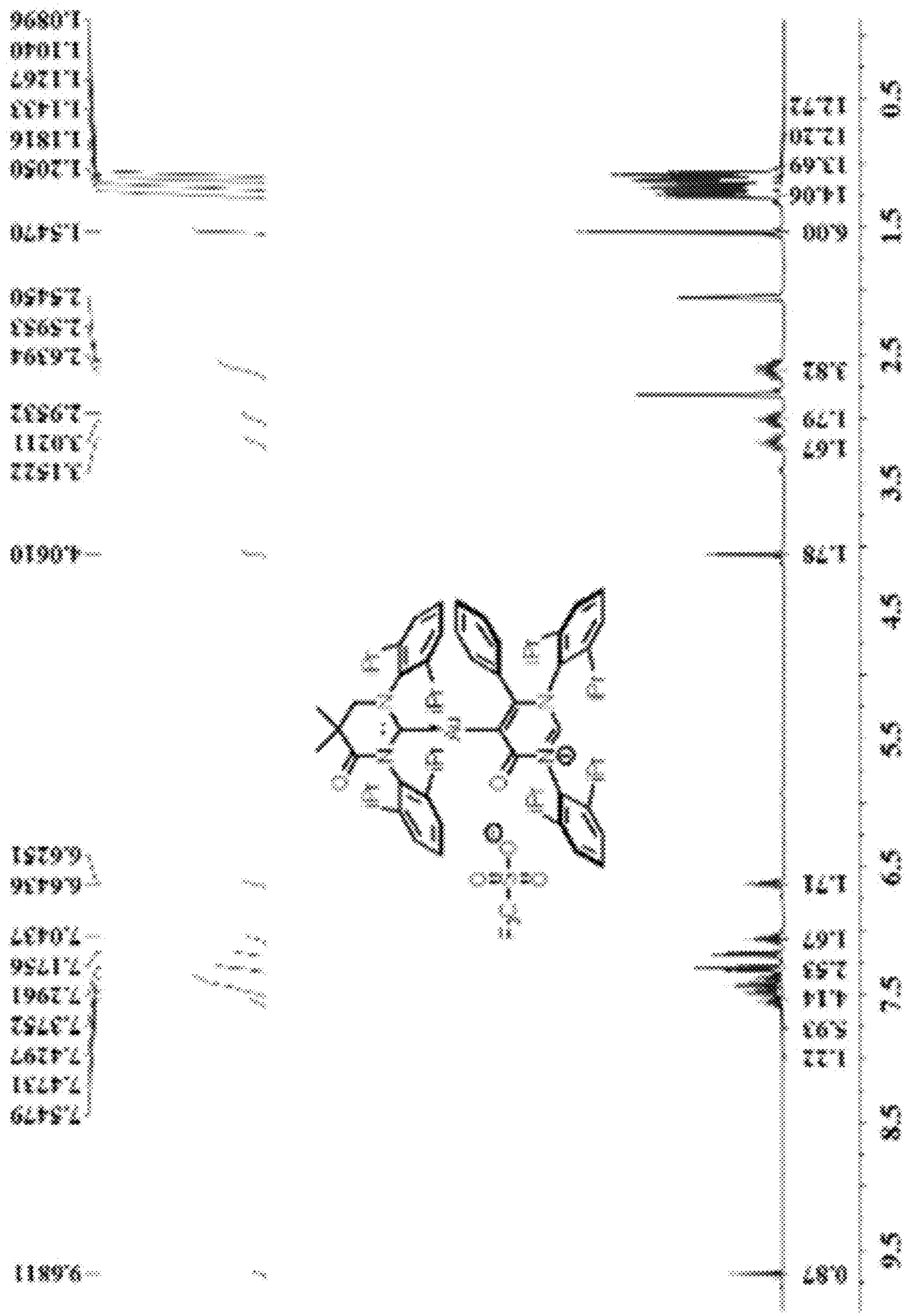
FIG. 37 is a $^{1}$H NMR spectrum of AuPhOTf in d6-Acetone.
Figure 38:
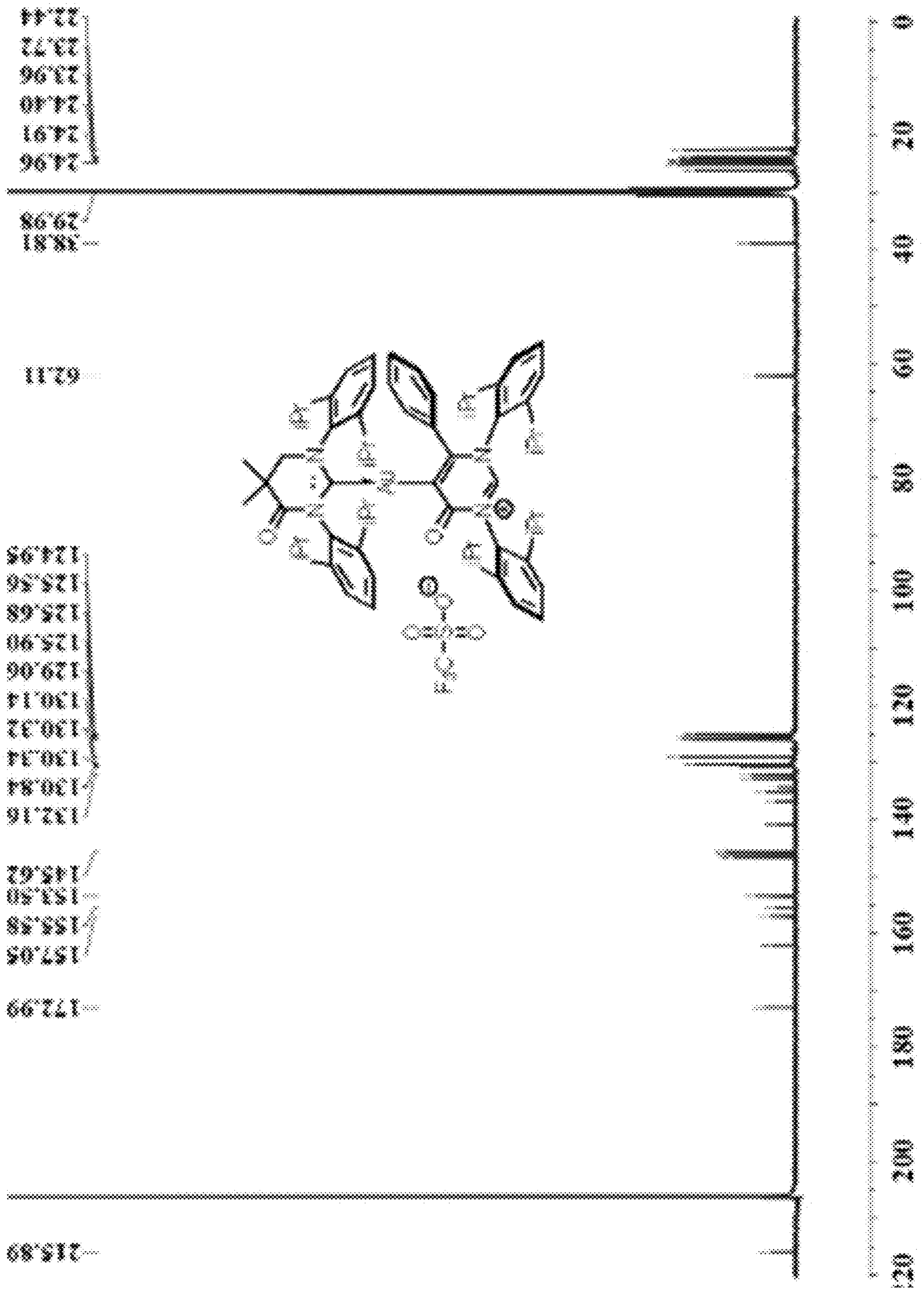
FIG. 38 is a $^{13}$C NMR spectrum of AuPhOTf in d6-Acetone.
Figure 39:
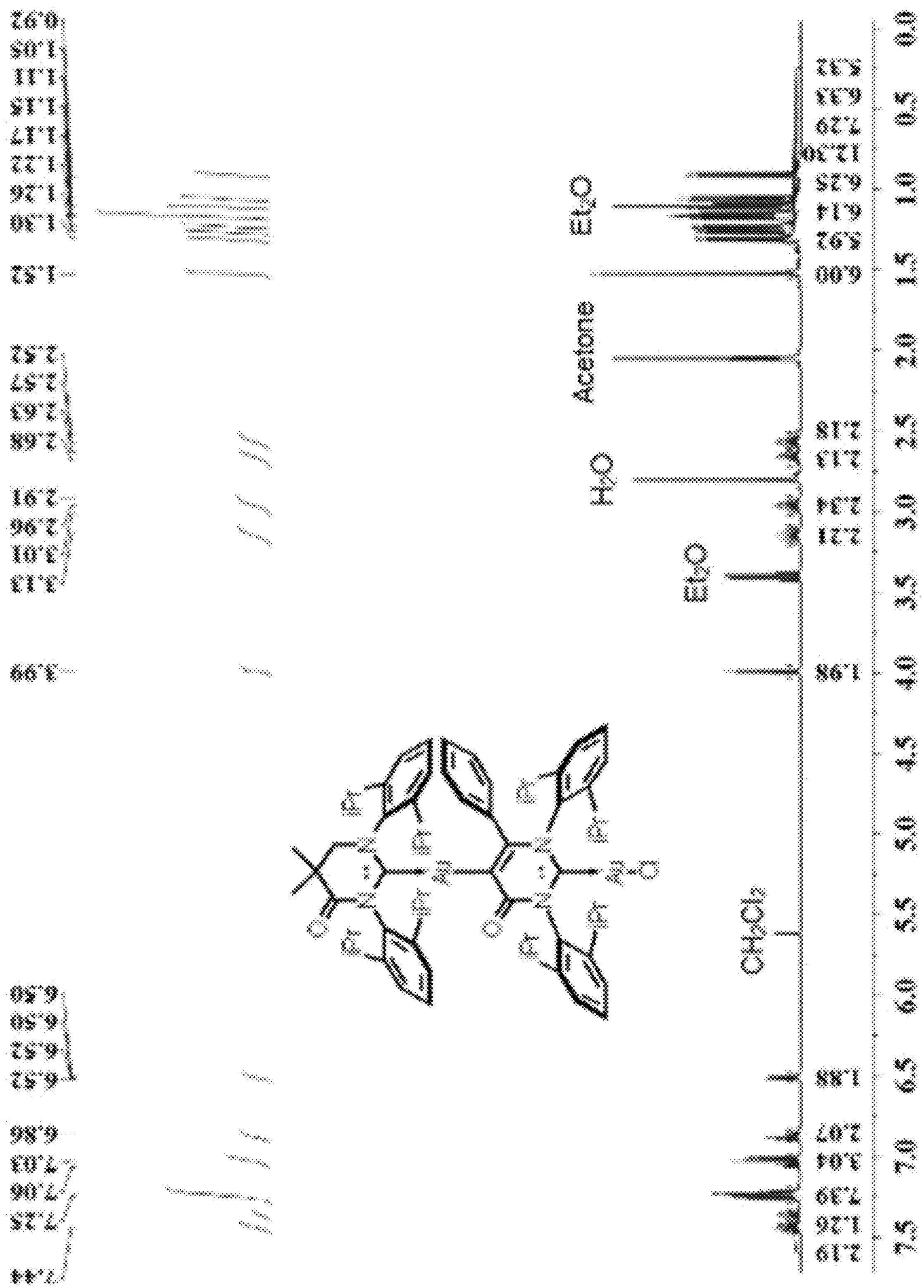
FIG. 39 is a $^{1}$H NMR spectrum of AuPhCl in d6-Acetone.
Figure 40:
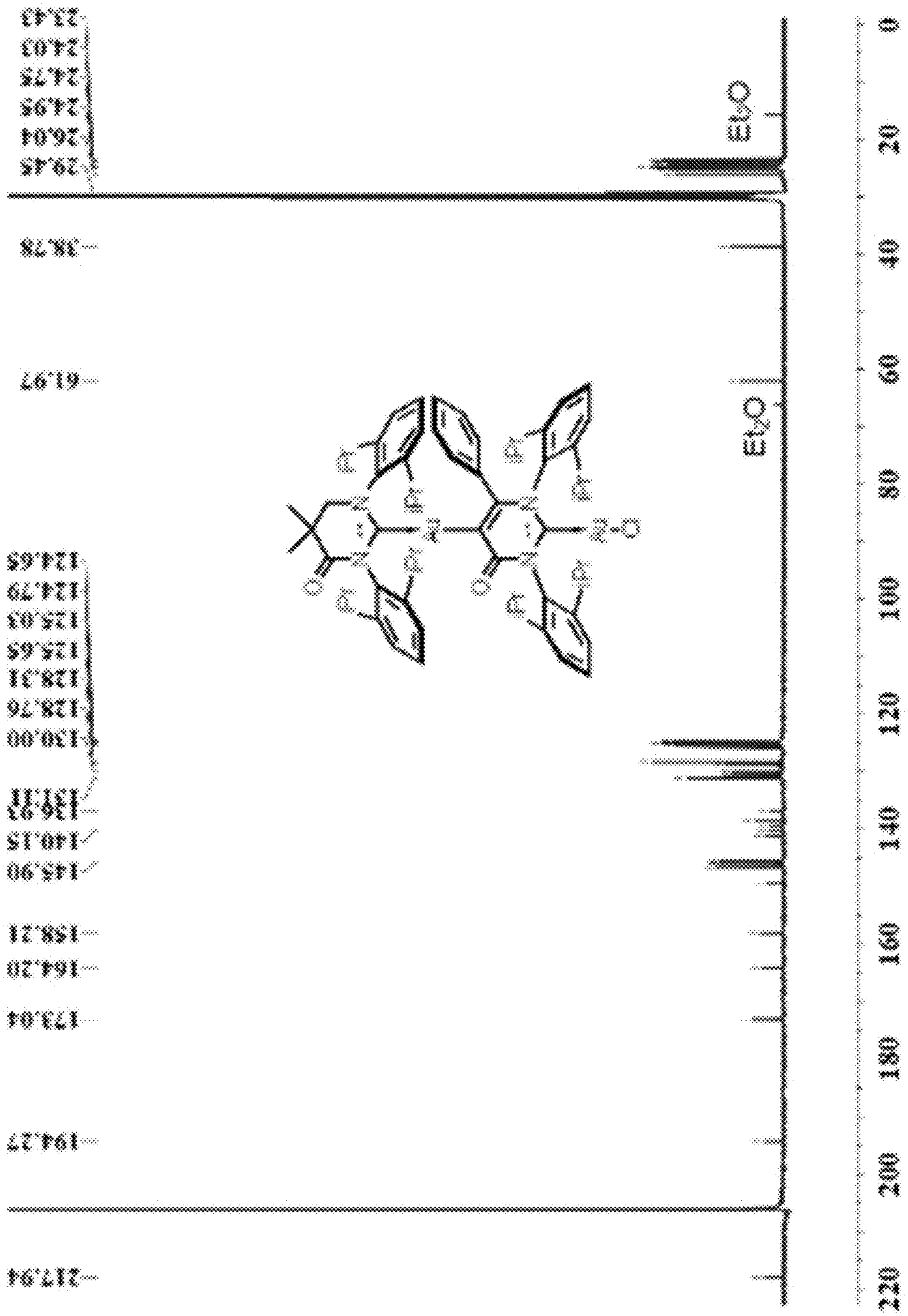
FIG. 40 is a $^{13}$C NMR spectrum of AuPhCl in d6-Acetone.
Figure 41:
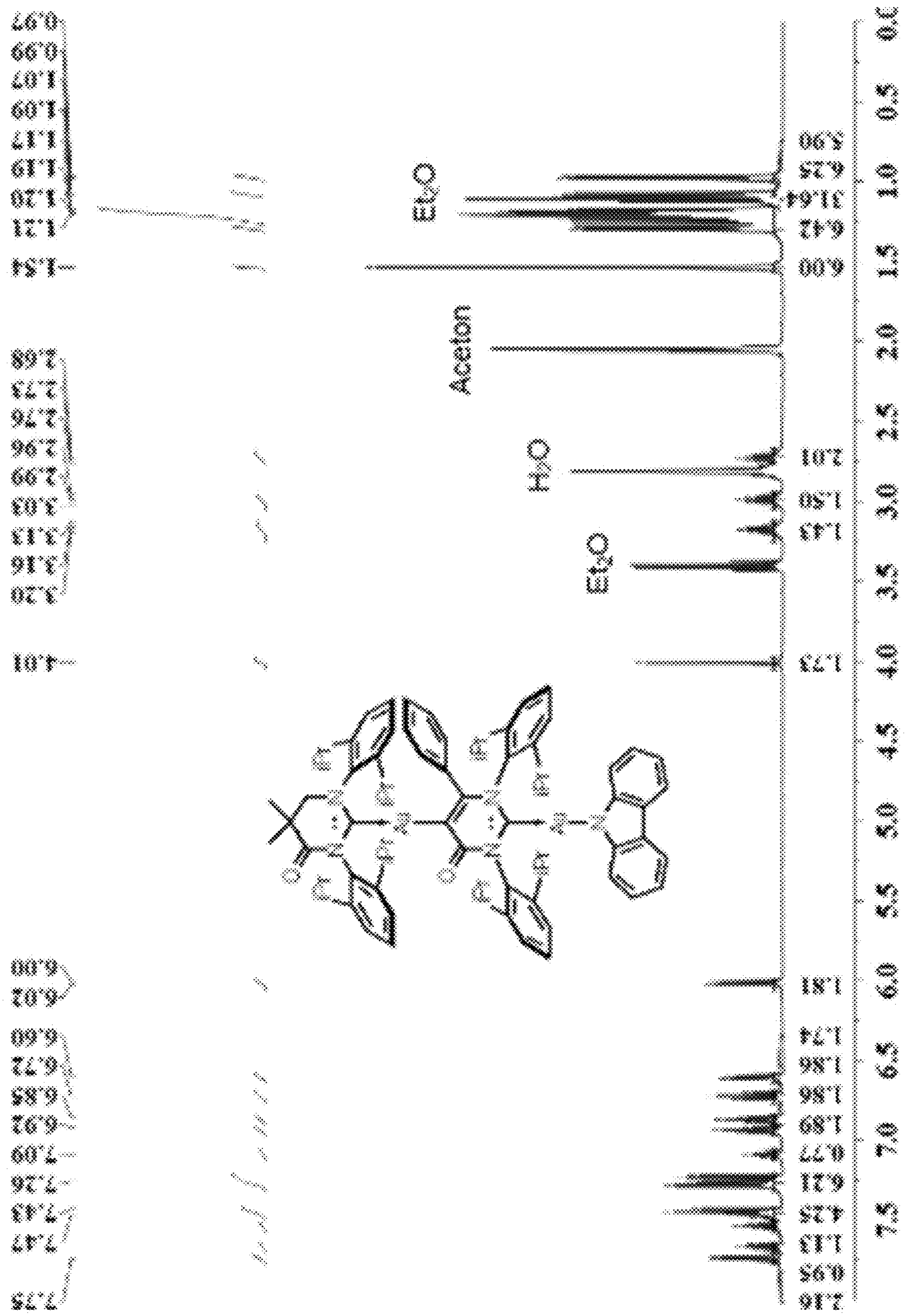
FIG. 41 is a $^{1}$H NMR spectrum of AuPhCz in d6-Acetone.
Figure 42:
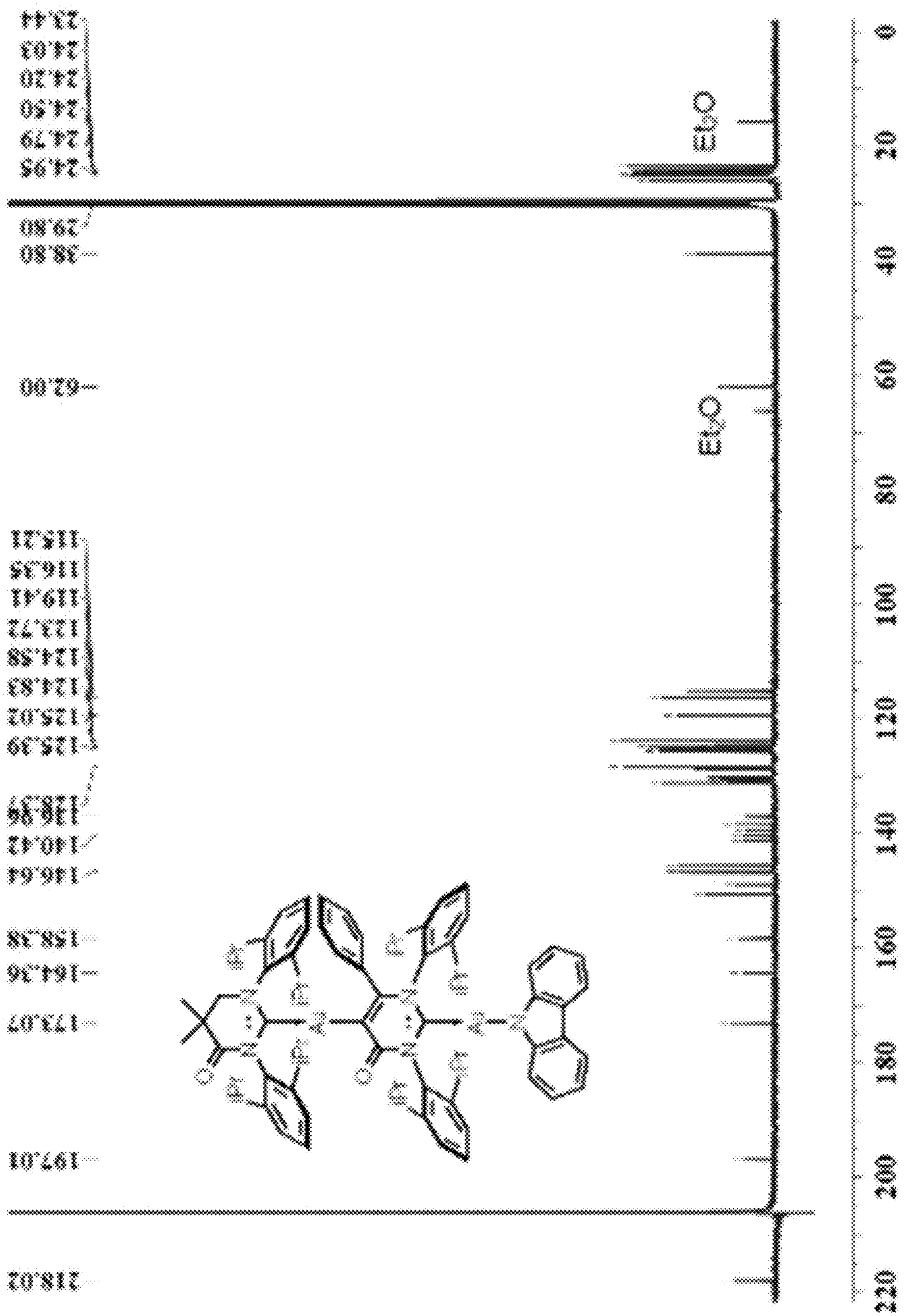
FIG. 42 is a $^{13}$C NMR spectrum of AuPhCz in d6-Acetone.

Another tandem carbene phosphor, AuPhCz, may be synthesized via the following scheme. A single crystal structure of the resulting tandem phosphor is shown in FIG. 34. The absorption spectra of AuPhCz in different solvents is shown in FIG. 35. FIG. 36 shows the emission spectra of AuPhCz in solution (top) and PS film (bottom). Photophysical properties of AuPhCz are shown below in Table 10. $^1H$ and $^{13}C$ NMR of AuPhOTf are shown in FIGS. 37 and 38. $^1H$ and $^{13}C$ NMR of AuPhOCl are shown in FIGS. 39 and 40. $^1H$ and $^{13}C$ NMR of AuPhOCz are shown in FIGS. 41 and 42.

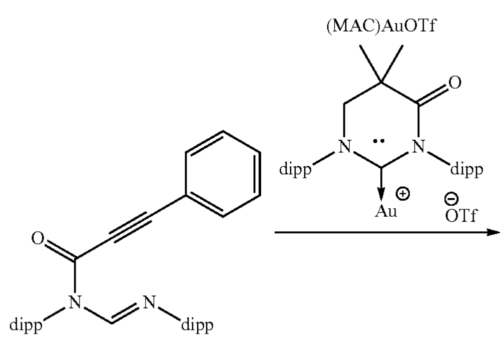

-continued

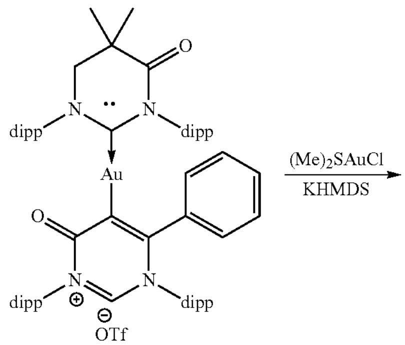

AuPhOTf

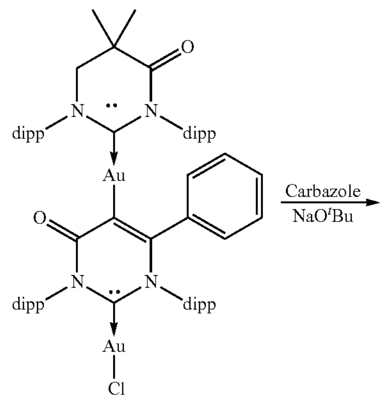

AuPhCl

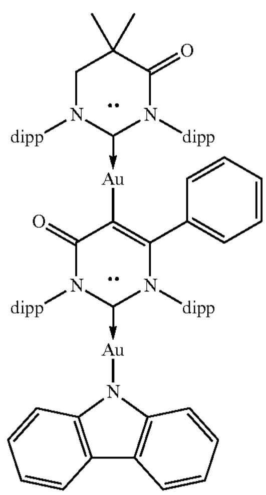

AuPhCz

TABLE 10

| Photophysical properties of AuPhCz | | | | | | | |
|---|---|---|---|---|---|---|---|
| | Room Temperature | | | | | 77 K | |
| Matrix | λ (nm) | $\Phi_{PL}$ | τ (μs) | $k_r$ ($\times10^5$ s$^{-1}$) | $k_{nr}$ ($\times10^5$ s$^{-1}$) | λ (nm) | τ (μs) |
| $CH_3CN$ | 550 | <0.01 | 0.31 | <0.30 | >30 | — | — |
| $CH_2Cl_2$ | 540 | <0.01 | 0.53 | <0.20 | >20 | — | — |
| MeTHF | 538 | <0.01 | 0.46 | <0.2 | >22 | 428, 456, 483, 520(sh) | 130 |

TABLE 10-continued

| Photophysical properties of AuPhCz | | | | | | | |
|---|---|---|---|---|---|---|---|
| | Room Temperature | | | | | 77 K | |
| Matrix | λ (nm) | $\Phi_{PL}$ | τ (μs) | $k_r$ ($\times10^5$ s$^{-1}$) | $k_{nr}$ ($\times10^5$ s$^{-1}$) | λ (nm) | τ (μs) |
| Toluene | 496 | 0.03 | 0.55 | 0.55 | 18 | — | — |
| MeCy | 466, 490(sh) | 0.05 | 0.63 | 0.80 | 15 | 470, 500 | 120 |
| PS film | 472 | 0.62 | 2, 43 | — | — | 506 | 103 |

Figure 43:
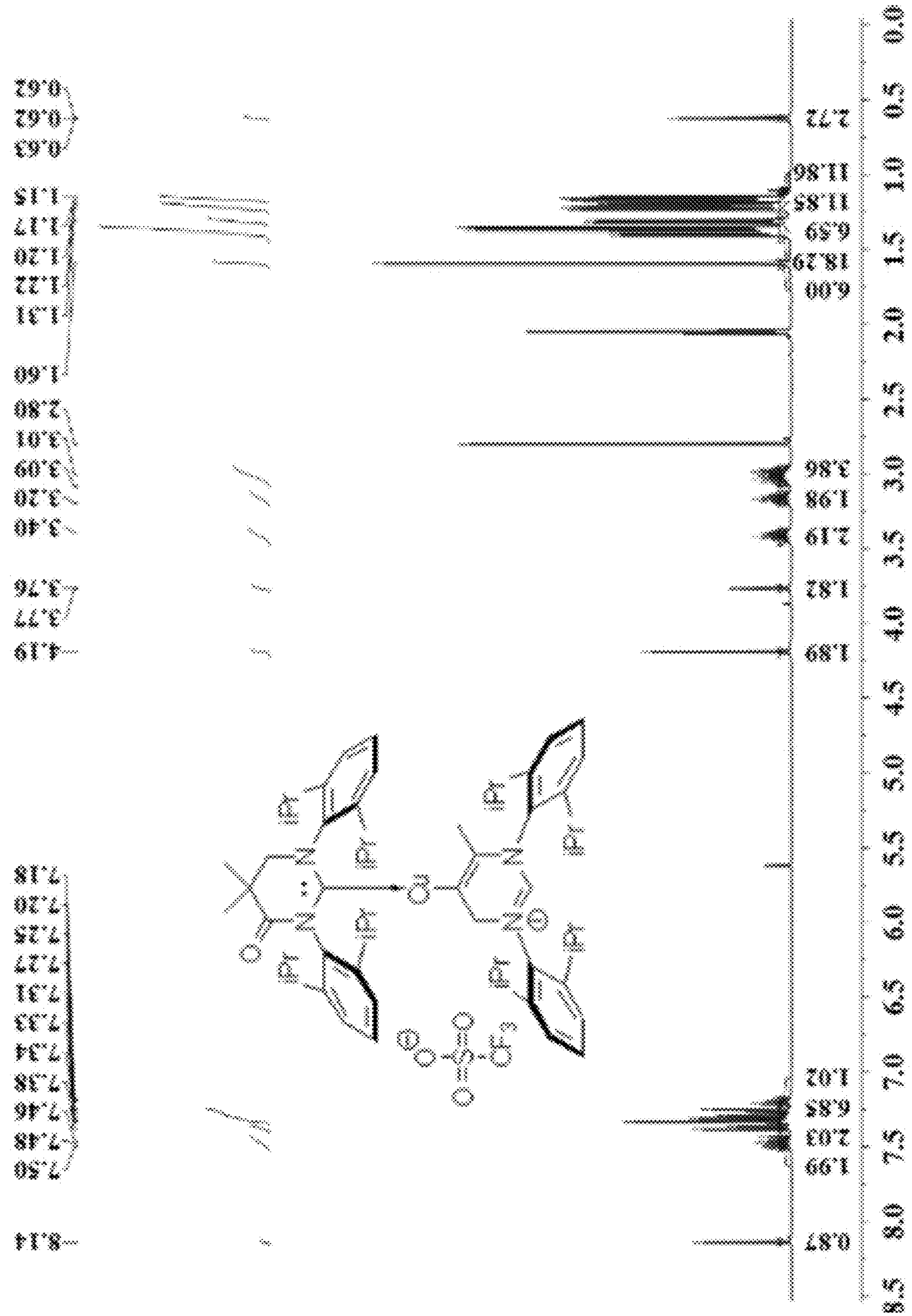
FIG. 43 is a $^{1}$H NMR spectrum of 4-CuOTf in d6-Acetone.

Another motif can be employed to realize clean donor to terminal carbene acceptor charge transfer state by increasing the π* orbital energy of the middle carbene. Thus, the $\Delta E_{ST}$ can be further shrunk, and radiative decay rate can be increased. When the carbonyl group on the AAC ligand is removed, a higher lying π* orbital is expected in the new carbene without carbonyl group. A synthesis of the corresponding Cu tandem carbene phosphor is shown below. Following the synthesis of 4-CuOTf, the synthesis proceeds in the manner described above. A $^1$H NMR of intermediate 4-CuOTf is shown in FIG. 43.

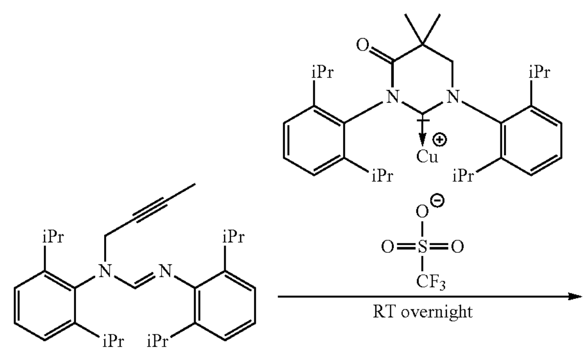

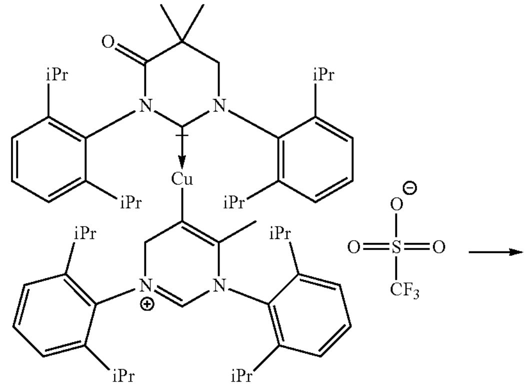

4-CuOTf

-continued

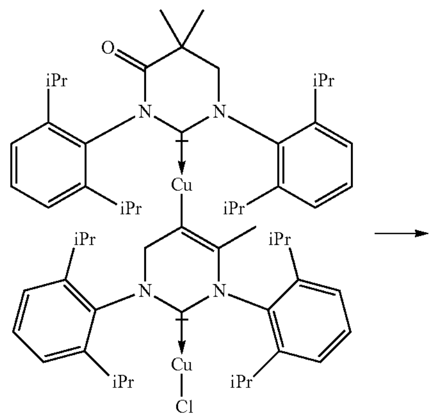

5-CuCl

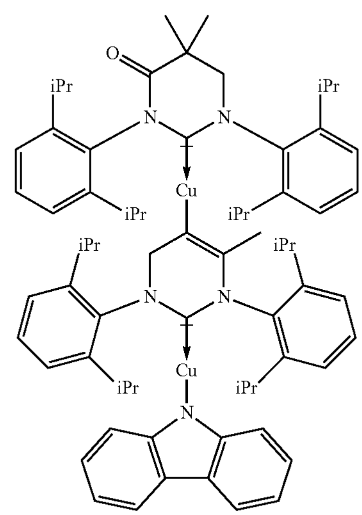

6-CuCz

Figure 44:
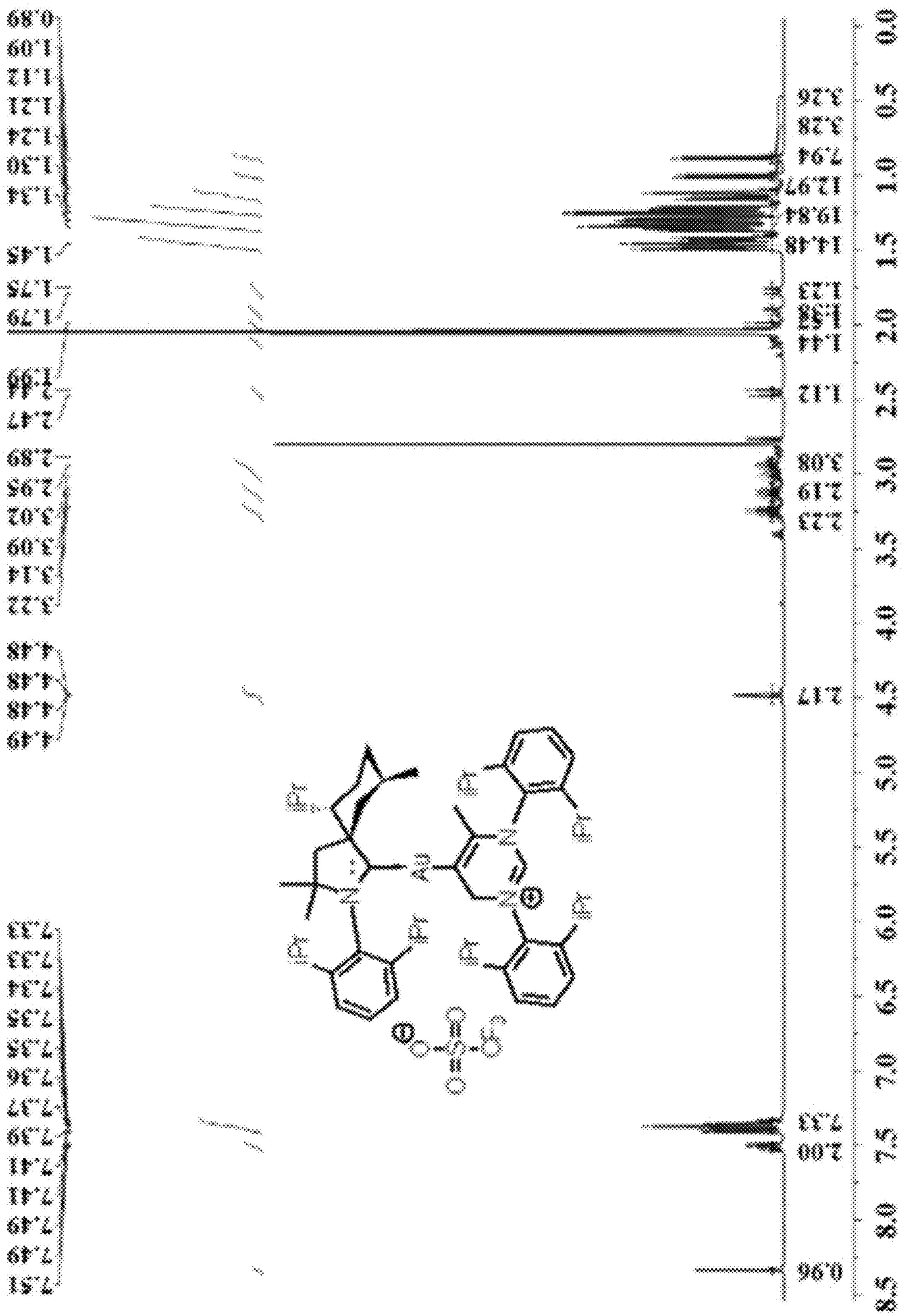
FIG. 44 is a $^{1}$H NMR spectrum of 4-AuOTf in d6-Acetone.

The tandem carbene phosphor 6-AuCz may be produced using the following method. A $^{1}$H NMR of intermediate 4-AuOTF is shown in FIG. 44.

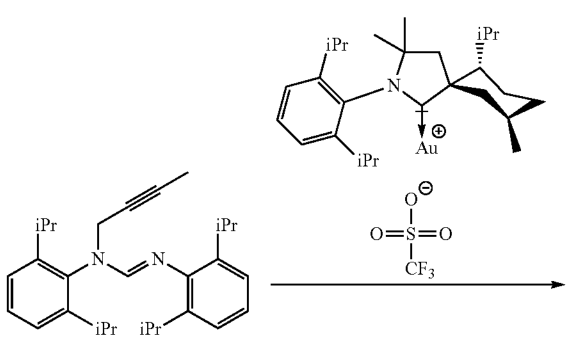

-continued

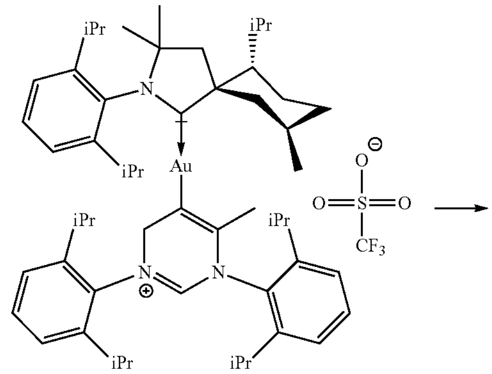

4-AuOTf

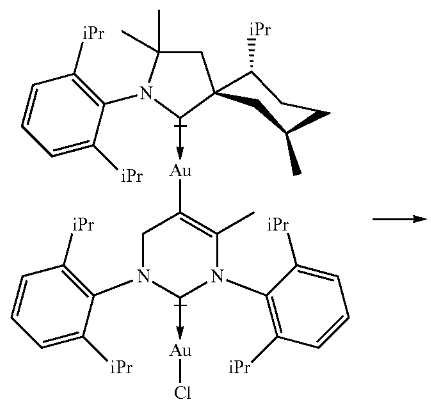

5-AuCl

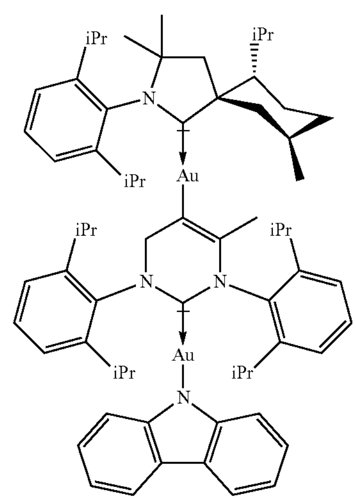

6-AuCz

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound represented by the following Formula I:

Formula I

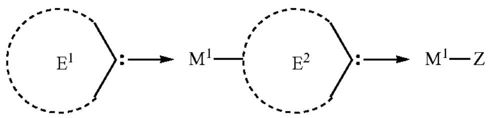

wherein $M^1$ and $M^2$ are independently selected from the group consisting of Au(I), Ag(I), and Cu(I);

$E^1$ is a carbene coordinated to the metal $M^1$;

$E^2$ is an anionic carbene coordinated to the metal $M^1$ and the metal $M^2$;

Z is a monoanionic ligand;

$E^1$, $E^2$, and Z may each be substituted with one or more substituents independently selected from the group consisting of hydrogen, deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ether, ester, vinyl, ketone, sulfinyl, sulfonyl, cyano, phosphino, and combinations thereof; wherein any two adjacent substituents may together join to form a ring.

2. The compound of claim 1, wherein Z is selected from the group consisting of an alkyl anion, aryl anion, halide, trifluoromethylsulfonate, amide, alkoxide, sulfide, or phosphide.

3. The compound of claim 1, wherein Z is represented by one of the following structures:

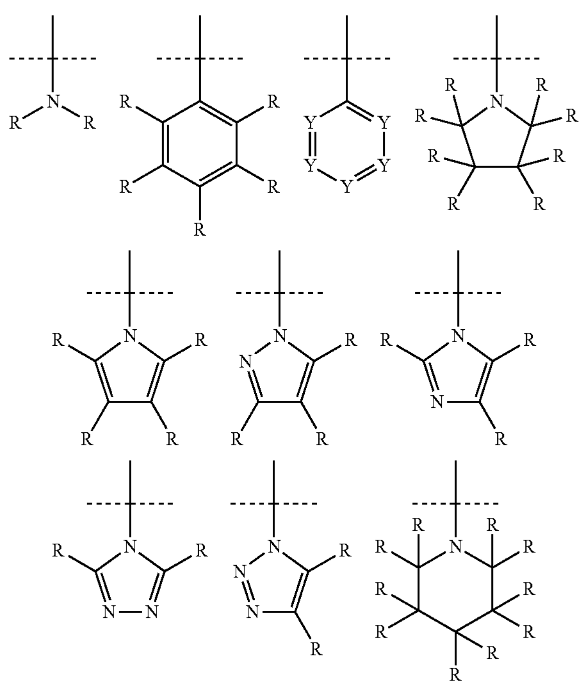

-continued

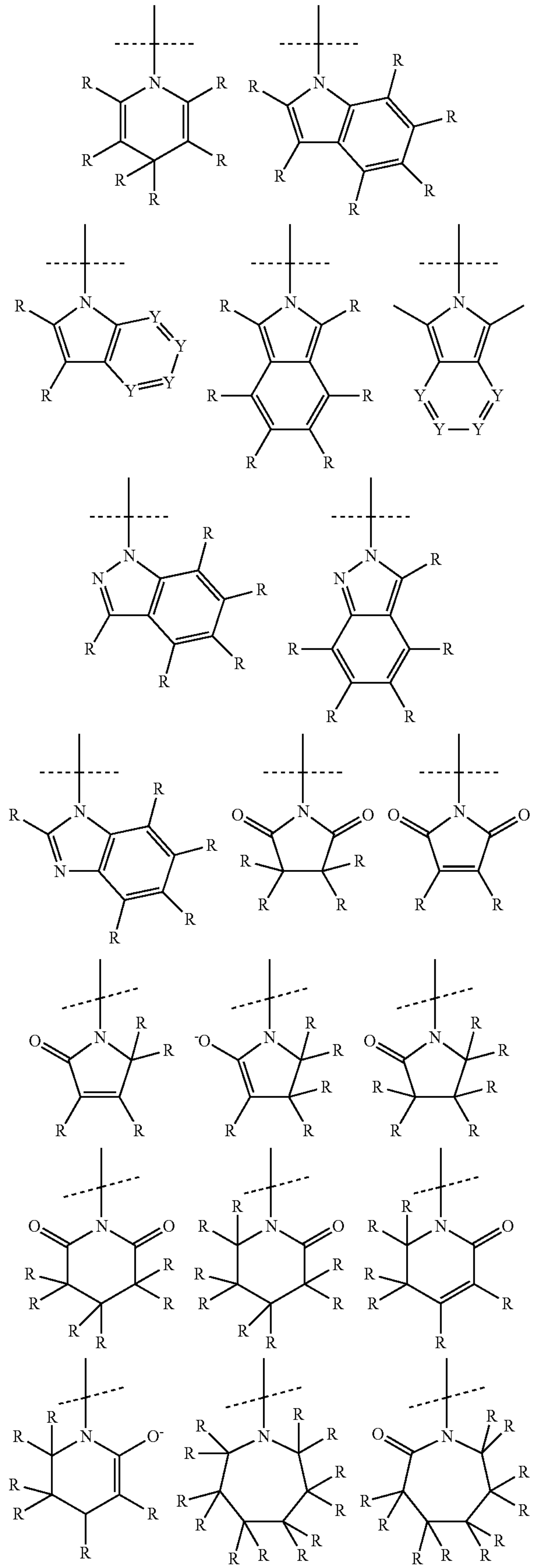

-continued

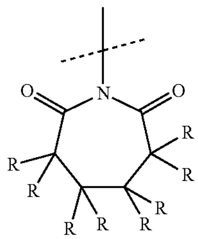
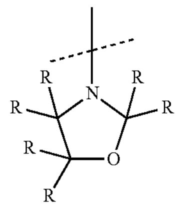
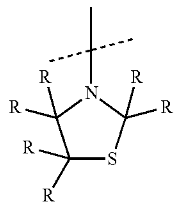
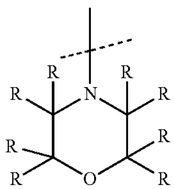
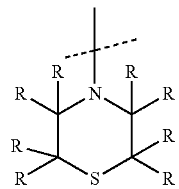
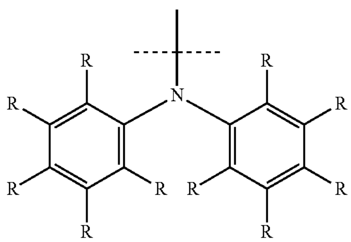
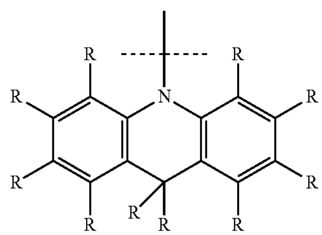
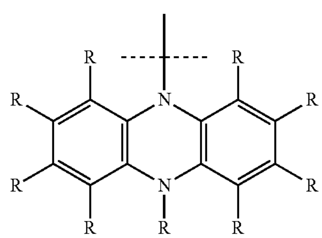
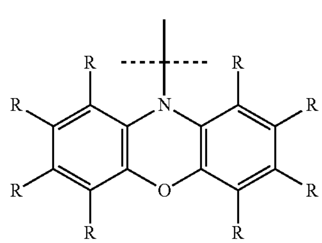
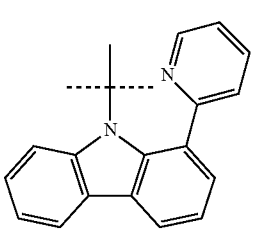
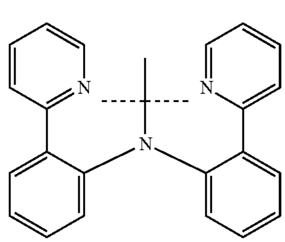

-continued

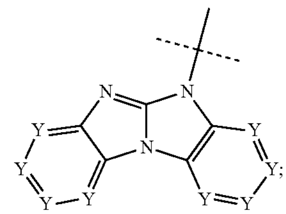

wherein the dashed line indicates the bond to $M^2$; and each occurrence Y is selected from the group consisting of N and CR.

4. The compound of claim 1, wherein Z is represented by one of the following structures:

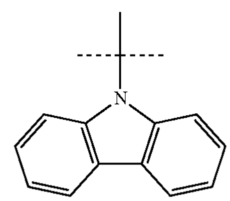
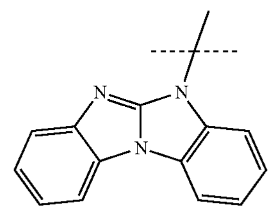
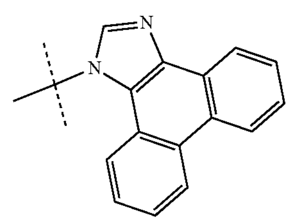

wherein the dashed line indicates the bond to $M^2$.

5. The compound of claim 1, wherein $E^1$ is selected from the group consisting of Formula A, Formula B, Formula C, Formula D, Formula E, and Formula F;

Formula A

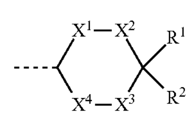

wherein each $X^1$ to $X^4$ independently represents $NR^1$, $CR^1R^2$, C═O, C═S, O, or S; and each occurrence of $R^1$ and $R^2$ is independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein any two adjacent $R^1$ and $R^2$ are optionally joined or fused together to form a ring which is optionally substituted;

Formula B

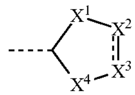

wherein each $X^1$ and $X^4$ independently represents N, $NR^1$, $CR^1$, $CR^1R^2$, $SiR^1$, $SiR^1R^2$, $PR^1$, B, $BR^1$, $BR^1R^2$, O, or S; and each $X^2$ and $X^3$ independently represents $CR^1$, $CR^1R^2$, $SiR^1$, $SiR^1R^2$, N, $NR^1$, P, $PR^1$, B, $BR^1$, O, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein any two adjacent $R^1$ and $R^2$ are optionally joined or fused together to form a ring which is optionally substituted; and the dashed line inside the five-member ring represents zero or one double-bond;

Formula C

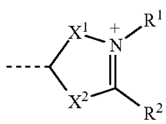

wherein each $X^1$ and $X^2$ independently represents $NR^1$, $CR^1R^2$, O, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted;

Formula D

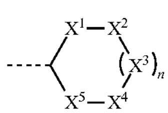

wherein each $X^1$ to $X^5$ independently represents N, P, $NR^1$, $PR^1$, B, $BR^1$, $CR^1$, $SiR^1$, $CR^1R^2$, $SiR^1R^2$, C═O, C═S, O, or S;

n is 0 or 1;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted;

Formula E

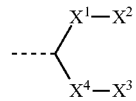

wherein each $X^1$ and $X^4$ independently represents $NR^1$, $CR^1$, $SiR^1$, $CR^1R^2$, $SiR^1R^2$, $PR^1$, $BR^1$, C═O, C═S, O, or S;

each $X^2$ and $X^3$ is independently present or absent, and if present, independently represents H, $NR^1R^2$, $CR^1$, $CR^1R^2$, C═O, C═S, O, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted Formula F

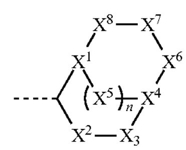

wherein each occurrence of $X^1$ to $X^8$ independently represents N, P, $NR^1$, $PR^1$, B, $BR^1$, $CR^1$, $SiR^1$, $CR^1R^2$, $SiR^1R^2$, C═O, C═S, O, or S;

n is 1 or 2;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted.

6. The compound of claim 1, wherein $E^1$ is represented by one of the following structures:

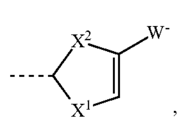
,
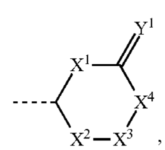
,
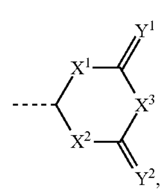
, and

-continued

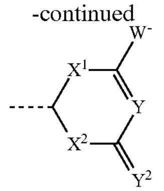

wherein each $X^1$ and $X^2$ independently represents $NR^1$, $CR^1$, $SiR^1$, $CR^1R^2$, $SiR^1R^2$, $PR^1$, $BR^1$, C═O, C═S, O, or S;

each $X^3$ and $X^4$ independently represents N, P, $NR^1$, $PR^1$, B, $BR^1$, $CR^1$, $SiR^1$, $CR^1R^2$, $SiR^1R^2$, C═O, C═S, O, or S;

Y represents N, P, $CR^1$, or $SiR^1$;

each $Y^1$ and $Y^2$ independently represents O, S, $NR^1$, or $CR^1R^2$

W represents O, $NR^1$, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted.

7. The compound of claim 1, wherein $E^1$ is represented by one of the following structures:

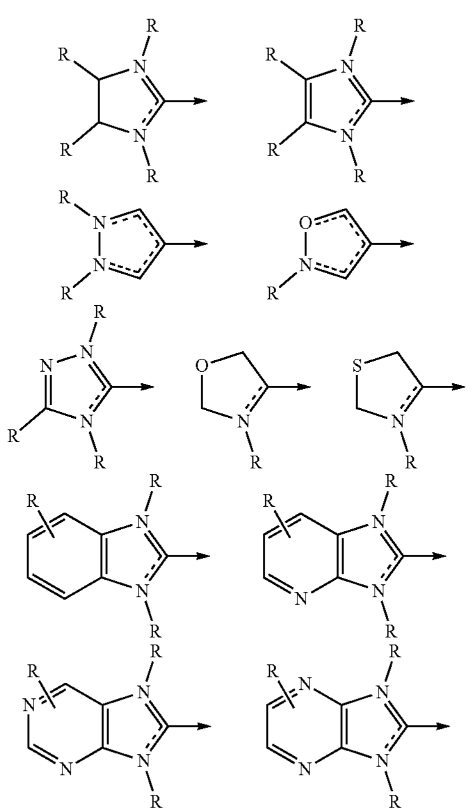

-continued

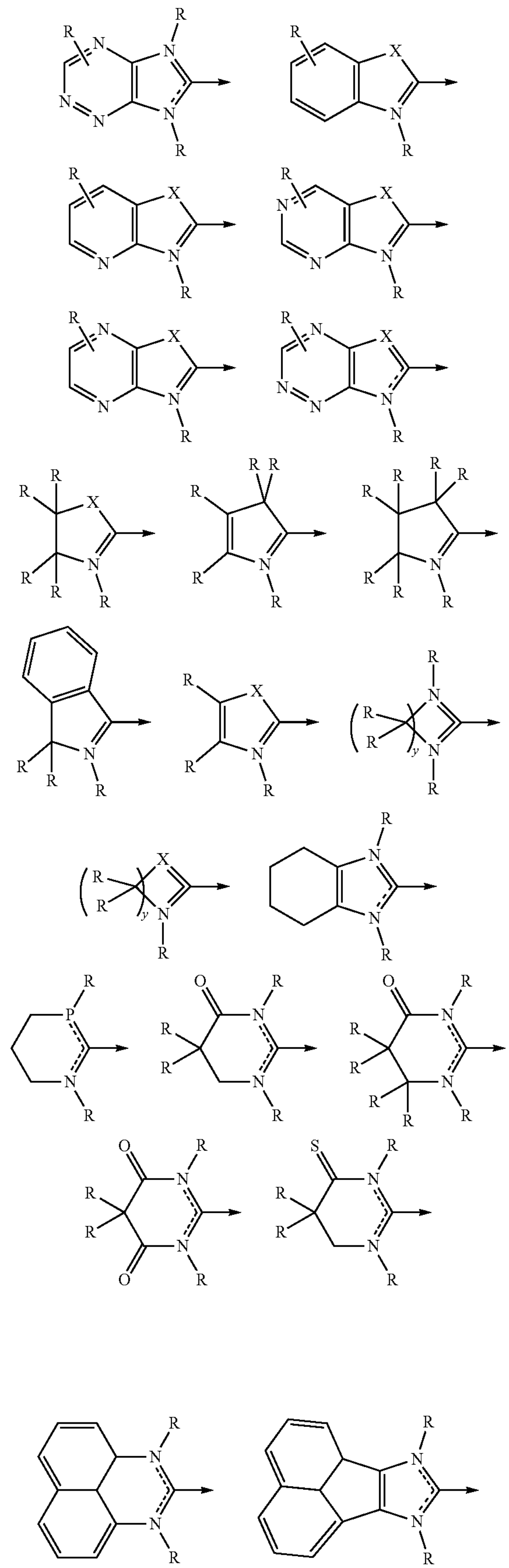

-continued

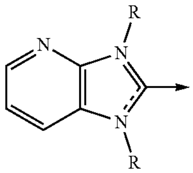
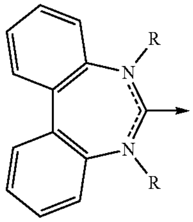
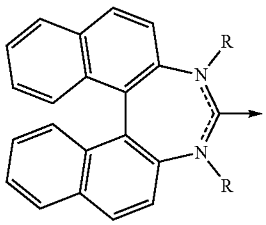
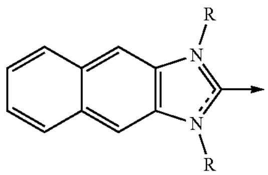
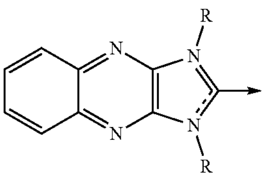
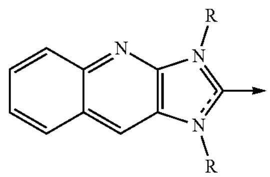
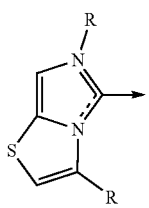
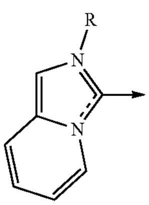
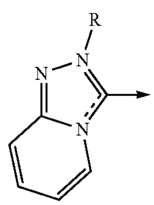
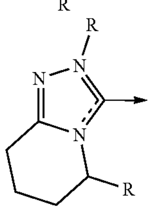
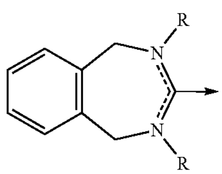
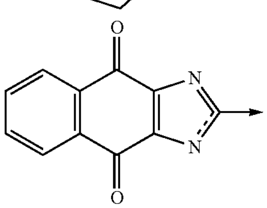
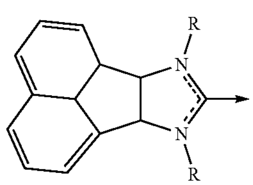
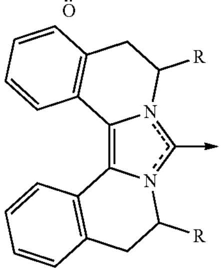
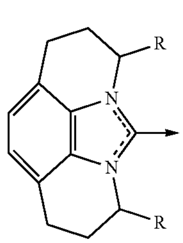
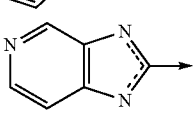
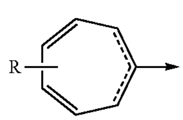
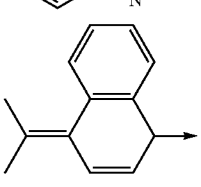
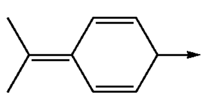

-continued

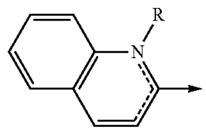
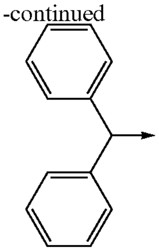
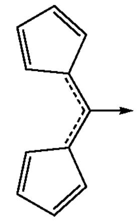
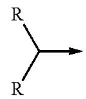
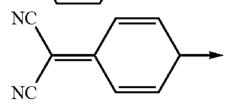

8. The compound of claim 1, wherein $E^1$ is represented by one of the following structures:

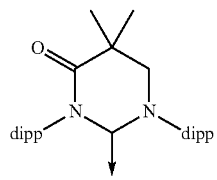
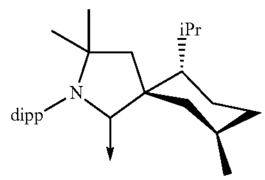
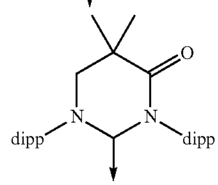
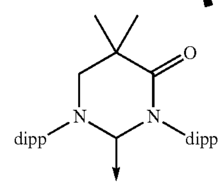
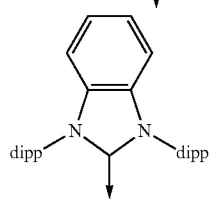
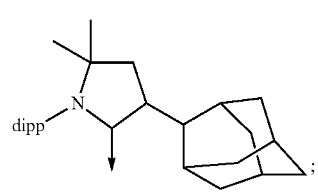
;

wherein dipp represents 2,6-diisopropylphenyl.

9. The compound of claim 1, wherein $E^2$ is selected from the group consisting of Formula A, Formula B, Formula C, Formula D, Formula E, and Formula F;

Formula A

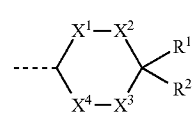

wherein each $X^1$ to $X^4$ independently represents $NR^1$, $CR^1R^2$, C═O, C═S, O, or S; and each occurrence of $R^1$ and $R^2$ is independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein any two adjacent $R^1$ and $R^2$ are optionally joined or fused together to form a ring which is optionally substituted;

provided that one occurrence of $R^1$ and $R^2$, or one substituent bound thereto, represents the bond to metal $M^1$;

Formula B

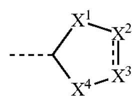

wherein each $X^1$ and $X^4$ independently represents N, $NR^1$, $CR^1$, $CR^1R^2$, $SiR^1$, $SiR^1R^2$, $PR^1$, B, $BR^1$, $BR^1R^2$, O, or S; and each $X^2$ and $X^3$ independently represents $CR^1$, $CR^1R^2$, $SiR^1$, $SiR^1R^2$, N, $NR^1$, P, $PR^1$, B, $BR^1$, O, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein any two adjacent $R^1$ and $R^2$ are optionally joined or fused together to form a ring which is optionally substituted; and the dashed line inside the five-member ring represents zero or one double-bond provided that one occurrence of $R^1$ and $R^2$, or one substituent bound thereto, represents the bond to metal $M^1$;

Formula C

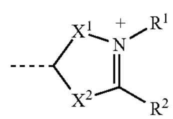

wherein each $X^1$ and $X^2$ independently represents $NR^1$, $CR^1R^2$, O, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted;

provided that one occurrence of $R^1$ and $R^2$, or one substituent bound thereto, represents the bond to metal $M^1$;

Formula D

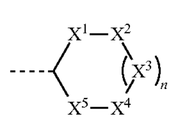

wherein each $X^1$ to $X^5$ independently represents N, P, $NR^1$, $PR^1$, B, $BR^1$, $CR^1$, $SiR^1$, $CR^1R^2$, $SiR^1R^2$, C═O, C═S, O, or S;

n is 0 or 1;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted;

provided that one occurrence of $R^1$ and $R^2$, or one substituent bound thereto, represents the bond to metal $M^1$;

Formula E

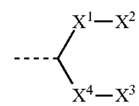

wherein each $X^1$ and $X^4$ independently represents $NR^1$, $CR^1$, $SiR^1$, $CR^1R^2$, $SiR^1R^2$, $PR^1$, $BR^1$, C═O, C═S, O, or S;

each $X^2$ and $X^3$ is independently present or absent, and if present, independently represents H, $NR^1R^2$, $CR^1$, $CR^1R^2$, C═O, C═S, O, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted;

provided that one occurrence of $R^1$ and $R^2$, or one substituent bound thereto, represents the bond to metal $M^1$;

Formula F

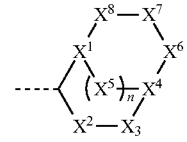

wherein each occurrence of $X^1$ to $X^8$ independently represents N, P, $NR^1$, $PR^1$, B, $BR^1$, $CR^1$, $SiR^1$, $CR^1R^2$, $SiR^1R^2$, C═O, C═S, O, or S;

n is 1 or 2;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted provided that one occurrence of $R^1$ and $R^2$, or one substituent bound thereto, represents the bond to metal $M^1$.

10. The compound of claim 1, wherein $E^2$ is represented by one of the following structures:

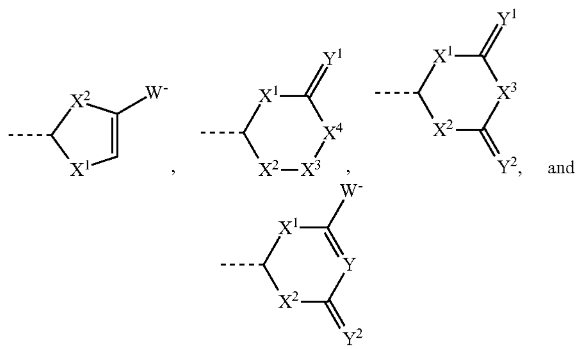

wherein each $X^1$ and $X^2$ independently represents $NR^1$, $CR^1$, $SiR^1$, $CR^1R^2$, $SiR^1R^2$, $PR^1$, $BR^1$, C═O, C═S, O, or S;

each $X^3$ and $X^4$ independently represents N, P, $NR^1$, $PR^1$, B, $BR^1$, $CR^1$, $SiR^1$, $CR^1R^2$, $SiR^1R^2$, C═O, C═S, O, or S;

Y represents N, P, $CR^1$, or $SiR^1$;

each $Y^1$ and $Y^2$ independently represents O, S, $NR^1$, or $CR^1R^2$

W represents O, $NR^1$, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein any two adjacent $R^1$ and $R^2$ are optionally joined or fused together to form a ring which is optionally substituted;

provided that one occurrence of $R^1$ and $R^2$, or one substituent bound thereto, represents the bond to metal $M^1$.

11. The compound of claim 1, wherein $E^2$ is represented by one of the following structures:

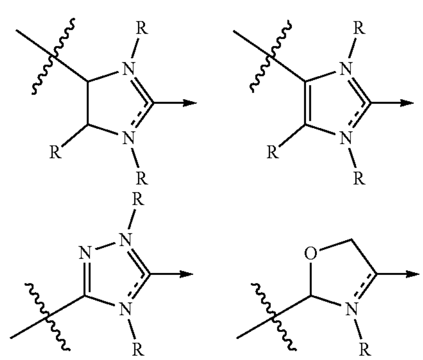

-continued

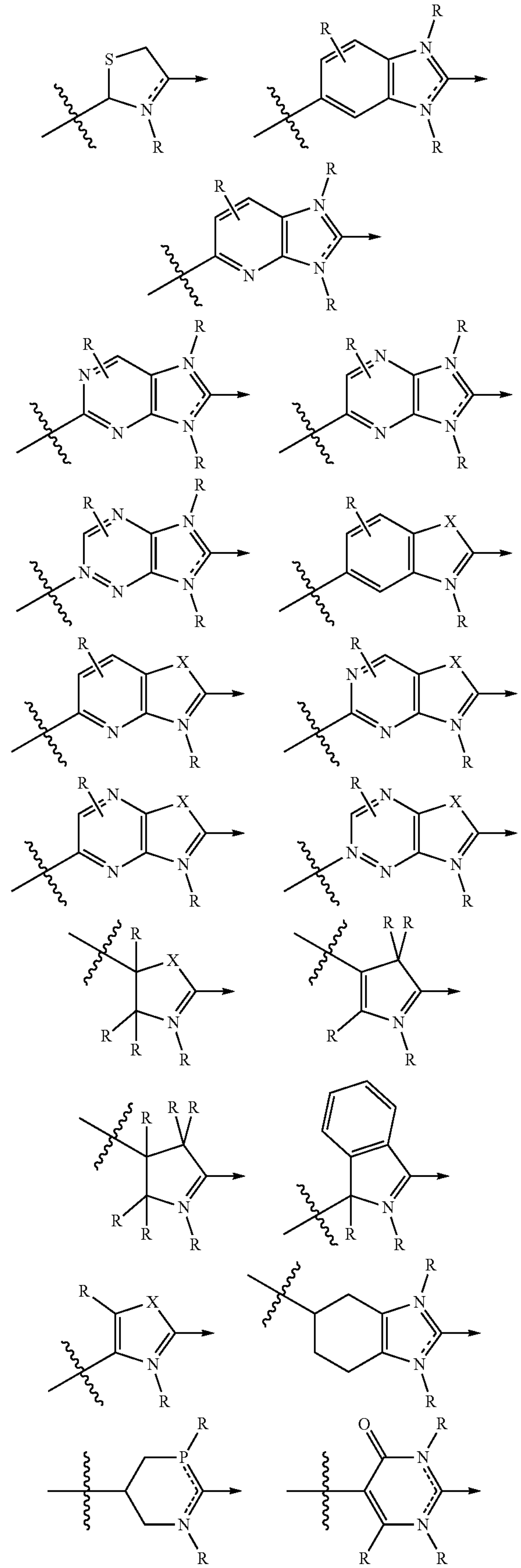

-continued
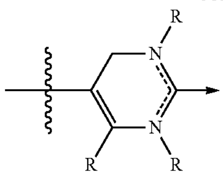
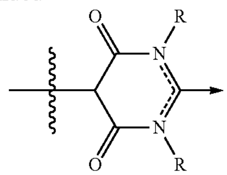
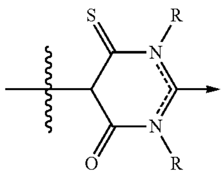
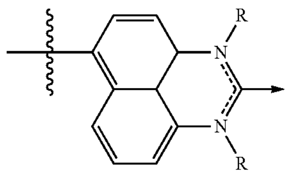
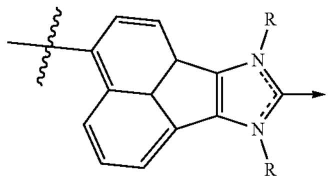
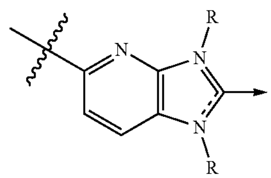
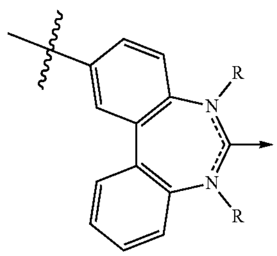
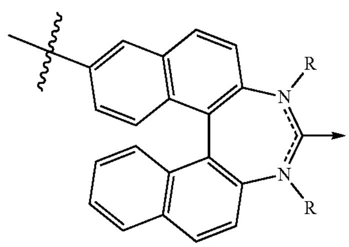
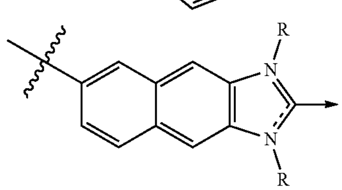
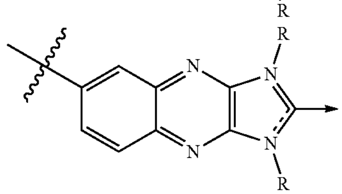
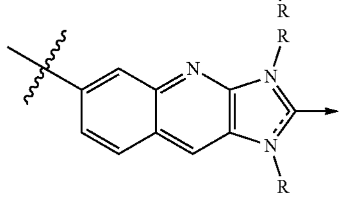
-continued
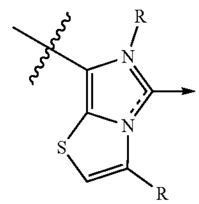
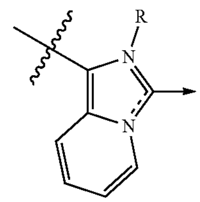
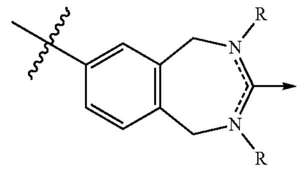
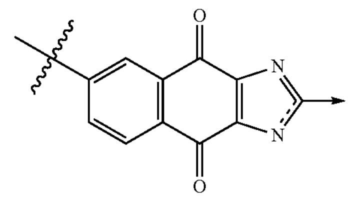
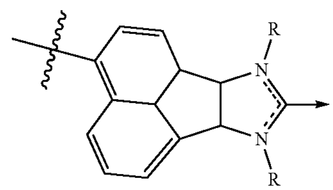
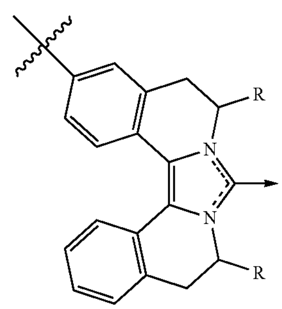
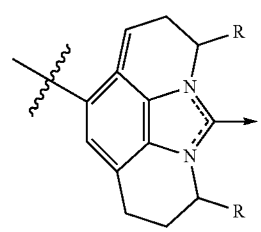
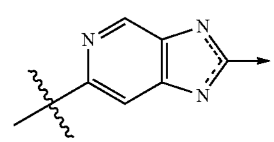
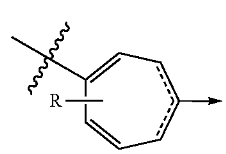
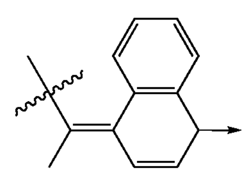
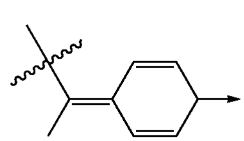
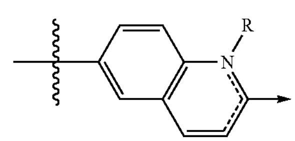

-continued

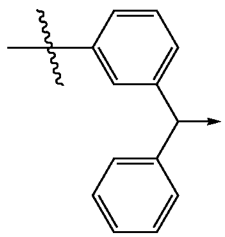

wherein the wavy line indicates the bond to metal $M^1$; and wherein the arrow indicates the bond to metal $M^2$.

12. The compound of claim 1, wherein $E^2$ is represented by one of the following structures

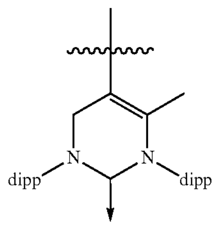

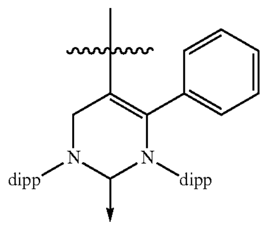

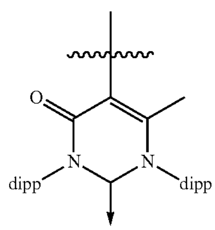

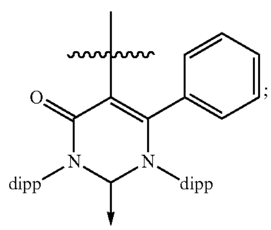;

wherein dipp represents 2,6-diisopropylphenyl;

the wavy line indicates the bond to $M^1$; and the arrow indicates the bond to $M^2$.

13. The compound of claim 1, wherein the compound is represented by one of the following structures

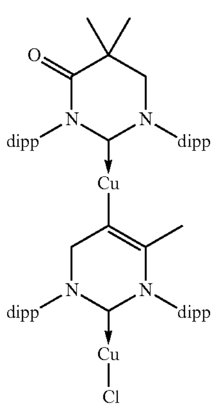

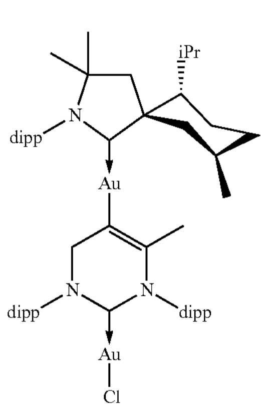

-continued

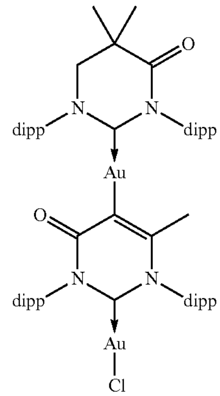

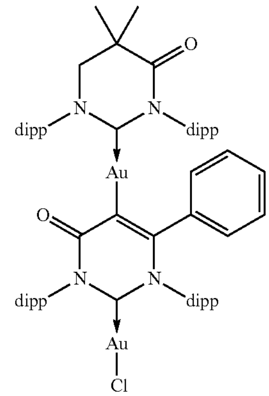

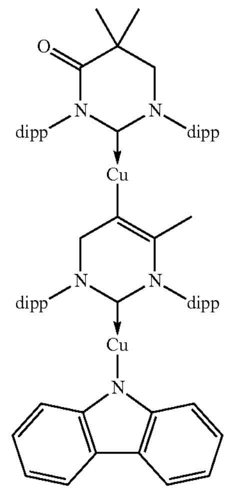

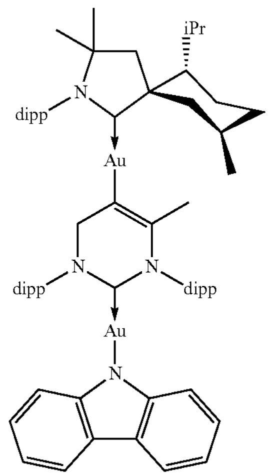

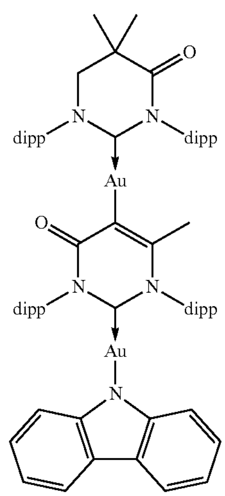

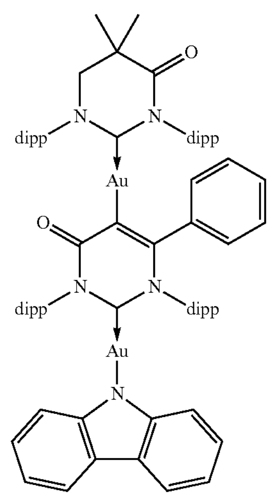

wherein dipp represents 2,6-diisopropylphenyl.

14. An organic electroluminescent device comprising:

an anode;

a cathode; and an organic layer, disposed between the anode and the cathode, comprising a compound represented by the following Formula I:

Formula I

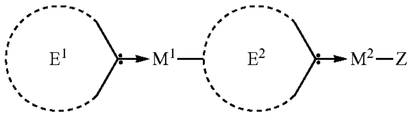

wherein $M^1$ and $M^2$ are independently selected from the group consisting of Au(I), Ag(I), and Cu(I);

$E^1$ is a carbene coordinated to the metal $M^1$;

$E^2$ is an anionic carbene coordinated to the metal $M^1$ and the metal $M^2$;

Z is a monoanionic ligand;

$E^1$, $E^2$, and Z may each be substituted with one or more substituents independently selected from the group consisting of hydrogen, deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ether, ester, vinyl, ketone, sulfinyl, sulfonyl, cyano, phosphino, and combinations thereof; wherein any two adjacent substituents may together join to form a ring.

15. The OLED claim 14, wherein the organic layer is an emissive layer and the compound is an emissive dopant or a non-emissive dopant.

16. The OLED of claim 14, wherein the organic layer further comprises a host, wherein the host comprises at least one chemical group selected from the group consisting of triphenylene, carbazole, dibenzothiphene, dibenzofuran, dibenzoselenophene, azatriphenylene, azacarbazole, aza-dibenzothiophene, aza-dibenzofuran, and aza-dibenzoselenophene.

17. A consumer product comprising an organic light-emitting device (OLED) comprising:

an anode;

a cathode; and an organic layer, disposed between the anode and the cathode, comprising a compound represented by the following Formula I:

Formula I

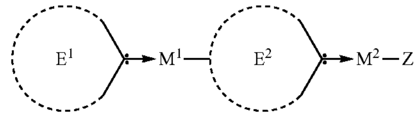

wherein $M^1$ and $M^2$ are independently selected from the group consisting of Au(I), Ag(I), and Cu(I);

$E^1$ is a carbene coordinated to the metal $M^1$;

$E^2$ is an anionic carbene coordinated to the metal $M^1$ and the metal $M^2$;

Z is a monoanionic ligand;

$E^1$, $E^2$, and Z may each be substituted with one or more substituents independently selected from the group consisting of hydrogen, deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ether, ester, vinyl, ketone, sulfinyl, sulfonyl, cyano, phosphino, and combinations thereof; wherein any two adjacent substituents may together join to form a ring.

18. The consumer product of claim 15, wherein the consumer product is selected from the group consisting of a flat panel display, a computer monitor, a medical monitors television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display, a 3-D display, a virtual reality or augmented reality display, a vehicle, a large area wall, a theater or stadium screen, and a sign.

19. A formulation comprising the compound of claim 1.

* * * * *